(12) United States Patent
Chiang et al.

(10) Patent No.: US 10,833,263 B2
(45) Date of Patent: Nov. 10, 2020

(54) CURRENT COMPLIANCE LAYERS AND MEMORY ARRAYS COMPRISING THEREOF

(71) Applicant: Intermolecular, Inc., San Jose, CA (US)

(72) Inventors: Tony Chiang, Los Gatos, CA (US); Sergey V. Barabash, San Jose, CA (US); Karl Littau, Palo Alto, CA (US); Vijay Kris Narasimhan, Mountain View, CA (US); Stephen Weeks, San Jose, CA (US)

(73) Assignee: INTERMOLECULAR, INC., San Jose, CA (US)

( * ) Notice: Subject to any disclaimer, the term of this patent is extended or adjusted under 35 U.S.C. 154(b) by 0 days.

(21) Appl. No.: 16/735,801

(22) Filed: Jan. 7, 2020

(65) Prior Publication Data
US 2020/0152867 A1    May 14, 2020

Related U.S. Application Data

(63) Continuation of application No. 15/863,199, filed on Jan. 5, 2018, now Pat. No. 10,580,978.

(Continued)

(51) Int. Cl.
| | | |
|---|---|---|
| *H01L 45/00* | (2006.01) | |
| *H01L 27/24* | (2006.01) | |
| *G11C 13/00* | (2006.01) | |

(52) U.S. Cl.
CPC ........ *H01L 45/1233* (2013.01); *G11C 13/003* (2013.01); *G11C 13/0007* (2013.01); *H01L 27/249* (2013.01); *H01L 27/2409* (2013.01); *H01L 27/2481* (2013.01); *H01L 45/04* (2013.01); *H01L 45/06* (2013.01);
(Continued)

(58) Field of Classification Search
CPC ... H01L 45/1233; H01L 45/06; H01L 45/144; H01L 45/143
See application file for complete search history.

(56) References Cited

U.S. PATENT DOCUMENTS

| | | | | |
|---|---|---|---|---|
| 4,621,032 A | * | 11/1986 | deNeufville | ........... G11B 7/243 427/248.1 |
| 2007/0023758 A1 | * | 2/2007 | Tsurume | ............. H01L 27/1266 257/66 |

(Continued)

*Primary Examiner* — Jaehwan Oh
(74) *Attorney, Agent, or Firm* — Hunter Clark PLLC

(57) ABSTRACT

Provided are novel compositions of current compliance layers (CCLs) as well as novel methods of fabricating such CCLs and novel architectures of arranging CCLs and memory cells in memory arrays. A CCL may comprise one of sulfur (S), selenium (Se), and tellurium (Te). The CCL may further comprise one of germanium (Ge) and silicon (Si). CCLs may be fabricated as amorphous structure and remain amorphous when heated to 400° C. or 450° C. and above. In some embodiments, CCLs have crystallization temperatures of greater than 400° C. and, in some embodiments, glass transition temperatures of greater than 400° C. CCLs may be fabricated using atomic layer deposition (ALD) as a nanolaminate of layers having different compositions. The composition, number, and arrangement of the layers in the nanolaminate is specifically selected to yield a desired composition of CCL.

8 Claims, 77 Drawing Sheets

Related U.S. Application Data

(60) Provisional application No. 62/489,545, filed on Apr. 25, 2017.

(52) U.S. Cl.
CPC ........ *H01L 45/085* (2013.01); *H01L 45/1246* (2013.01); *H01L 45/144* (2013.01); *H01L 45/16* (2013.01); *H01L 45/1608* (2013.01); *G11C 2213/76* (2013.01)

(56) References Cited

U.S. PATENT DOCUMENTS

| | | | | |
|---|---|---|---|---|
| 2007/0254455 A1* | 11/2007 | Yamaguchi | ......... | H01L 27/0688 438/455 |
| 2008/0042180 A1* | 2/2008 | Yamazaki | ........... | H01L 21/8221 257/306 |
| 2008/0123396 A1* | 5/2008 | Kato | ................... | G06K 19/0723 365/163 |
| 2008/0308785 A1* | 12/2008 | Park | ........................ | H01L 45/06 257/4 |
| 2009/0250682 A1* | 10/2009 | Park | ...................... | H01L 45/148 257/4 |
| 2011/0089393 A1* | 4/2011 | Chang | .................... | H01L 45/04 257/4 |
| 2013/0105756 A1* | 5/2013 | Kim | ........................ | H01L 45/06 257/2 |
| 2015/0130751 A1* | 5/2015 | Teraguchi | ............. | G06F 3/0412 345/174 |
| 2015/0249211 A1* | 9/2015 | Knobloch | ........... | H01L 45/1608 257/5 |
| 2016/0315115 A1* | 10/2016 | Izuha | ................. | H01L 27/14649 |
| 2017/0214864 A1* | 7/2017 | Izuha | ................... | H04N 5/3698 |

* cited by examiner

*Side View*  FIG. 5C

CURRENT COMPLIANCE LAYERS AND MEMORY ARRAYS COMPRISING THEREOF

CROSS-REFERENCE TO RELATED APPLICATIONS

This application is a continuation of U.S. patent application Ser. No. 15/863,199, filed on Jan. 5, 2018, entitled "Current Compliance Layers and Memory Arrays Comprising Thereof," which claims the benefit under 35 U.S.C. § 119(e) of U.S. Provisional Patent Application 62/443,758, entitled: "Current Compliance Layers and Memory Arrays Comprising Thereof" filed on Jan. 8, 2017, and also claims the benefit under 35 U.S.C. § 119(e) of U.S. Provisional Patent Application 62/489,545, entitled: "Current Compliance Layers and Memory Arrays Comprising Thereof" filed on Apr. 25, 2017, each of which are incorporated herein by reference in their entireties.

BACKGROUND

Memory arrays are typically arranged with multiple memory cells sharing the same word lines and bit lines. Sneak current paths and memory cell variability in such arrays can cause various performance issues and limit the size of the array that can be achieved. For example, partial or half selected cells in a given memory block may provide a sneak current path(s) around the target cell(s) and interfere with the performance of the array and limit its density as the current will scale with the number of affected partial or half selected cells. These sneak current paths need to be suppressed to enable low power (e.g. low current and/or low voltage) operation, reduce variabilities (e.g. improve programming and read voltage distributions, avoid read/write disturb) in operation, increase cell/array operating windows, and improve overall reliability in memory arrays such as used in high density non-volatile memories (NVM). Additionally, variability in memory cells themselves can limit memory array performance, low power scaling, and density scaling. A means to increase the cell/array operating windows with low off currents is advantageous to improving memory array performance, low power scaling, and density scaling. While a current compliance layer (CCL) can be connected in series to each memory cell in an array, integrating CCLs into large arrays is challenging because of space and processing constraints. Conventional materials and architectures used for CCLs do not scale well because of high production cost, and decreased feature dimensions, among other issues. For example, each new layer in fabricating a memory array using a stacked cross-point architecture requires additional lithography/patterning steps at critical dimensions which limits cost/bit scaling at higher densities. Furthermore, many materials used for CCLs are sensitive to temperature and exposure to high temperatures during manufacture of the memory or even during operation of the memory array could negatively impact their performance. Additionally, many materials for CCLs may contain arsenic which has safety and manufacturing concerns.

SUMMARY

Provided are novel compositions for current compliance layers (CCLs) as well as novel methods for fabricating such CCLs and novel architectures of arranging or integrating CCLs and memory cells in memory arrays. A CCL may comprise at least one or more of sulfur (S), selenium (Se), and tellurium (Te) as well as at least one or more of germanium (Ge) and silicon (Si). CCLs may be fabricated having an amorphous structure and remain amorphous when heated to 400° C. or even 450° C. and above. In some embodiments, CCLs have crystallization temperatures of greater than 400° C. and, in some embodiments, glass transition temperatures of greater than 400° C. CCLs may be fabricated using atomic layer deposition (ALD) as a nanolaminate of layers having different compositions. The composition, number, and arrangement of the layers in the nanolaminate are selected to yield a desired composition of the CCLs.

In some embodiments, a memory device comprises a CCL, the CCL comprising an interface layer and a main layer. The interface layer directly interfaces the main layer. The interface layer comprises tellurium oxide. The main layer comprises germanium and tellurium. The concentration of germanium may vary throughout the thickness of the main layer, such that the thickness extends in a direction substantially perpendicular to an interface between the main layer and the interface layer. The concentration of germanium in the main layer may increase toward the interface between the main layer and the interface layer. The concentration of germanium in the main layer may have multiple spikes throughout the thickness of the main layer. In some embodiments, the concentration of tellurium in the main layer is between about 80% atomic and 99% atomic. In some embodiments, the concentration of germanium in the main layer may be between about 1% atomic and 10% atomic.

In some embodiments, the thickness of the interface layer may be between about 0.1 nanometers and 10 nanometers. In some embodiments, the interface layer is substantially conformal. In some embodiments, the thickness of the main layer is between about 10 nanometers and 200 nanometers.

In some embodiments, the CCL further comprises a first electrode. The interface layer may be disposed between the first electrode and the main layer. The interface layer may directly interface the first electrode. In some embodiments, the CCL further comprises a second electrode. The main layer may be disposed between the second electrode and the interface layer. The main layer directly may interface the second electrode.

In some embodiments, the memory device further comprises a memory element. The CCL may be stacked with and connected in series with the memory element. The memory element may directly interface the main layer of the CCL. In some embodiments, the memory element is a resistive random-access memory (ReRAM). In some embodiments, the CCL is operable as a memory cell.

Also provided is a method of forming a memory device, comprising a CCL. The method comprises depositing an interface layer of the CCL using atomic layer deposition (ALD). The method also comprises depositing a main layer of the CCL using ALD. The interface layer directly interfaces the main layer. The interface layer comprises tellurium oxide. The main layer comprises germanium and tellurium. In some embodiments, the precursors used to deposit the interface layer comprise tellurium ethoxide ($Te(OC_2H_5)_4$) and water ($H_2O$). The precursors used to deposit the main layer may comprise one or more of $((CH_3)_3Si)_2Te$, $Te(OEt)_4$, $Ge(OEt)_4$, $GeCl_4$, $HGeCl_3$, and $GeCl_2$. In some embodiments, different ALD cycles producing layers having different compositions are used for depositing the main layer. The concentration of germanium may vary throughout a thickness of the main layer, the thickness extending in a direction substantially perpendicular to an interface between the main layer and the interface layer.

These and other embodiments are described further below with reference to the figures.

BRIEF DESCRIPTION OF THE DRAWINGS

FIGS. 6A-6H-2 are schematic representations of a second example of a 3D array at different fabrication stages, in accordance with some embodiments.

FIGS. 7A-7I-2 are schematic representations of a third example of a 3D array at different fabrication stages, in accordance with some embodiments.

DETAILED DESCRIPTION OF EXAMPLE EMBODIMENTS

Figure 1A:
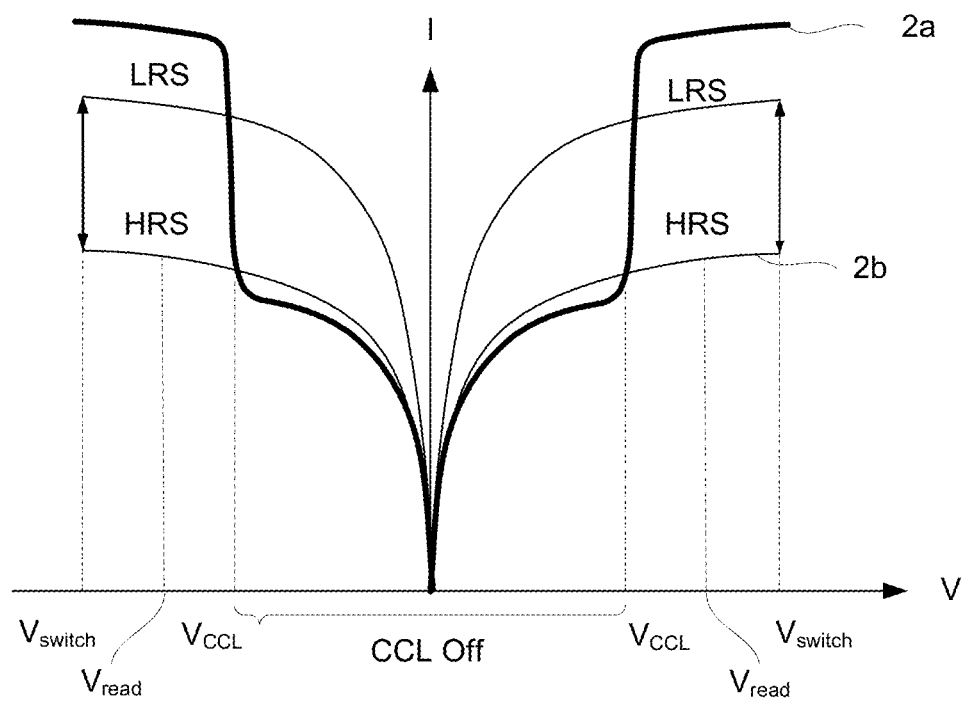
FIGS. 1A-1D are schematic representations of I-V curves for a memory element comprising a CCL and a memory cell, in accordance with some embodiments.
Figure 1B:
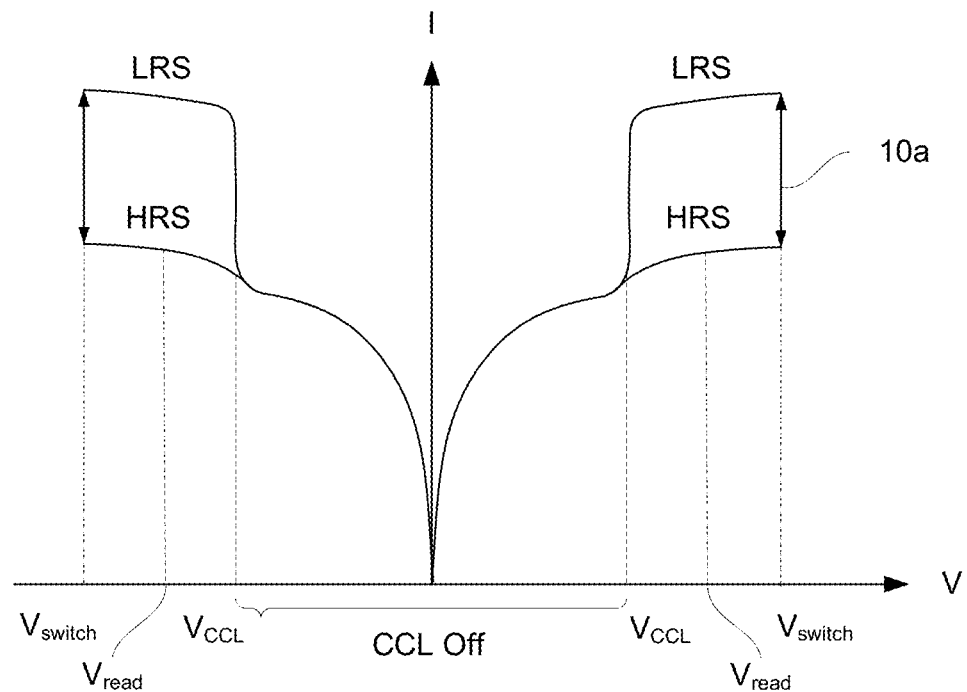
Figure 1C:
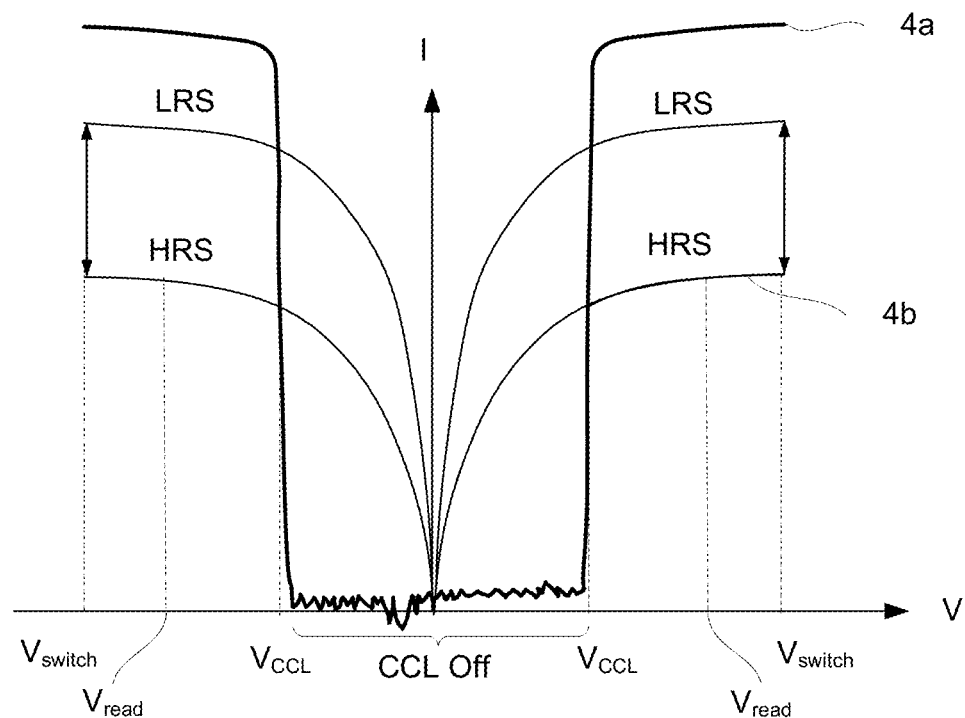
Figure 1D:
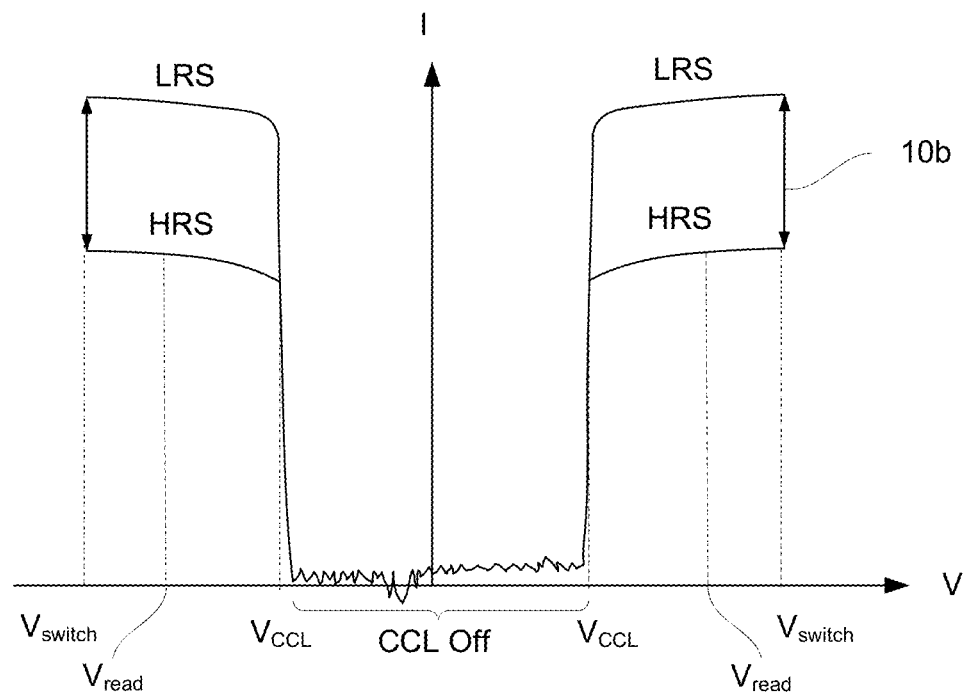

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Introduction

Memory arrays, especially high density/low power memory arrays, may suffer from sneak current paths. CCLs may be used to block these sneak current paths. For example, a CCL may be used in a two-terminal memory array to reduce/retard memory leakage currents. Specifically, a CCL element may be used to avoid disturbance of unselected and/or partially (e.g. half) selected memory elements and to minimize the cumulative parasitic current leakage across the entire array. It is advantageous for bipolar memory elements to have CCLs with symmetric characteristics for both forward and reverse polarities, which is not achievable with conventional diodes used as the CCL. For purposes of this disclosure, CCLs used in bipolar memory elements are referred to as bipolar CCLs or simply CCLs. Some characteristics of bipolar CCLs include symmetric current characteristics at forward and reverse voltage biases, low current (current suppression) up to a threshold voltage, high current above the threshold voltage (low resistance above the threshold voltage), and large current-voltage non-linearity (NL) at the threshold voltage (e.g., an increase of 4 or more orders of magnitude in the current value per applied Volt, and in some embodiments an increase of 6 or more orders of magnitude in the current value per applied Volt). In other embodiments, bipolar CCLs may exhibit asymmetry in that the magnitude of the threshold voltages may differ and/or the NL may differ for each polarity.

In some embodiments, CCLs are provided with a non-linear current-voltage (I-V) behavior, including low current at low voltages and high current at higher voltages. FIGS. 1A-1D are schematic representations of I-V curves for a memory element comprising a CCL and a memory cell, in accordance with some embodiments. Two different examples of CCLs are presented in these I-V curves.

Unipolar CCLs can be used together with unipolar memory cells or memory cells operated in unipolar fashion, whereas bipolar CCLs can be used with bipolar memory cells or memory cells operated in bipolar fashion. Example memory cell types include but are not limited to phase change memory (PCM), resistive random-access memory (ReRAM), conductive bridge random-access memory (CBRAM), electrolytic memory, and ferroelectric memory. The unipolar CCL can have high resistance at reverse polarity conditions. Both unipolar and bipolar CCLs can have high resistance at low voltages. These CCLs can prevent sneak-through current, even when adjacent memory elements are in low-resistance state. Furthermore, the non-linear I-V can also provide the CCL with low resistance at higher voltages so that there is no significant voltage drop across the CCL during switching.

For purposes of this disclosure, a CCL may be also referred to as a selector, a selector element, a current limiter, a current compliance layer, a current steering element, or a threshold switch. For purposes of this disclosure, a CCL is defined as a circuit element operable to limit the current through the CCL at one set of conditions and allow for the current to pass through the CCL at another set of conditions. Some examples of the conditions include the programming voltages across the CCL.

One challenging aspect of integrating CCLs into memory arrays, and particularly into 3D memory arrays, is to maintain their characteristics described above after fabricating these CCLs during the manufacturing process. For example, after CCLs are fabricated on a substrate (which may contain CMOS devices, access transistors, peripheral transistors, core and peripheral circuitry under and/or adjacent to the memory array) additional processing may be performed to fabricate other components. This processing may involve heating and/or exposing the previously fabricated CCLs to processing environments which may deleteriously alter their properties. Heating can be particularly challenging as CCLs may change their morphology (e.g., crystallize) while heated. Proposed aspects of mitigating crystallization of CCL materials involve using materials that remain amorphous when heated to 400° C. or even 450° C. and above. In some embodiments, CCLs have crystallization temperatures of greater than 400° C. and, in some embodiments, CCLs have glass transition temperatures of greater than 400° C. Additionally, CCLs may temporally and spatially (locally) melt while heated and return to the amorphous state by rapid transient cooling. Furthermore, low post-CCL-deposition temperature processing and integration schemes may be used to reduce and prevent crystallization of amorphous CCLs. In some embodiments, CCLs maintain their crystallinity content to less than 40% by volume, less than 30% by volume, less than 20% by volume, less than 10% by volume, and even less than 5% by volume.

Figure 18A:
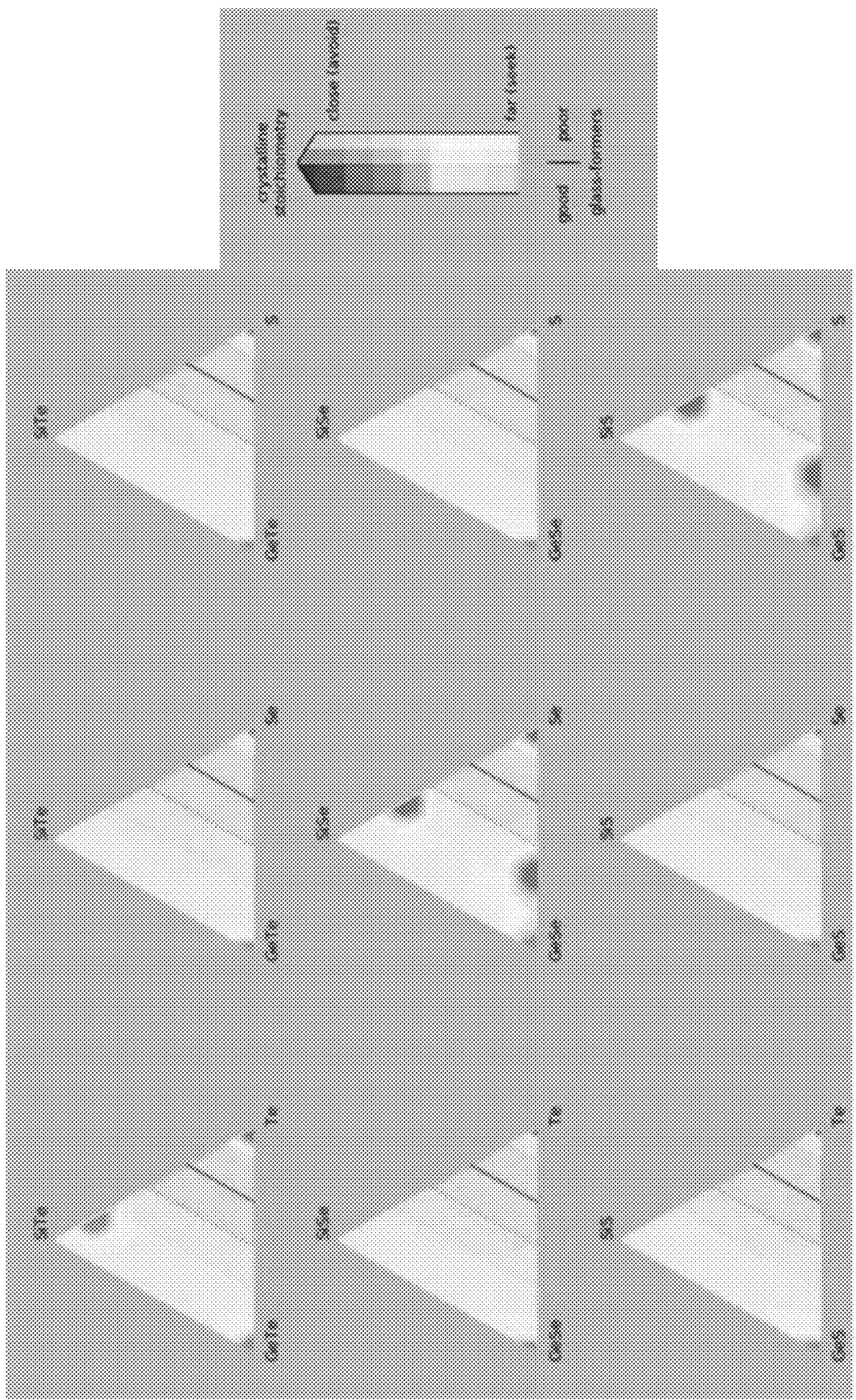
FIGS. 18A and 18B illustrate merit functions for different combinations of silicon, tellurium, germanium, selenium, and sulfur or more, specifically, low-T phases in FIG. 18A and high-T phases in FIG. 18B.
Figure 18B:
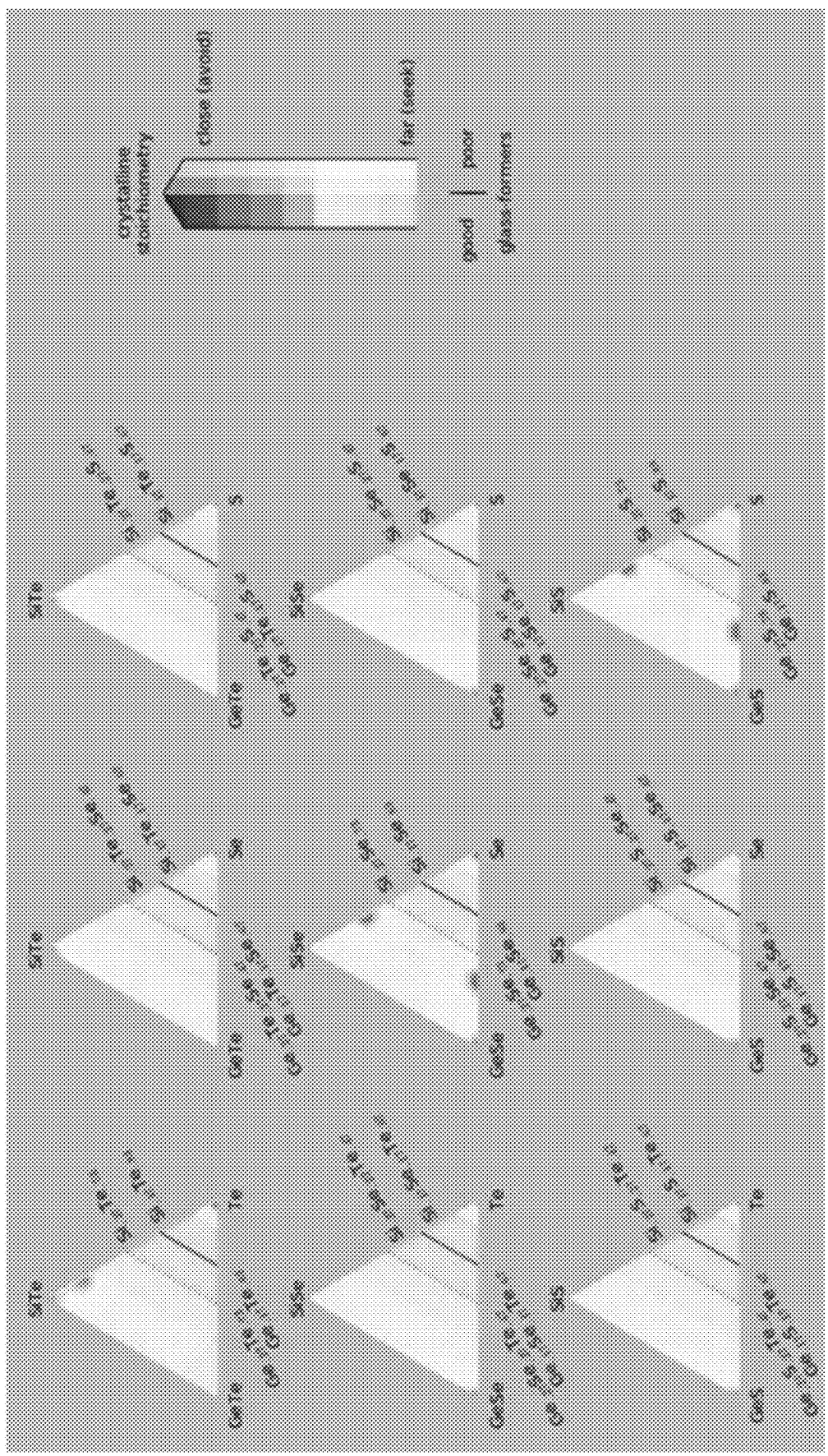
Figure 19A:
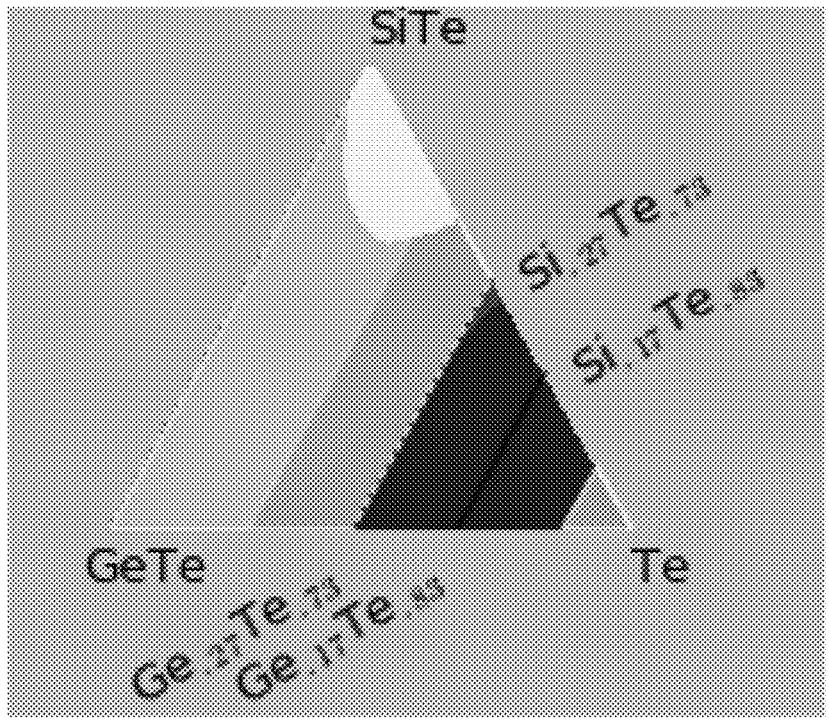
FIGS. 19A-26 illustrate plots of different glass transition temperatures, in which corners represent different compositions of pure materials, including pure binaries.
Figure 19B:
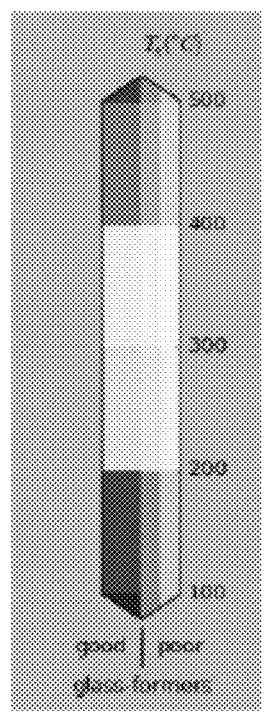
Figure 19B:
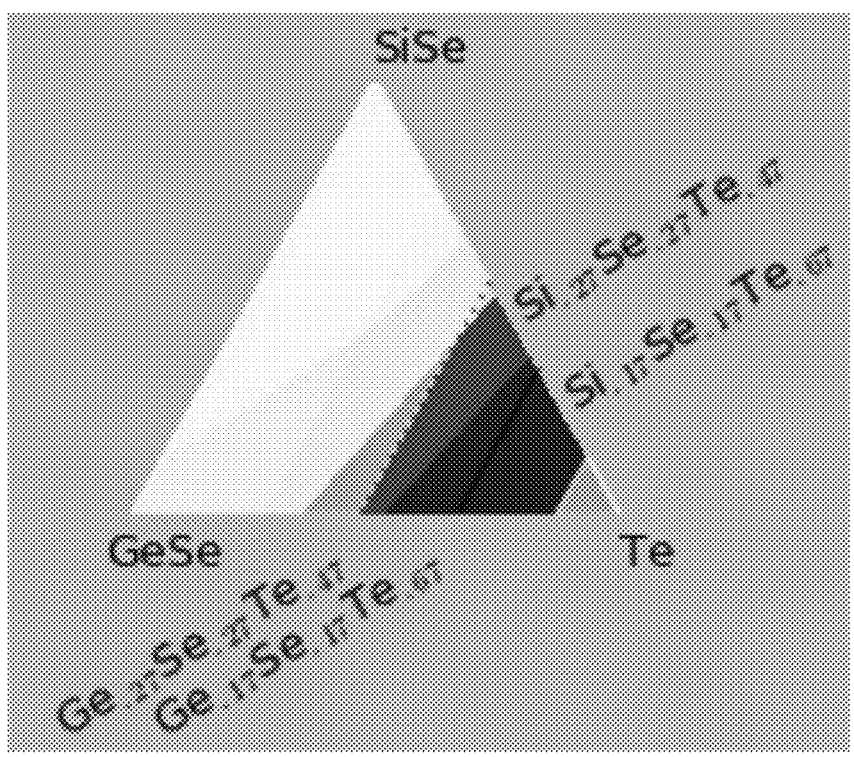
Figure 19C:
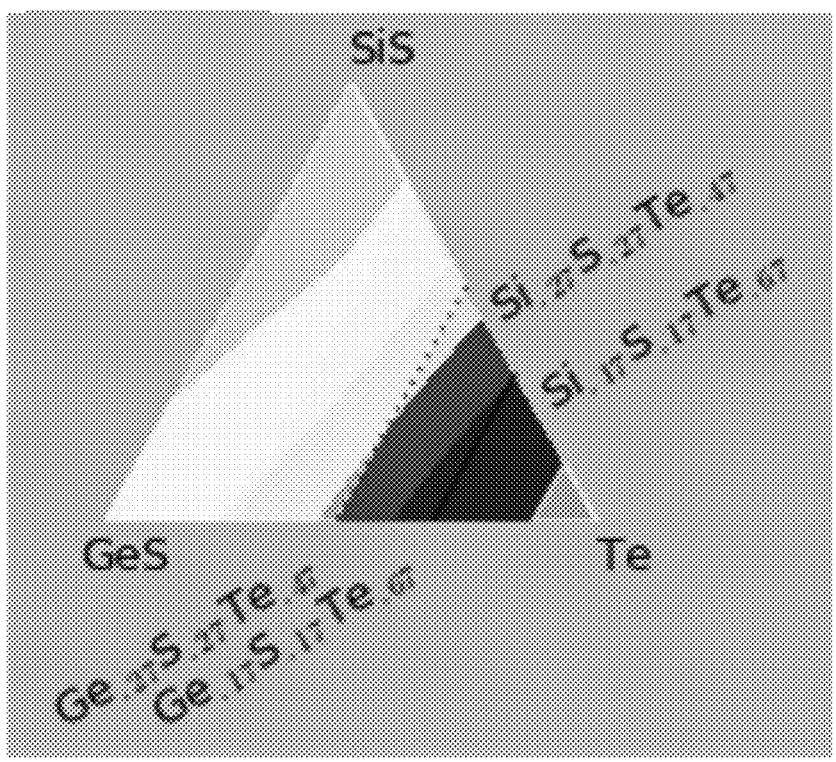
Figure 19D:
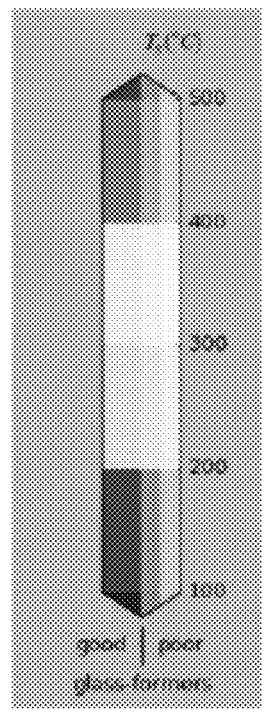
Figure 19D:
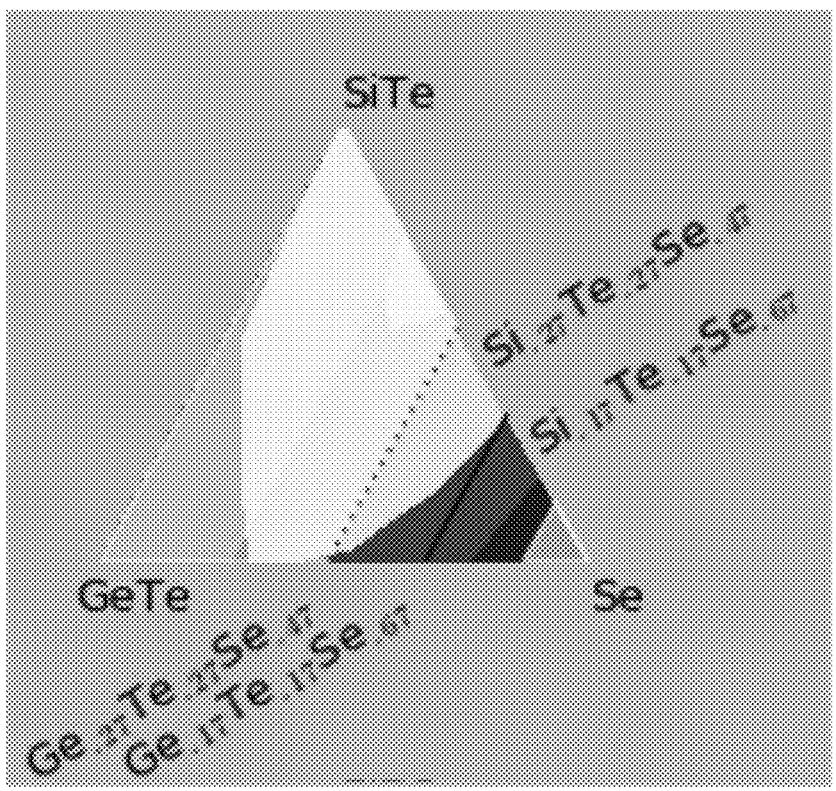
Figure 19E:
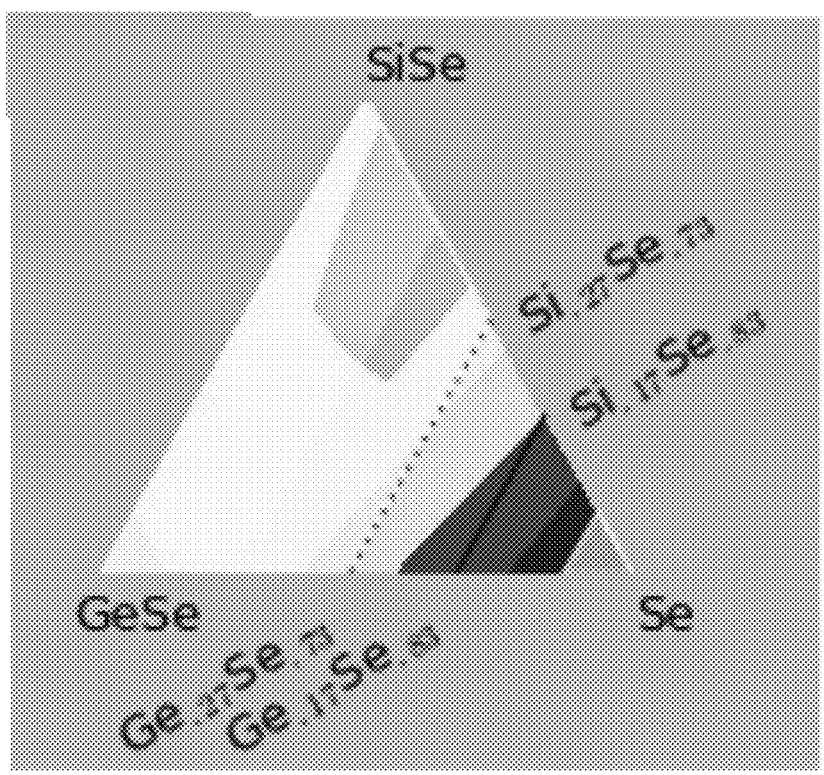
Figure 19F:
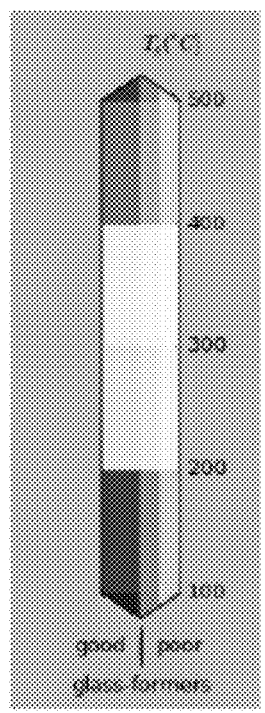
Figure 19F:
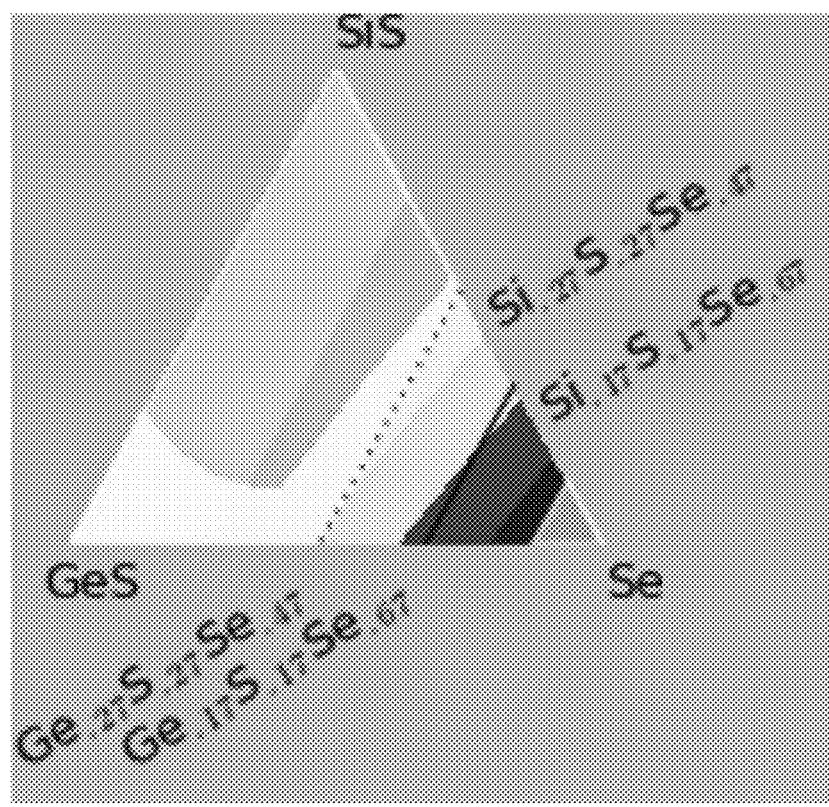
Figure 19G:
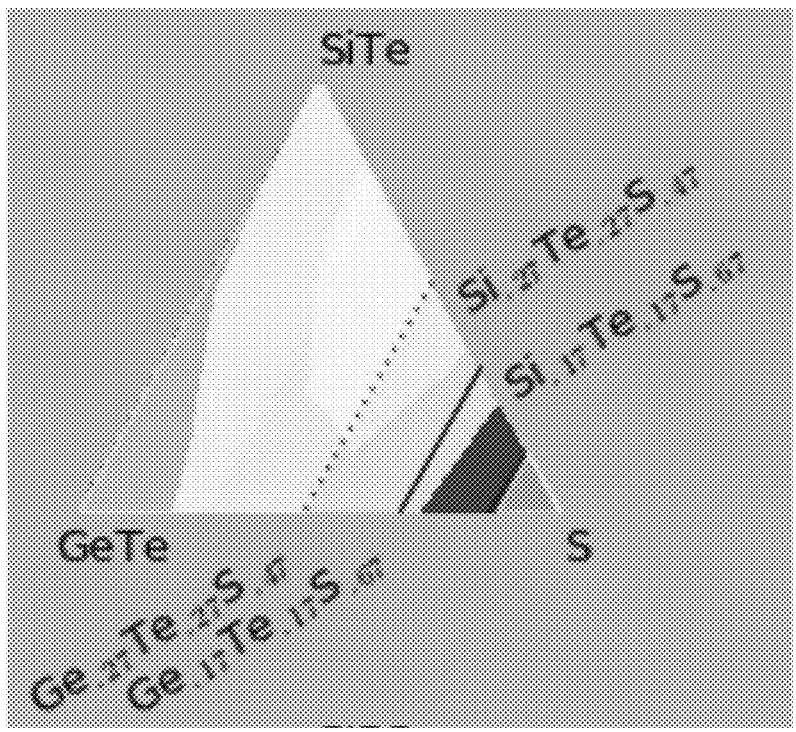
Figure 19H:
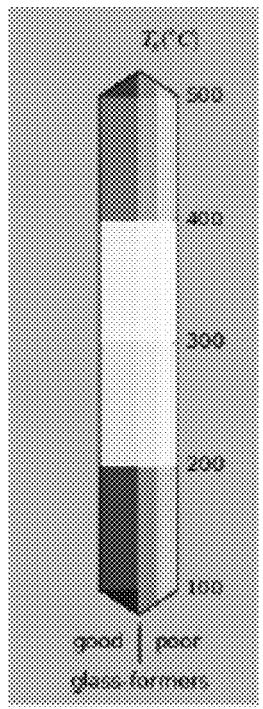
Figure 19H:
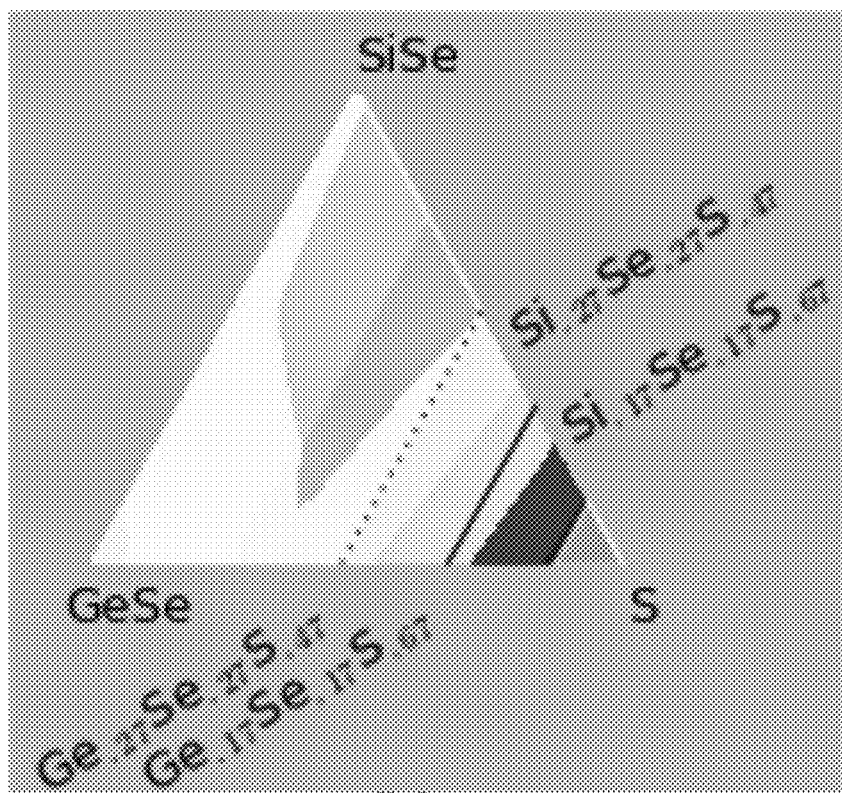
Figure 19I:
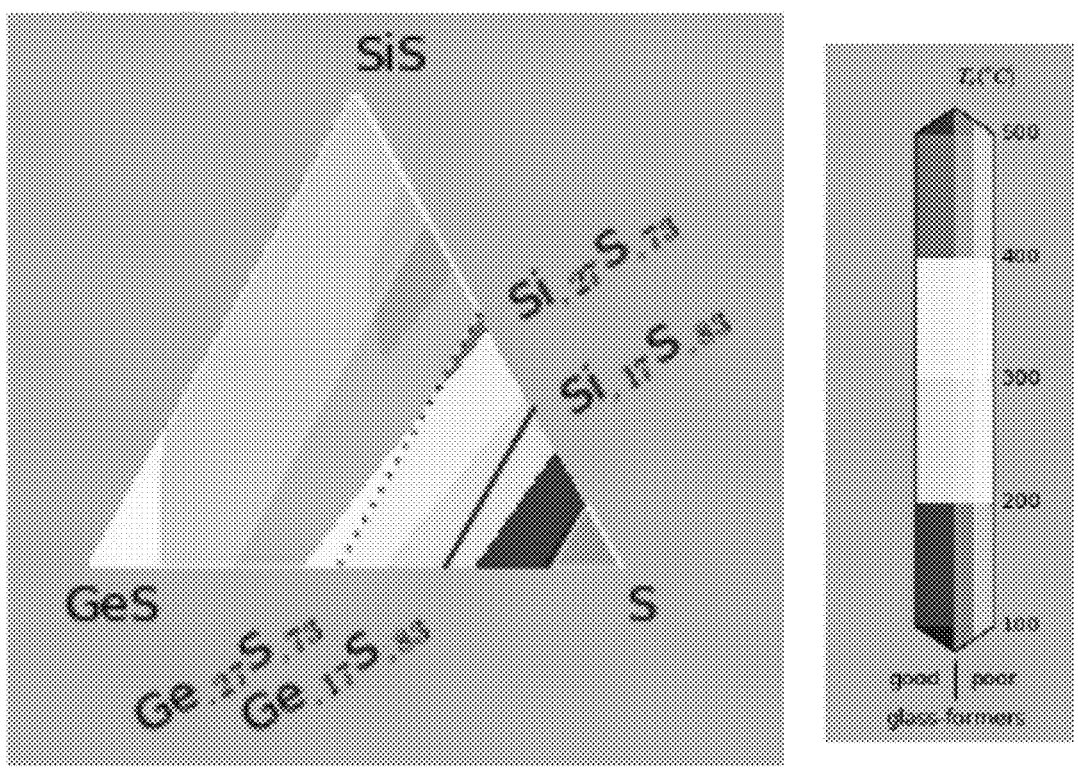
Figure 20A:
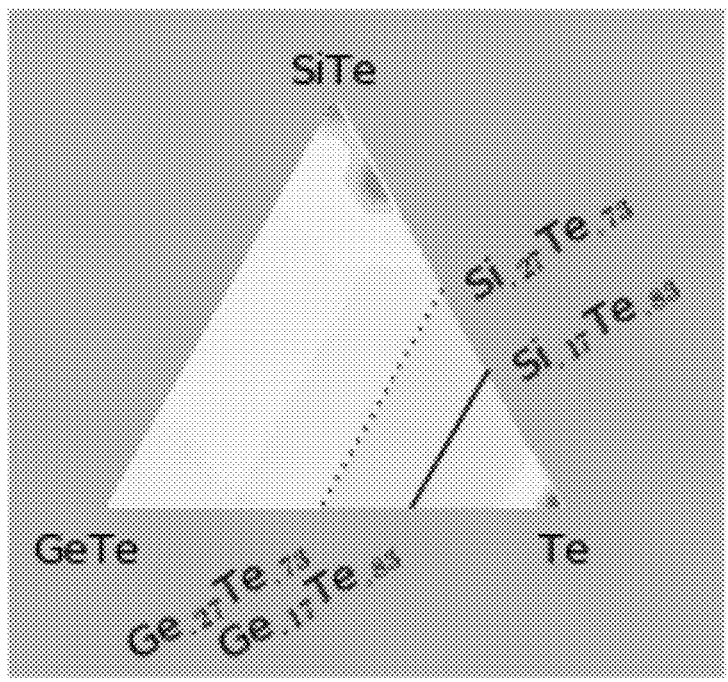
Figure 20B:
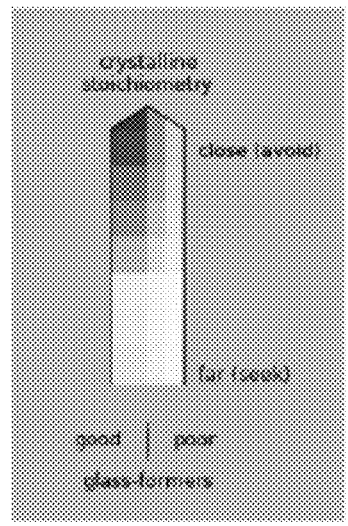
Figure 20B:
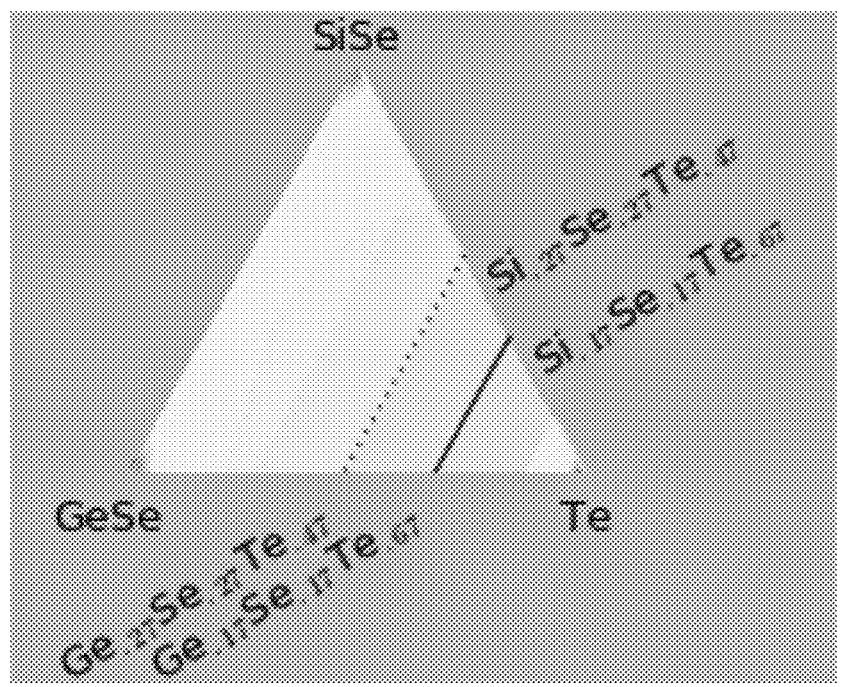
Figure 20C:
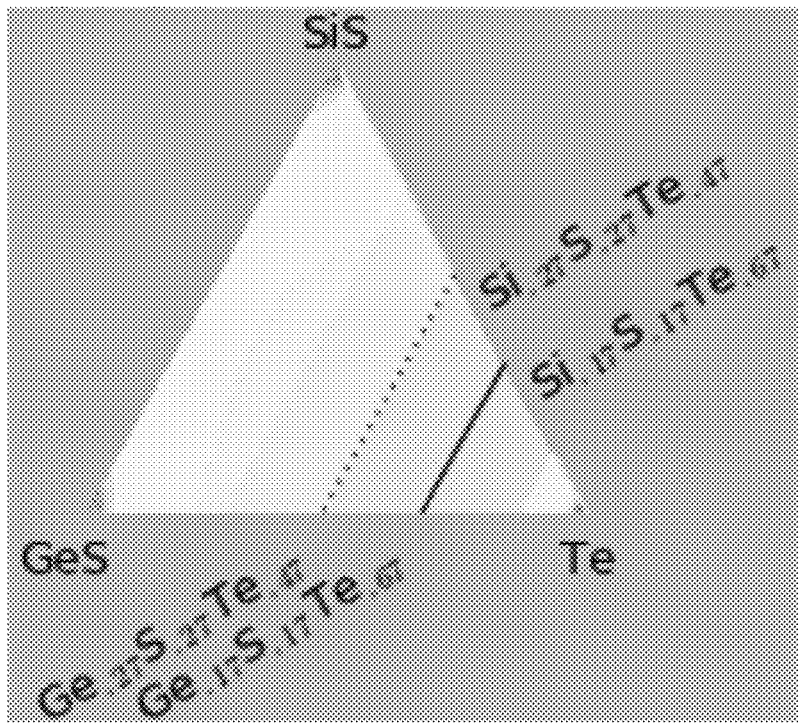
Figure 20D:
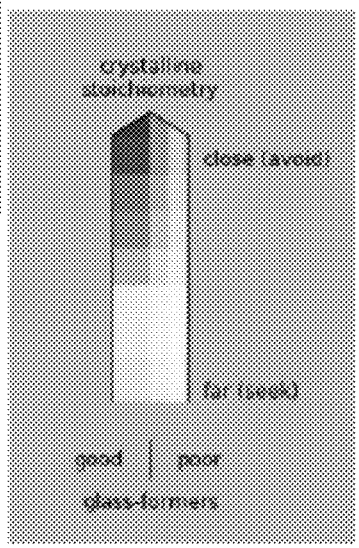
Figure 20D:
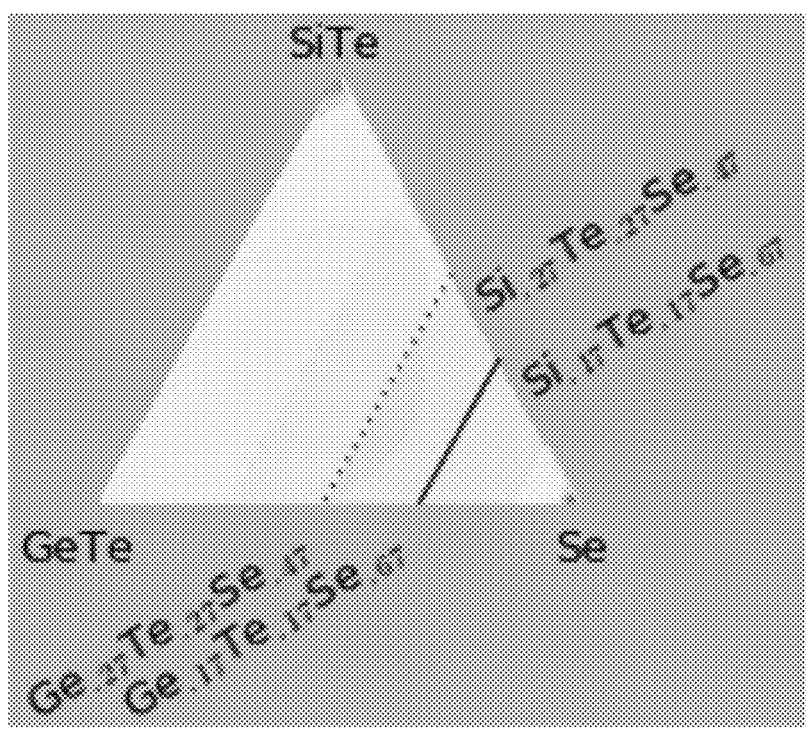
Figure 20E:
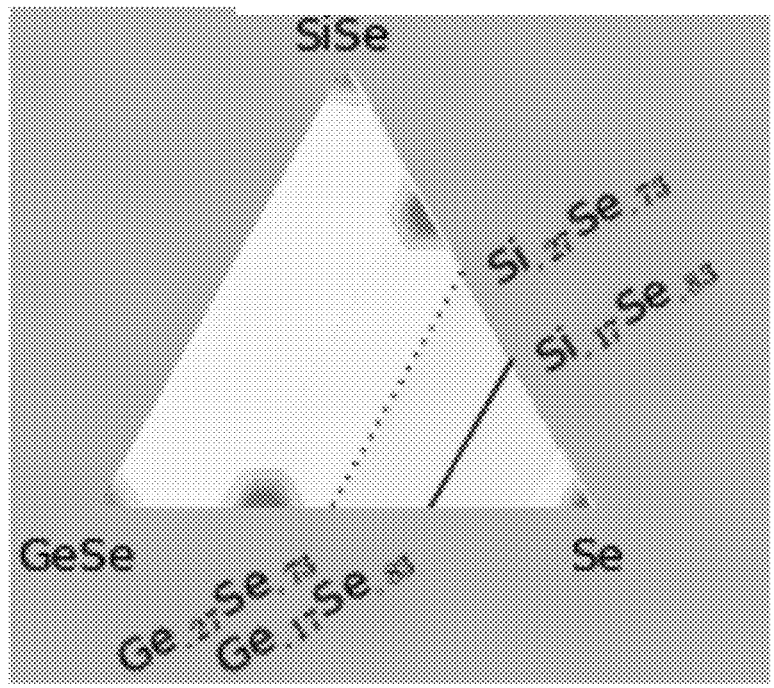
Figure 20F:
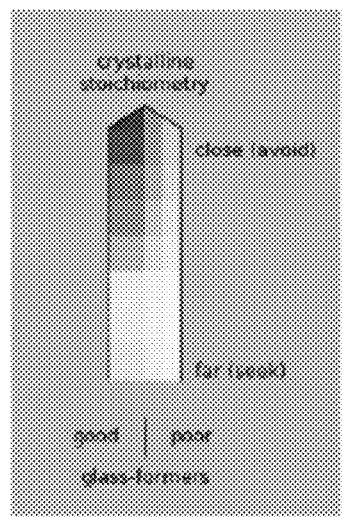
Figure 20F:
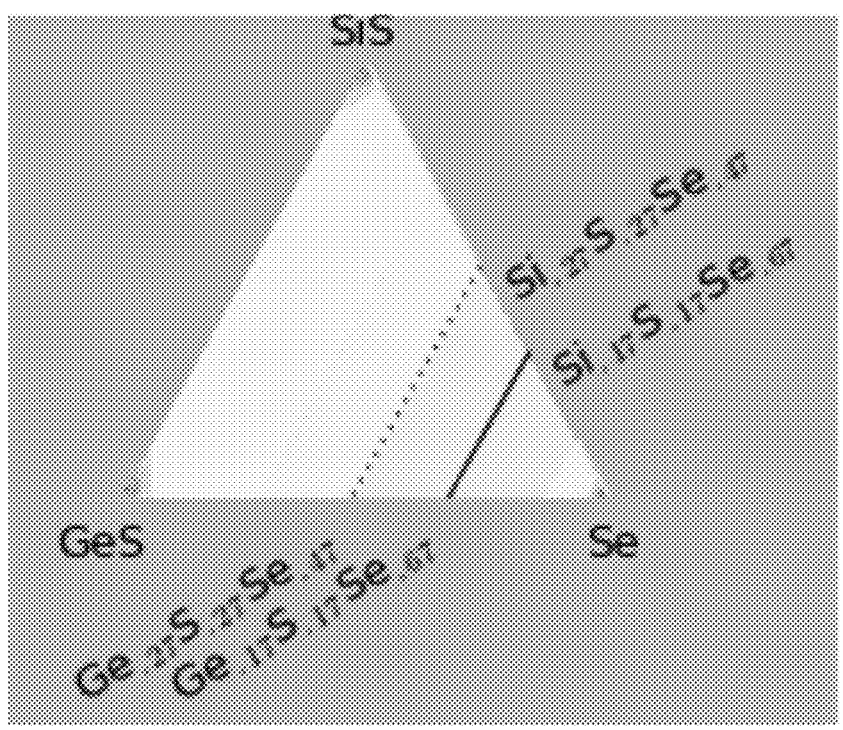
Figure 20G:
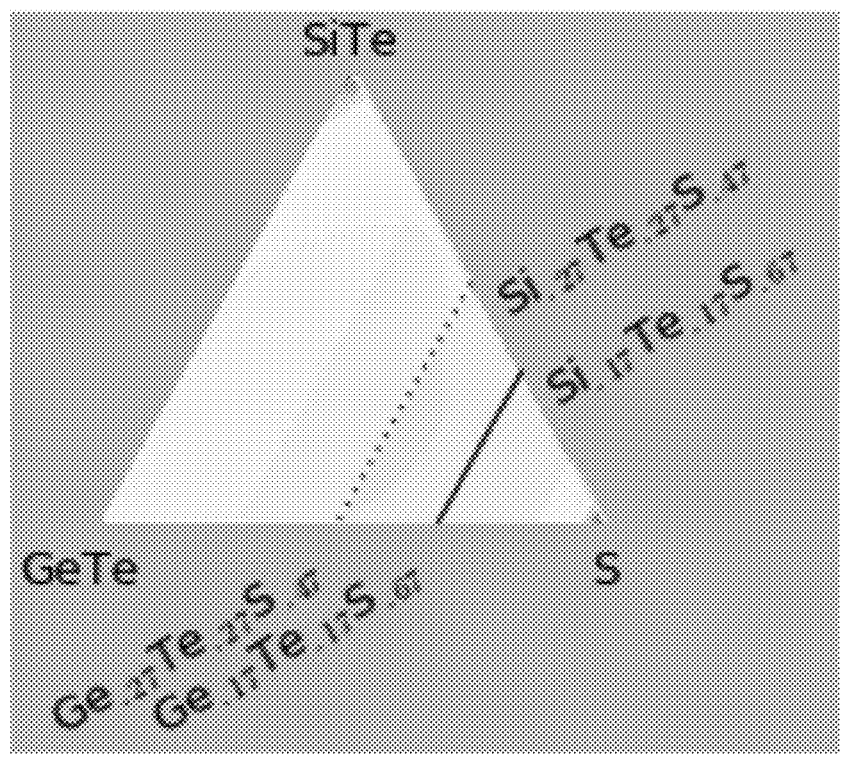
Figure 20H:
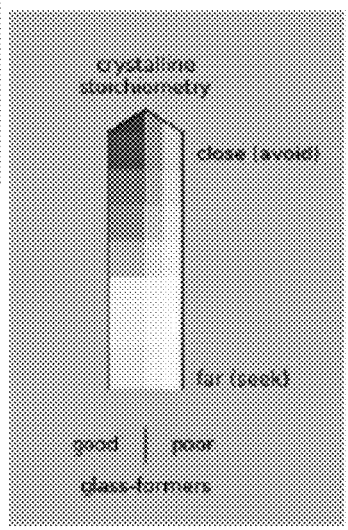
Figure 20H:
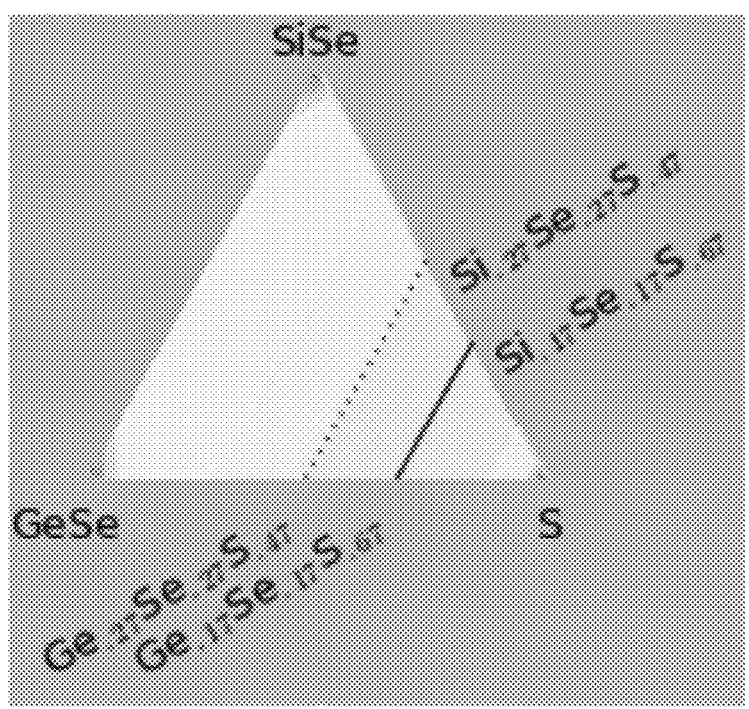
Figure 20I:
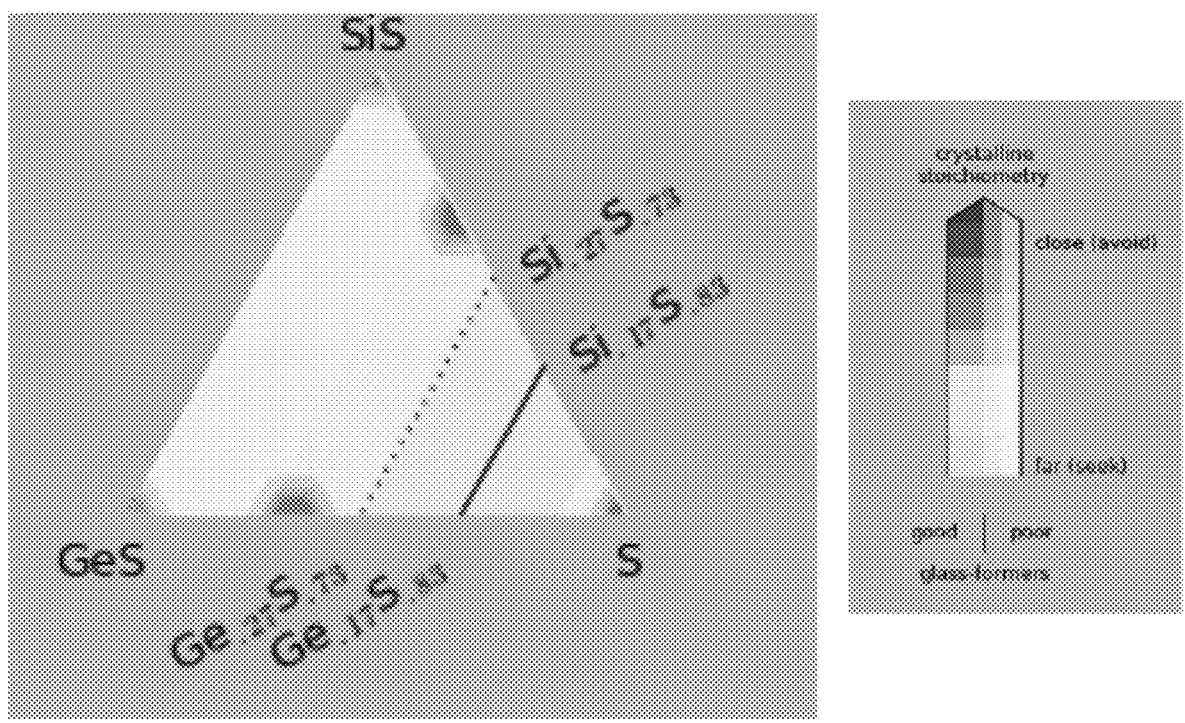
Figure 21A:
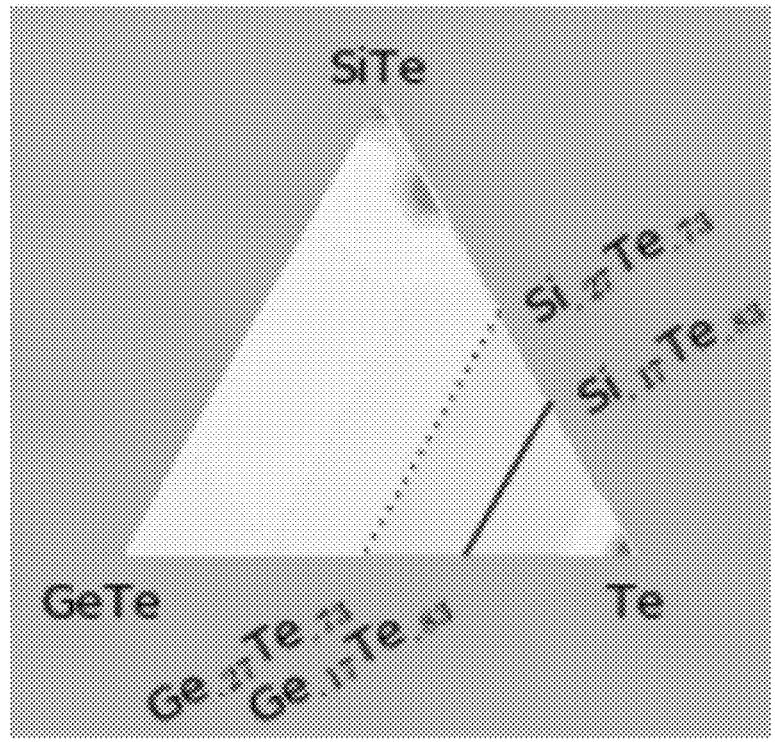
Figure 21B:
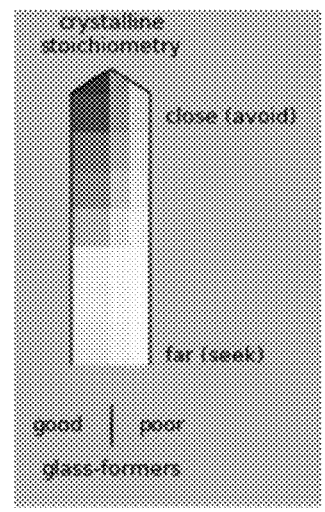
Figure 21B:
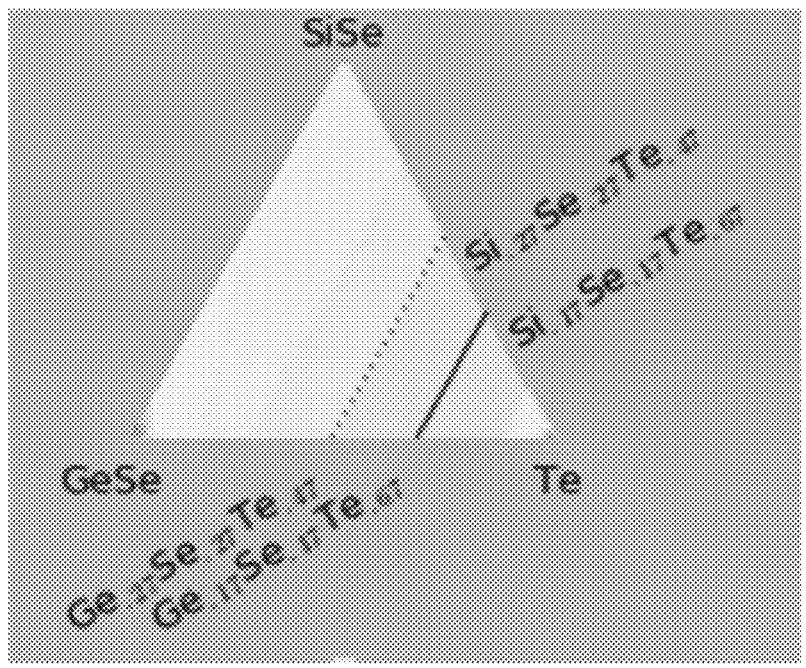
Figure 21C:
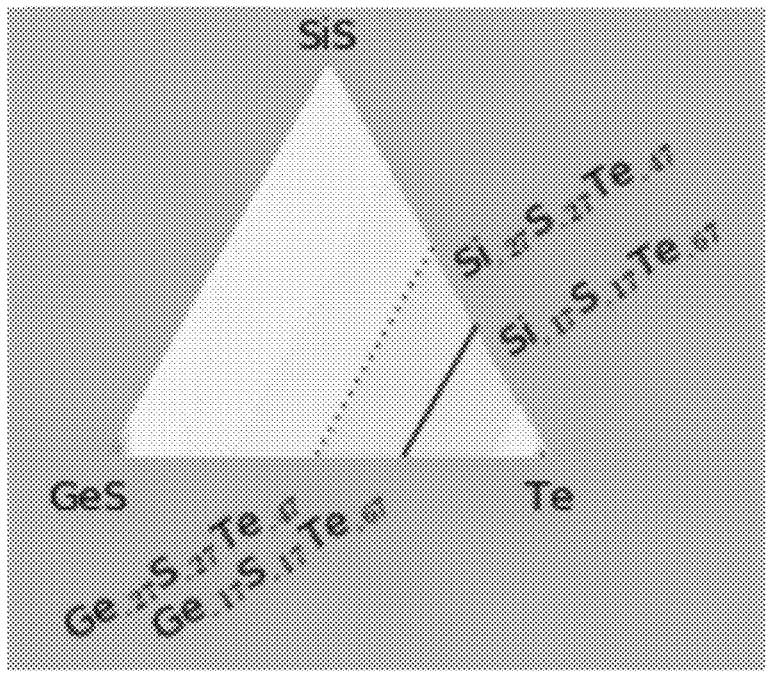
Figure 21D:
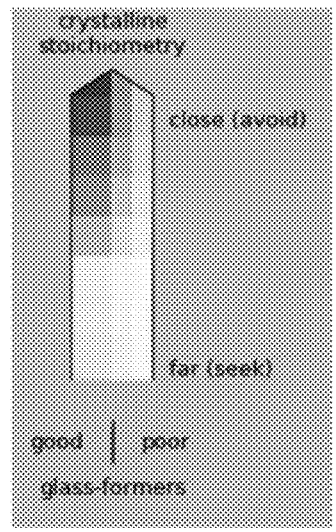
Figure 21D:
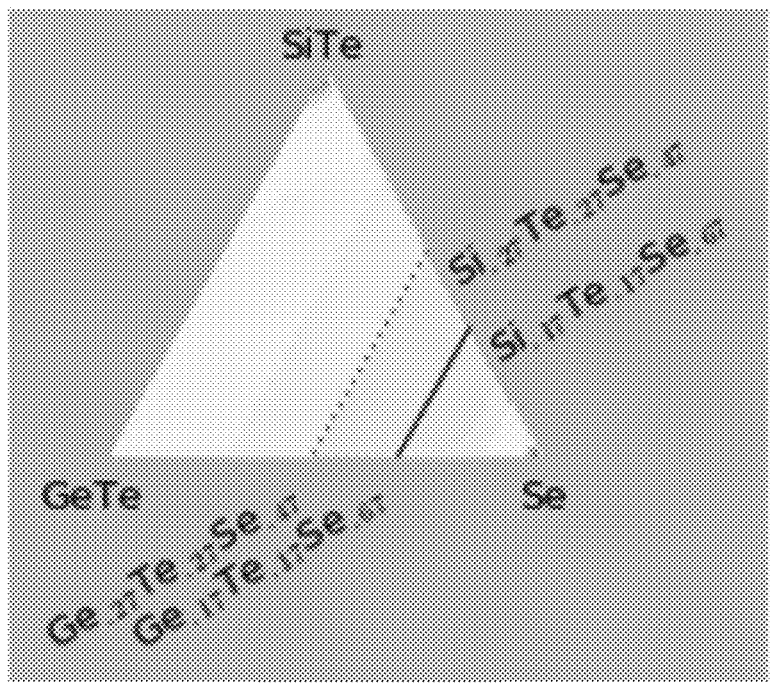
Figure 21E:
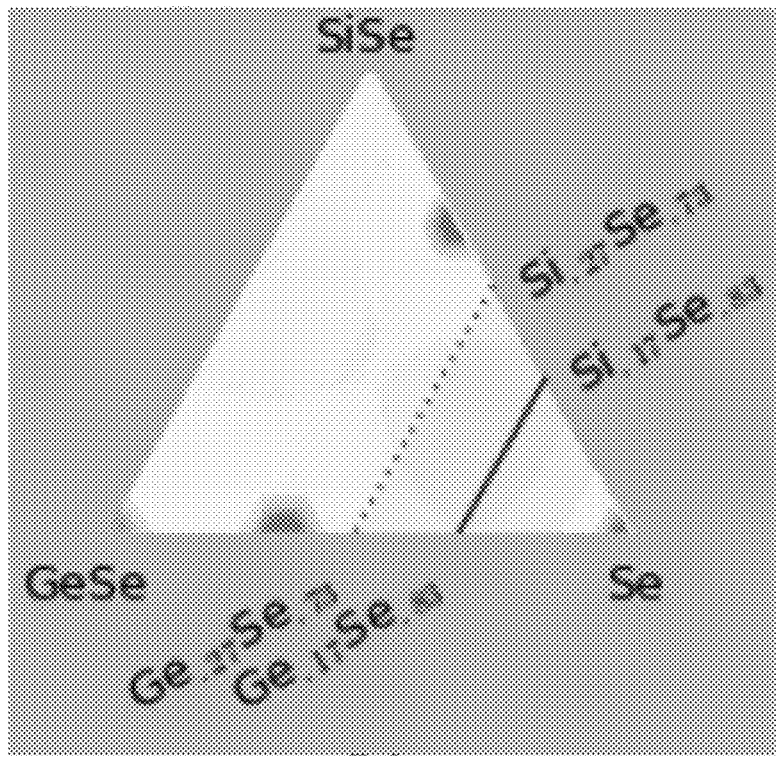
Figure 21F:
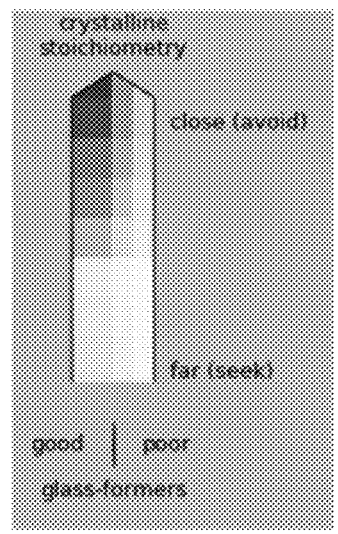
Figure 21F:
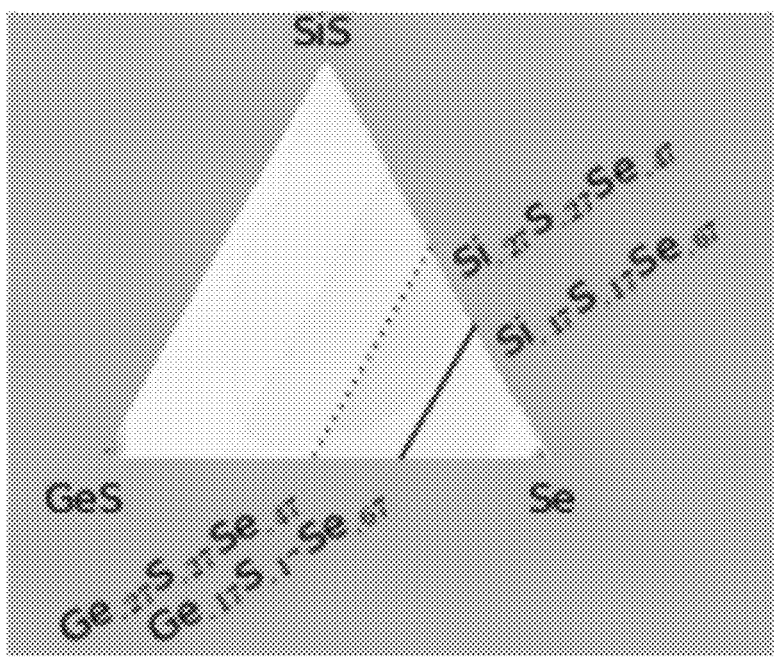
Figure 21G:
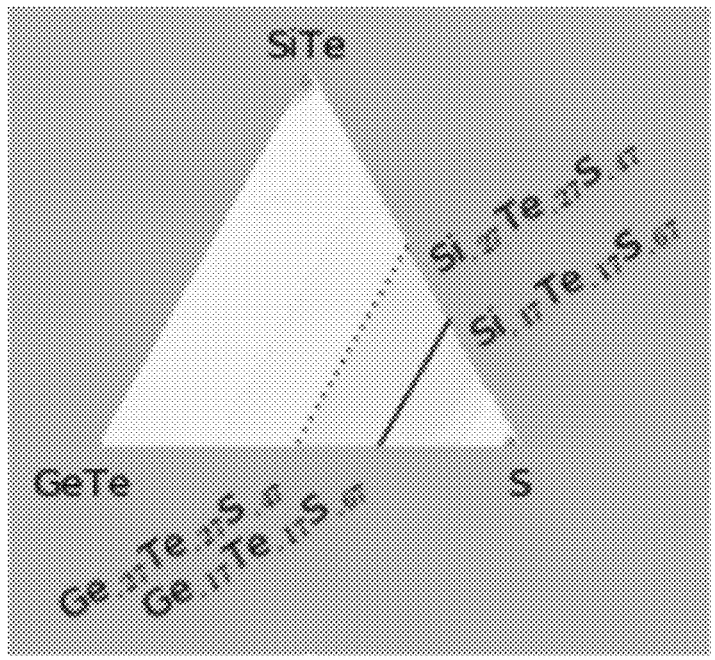
Figure 21H:
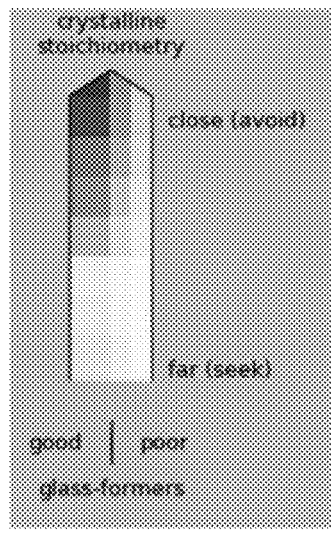
Figure 21H:
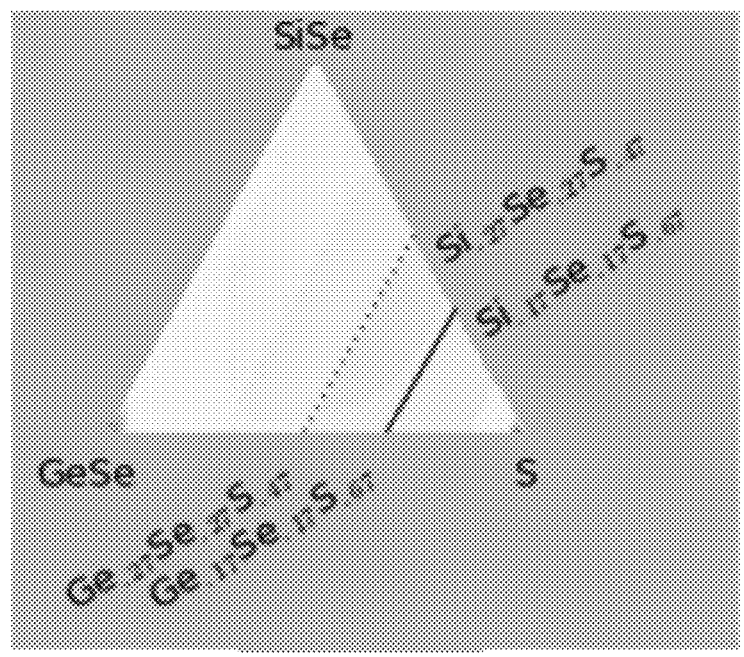
Figure 21I:
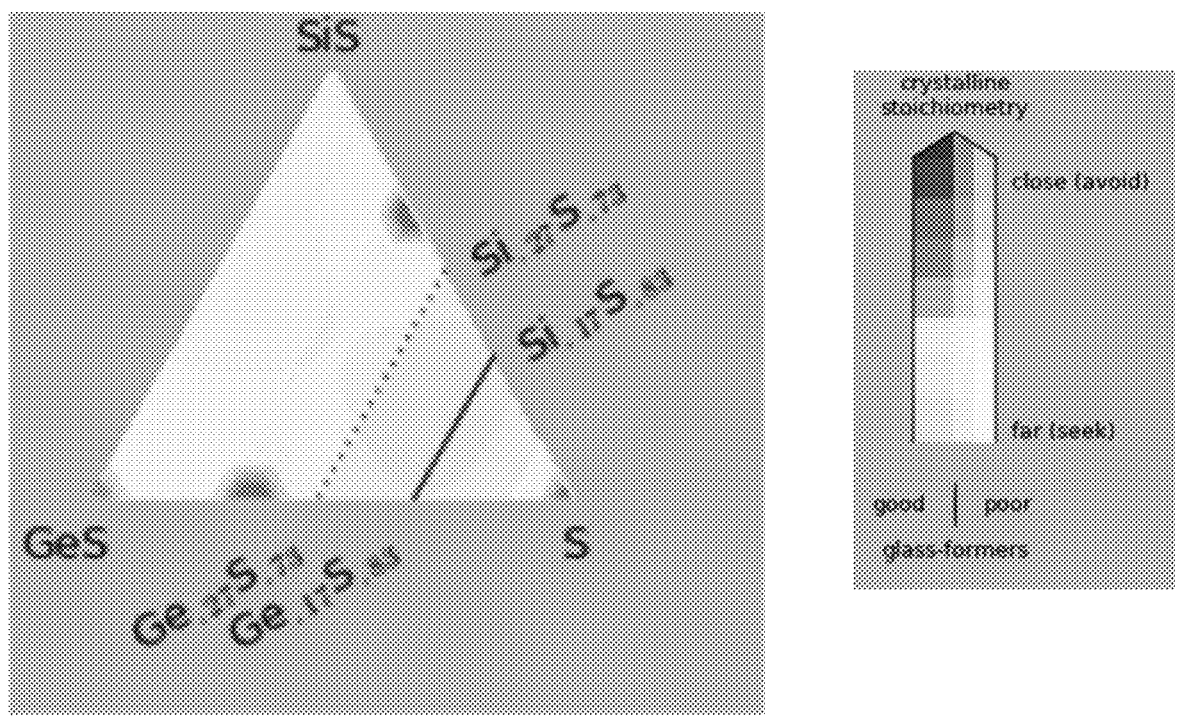
Figure 22A:
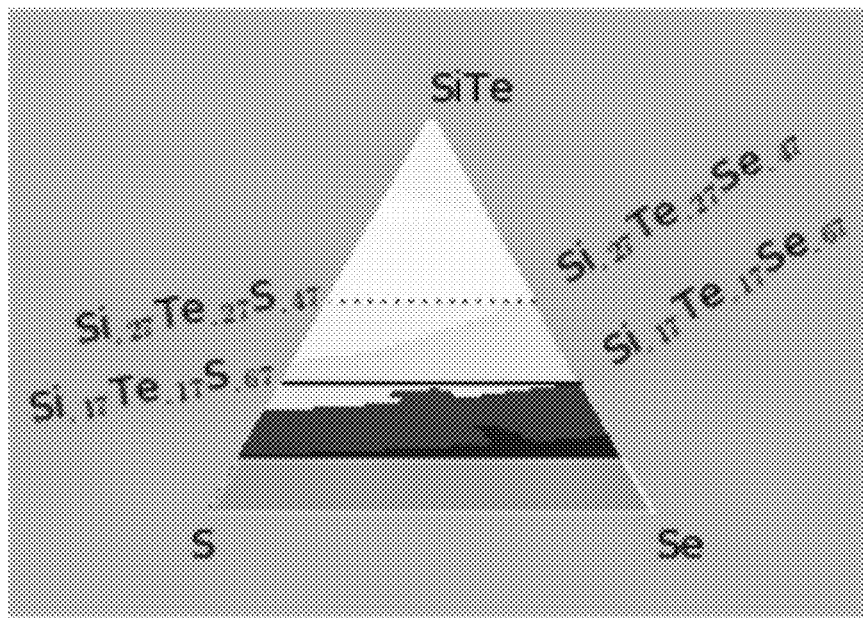
Figure 22B:
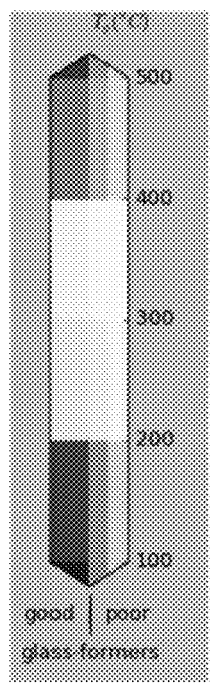
Figure 22B:
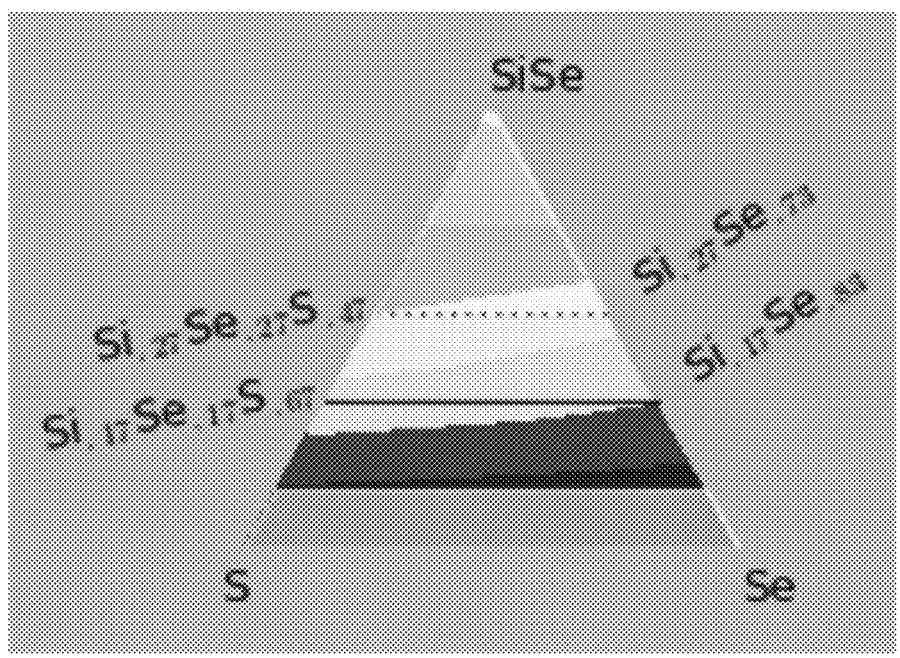
Figure 22C:
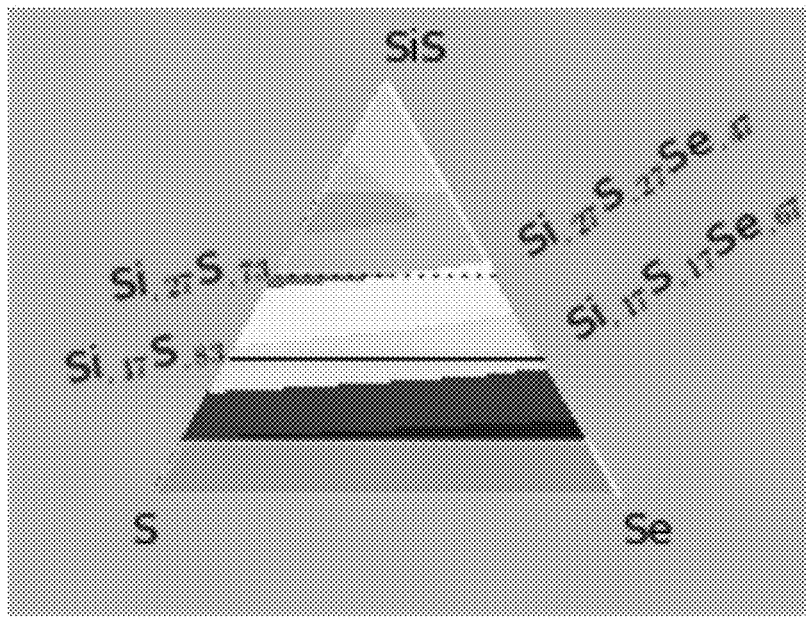
Figure 22D:
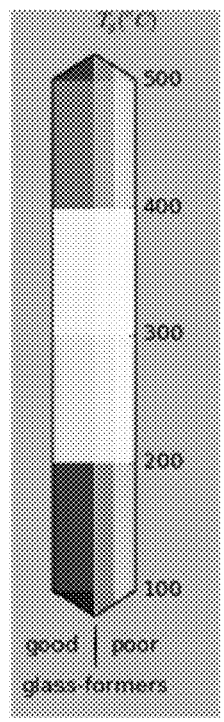
Figure 22D:
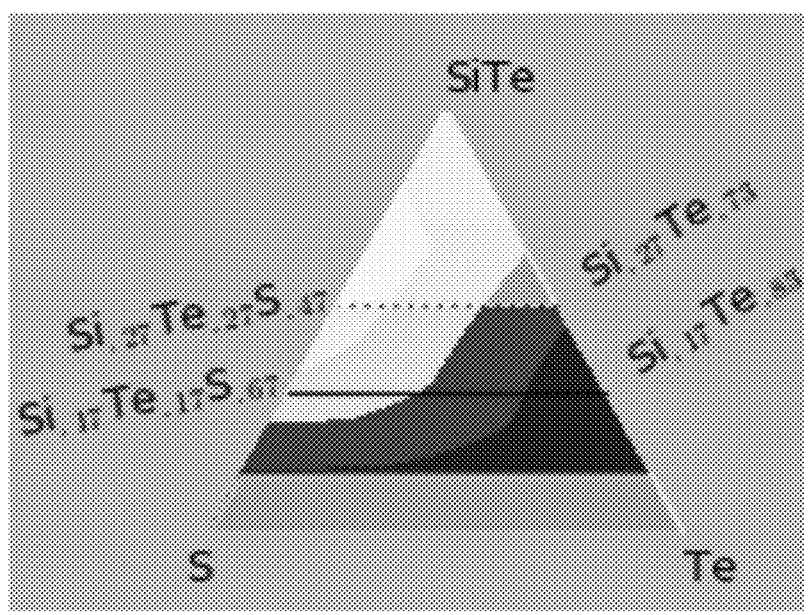
Figure 22E:
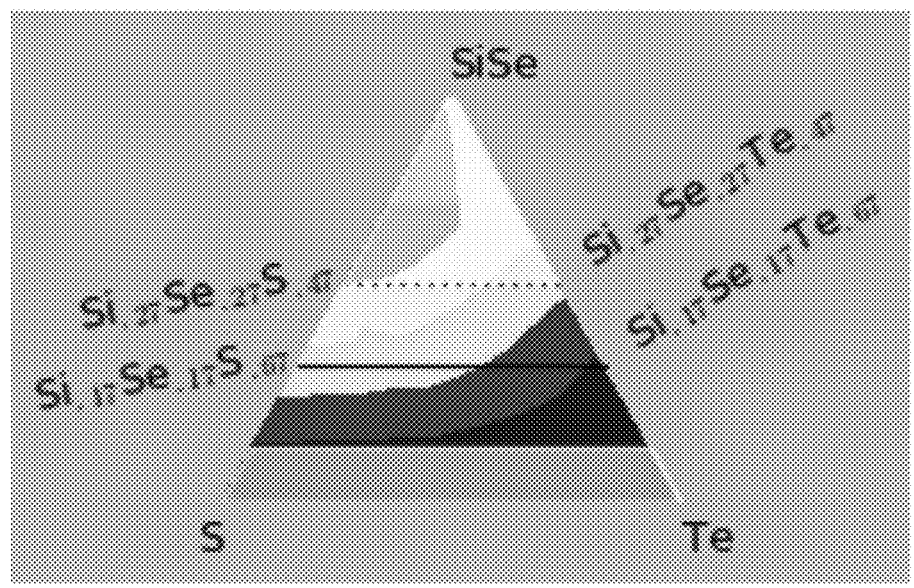
Figure 22F:
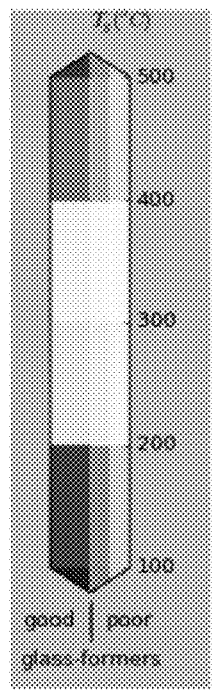
Figure 22F:
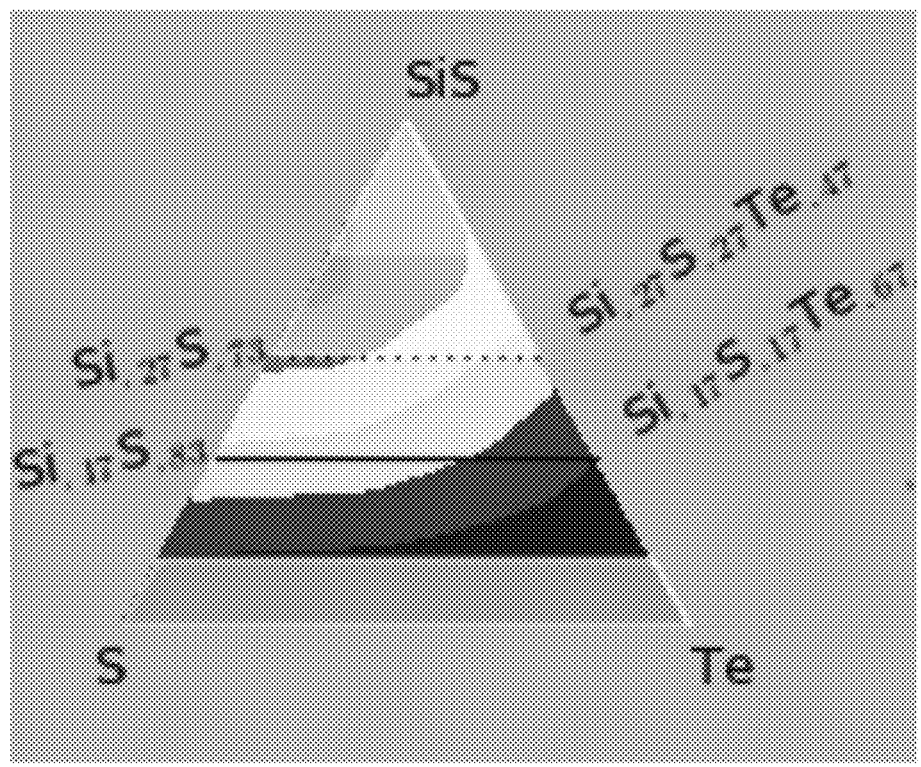
Figure 22G:
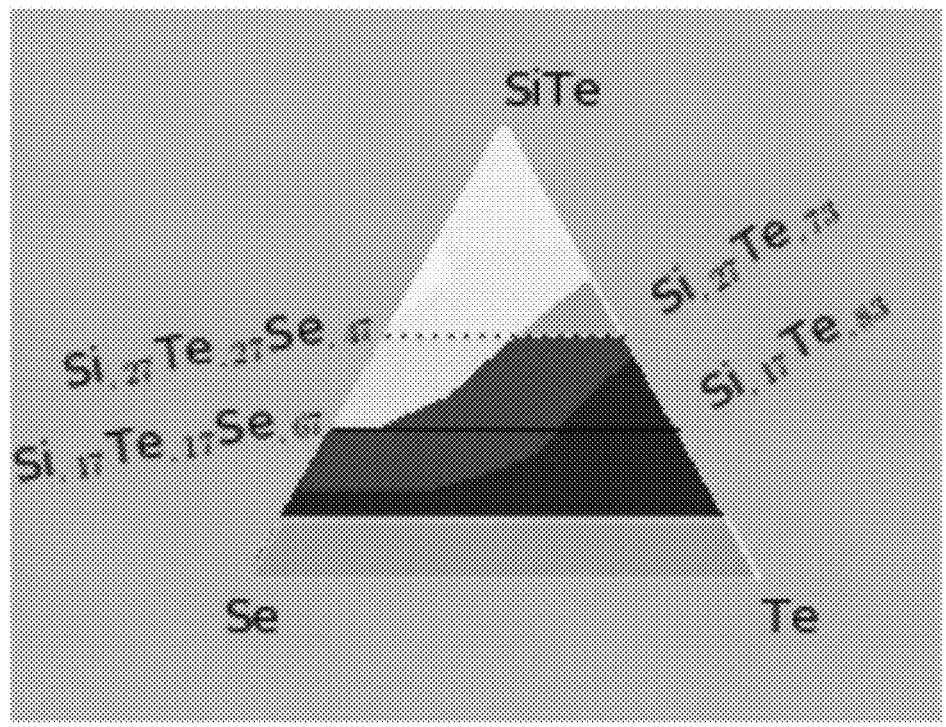
Figure 22H:
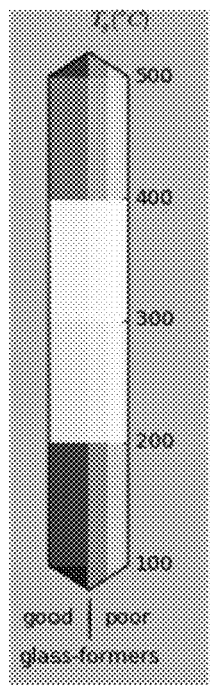
Figure 22H:
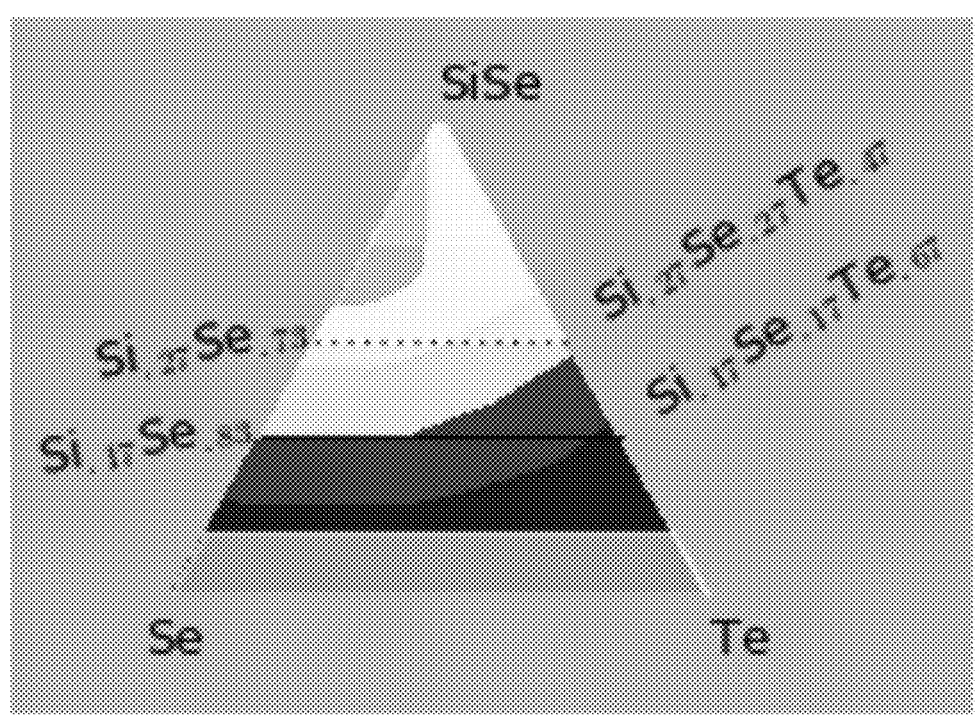
Figure 22I:
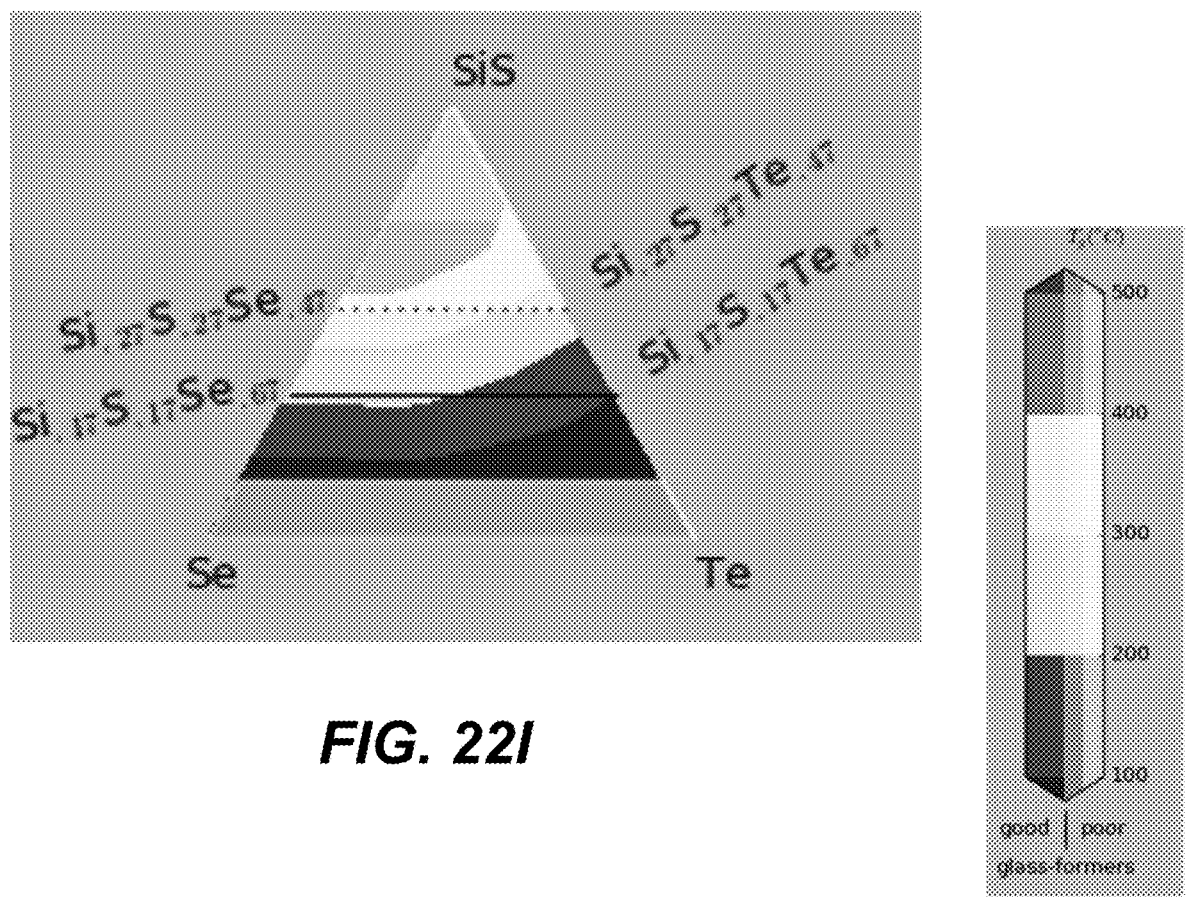
Figure 23A:
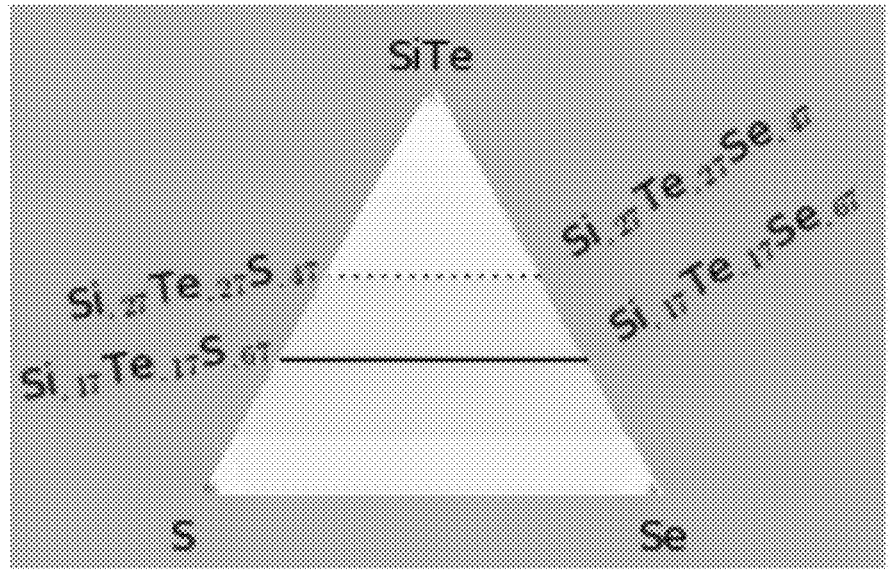
Figure 23B:
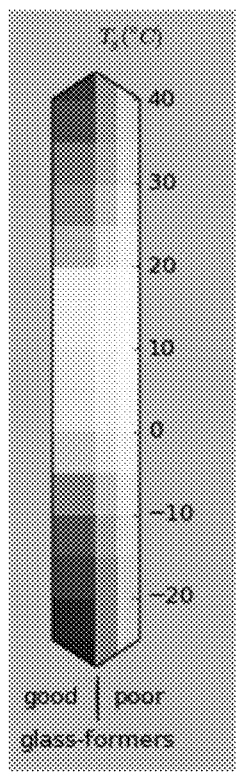
Figure 23B:
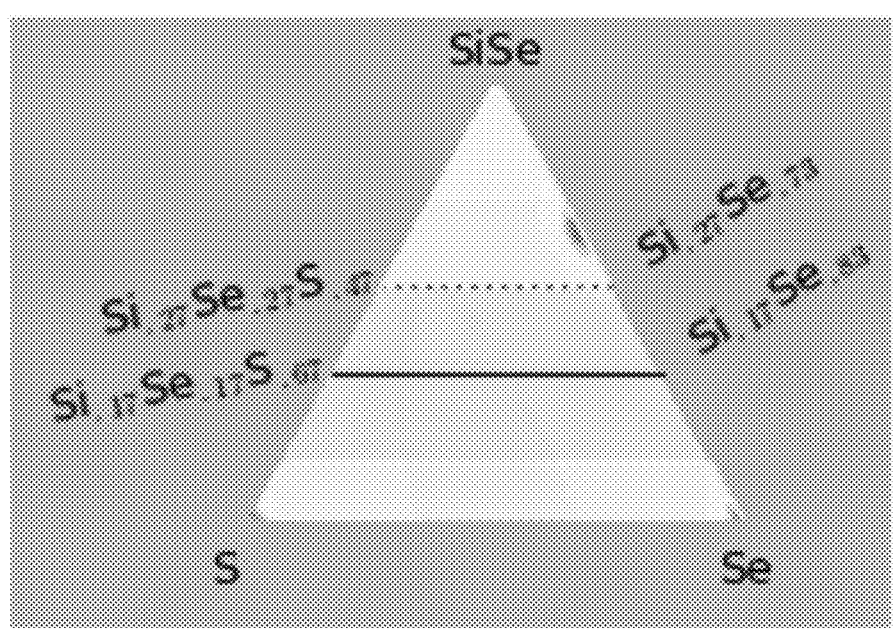
Figure 23C:
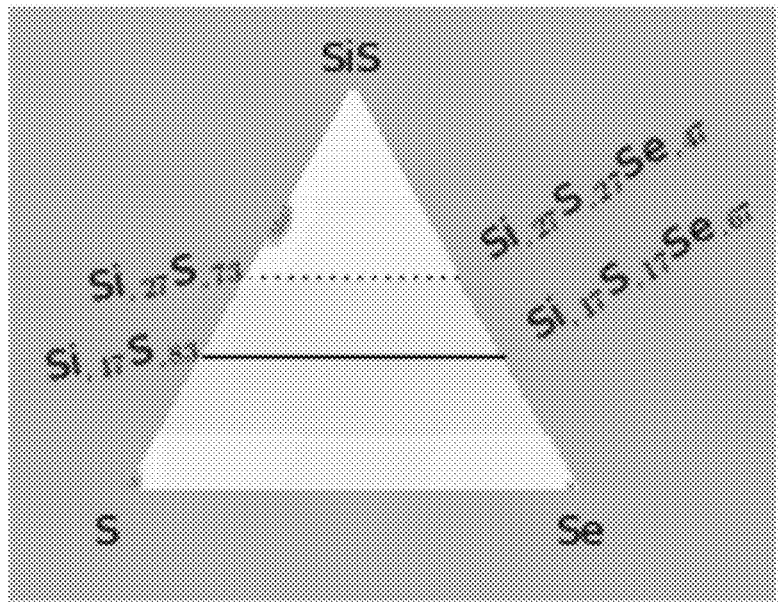
Figure 23D:
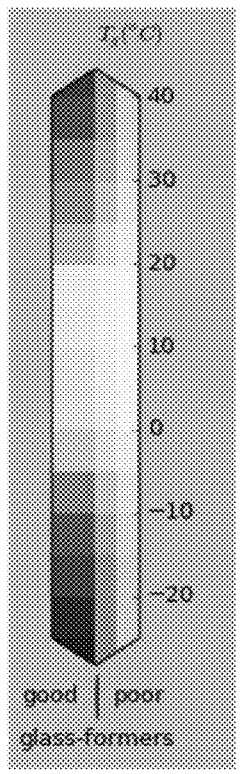
Figure 23D:
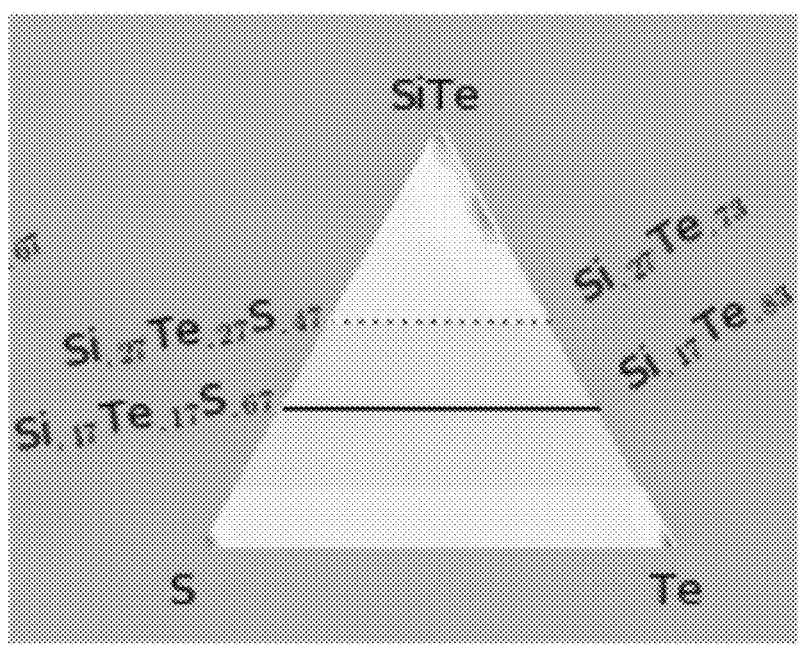
Figure 23E:
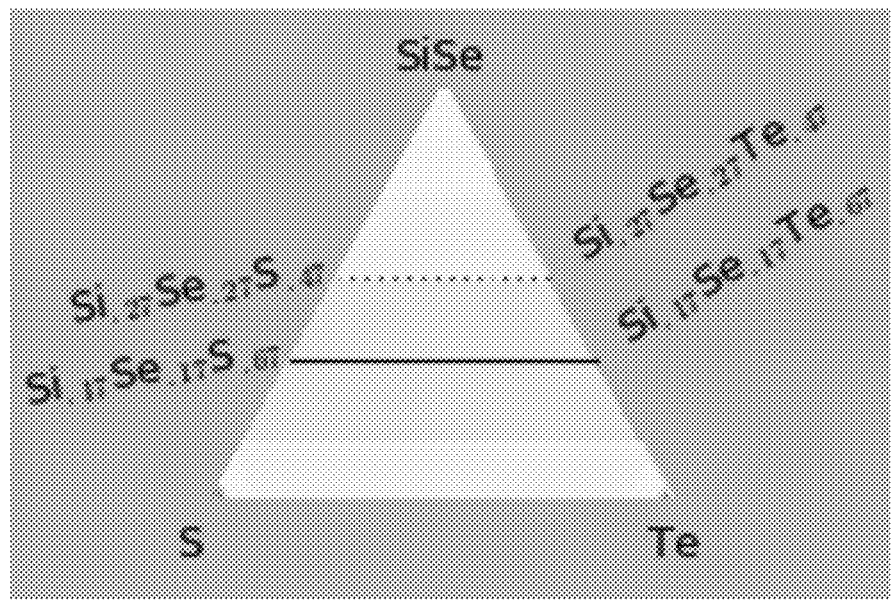
Figure 23F:
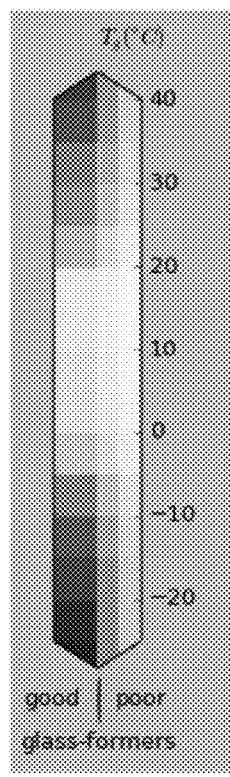
Figure 23F:
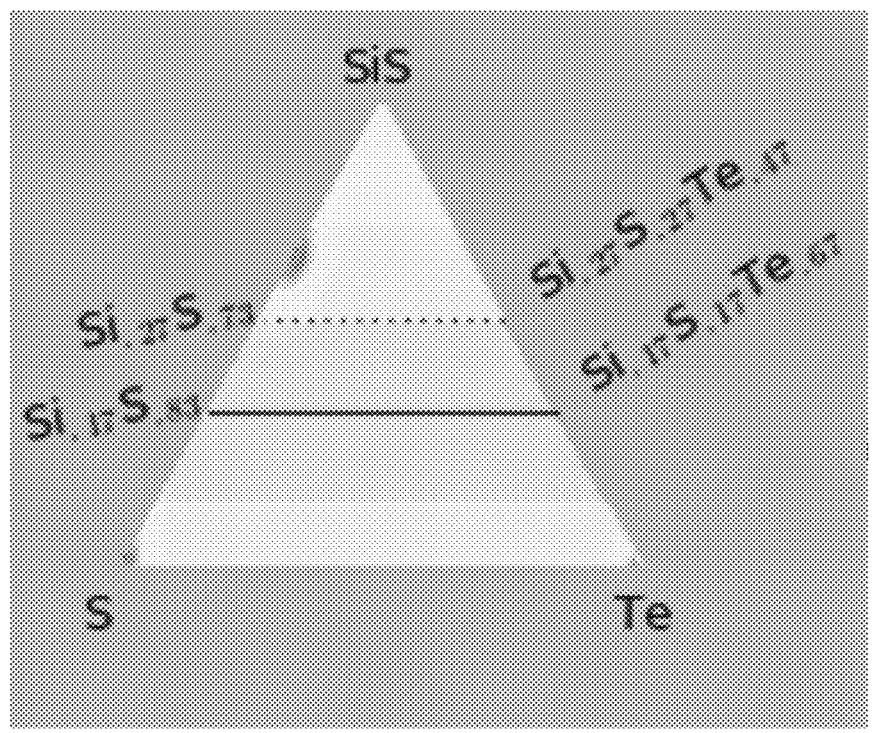
Figure 23G:
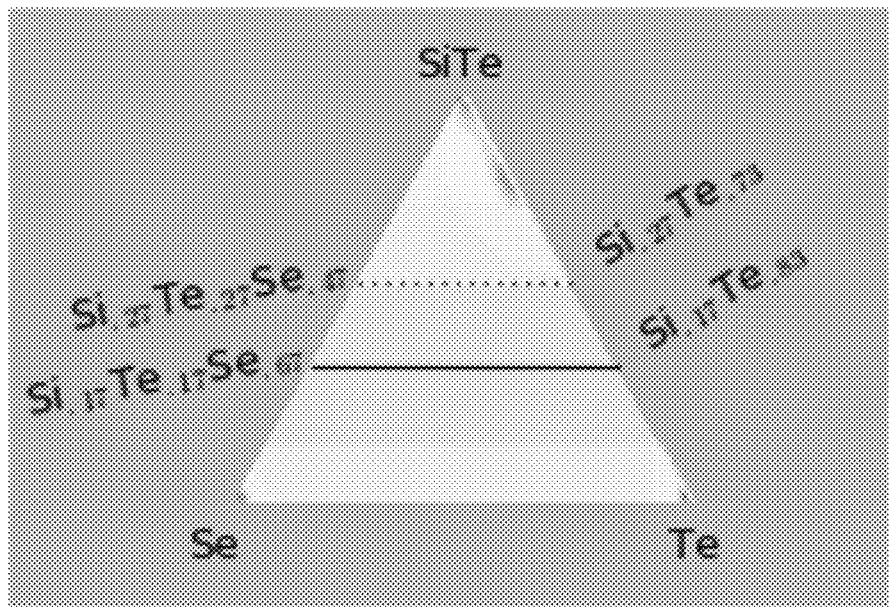
Figure 23H:
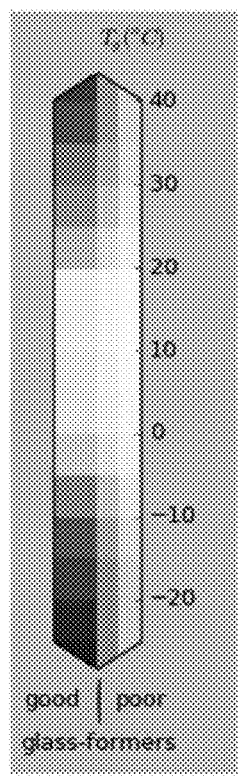
Figure 23I:
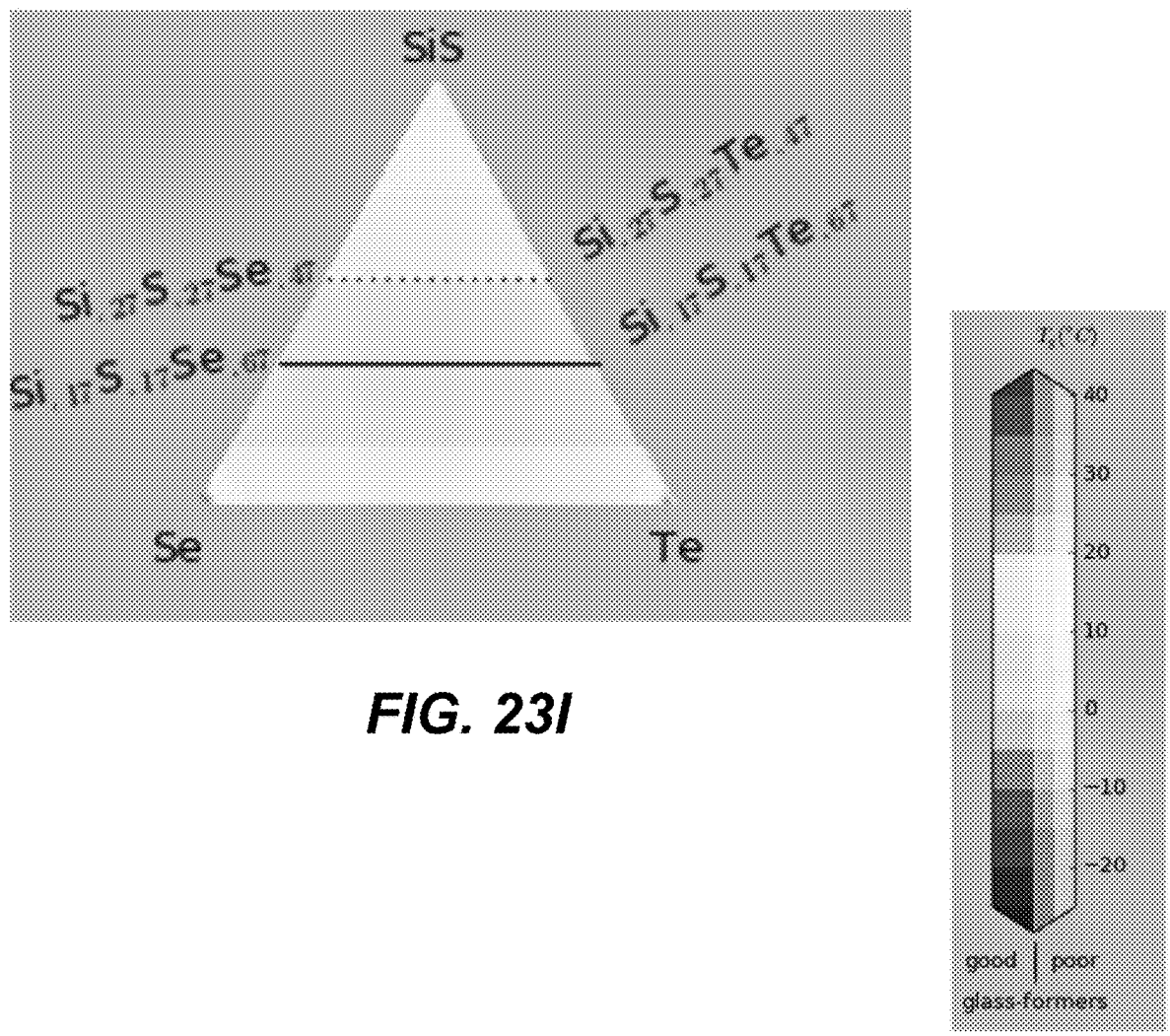
Figure 24A:
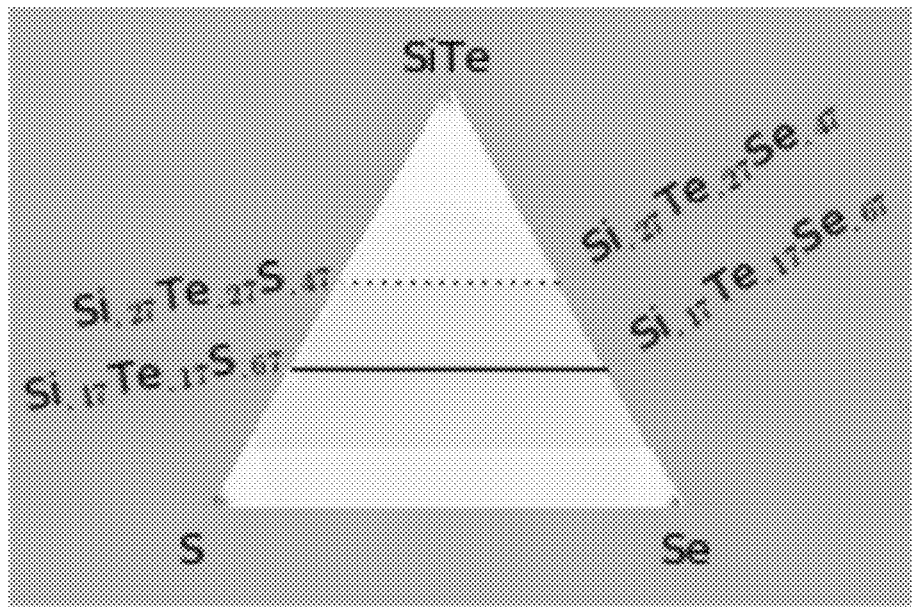
Figure 24B:
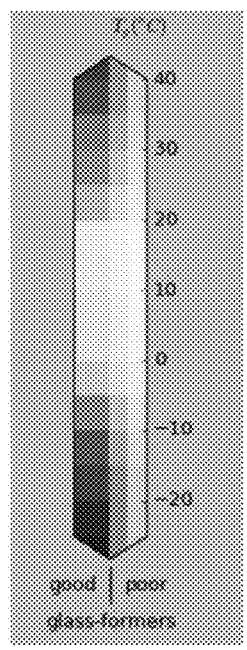
Figure 24B:
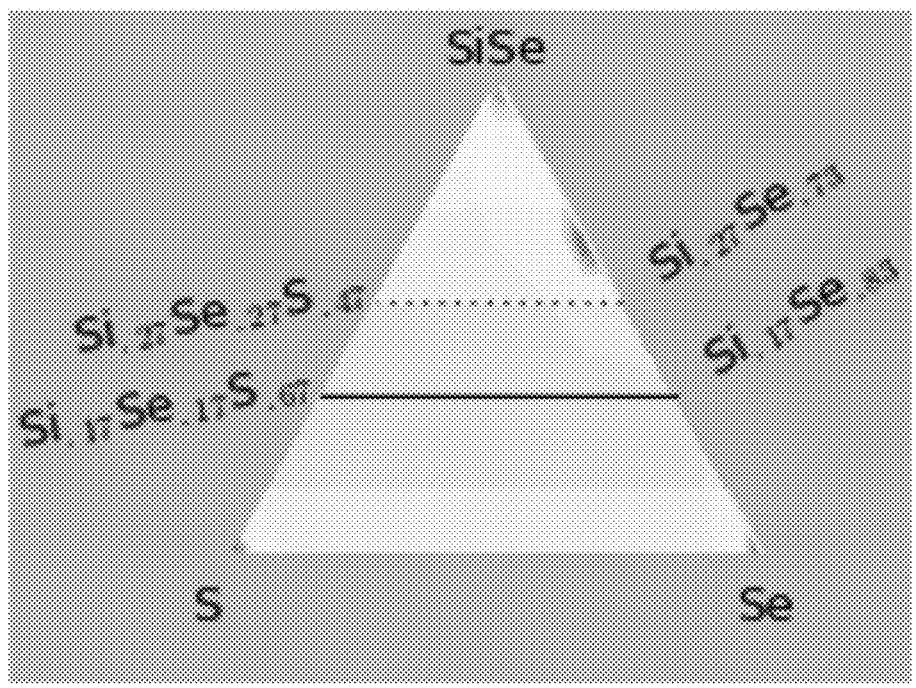
Figure 24C:
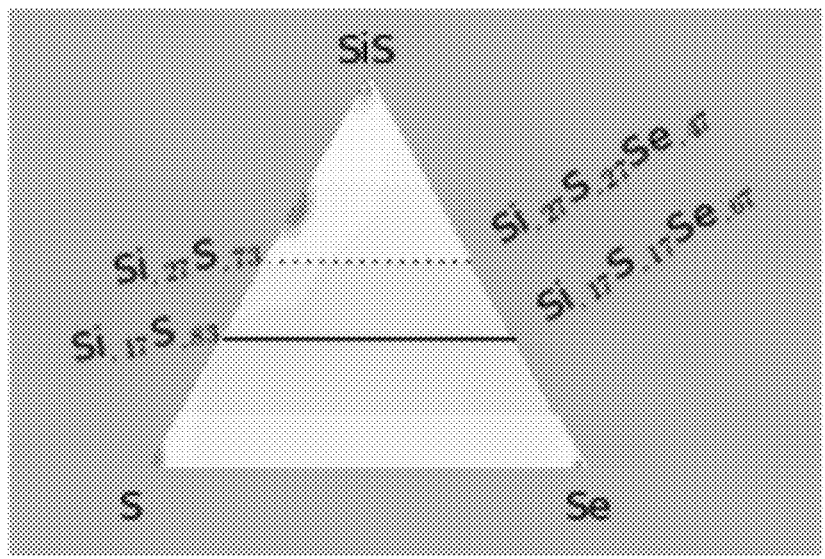
Figure 24D:
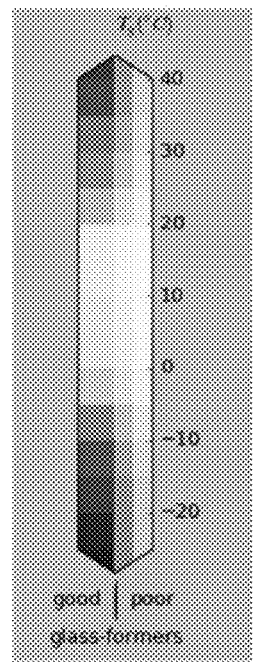
Figure 24D:
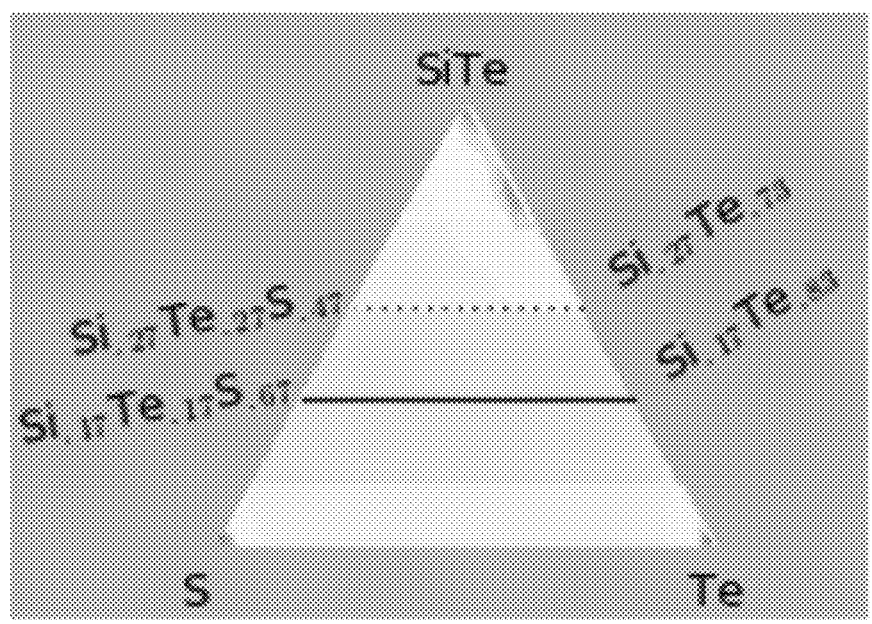
Figure 24E:
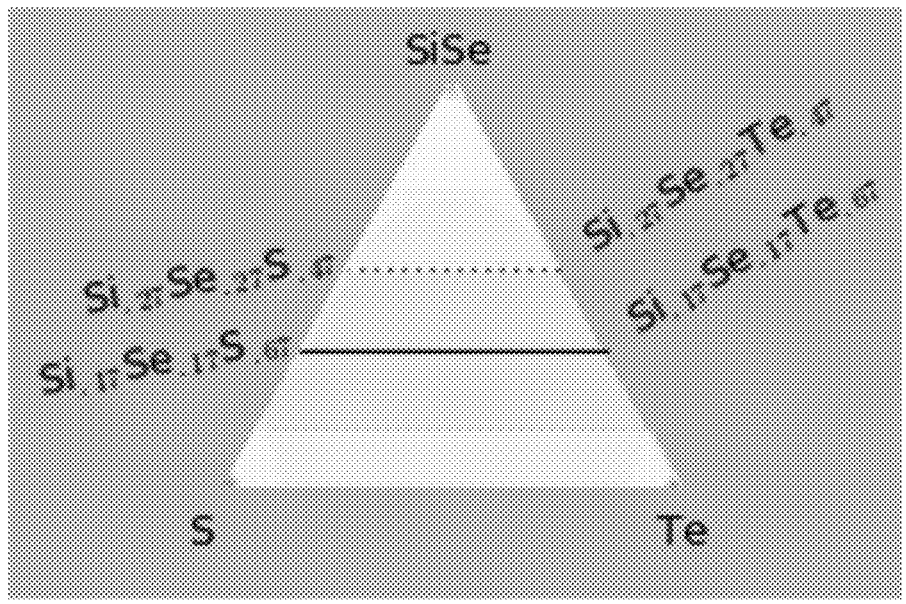
Figure 24F:
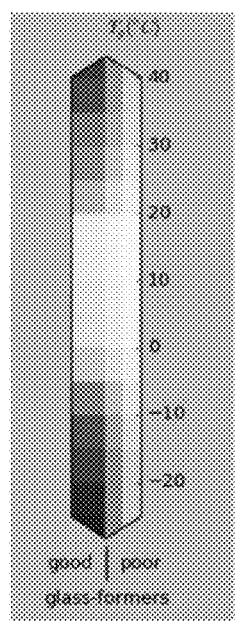
Figure 24F:
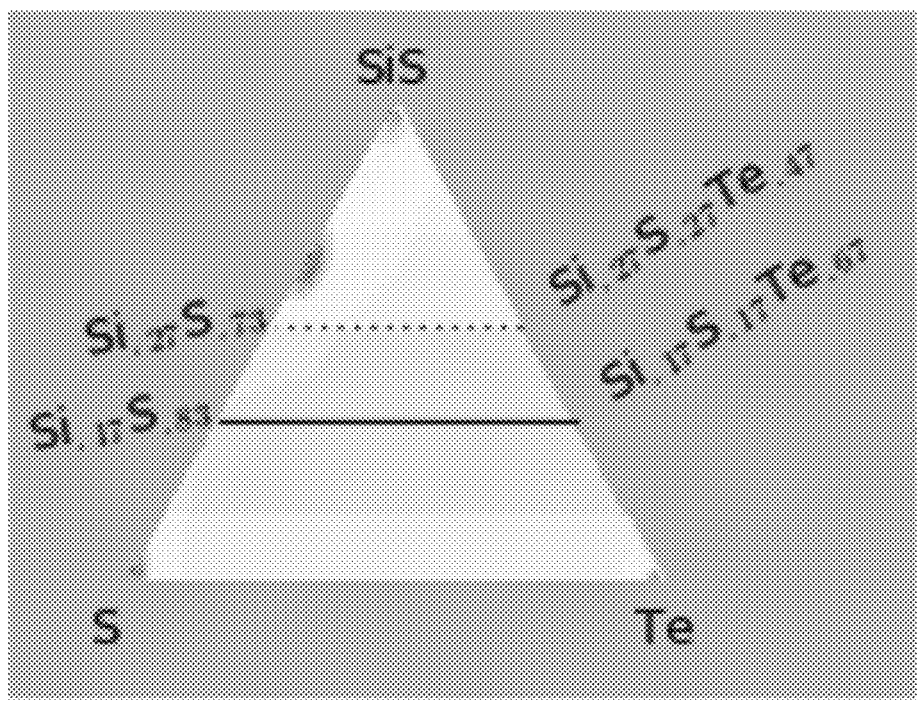
Figure 24G:
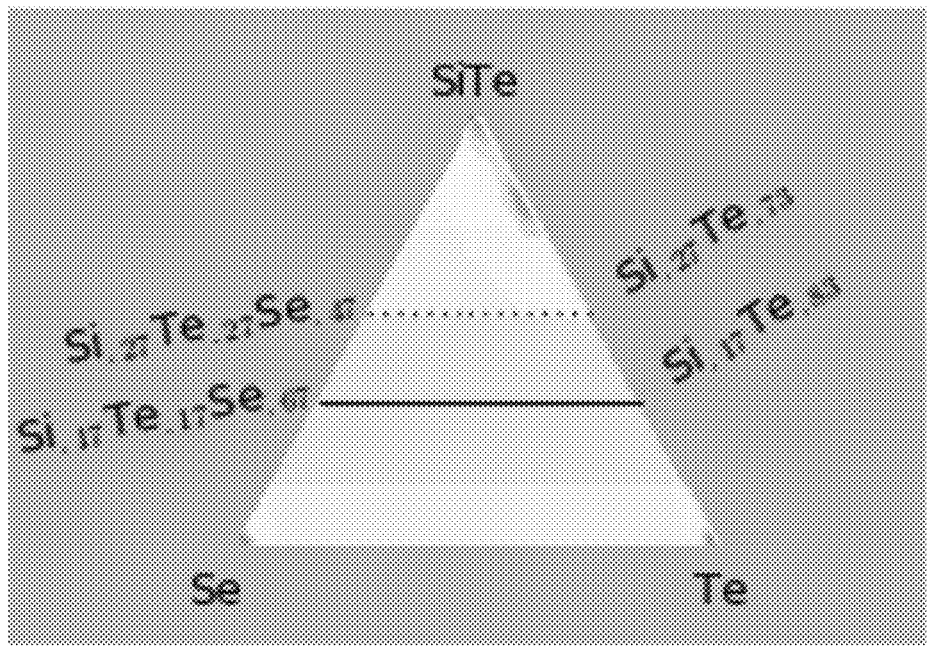
Figure 24H:
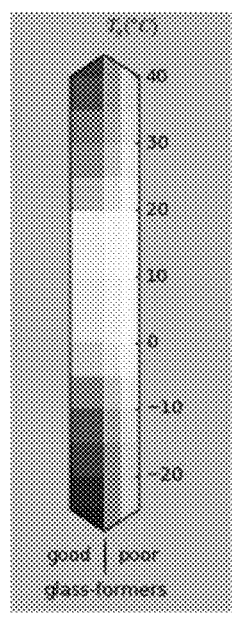
Figure 24H:
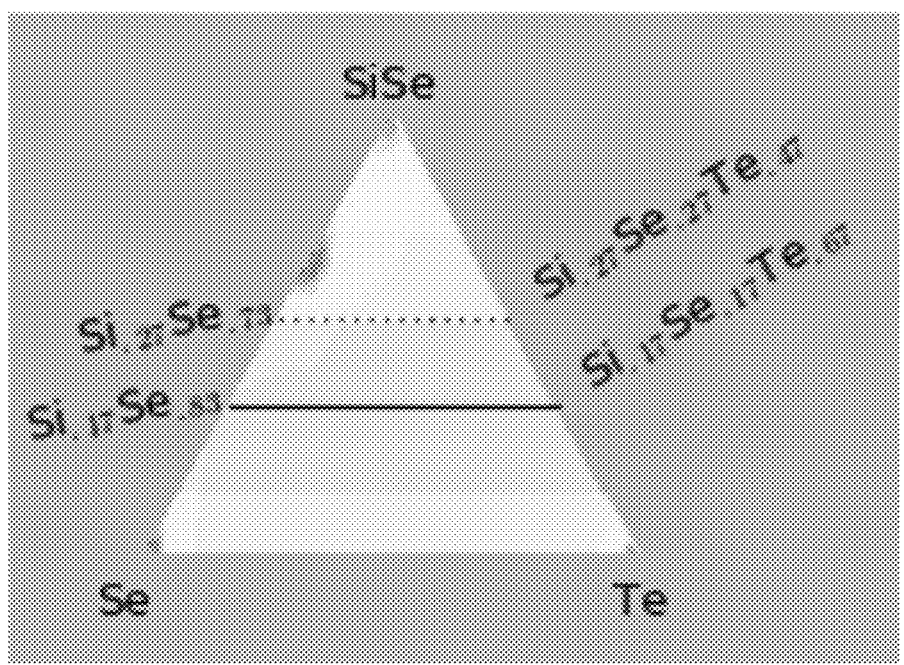
Figure 24I:
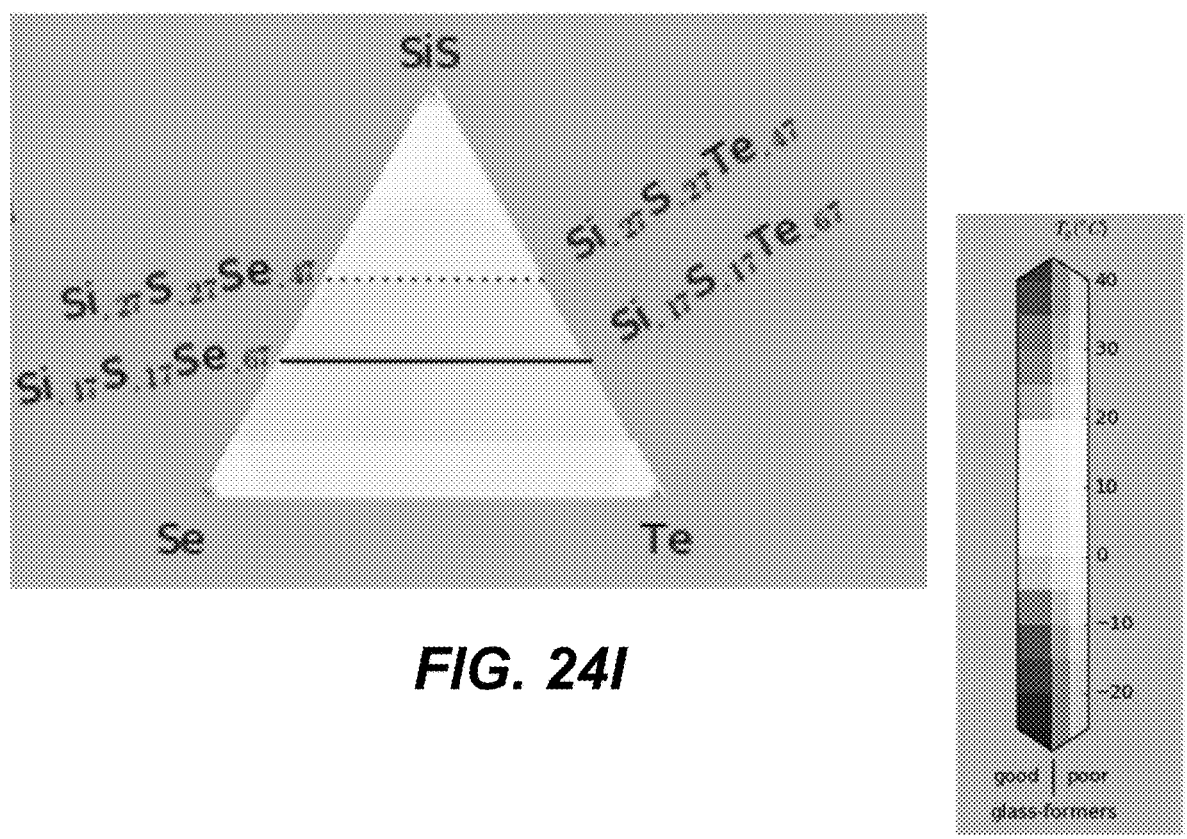

To avoid crystallization, the composition of a CCL may be selected away from the known low-T and high-T stable crystalline phases. For example, merit functions for different combinations of silicon, tellurium, germanium, selenium, and sulfur may be evaluated. Some examples of these merit functions are presented in FIGS. 18A and 18B. Specifically, FIG. 18A only illustrates low-T phases, while FIG. 18B only illustrate high-T phases. The selected compositions may have values higher than a certain merit function threshold value.

Topological considerations are used to determine compositions for CCLs where the material is likely to form glasses. It should be noted that even proximity to a stable crystalline stoichiometry still makes glass-to-crystalline transformation very easy. In particular, compositions that are close to crystalline stoichiometries may exhibit memory-like behavior.

While melting-temperature considerations can be used to evaluate memory-vs-selector behavior at compositions where the crystalline phase is well-defined, these melting-temperature considerations become less meaningful far away from compositions with well-defined crystalline phase. This may be due to the ambiguity of the definition of melting temperature at those compositions. However, the proximity itself to the crystalline compositions can be used as an indicator of a likelihood of a glass-to-crystalline transformation. For example, a figure of merit can be defined for a given composition $x_0$ by going over all known stable crystalline compounds C. Each compound may be approximated by its "ideal" stoichiometry $x^C$.

Phase diagrams show that crystalline chalcogenide binary compounds (that are thermodynamically stable) do not deviate significantly from one of such well-defined stoichiometries, such as GeTe or $Si_2Te_3$. As such, the sum of inverse "normalized distances" $n(x,x^C)$ in the composition space may be considered. Recognizing that both x and $x_C$ are actually multi-dimensional vectors ($\{x_i\}$ and $\{x^C_i\}$, e.g. for GeTe $x_{Ge}$=0.5, $x_{Te}$=0.5 and all other $x_i$=0) in the composition space, the "normalized distance" $n(x,x_C)$ may be calculated as to some power p, summed over individual composition indices i. Optionally, the inverse power 1/p of the sum may be considered. For example, summing p=2 powers of |xi−xCi| and taking ½ power (i.e., the square root) of the sum yields the usual Euclidian distance. However, other definitions of normalized distances are also within the scope. It is observed that a reasonable comparison (compared to available experimental data) is achieved using p=1.2 and not taking the 1/p power of the sum; this expression is used to produced the above plots.

Low-T crystalline phases are identified as Ge, GeS, $GeS_2$, S, Se, GeSe, $GeSe_2$, Si, $SiS_2$, $SiSe_2$, Te, GeTe, $Si_2Te_3$, $Si_3N_4$, $Ge_3N_4$, and $S_4N_4$. High-T crystalline phases may additionally include SiS and/or SiSe. CCL compositions close to these phases should be avoided for reliable manufacturing and operation of amorphous selector.

In some embodiments, ALD cycles that deposit three different chalcogenide materials are used. Specifically, two different binary components formed using group IV and group VI elements (e.g., GeSe and SiSe). An additional pure chalcogen (e.g., Te) may be added. FIGS. 19A-21I and FIGS. 22A-24I illustrate plots in which corners represent different compositions of pure materials, including pure binaries. The closer a particular CCL composition is to a given corner, the larger number of ALD cycles for this material is needed.

The number of the ALD cycles for each of the individual materials is selected such as to obtain an average composition with high Tg, high glass-forming ability and away from the known low-T and high-T stable crystalline phase stoichiometries. In some embodiments, the number of consecutive cycles depositing the same material is kept to the minimum (such as depositing less than a monolayer, or less than 3 monolayers, of given material), so as to provide best intermixing of constituent elements within an amorphous structure.

Specifically, based on the glass-forming ability, the materials are selected such as to lie fully outside the white-color-shaded areas (limited by the dotted line) in the following plots shown in FIGS. 19A-21I, or alternatively within the lightly-shaded area as close as possible (based on other considerations) to the dashed line. Based on Tg, the materials with high Tg based on the following plot are selected in FIGS. 19A-19I. Based on the proximity to the crystalline phases, the materials in the darker areas in FIGS. 20A-20I are selected for to low-T competing compounds. Finally, based on the proximity to the crystalline phases, the materials in the darker areas in FIGS. 21A-21I are selected for to high-T competing compounds.

Referring to plots presented in FIGS. 22A-24I, material compositions may be selected such that these compositions lie fully outside, the white-color-shaded areas (limited by the dotted line), or alternatively within the lightly-shaded area as close as possible (based on other considerations) to the dashed line. Based on Tg, the materials with high Tg based on the following plot are selected in FIGS. 22A-22I. Based on the proximity to the crystalline phases, the materials in the darker areas in FIGS. 23A-23I are selected for to low-T competing compounds. Finally, based on the proximity to the crystalline phases, the materials in the darker areas in FIGS. 24A-24I are selected for to high-T competing compounds.

CCLs described herein may be fabricated from different materials, such as at least one of Group VIB chalcogens. In some embodiments, a CCL may also include at least one of Group IVB semiconductor elements. The CCL may also include an electropositive metal element (e.g., CuTe, CuS). Examples of Group VIB chalcogens are sulfur (S), selenium (Se), and tellurium (Te). Examples of Group IVB semiconductor elements are germanium (Ge), and silicon (Si). Examples of electropositive metal elements are transition metals, such as copper (Cu), silver (Ag), titanium (Ti), molybdenum (Mo), tungsten (W) and the like. The concentration of the one or more Group VIB chalcogens in the CCL may be greater than that of the one or more Group IVB semiconductor elements, e.g., equal to or greater than four times the concentration of the one or more Group IVB semiconductor elements. In some embodiments, the concentration of the one or more Group VIB chalcogens in the CCL may be greater than that of the one or more electropositive metal elements, e.g., equal to or greater than four times the concentration of the one or more electropositive metal elements. Furthermore, the concentration of the one or more Group VIB chalcogens in the CCL may be greater than the combined concentration of the one or more Group IVB semiconductor elements and the one or more electropositive metal elements, e.g., equal to or greater than four times the combined concentration of the one or more Group IVB semiconductor elements and the one or more electropositive metal elements. Other examples of materials that can be use in CCL include aluminum (Al), gallium (Ga), carbon (C), nitrogen (N), phosphorus (P), antimony (Sb), bismuth (Bi), and/or arsenic (As). In some embodiments, it is preferable to not include materials such as arsenic (As) which poses safety and manufacturing concerns.

For example, a CCL may comprise at least germanium (Ge) and at least one of sulfur (S), selenium (Se), or tellurium (Te). The combined atomic concentration of sulfur (S), selenium (Se), and tellurium (Te) may be equal or greater than that of germanium. Furthermore, nitrogen (N) and/or carbon (C) may be added to the above composition of the CCL. Nitrogen (N) and/or carbon (C) may be added by cyclic exposure or subsequent annealing in a nitrogen (N) and/or carbon (C) containing environment. Additional examples are described below. It should be noted that subscripts presented in this disclosure typically represent percentage values whereby all subscript values for a given composition add to 100 percent. However, other notations may be used as well (e.g., $Ge_{0.2}Te_{0.8}$ and $GeTe_4$).

A CCL may be fabricated as a conformal layer or a substantially conformal (>75%) layer. Conformality is a measure of film thickness uniformity across a three-dimensional surface or structure. For example, the thickness of the CCL layer within a three-dimensional structure such as the sidewall is at least 75% that of the field area. In some embodiments, the CCL is at least 85% conformal, and in some embodiments, the CCL is at least 95% conformal. The thickness of the CCL may be less than or equal to 200 Angstroms, or in some embodiments, less than or equal to 100 Angstroms or, even less than or equal to 50 Angstroms. The CCL may be substantially amorphous (e.g., more than 50% by volume amorphous in some embodiments or more than 80% by volume amorphous in some embodiments) or even fully amorphous in some embodiments (e.g., more than 99% by volume being amorphous). A thin, conformal CCL aids in 3D (vertical) integration schemes of the memory arrays by conserving space and enabling true vertical integration beyond multi-layered 2D cross-point stacks to achieve 3D density. Additionally, a uniform film thickness facilitates uniform CCL properties. Conformal deposition techniques with compositional and thickness control such as ALD or suitable CVD process regime(s) with compositional and thickness control and conformal deposition is preferred. A thermally stable CCL prevents CCL degradation during the manufacturing process of the integrated memory device and arrays (and subsequent processing) as well as during operation. An amorphous CCL is preferred over one that may change between amorphous and crystalline state during manufacture and/or during operation which can cause degradation of the CCL performance or render it inoperable as a CCL.

In some embodiments, atomic layer deposition (ALD) or ALD-derivatives are used to fabricate the CCL. Some examples include ALD assisted, enhanced, or induced by plasma (direct or remote), e-beam, rapid thermal processing (RTP), ultraviolent (UV), laser, photo, ion, radical, and/or atom processing. Chemical vapor deposition (CVD) or CVD derivatives including but not limited to flow modulated, cyclical, low pressure, plasma (direct or remote), e-beam, RTP, UV, laser, photo, ion, radical, atom assisted CVD may be used as well.

In some embodiments, the CCL's composition is controlled by fabricating a stack containing multiple layers whereby some layers may have differing compositions. The number, arrangement (in the stack), composition, and other characteristics of these layers determine the CCL's overall composition and distribution of different materials (e.g., elements) throughout the thickness of the CCL. For purposes of this disclosure, the thickness of the CCL is a dimension in the direction of the deposition. For example, concentrations of germanium and tellurium in the CCL may be controlled by depositing a number (m) of germanium-tellurium layers and a number (n) of tellurium layers. The number and position of the layers in the stack fabricating the CCL is defined by the number of ALD cycles and the order of these cycles.

Figure 2A:
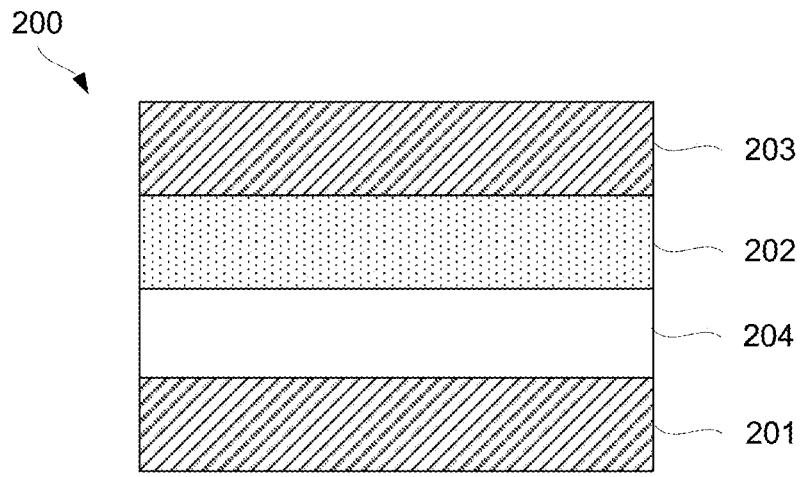
FIG. 2A is a schematic representation of a memory element comprising a CCL, a memory cell, and two signal lines, in accordance with some embodiments.

A CCL may be stacked together with a memory cell to fabricate a memory element as will now be described with references to FIG. 2A. Specifically, FIG. 2A is a schematic representation of memory element 200 comprising CCL 202, memory cell 204, first signal line 201 (e.g., a bit line), and second signal line 203 (e.g., a word line), in accordance with some embodiments. CCL 202 and memory cell 204 are stacked between first signal line 201 and second signal line 203 and interconnected in series. CCL 202 and memory cell 204 stacking can be in any orientation/order relative to each other and CCL 202 and memory cell 204 may take a number of different non-planar shapes as further described below. CCL 202 and memory cell 204 may directly interface as, for example, shown in FIG. 2A.

Figure 2B:
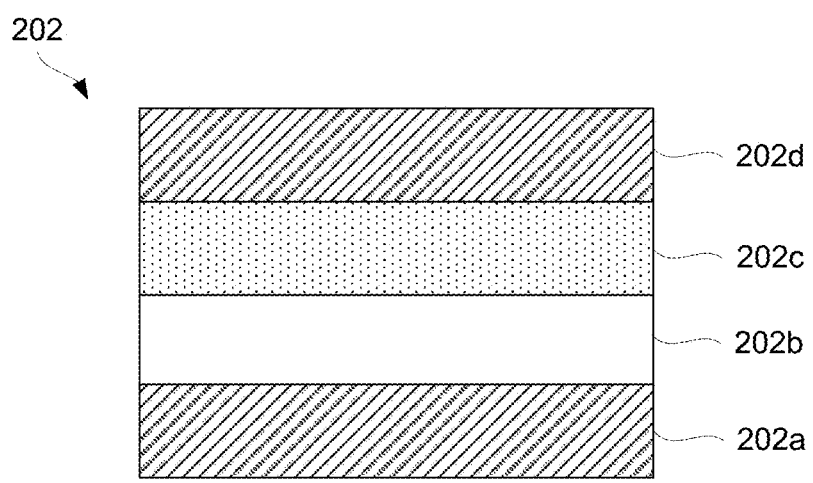
FIG. 2B is a schematic illustration of a CCL being a multilayered structure, in accordance with some embodiments.

In some embodiments, current compliance layer (CCL) 202 is a multilayered structure as, for example, shown in FIG. 2B. Without being restricted to any particular theory, it is believed that the multilayered structure can provide various characteristics that are generally not available with single-layered structures. In particular, a multilayered structure has an interface between two distinct layers. Many CCL materials are amorphous and need to remain so during operation. Multilayered structures can enhance the stability of the amorphous phase by introducing additional interfaces which retard atomic rearrangements required for crystallization.

Figure 2C:
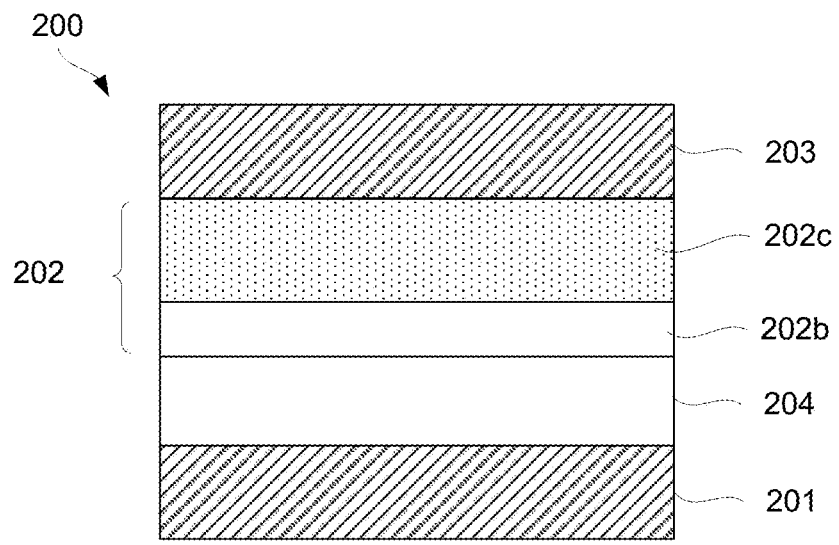
FIGS. 2C-2E are schematic representations of a memory element comprising a CCL, in accordance with some embodiments.
Figure 2D:
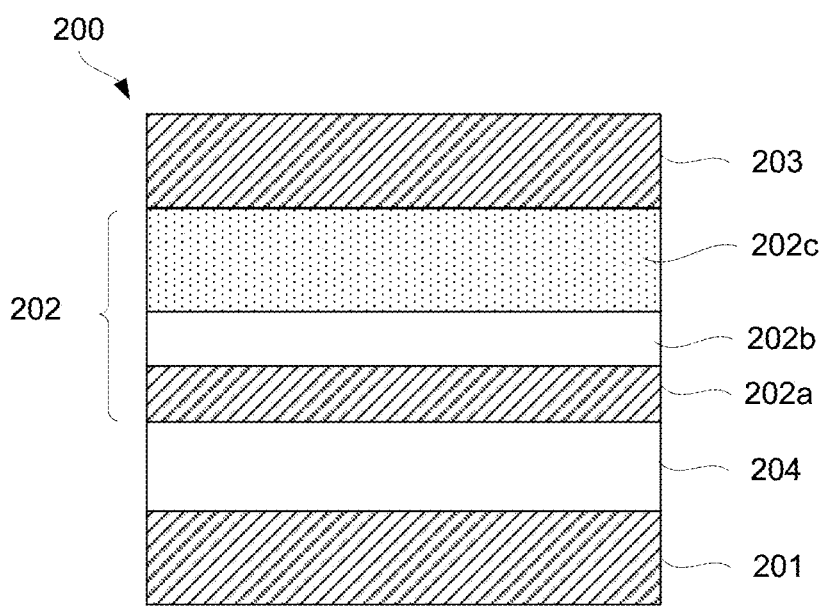
Figure 2E:
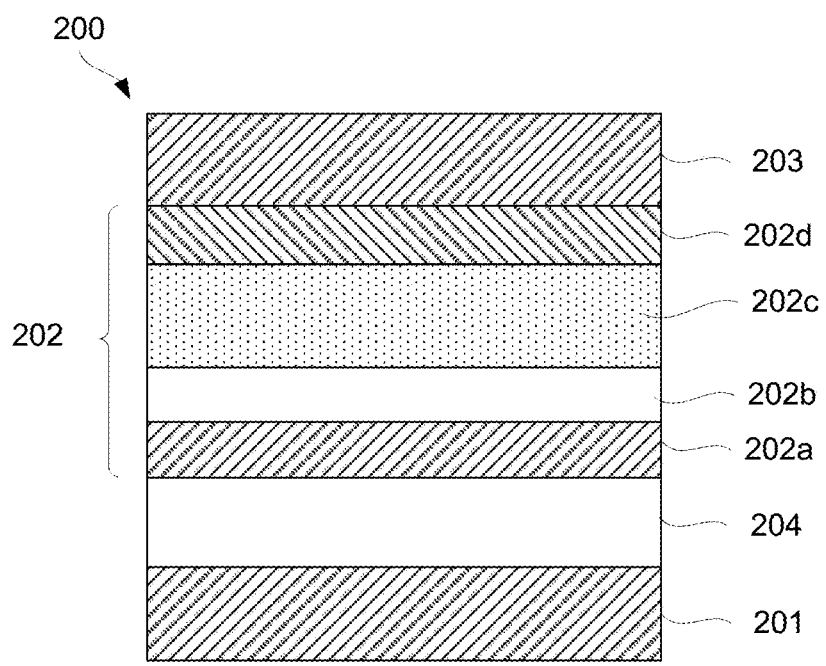

CCL 202 may comprise interface layer 202b and main layer 202c, which has a different composition and/or morphology than interface layer 202b. In some embodiments, CCL 202 comprises optional first electrode 202a and/or optional second electrode 202d. For example, CCL 202 may be a standalone component, with both first electrode 202a and second electrode 202d present, as shown in FIG. 2B. Furthermore, both first electrode 202a and second electrode 202d may still be present even if CCL 202 is integrated into memory element 200, e.g., together with memory cell 204, as shown in FIG. 2E. In this example, first electrode 202a may be positioned between memory cell 204 and one of interface layer 202b and main layer 202c, while second electrode 202d may be positioned between a signal line and the other one of interface layer 202b and main layer 202c. Specifically, the example shown in FIG. 2E has first electrode 202a of CCL 202 positioned between memory cell 204 and interface layer 202b. Second electrode 202d is positioned between second signal line 203 and main layer 202c. In this example, first electrode 202a of CCL 202 may be used to control voltage across CCL 202 independently from controlling the voltage across memory cell 204, and may be referred to as an intermediate electrode. Second electrode 202d may be used, for example, to provide a specific interface to main layer 202c that, for example, cannot be achieved with second signal line 203. For example, second signal line 203 may be formed from less resistive material than second electrode 202d.

Alternatively, CCL 202 may have only one of first electrode 202a and second electrode 202d or no electrodes at all. FIG. 2C illustrates an example in which interface layer 202b directly interfaces memory cell 204, while main layer 202c directly interfaces second signal line 203. In another example, interface layer 202b may directly interface a signal line, while main layer 202c may directly interface memory cell 204.

FIG. 2B illustrates another example in which first electrode 202a is disposed between interface layer 202b and memory cell 204, while main layer 202c directly interfaces second signal line 203. In yet another example, first electrode 202a may be disposed between main layer 202c and memory cell 204, while interface layer 202b may directly interface a signal line. In some embodiments, a 1R1S device comprises a lower electrode (which may be a compound electrode, e.g., tungsten/carbon bilayer), followed CCL 202, followed by an intermediate electrode. The voltage of this intermediate electrode may not externally controlled. The intermediate electrode may be used as a diffusion/thermal barrier. The 1R1S may also comprise a memory element, disposed over the intermediate electrode, and an upper electrode disposed over the memory element.

In some embodiments, CCL 202 may be also operable as a memory cell. The dual function of CCL 202 may be attributed, for example, to an interface presented in the multilayered design and, in some embodiments, to a concentration gradient of various components in one or both layers of CCL 202 as further described below. For example, the resistance of the CCL layer may be modulated by changes in the concentration gradient of one or more CCL elementary components. This gradient can be altered by appropriate application of electric fields which will drive motion of the elements toward or away from the applied electric field.

Interface layer 202b may comprise tellurium oxide. Tellurium oxide is used to enhance the growth of subsequent CCL materials. Tellurium oxide can be formed using ALD providing a relatively high reactive surface for subsequent CCL deposition. Tellurium oxide is chemically compatible with typical CCL materials and has high thermal stability.

The thickness of interface layer 202b may be between about 0.1 nanometers and 10 nanometers or, more specifically, between about 1 nanometer and 5 nanometers. Interface layer 202b needs to be sufficiently thick such that first electrode 202a or any other component, which main layer 202c is formed over, is physically isolated from main layer 202c. Furthermore, at low thickness values, interface layer 202b may not be sufficiently conformal or even coat the entire surface supporting interface 202b.

Interface layer 202b separates main layer 202c from first electrode 202a and, in some embodiments, helps with nucleation of main layer 202c. In these embodiments, interface layer 202b is formed prior to main layer 202c. Main layer 202c is then deposited directly over interface layer 202b. Without being restricted to any particular theory, it is believed that, relative to first electrode 202a, interface layer 202b provides a more uniform surface with a sufficient number of nucleation sites to achieve a continuous main layer for very thin films with low roughness.

Main layer 202c may comprise a combination of germanium, selenium, silicon, arsenic, antimony, tellurium, nitrogen, tin, and sulfur or, more specifically, a combination of tellurium and germanium. The concentration of tellurium in main layer 202c may be between about 80% atomic and 99% atomic or, more specifically, between about 90% atomic and 95% atomic. The concentration of germanium in main layer 202c may be between about 1% atomic and 20% atomic or, more specifically, between about 1% atomic and 5% atomic. Excess tellurium avoids compositions near GeTe and GeTe$_2$ which are crystalline, while still giving CCL like behavior.

Figure 2F:
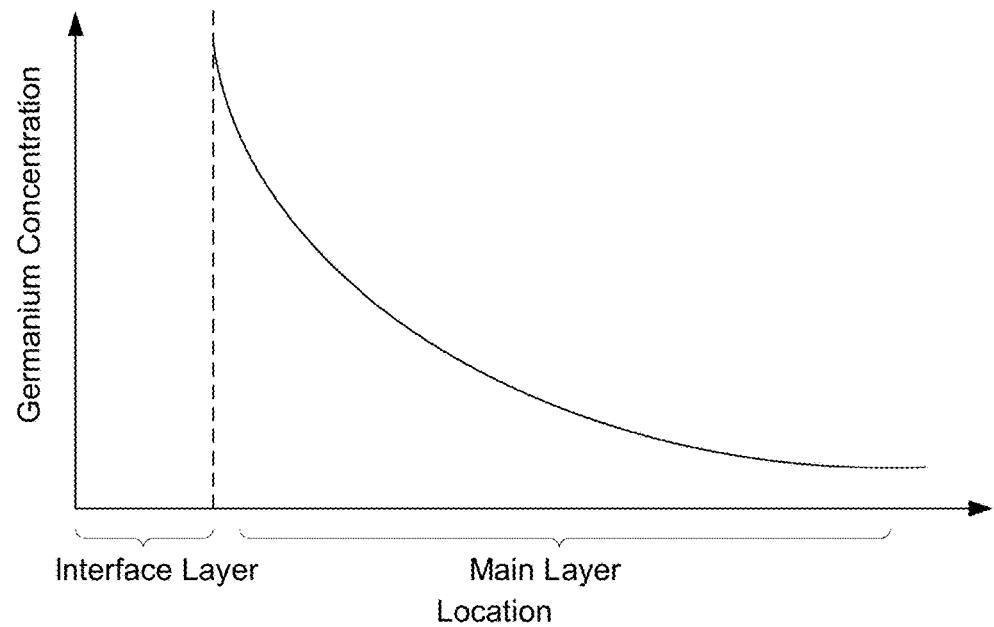
FIGS. 2F-2I are schematic representations of different profile concentrations in a CCL, in accordance with some embodiments.

The distribution of tellurium and germanium in main layer 202c may be substantially uniform (e.g., vary by less than 25% at any two locations within main layer 202c). For example, FIG. 2I illustrates a constant concentration of germanium throughout the thickness of main layer 202c. This example of main layer 202c may be formed by depositing both tellurium and germanium in the same ALD cycle as, for example, shown in the following equations, each representing a different ALD cycle:

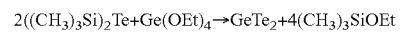

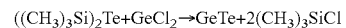

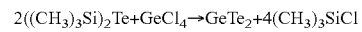

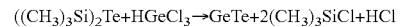

Alternatively, the distribution of tellurium and germanium in main layer 202c may be non-uniform (e.g., vary by more than 25% in at least two locations within main layer 202c). For example, as shown in FIG. 2F, more germanium may be present at the interface with interface layer 202c than, for example, away from this interface. This example may be achieved by using different ALD cycles. For example, initial ALD cycles, which start forming main layer 202c over interface layer 202b, may deposit only germanium or a combination of tellurium and germanium. As the thickness of main layer 202c increases, the depositing process may switch to ALD cycles depositing only tellurium. Each ALD cycle produces a sub-layer of main layer 202c that is only a few Angstroms thick. Therefor varying ALD cycles during deposition of main layers 202c may be used to produce various concentration profiles. Sharp concentration profiles may show more memory like behavior due to element migration under application of an electric field or other stress. Gradual or uniform profiles may exhibit more CCL-like behavior. Small changes in the profiles may alter the threshold voltage or other electrical properties of the CCL.

Figure 2G:
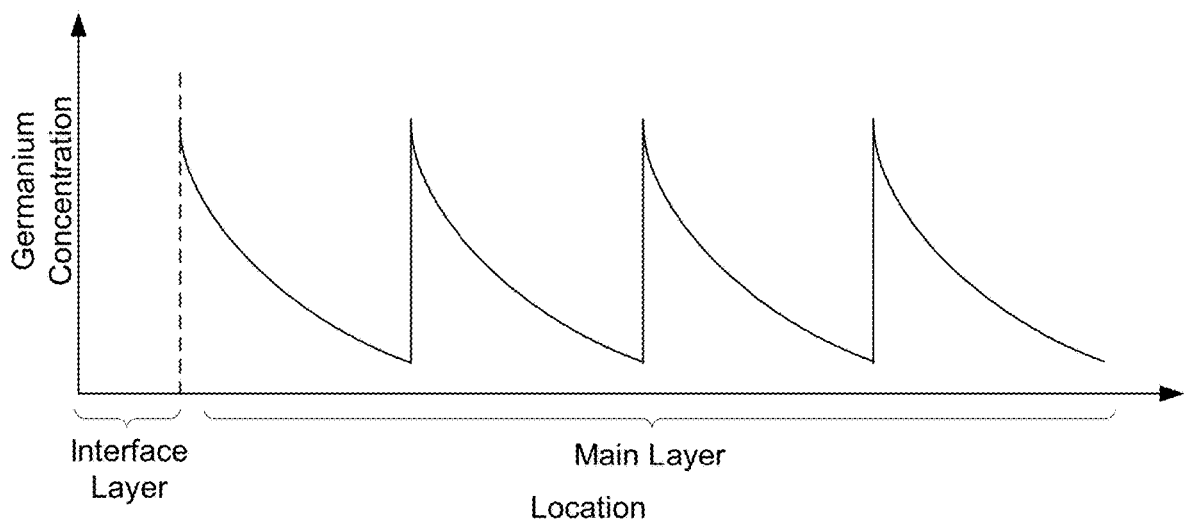
Figure 2H:
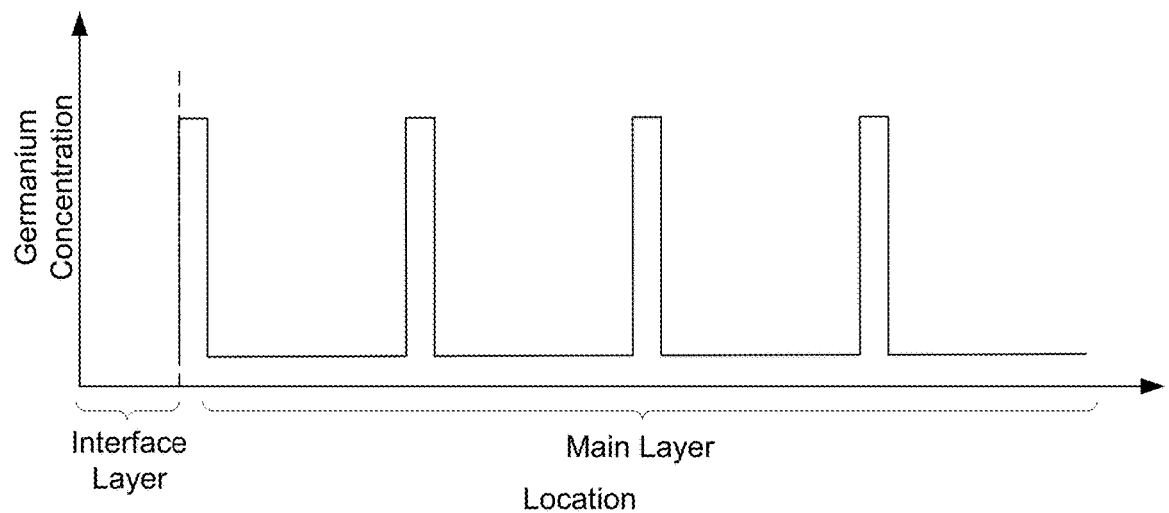
Figure 2I:
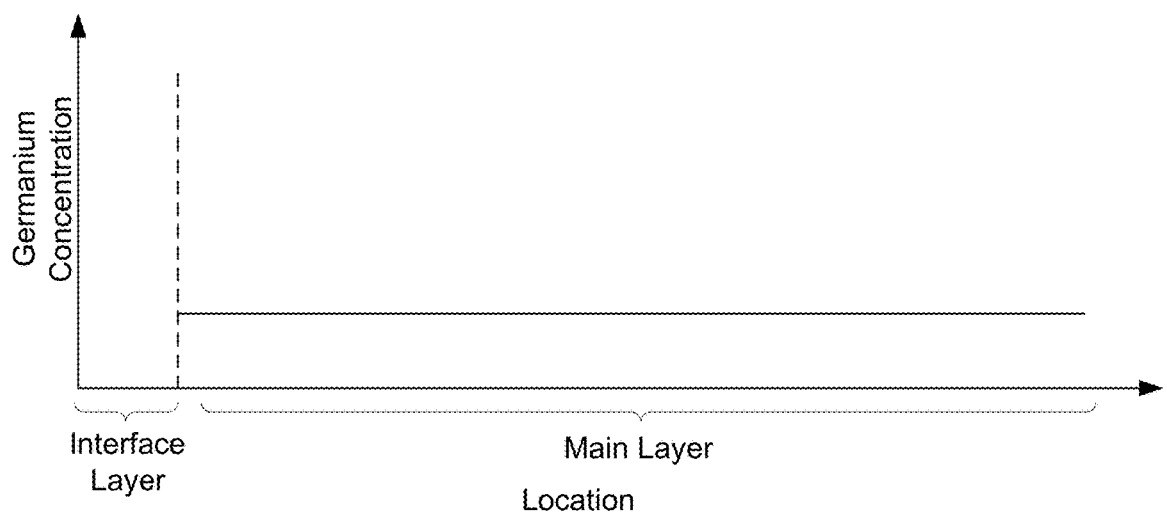

Furthermore, in some embodiments, the concentration of germanium may periodically spike throughout the thickness of main layer 202c as, for example, shown in FIG. 2G or FIG. 2H. These spikes may be produced caused by reapplication of interface layer 202b. A film with repeated spikes in germanium will have a higher average concentration and, on average, be more uniform leading to a more pure CCL-like behavior. Furthermore, a higher average Ge concentration may enhance the stability of the main layer.

The thickness of main layer 202c may be between about 10 nanometers and 200 nanometers or, more specifically, between about 20 nanometers and 50 nanometers. Lower thickness values may lead to an electrical breakdown of main layer 202c, while main layer 202c with larger thicknesses may be hard to form, especially when ALD is used for deposition of main layer 202c.

First electrode 202a and/or second electrode 202d may be formed from titanium nitride, tungsten, molybdenum, amorphous carbon, and the like. In some embodiments, electrodes with good diffusion barrier properties, such as W and/or TiN, may be used. Electrodes with low thermal conductivity (like C) may be used since self-heating can be important for CCL operation.

Interface layer 202b and main layer 202c may be formed using ALD or other techniques. When ALD is used to form interface layer, precursors may be tellurium ethoxide (Te(OC$_2$H$_5$)$_4$) and water (H$_2$O).

Main layer 202c may be also formed using ALD in which germanium-containing layers are alternated with tellurium layers. In some embodiments, the deposited layer may include both germanium and tellurium as shown below.

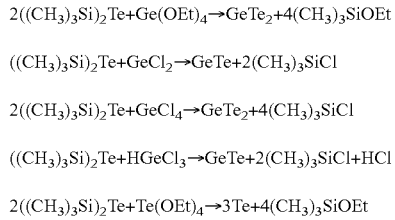

All ALD processing may be performed at temperatures of less than 100° C. The processing may not involve annealing of the deposited structures.

Figure 2J:
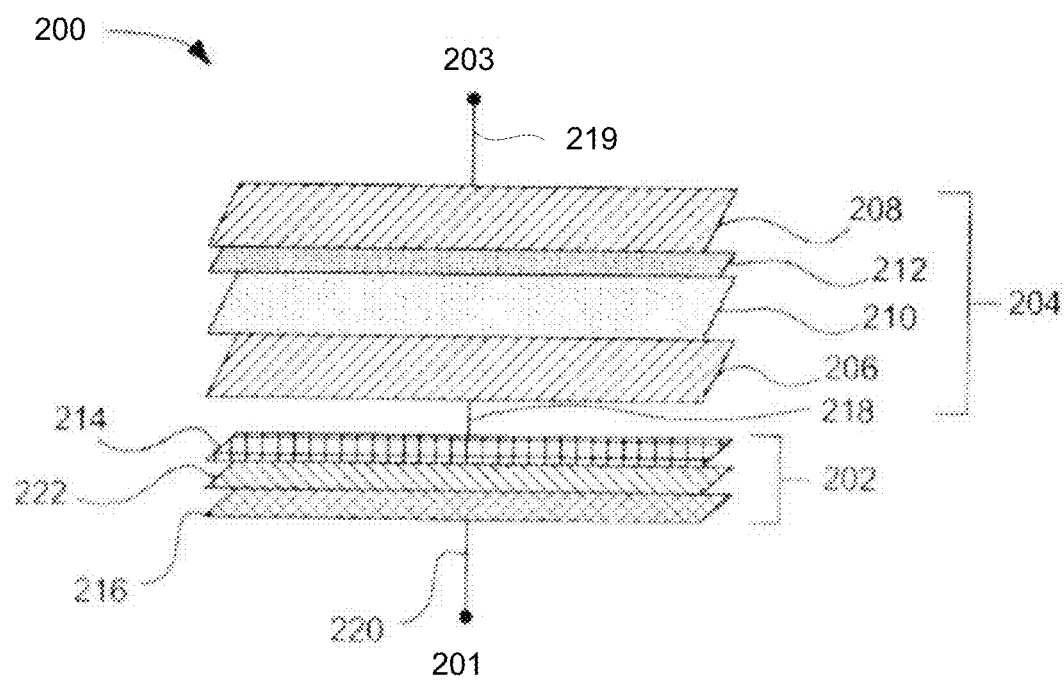
FIG. 2J is a schematic representation of a memory element comprising a CCL, a memory cell, and two signal lines, in accordance with some embodiments.

Memory cell 204 may be a single layer or a stack of different layers as, for example, shown in FIG. 2J. For example, memory cell 204 may include first electrode 206 and second electrode 208. First electrode 206 and second electrode 208 of memory cell 204 should not be confused with first signal line 201 and second signal line 203 of memory element 200. First electrode 206 and second electrode 208 are operable to connect memory cell 204 to other internal components of memory element 200 and not to external components outside of memory element 200. In some embodiments, the outermost electrode 208 and first conductive layer 216 in FIG. 2J can be either vertical/horizontal or horizontal/vertical electrodes pairs corresponding to bit/word or word/bit signal line pairs. This saves real estate for dense 3D (vertical) integration and is advantages for cost and manufacturability. First electrode 206 and second electrode 208 may be fabricated from metals (e.g., Pt, Ru, Ir, W, Ta, Co, Ni), metal oxides (e.g., RuO$_2$, IrO$_2$, MoO$_2$), metal nitrides (e.g., TiN$_x$, TaN$_x$, WN$_x$), silicides (e.g. CoSi$_x$, TiSi$_x$, NiSi$_x$), carbon, or doped semiconductor (e.g., p- or n-type doped polysilicon).

When memory cell 204 is a resistive random-access memory (ReRAM) cell, then it may also include variable resistance layer 210 (e.g. an insulator or metal oxide). Variable resistance layer 210 can be a metal oxide or other dielectric material. In some embodiments, variable resistance layer 210 has a bandgap greater than four electron volts (eVs). Some examples of materials for variable resistance layer 210 include, but are not limited to HfO$_2$, Ta$_2$O$_5$, Al$_2$O$_3$, Y$_2$O$_3$, or ZrO$_2$ and non-stoichiometric variations thereof such as HfO$_x$, TaO$_y$, Al$_x$O$_y$, Y$_x$O$_y$, ZrO$_x$ where x and y deviate from aforementioned stoichiometric integer values. Materials employed for variable resistance layer 210 may use defect-based mechanisms to switch from a high resistance state to a low resistance state and vice versa. These materials further have set and reset voltages (i.e. switching voltages) that increase with increasing thickness of variable resistance layer 210 and the defects are filled by a voltage-mediated (e.g. a field-based) mechanism. Defects can be filled (and resistance of layer 210 can switch) during a transient voltage pulse or a non-transient voltage pulse. Resistance-switching layer may switch using a transient-type switching mechanism with a relatively short (e.g. less than 1 ms, less than 10 μs, less than 5 μs, less than 1 μs, or less than 100 ns) voltage pulse (i.e. "a transient pulse voltage") and may switch with steady, non-transient voltage pulses.

Memory cell 204 may also include interface layer 212 as, for example, shown in FIG. 2J. Interface layer 212 may be a metal oxide, such as TiO$_2$, ZrO$_2$, and Al$_2$O$_3$, that is different from the metal oxide of variable resistance layer 210. Interface layer 212 may be operable as a diffusion barrier between second electrode 208 and variable resistance layer 210. In some embodiments, interface layer 212 may include the same most prevalent metal as second electrode 208 (e.g., second electrode 208 may comprise TiN, while interface layer 212 may comprise TiOx or TiO$_2$ or second electrode 208 may comprise hafnium nitride while interface layer 212 may comprise HfOx or HfO$_2$). Interface layer 212 can be thinner than variable resistance layer 210. For example, interface layer 212 may have a thickness that is less than 25% of the thickness of variable resistance layer 210 or even less than 10%. In some embodiments, variable resistance layer 210 may have a thickness of between about 20 and 100 Angstroms or, more specifically, between 20 and 60 Angstroms such as about 50 Angstroms. The thickness of interface layer may be between about 5 and 10 Angstroms.

Memory element 200 may include connectors 219 and 220 for connecting to respective signal lines. Furthermore, memory element 200 may include connector 218 interconnecting memory cell 204 with CCL 202. In some embodiments, one or more of connectors 218 and/or 220 may not be present. For example, memory cell 204 may be in direct contact with second signal line 203 or first signal line 201. CCL 202 may be in direct contact with first signal line 201 or second signal line 203. Furthermore, CCL 202 may be in direct contact with memory cell 204. Memory element 200 may be connected to the signal lines 201 and 203, which may be, for example, a bit line or word line. The connectors 218 and 220 are not necessarily present or another physical layer may be placed between the first electrode 206 and the top electrode layer 214 of CCL 202. In some embodiments, the number of electrode/conductive layers and/or their thicknesses are reduced to facilitate 3D (vertical) integration and manufacture for improved yield, reliability, and cost as shown in 200 whereby 203 and 201 serve both as electrode/conductive layers and signal lines. In some embodiments, the thicknesses of CCL 202 and memory cell 204 is reduced to facilitate 3D (vertical) integration and manufacture for improved yield, reliability, and cost.

CCL 202 may be a single layer or a stack of different layers as, for example, shown in FIG. 2J. For example, CCL 202 may include first conductive layer 216 and second conductive layer 214. Threshold switching layer 222 of CCL 202 may be disposed between and interfacing first conductive layer 216 and second conductive layer 214. In some embodiments, one of first conductive layer 216 and second conductive layer 214 may be also operable as an electrode of memory cell 204.

Figure 2K:
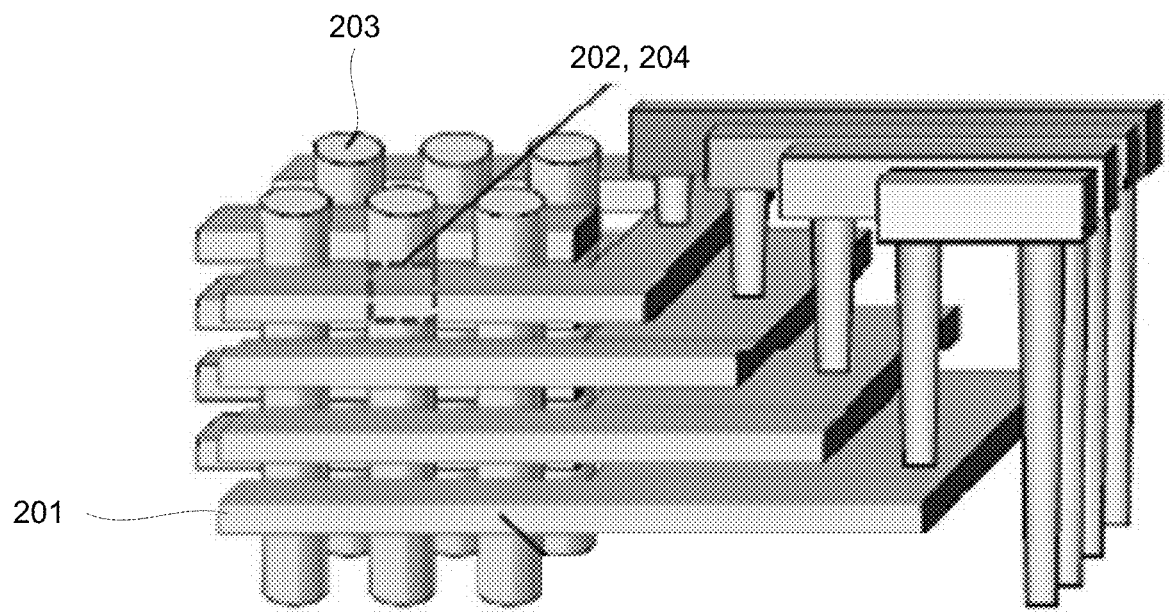
FIGS. 2K-2N represent 3D arrays comprising multiple memory elements sharing signal lines, in accordance with some embodiments.

FIGS. 2K-2N represent schematics of various 3D and stacked 2D arrays. Specifically, FIG. 2K schematically illustrates a 3D memory array whereby the memory cell 204 of memory elements 200 are at the intersection of first 201 and second 203 signal lines. Interconnection [not labeled] are schematically shown to each layer of first signal lines 201. CCL 202 integration is not described in the art for this 3D array. Integration schemes for the CCL 202 at the intersection of first 201 and second 203 signal lines will be described in below sections in present disclosure.

Figure 2L:
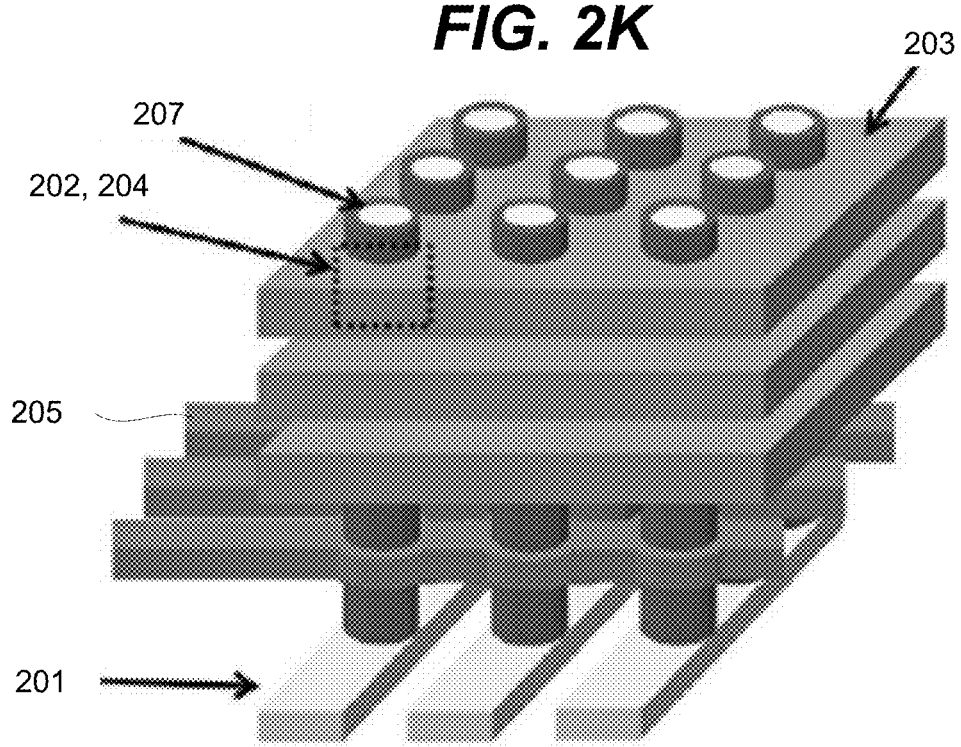

In the 3D memory array schematically shown in FIG. 2L, first signal lines (e.g., bit lines) 201 connect to the pillar electrodes 207 and the horizontal plane electrodes acts as second signal lines 203 (e.g., word lines). CCL 202 and memory cell 204 of memory elements 200 are at the intersection of first 201 and second 203 signal lines. Source lines 205 are connected to access transistors (not shown). In this integration scheme, it may be costly and difficult to manufacture with good yield, reliability, and scaling as the horizontal plane electrodes (typically a conductor) need to be etched. Stacking multiple horizontal plane electrodes at small CD will make the hole etch very difficult especially as the aspect ratio of the hole increases. High aspect ratio metal etching is more difficult and costly as compared to etching of Si or dielectrics such as silicon dioxide and silicon nitride.

Figure 2M:
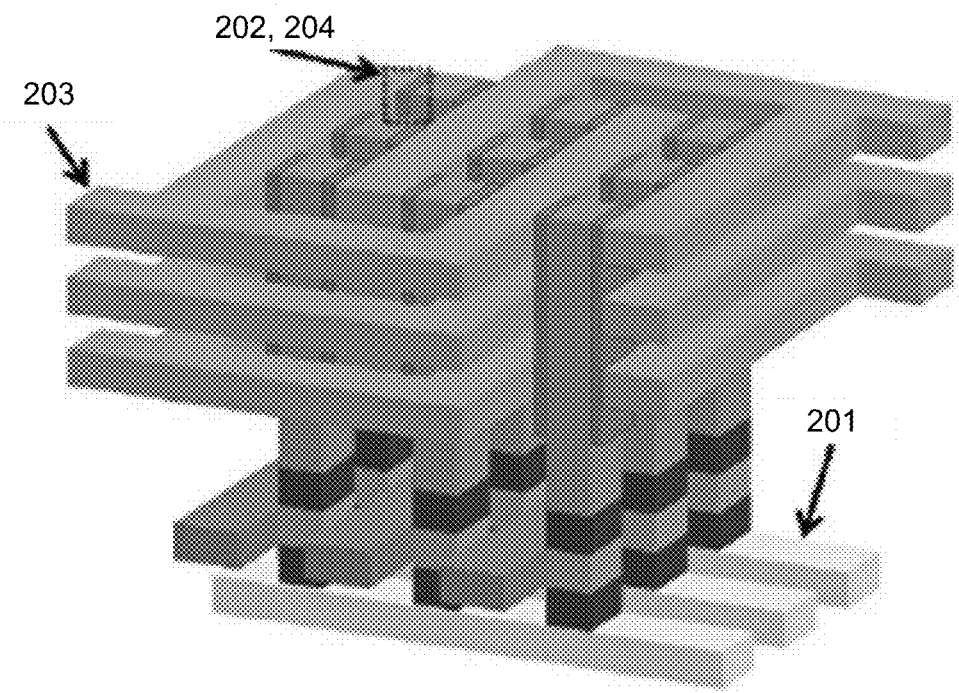

FIG. 2M is a schematic of a 3D memory array. CCL 202 and memory cell 204 of memory elements 200 are integrated at the intersection of first 201 and second 203 signal lines. Select lines can be connected to access devices such as access transistors (not shown).

Figure 2N:
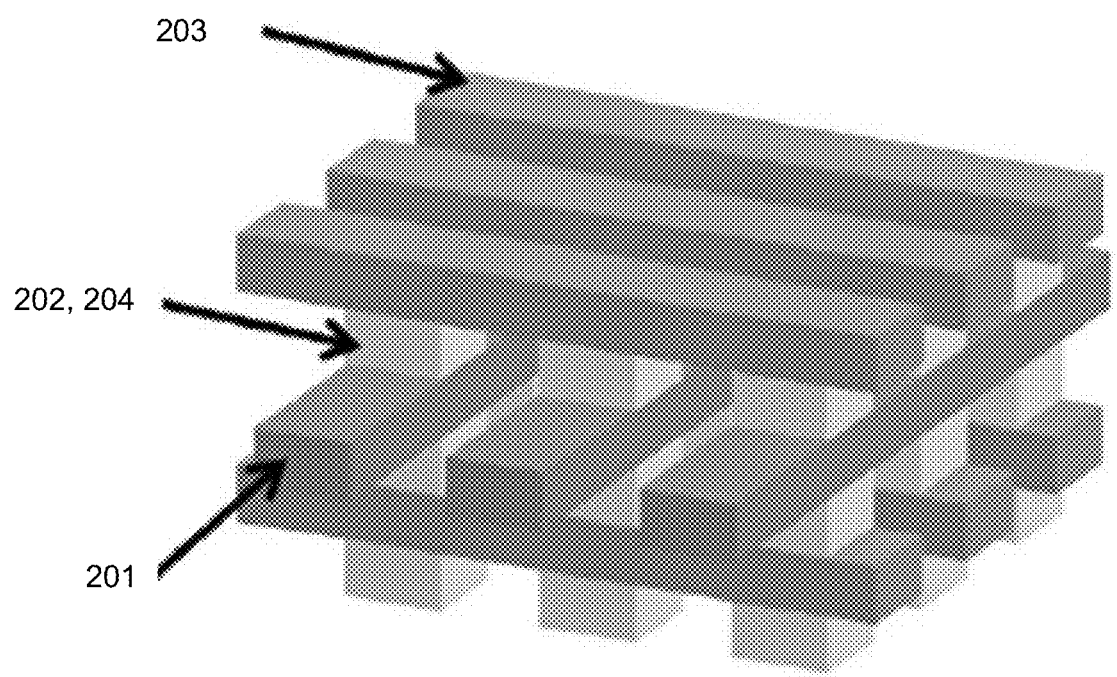

FIG. 2N is a schematic of a 2D cross point array which can be optionally stacked to create a stacked 3D cross point array. CCL 202 and memory cell 204 of memory elements 200 are integrated at the intersection of first 201 and second 203 signal lines. This integration scheme may have disadvantages in manufacturing cost and scaling cost/bit at higher density as each layer requires costly lithography/patterning (which may also comprise multi-patterning techniques such as double, triple, quadruple or greater) steps at minimum critical dimensions.

The present disclosure describes additional embodiments for 3D (vertical) integration of memory elements 200 into memory arrays with reduced manufacturing cost, improved yield, reliability, density, performance and scaling (cost and performance).

When a CCL is fabricated (e.g., using an ALD process as further described below), the material may be solid and amorphous. If this CCL is then heated above the glass transition temperature ($T_g$) for the corresponding composition, a portion of the CCL material may spatially or temporally melt or become otherwise deleteriously altered. This and other transformations depend on the composition and temperature. If this temperature is above the liquidus temperature ($T_{liq}$), (i.e., for a given composition based on the phase diagram), then the material remains homogeneous. The homogeneous liquid may be then rapidly cooled back below the glass transition temperature ($T_g$) and the liquid turns back into an amorphous solid state. The acceptable cooling rate depends on material composition. For example, $Ge_{17}Se_{83}$ may turn back into an amorphous solid even with "slow cooling", that is, under typical processing conditions, whereas $Ge_{30}Se_{70}$ films need to be quenched in nitrogen under vacuum for example, while $Ge_{41}Se_{59}$ films only turn back into an amorphous solid if the cooling rate is very high, such as quenching in nitrogen under vacuum and using a suitably chilled electrostatically clamped pedestal.

Different models and considerations can be used for estimating glass transition temperatures ($T_g$) and selecting the optimal composition. Below, we describe the compositions chosen according to at least one of those models. The relative magnitude of glass transition temperature ($T_g$) vs. composition can be used. However, one having skill in the art would understand that experimental values of glass transition temperature ($T_g$) can be higher than those in models. Furthermore, the desired values of glass transition temperature ($T_g$) may depend on various post-CCL fabrication processes and operating conditions. For example, while CCLs with glass transition temperature ($T_g$) of at least about 400° C. and even at least about 450° C. may be used, some CCLs may have lower glass transition temperatures ($T_g$).

Examples of CCL Compositions

As stated above, one challenging aspect of integrating CCLs into memory arrays and particularly into 3D memory arrays is to maintain their characteristics described above after fabricating these CCLs during the manufacturing process. For example, after CCLs are fabricated on a substrate (which may contain CMOS, access transistors, peripheral transistors, core and peripheral circuitry under and/or adjacent to the memory array) additional processing may be performed to fabricate other components. This processing may involve heating and/or exposing the previously fabricated CCLs to processing environments which may deleteriously alter their properties. For example, in some conventional process regimes, TiN is used as an electrode, conductive layer, barrier layer, or liner film layer deposited via CVD and is deposited at approximately 380° C. to 480° C. Heating can be particularly challenging as CCLs may change their morphology (e.g., crystallize) while heated.

Proposed aspects of mitigating crystallization of CCL materials involve using materials that remain amorphous when heated to 400° C. or even 450° C. and above. In some embodiments, CCLs have crystallization temperatures of greater than 400° C. and, in some embodiments, glass transition temperatures of greater than 450° C. Additionally, CCLs may temporally and spatially (locally) melt while heated and return back to the amorphous state by rapid cooling. Furthermore, low post-CCL-deposition temperatures processing and integration schemes may be used to reduce and even prevent crystallization of amorphous CCLs. In some embodiments, CCLs maintain their crystallinity content to less than 40% by volume, less than 30% by volume, less than 20% by volume, less than 10% by volume, and even less than 5% by volume. These materials will now be described in more detail.

Examples of CCL Germanium-Selenium-Tellurium Composition

In has been found that various tellurium rich germanium-tellurium combinations show good CCL properties. However, when these germanium-tellurium combinations are exposed to temperatures of at least about 400° C. or at least about 450° C., these materials may partially or locally crystallize and/or melt. It has been also found that a certain subset of these tellurium-rich combinations may remain amorphous (or glassy) even when exposed to temperatures of greater than about 400° C. or even greater than about 450° C. This subset may be expressed with a formula GexSeyTez, where X, Y, and Z represent percentage atomic concentrations, and X may be between about 0.14-0.20 or, more specifically, between about 0.16-0.18, Y may be between about 0.13-0.19 or, more specifically, between about 0.15-0.17, Z may be between about 0.64-0.70 or, more specifically, between about 0.66-0.68. One example may be referred to as $Ge_{0.17}Se_{0.16}Te_{0.67}$ example, based on a midpoint composition of the above ranges. However, one having ordinary skills in the art would understand that $Ge_{0.17}Se_{0.16}Te_{0.67}$ example includes a range of concentrations for its components as listed above.

In another example, which may be referred to as $Ge_{0.12}Se_{0.11}Te_{0.77}$ example, X may between about 0.09-0.15 or, more specifically, between about 0.11-0.13, Y may be between about 0.08-0.14 or, more specifically, between about 0.10-0.12, Z may be between about 0.74-0.80 or, more specifically, between about 0.76-0.78.

In another example, which may be referred to as $Ge_{0.04}Se_{0.10}Te_{0.86}$ example, X may be between about 0.01-0.07 or, more specifically, between about 0.05-0.06, Y may be between about 0.07-0.13 or, more specifically, between about 0.09-0.11, Z may be between about 0.83-0.89 or, more specifically, between about 0.85-0.87.

In yet another example, which may be referred to as $Ge_{0.12}Se_{0.24}Te_{0.64}$ example, X may be between about 0.09-0.15 or, more specifically, between about 0.11-0.13, Y may be between about 0.21-0.27 or, more specifically, between about 0.23-0.25, Z may be between about 0.61-0.67 or, more specifically, between about 0.63-0.65.

In addition to the examples presented above, the subset of the thermally stable tellurium-rich combinations includes a range of compositions that linearly extend between the $Ge_{0.17}Se_{0.16}Te_{0.67}$ example and the $Ge_{0.12}Se_{0.11}Te_{0.77}$ example. This linear extension applies to each of germanium, selenium, and tellurium in a 3D coordinate system representing concentrations of these three elements. It should be noted that the concentration for each element may vary 3 atomic % or, more specifically, 1 atomic % for each element from the linear extension such that the total composition is 100 atomic %. Similar linearly extended ranges apply to the $Ge_{0.12}Se_{0.11}Te_{0.77}$ example and the $Ge_{0.04}Se_{0.10}Te_{0.86}$ example and the $Ge_{0.12}Se_{0.11}Te_{0.77}$ example and the $Ge_{0.12}Se_{0.24}Te_{0.64}$ example.

A minimum in the $T_{liq}$ vs composition curve in a Ge—Te binary phase diagram at 85 atomic % Te, defines the binary eutectic temperature ($T_{eut}$) and the binary eutectic composition. At other compositions, if the post-deposition temperature ($T_{pdep}$) experienced by a CCL is below the liquidus temperature ($T_{liq}$) but above the eutectic temperature ($T_{eut}$), thermodynamically driven precipitation may occur in the CCL. For example, in Ge—Te CCL, if the average composition of the CCL (or of a particular portion of CCL in a case of a multilayer CCL) is between the eutectic composition and the composition of GeTe (i.e. <85 atomic % Te), the precipitating phase may include GeTe, whereas if the average composition of the CCL (or of a particular portion of CCL in a case of a multilayer CCL) is between the eutectic composition and pure Te (i.e. >85 atomic % Te), the precipitating phase may include crystalline Te. Furthermore, if the post-deposition temperature ($T_{pdep}$) experienced by the CCL is below the eutectic temperature ($T_{eut}$), then there is a thermodynamic driving force to precipitate both GeTe and Te.

Referring to the precipitation examples described above, if any of the precipitates are present and/or the CCL is held at this temperature long enough for the precipitates to fabricate, then the growth of the precipitates may result in a phase separation and formation of crystalline regions. Even if the precipitation does not occur, the material may form metastable crystalline phases. Typically, crystallization happens if the material is held for a sufficiently long time above the crystallization temperature ($T_c$). The crystallization may be avoided in any of the following cases: if the temperature is maintained below $T_c$ (in which case the crystallization may be hindered by sluggish kinetics), or if the temperature is raised above $T_{liq}$ (in which case the material may become liquid), or if the temperatures between Tc and $T_{liq}$ are only sustained for a short period such as those corresponding to the composition-dependent acceptable cooling rates as discussed above (in which case there may be not enough time for crystalline precipitates to form).

In some examples, the glass transition ($T_g$) temperature is equal to approximately two thirds of liquidus temperature ($T_{liq}$), i.e., $T_g \sim \frac{2}{3} T_{liq}$ (in units of K). In some examples, $T_g$ can be determined by bond energy. Furthermore, the crystallization temperature ($T_c$) may exhibit a maximum at topologically-favored compositions as described below. In some materials, the $T_c$ at topologically-favored compositions may rise to the liquidus temperature ($T_{liq}$) and/or become ill-defined as the crystallization may not occur on practical timescales in the absence of crystalline precipitates. For example, in the Ge—Se system, one can observe that $T_c$ rapidly increases towards $T_{liq}$ once the Se content is increased above approximately 71 atomic %, while above approximately 76 atomic % Se $T_c$ may become ill-defined or be sufficiently close to $T_{liq}$ such that it cannot be reliably measured. Once the Se content exceeds the range of the topologically-favored compositions, (approximately at 92 atomic % of Se), $T_c$ becomes lower than $T_{liq}$.

The ternary Ge—Se—Te phase diagram (not shown) may be used to identify liquidus isothermal contours, as well as cotectic boundary curves, and miscibility boundary curves. In the Te-rich region, it should be understood that moving along the Ge—Te binary edge, the binary eutectic composition identified above (85 atomic % Te) coincides with the end point of the cotectic line where the liquidus temperature is less than 400° C. (375-388° C. according to the binary diagrams). The expected glass transition temperate ($T_g \sim \frac{2}{3} T_{liq}$) would be approximately 175° C., which is in agreement with the actual glass transition temperate ($T_g$) of 150° C. However, such low temperatures may be not sufficient for post-deposition processing.

Moving away from the Ge—Te binary eutectic (i.e., substituting small amounts of tellurium (Te) with selenium (Se)), only lowers the liquidus temperature towards the minimum at the ternary eutectic point. However, once the cotectic line is crossed, adding even larger amounts of Se increases the liquidus temperature ($T_{liq}$) to 400° C., then to 450° C. and eventually nearly 500° C. This increase occurs before crossing the next cotectic line. The crossing of the good-glass-forming line and the miscibility boundary line may correspond to compositions of $Ge_{17}Se_{16}Te_{67}$ example described above. For this example, the glass transition is expected to raise to about 230° C., i.e., $T_g \sim \frac{2}{3} T_{liq} \sim 230°$ C. As such, temperature of up to 230° C. may be used for certain post-deposition processing and operation of the CCL. While this temperature limitation may be insufficient for typical post-deposition processing embodiments, such as fabricating the second electrode (438 in FIG. 4A) by CVD deposition of TiN at approximately 380° C. to 480° C., it may be used with some other choices of post-deposition processes. For example, in some embodiments, fabricating the second electrode (438 in FIG. 4A) is done by lower temperature ALD deposition using appropriate ligands.

Above glass transition temperature ($T_g$) but below liquidus temperature ($T_{liq}$), the material may spatially and/or temporally melt. Without being restricted to any particular theory, it is believed that a driving force for precipitation of small amounts of $GeSe_2$ exists at these conditions. This would drive the composition of the remaining liquid. However, due to the very small amount of the required $GeSe_2$ precipitation, it is unlikely that the precipitates of sufficient size would have been fabricated. If, however, some $GeSe_2$ precipitates do fabricate, then this precipitation/crystallization can be corrected by briefly heating the CCL above the liquidus temperature ($T_{liq}$) to dissolve these precipitates. For example, rapid thermal treatment at 500° C. for between 3 and 10 seconds immediately followed by cooling in a nitrogen environment using an electrostatically clamped pedestal configured with a chiller can be used to dissolve possible precipitates of $GeSe_2$. Due to a small selenium (Se) content, the material behaves as a CCL, and due to a substantial (Ge, Te) content the material would have a relatively high band gap and small leakage.

Increasing tellurium (Te) concentration allows one to remain within the good-glass-fabricating window as described below. Furthermore, increasing tellurium (Te) concentration will further raise the expected glass transition temperature ($T_g$). For example, the glass transition temperature ($T_g$) for the composition $Ge_{0.12}Se_{0.11}Te_{0.77}$ is approximately 250° C. In other aspects, the behavior of the material at this composition is similar.

The composition may be $Ge_{0.04}Se_{0.10}Te_{0.86}$. This corresponds to a composition at the quasi-binary $GeSe_2$—Te, and the liquidus temperature ($T_{liq}$) for this composition is 560° C., corresponding to the eutectic-like minimum of $T_{liq}$. The glass transition temperature ($T_g$) is expected to be about 280° C. The compositions in between $Ge_{0.17}Se_{0.16}Te_{0.67}$ and $Ge_{0.04}Se_{0.10}Te_{0.86}$ may exhibit acceptable characteristics for some CCL embodiments.

If the liquidus temperature ($T_{liq}$) is identified with the miscibility temperature ($T_{misc}$), then due to a much higher liquidus temperature ($T_{liq}$) temperature in the immiscible region it is possible that the glass transition temperature ($T_g$) is further increased such that the material never melts and is thus never allowed to phase separate. For example, following along the $GeSe_2$—Te line, the following composition is identified—$Ge_{0.12}Se_{0.24}Te_{0.64}$. The miscibility temperature ($T_{misc}$) may be greater than about 700° C.

If the miscibility temperature ($T_{misc}$) is identified with liquidus temperature ($T_{liq}$), such as $T_g \sim \frac{2}{3} \times T_{misc}$, then the glass transition temperature ($T_g$) may be greater than 375° C. for this $Ge_{0.12}Se_{0.24}Te_{0.64}$ composition. CCL compositions between $Ge_{0.12}Se_{0.11}Te_{77}$ and $Ge_{0.12}Se_{0.24}Te_{0.64}$ may reduce risk of phase separation and increase the glass transition temperature ($T_g$).

Examples of CCL Germanium-Sulfur-Tellurium Composition

In some embodiments, the CCL material composition is represented by the formula $Ge_{12+x}S_{24+2x}Te_{64-3x}$, where x is between 0 and 2, or by the formula $Ge_{12+x}S_{8+10x}Te_{80-11x}$, where x is between 0 and 2.

Specific examples include $Ge_{0.14}S_{0.28}Te_{0.58}$, $Ge_{0.12}S_{0.24}Te_{0.64}$ and $Ge_{0.12}S_{0.08}Te_{0.80}$. In some embodiments, selenium (Se) may be added to these compositions to replace some of sulfur (S), e.g., $Ge_{0.12}Se_xS_{0.24-x}Te_{0.64}$ with x<0.12, such as with x<0.10. A specific example may be $Ge_{0.12}Se_{0.10}S_{0.14}Te_{0.64}$. In some embodiments, Ge—Se—S—Te compositions belong to the quasi-ternary $Ge_{0.12}S_{0.88}$—$Ge_{0.12}Se_{0.88}$—$Ge_{0.12}Te_{0.88}$ and CCL composition would be within the region limited by $Ge_{0.12}S_{0.24}Te_{0.64}$, $Ge_{0.12}S_{0.08}Te_{0.80}$, and $Ge_{0.12}Se_{0.10}S_{0.14}Te_{0.64}$ compositions if plotted within the Gibbs triangle of this quasi-ternary. In all the above cases, one may accept some additional deviations in Ge/(Se+Te) ratio, but no more than 5 atomic % (e.g., <1 atomic %).

The CCL will have a liquidus temperature ($T_{liq}$) above 750° C., and most likely above 800° C. in the good glass forming region at approximately 64 atomic % of tellurium (Te) corresponding to a CCL composition of $Ge_{0.12}S_{0.24}Te_{0.64}$. Using $Tg \sim \frac{2}{3}T_{liq}$ as described above, this implies the estimated glass transition temperature ($T_g$) is greater than 400° C. or, more specifically, greater than 450° C. for and around $Ge_{0.12}S_{0.24}Te_{0.64}$ composition. A decrease in tellurium (Te) content to around $Ge_{0.14}S_{0.28}Te_{0.58}$ composition may improve both the glass-forming properties and the glass transition temperature ($T_g$).

It should be noted that a substantial content of sulfur (S) may potentially change the CCL characteristics when added to Te-rich, Ge—Te alloys. From atomic structure simulations of different material compositions, it has been found that Ge—S alloys tend to fabricate 4-member rings (Ge—S—Ge—S). Due to the atomic size mismatch, sulfur (S)-containing 4-member rings are unlikely to accept tellurium (Te). In other words, Ge—S—Ge—Te rings would be less likely to form at small concentrations of sulfur (S), such as less than about 10 atomic %. However, at high concentrations of sulfur (S), formation of Ge—S—Ge—Te rings would promote local structures characteristic of Ge—S rather than Ge—Te. This would potentially modify the CCL behavior. In some embodiments, changing composition to $Ge_{0.12}S_{0.08}Te_{0.80}$ with tellurium concentration varying between 78 and 82 atomic %, the CCL will have the liquidus temperature ($T_{liq}$) of at least about 750° C. with the glass transition temperature ($T_g$) estimated at greater than 400° C.

Sulfur (S) content can be reduced in a CCL by substituting some sulfur (S) with selenium (Se). In other words, the CCL may include all four elements, i.e., germanium (Ge), sulfur (S), selenium (Se), and tellerium (Te). The Ge—S—Se phase diagrams along the $GeS_2$—$GeSe_2$ cross-section demonstrate a near-linear behavior of the liquidus temperature ($T_{liq}$).

The glass-fabricating compositions along the $GeSe_2$—Te line fall within a two-phase liquid-liquid region. This can be derived from the phase diagrams, $Ge_{0.14}S_{0.28}Te_{0.58}$ along the $GeS_2$—Te composition, and $Ge_{0.04}Se_{0.10}Te_{0.86}$ along the $GeSe_2$—Te composition. The near-linear behavior may also be used to estimate the compositions at which the liquid-liquid immiscibility develops. In order to stay within the good-glass-forming region, 12 atomic % Ge is needed as described above. In this case, $Ge_{0.12}Se_xS_{0.24-x}Te_{0.64}$ alloys with x<0.096 (x<0.10 within the accuracy of the data) would remain miscible and stay within the good-glass-forming region. According to the above analysis, these may also have the glass transition temperature ($T_g$) estimated at greater than 400° C.

Examples of CCLs Comprising Germanium and Chalcogen

In some embodiments, the CCL has a composition represented by the following formula: $Ge_{0.27+\Delta}S_{0.73-\Delta-z2-z3}Se_{z2}Te_{z3}$, with A ranging between 0-0.08 or, more specifically, between 0-0.04, z2 ranging between 0-0.40 or, more specifically, between 0-0.20, and z3 ranging 0-0.20 or, more specifically, between 0-0.10. In another example, A may range between 0-0.73 or, more specifically, between 0.02-0.48, z2 ranging between 0-0.25 or, more specifically, between 0-0.15, and z3 ranging 0-0.20 or, more specifically, between 0-0.07 or between 0.03-0.07. More specific examples include $(Ge_{0.42+z3}S_{0.58-2z3}Te_{z3})_{1-x}(Ge_{0.42}Se_{0.58-z3}Te_{z3})_x$, or $Ge_{0.48}S_{0.52-z2-z3}Se_{z2}Te_{z3}$, or $Ge_{0.54}S_{0.46-z2-z3}Se_{z2}Te_{z3}$, or $(Ge_{3-z3}S_{0.97}Te_{z3})_{1-x}(Ge_{0.91-z3}Se_{0.09}Te_{z3})_x$. These materials may be fabricated in an amorphous state. Furthermore, for these compositions, it is preferable to control the uncapped post CCL deposition temperature to be less than 400° C.

In some embodiments, efficient removal of locally generated joule heat is provided. In some embodiments, the removal of the locally generated joule heat is performed by metallic or carbon layers, which may be good heat conductors. For example, the second electrode fabricated in step 438 in FIG. 4A may have a sufficient thickness to absorb the generated joule heat, or may extend laterally sufficiently far from the region where most of the joule heating is generated, depending on the specific design of the memory array.

Without being restricted to any particular theory, it is believed the glass transition temperature ($T_g$) in glasses could be related to the chemical energy associated with bond breaking. In chalcogen-rich films, the glass transition temperature ($T_g$) could be controlled primarily by van-der-Waals slips. If the van-der-Waals-slip mechanism begins to become important once the number of chemical bond constraints becomes smaller than the number of the degrees of freedom (as further described below) and becomes the primary factor determining the glass transition temperature ($T_g$) in pure chalcogenides, then the expected glass transition temperature ($T_g$) can be found as a function of composition at various Ge—Te—Se—S compositions, as shown in FIG. 11.

Figure 11:
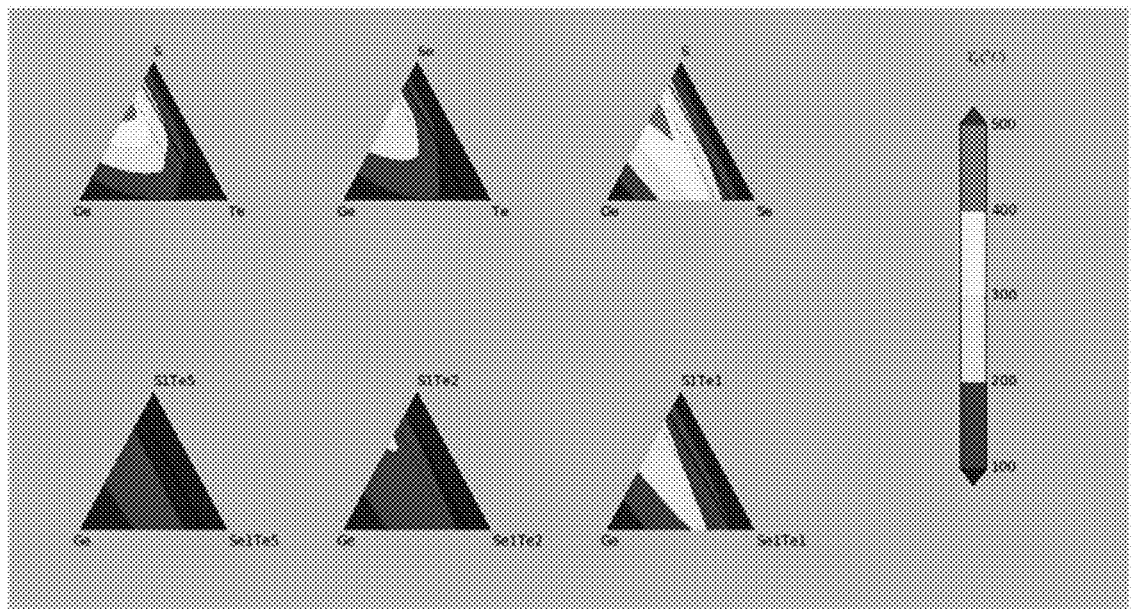
FIGS. 11, 12, and 13A-13D are glass transition temperature ($T_g$) diagrams for different compositions.

The solid black line in the diagrams of FIG. 11 shows the topologically-favored compositions as described below, fabricating where recrystallization is expected to be the slowest. As such, for more chalcogen-rich compositions the glass transition temperature ($T_g$) is expected to be less than 300° C. or even less than 200° C. if more than half of chalcogen atoms are tellurium (Te) atoms as, for example, shown in the bottom three diagrams of FIG. 11.

The dotted black line in the diagrams of FIG. 11 shows the lowest chalcogen content at which the good class-fabricating properties are expected as further described below. At higher chalcogen contents, the recrystallization temperatures ($T_c$) can be expected to substantially exceed the glass transition temperature ($T_g$) as also further described below. It is seen that based on the chemical bond model, good glass-fabricating Ge—Te—Se—S materials are not expected to have the glass transition temperature ($T_g$) reaching or exceeding 400° C. However, the kinetics in overcooled liquids just above glass transition temperature ($T_g$) is quite slow, and their viscosity is very high. Thus, thin films at compositions listed above can substantially behave as solid glasses over the short period of time required for subsequent processing (such as deposition of TiN electrodes/signal lines). These materials are expected to have the glass transition temperature ($T_g$) above 300° C. or, more specifically, about 350° C.

Materials with less chalcogen content (e.g., less than 73 atomic %, such as less than 60 atomic %) may have recrystallization temperatures ($T_c$) closer to the glass transition temperature ($T_g$). However, in Ge-rich compositions (e.g., greater than 50 atomic % of Ge), the glass transition may be not observed and the above model may not hold.

However, many of the above-listed materials can be deposited as amorphous solids (e.g. a-Ge) by thin film deposition methods. In such deposition methods, amorphous solids kinetics may be suppressed sufficiently for them to behave in many aspects as glasses below some effective glass transition temperature ($T_g$). Without being restricted to any particular theory, it is believed that the above-presented model can be modified so that it yields reasonable values of such an effective glass transition temperature ($T_g$) in amorphous materials such as a-Ge. This modification produces "effective" glass transition temperature ($T_g$) plots presented in FIG. 12.

Based on this model, compositions identified above may be used for CCLs when these materials are deposited in an amorphous state. Various deposition techniques to achieve these compositions are described below. However, when crystallization is induced due to excessive heating and/or operation of the CCL (e.g., in the presence of strong electric fields and currents/joule heating generated by the currents), then these materials may behave more as memory elements than as a CCL. Avoiding excessive temperatures during later processing steps and/or efficient removal of local heating during operation of a CCL may be used. Furthermore, to minimize the memory-like behavior in such materials, the composition may be selected around the eutectic compositions in the liquid state. These compositions may maximize the geometric frustration to the local atomic structure. Linearly interpolating the compositions of the four different types of eutectic points seen in the liquidus diagrams, and subject to the above constraints on compositions from the viewpoint of Tg, the compositions should be further chosen roughly along $(Ge_{0.42-z3}S_{0.58-2z3}Te_{z3})_{1-x}(Ge_{0.42}Se_{0.58-z3}Te_{z3})_x$, or $Ge_{0.48}S_{0.52-z2-z3}Se_{z2}Te_{z3}$, or $Ge_{0.54}S_{0.46-z2-z3}Se_{z2}Te_{z3}$, or $(Ge_{3-z3}S_{0.97}Te_{z3})_{1-x}(Ge_{0.91-z3}Se_{0.09}Te_{z3})_x$.

Examples of Silicon Based CCLs

In some embodiments, CCLs have a composition expressed by the following formula: $Si_{0.26-g2}Ge_{g2}S_{0.74-z2-z3}Se_{z2}Te_{z3}$, where $3*g2+z2+2*z3$ is less than 0.60 or, more specifically less than 0.30. For example, z2 can be as large as 0.60 and z3 as large as 0.30, but if z2=0.30 then z3 will be up to 0.15, not 0.30 as before. Independent deviations of each of the parameters (g2, z2, and z3) may be up to 0.04 or more specifically up to 0.01. In some embodiments, the net content of chalcogens is between about 0.70-0.78 or, more specifically, between 0.73-0.75. Such compositions can be understood as $Si_{0.26}S_{0.74}$ in which some Si may be substituted by Ge and/or some S may be substituted by Se and/or Te. For example, $Si_{0.26}S_{0.74}$ with <10 atomic % of Ge substituted for Si, or <30 atomic % of Se substituted for S, or <15 atomic % of Te substituted for S).

In some embodiments, CCLs have a composition expressed by the following formula: $Si_{0.27-\Delta-g2}Ge_{g2}S_{0.73+\Delta-z2-z3}Se_{z2}Te_{z3}$, where $10*\Delta+5*g2+z2+3*z3$ is less than one or more specifically less than 0.5. Each of Δ, g2, z2, and z3 are limited between 0 and 100%, e.g. <33% Te only (such as <25%), or <10% excess S in Si—S only (such as <5%). In some embodiments, the thermal processing above 350° C. or, more specifically, above 300° C. is limited to a relatively short period of time.

In some embodiments, CCLs have a composition expressed by the following formula: $(Si_{1-x}Ge_x)_{0.27+\Delta}Ge_{g2}S_{0.73-\Delta-z2-z3}Se_{z2}Te_{z3}$, where Δ is between about 0-0.73, x is between about 0-1, $z2-\Delta*(6-4.5*x)$ is less than 0.50, and $z3-\Delta*(¼+x/8)+z^{2/5}$ is less than 0.20.

Unlike Ge-based systems described above, experimental ternary phase diagrams are not available for Si-based systems. However, it is believed that the analysis applied to Ge-based can be extended to Si-based systems. Specifically, the Ge-based model can be extended using the Si—Si homopolar energy and the heteropolar energies calculated from electro-negativities using Pauling relationship in the fabricate $$E_d(AB) = \sqrt{E_d(AA)E_d(BB)} + 1.3(\chi_A - \chi_B)^2 \text{ eV}$$

Figure 13A:
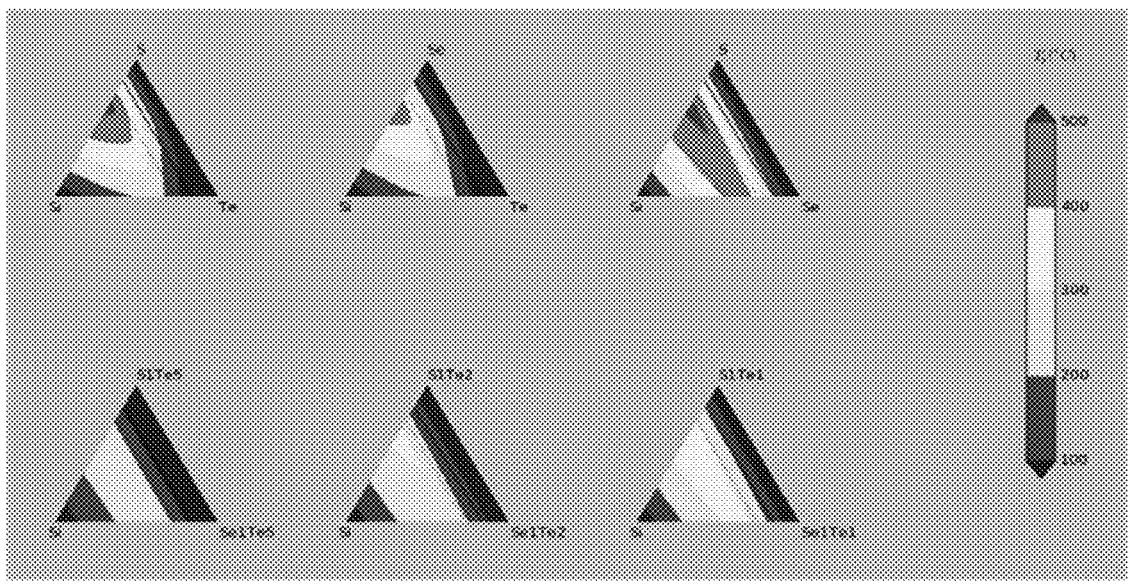
Figure 13B:
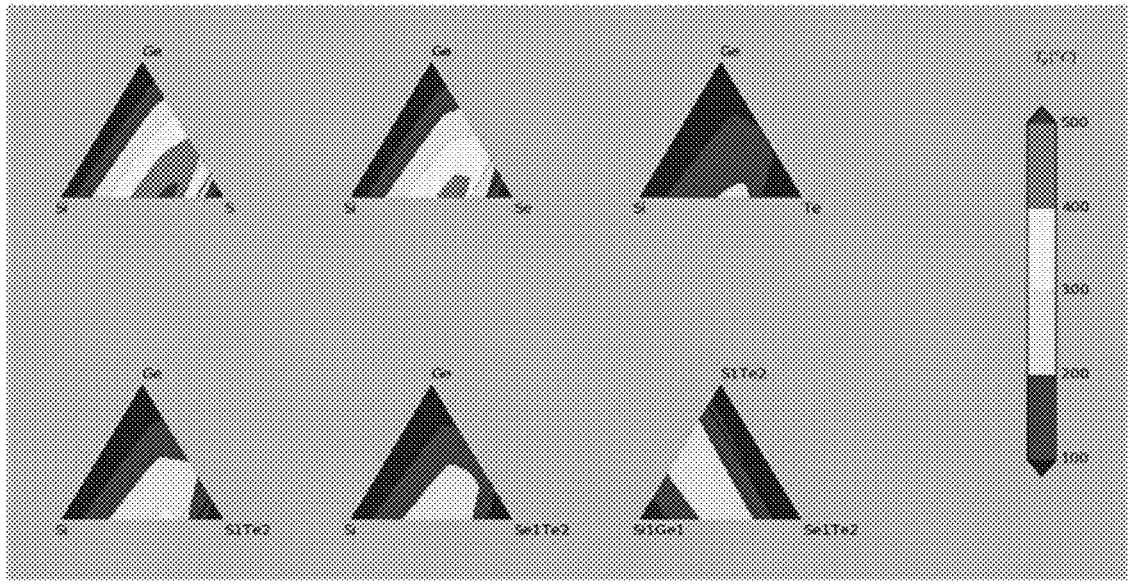

Assuming the same contribution from the van-de-Waals-slips as in the model describe above and other parameters of that model, the expected glass transition temperature ($T_g$) can be found as a function of composition at various Si—Te—Se—S and Si—Ge—Te—Se—S compositions, as shown in FIGS. 13A and 13B.

The extended model suggests that, unlike in Ge-based systems, glass transition temperatures ($T_g$) of greater than 400° C. may be achieved within the good-glass-forming region (on the chalcogen-rich side of the dotted line) at around $Si_{0.26}S_{0.74}$ composition, or more generally around $Si_{0.26-g2}Ge_{g2}S_{0.74-z2-z3}Se_{z2}Te_{z3}$, where, 3*g2+z2+2*z3 is less than 0.60 or, more specifically, less than 0.30. In this example, the concentration of germanium (Ge) may be less than 10 atomic %, the concentration of selenium (Se) may be less than 10 atomic %, the concentration of tellurium (Te) may be less than 15 atomic %. Deviations <4%, such as <1%, from the net 74% chalcogen content may be uses. These compositions are expected to withstand processing temperatures of greater 400° C. without crystallization. CCL's are formed using the aforementioned composition range in some embodiments.

Figure 13C:
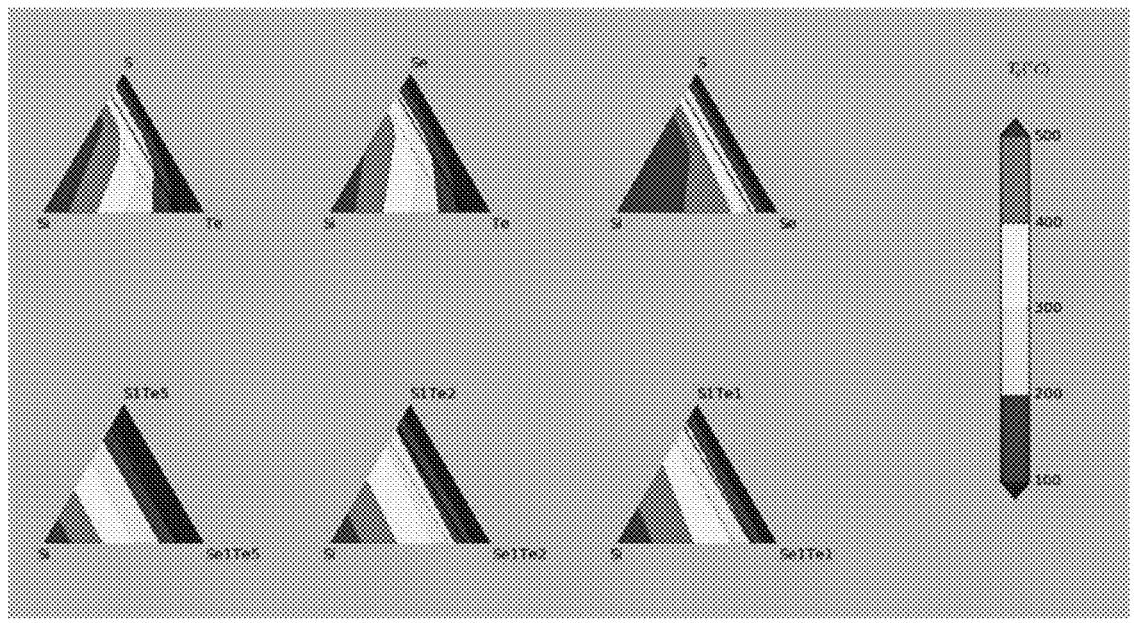
Figure 13D:
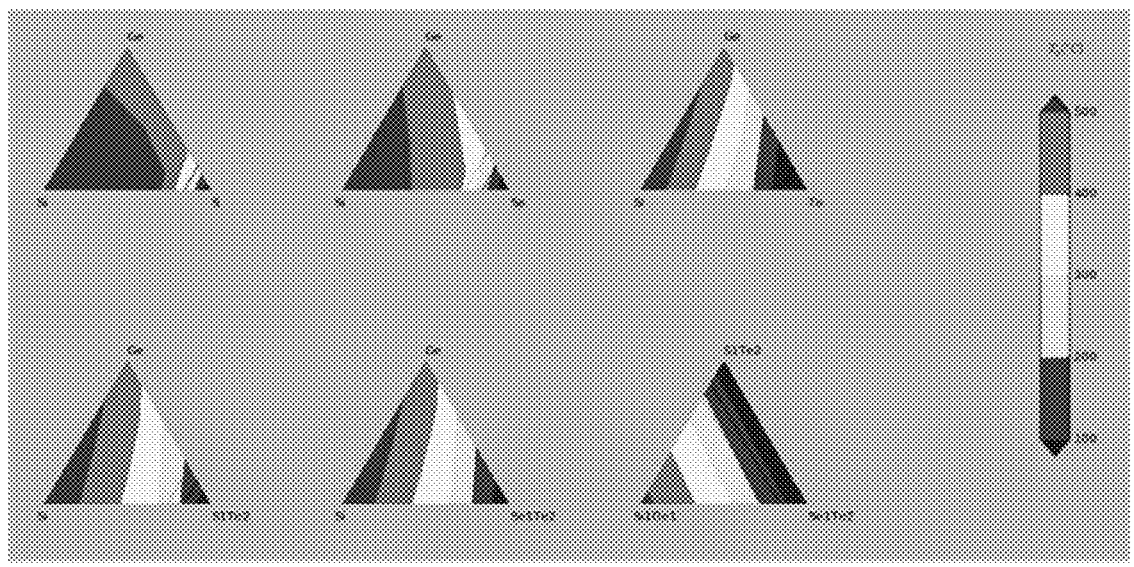

Further, if the time required for subsequent processing at elevated temperatures is relatively short, a much larger chalcogen content may be used in comparison to the germanium-based compositions described above. Specifically, in order to have glass transition temperatures ($T_g$) above ~300° C. (such as above ~350° C.), and substantially behave as solid glasses over a short period of time required for subsequent processing (such as deposition of TiN electrode), CCL may have compositions $Si_{0.27-\Delta-g2}Ge_{g2}S_{0.73+\Delta-z2-z3}Se_{z2}Te_{z3}$, where 10*Δ+5*g2+z2+3*z3 is less than 1 or, more specifically less than 0.5. Each of Δ, g2, z2, and z3 may be ranging between 0 and 100%. For example, the concentration of tellurium (Te) may be less than 33 atomic % or, more specifically, less than 25 atomic %, while the concentration of sulfur (S) may be less than 10 atomic % or, more specifically, less than 5 atomic %. Modifying the Ge-based model to produce an interpolation to reasonable values of "effective $T_g$" in a-Ge and a-Si suggests the maximum allowed processing temperatures as shown in FIGS. 13C and 13D.

Based on this model, CCL may have compositions $(Si_{1-x}Ge_x)_{0.27-\Delta}Ge_{g2}S_{0.73-\Delta-z2-z3}Se_{z2}Te_{z3}$, with Δ ranging from 0–0.73, x ranging from 0 to 1, and z2−delta*(6−4.5*x) being less than 0.5 and z3−delta*(¼+x/8)+z2⅖ being less 0.2.

In some embodiments, the CCL has a well-defined band gap 0.5 to 3.5 eV, such as 0.7 to 1.8 eV, with low density of tail states within the band gap. In some embodiments, the materials have a pseudo band gap (or a gap with a high density of tail states) 0.4 to 3.0 eV, such as 0.9 to 2 eV. In some embodiments, the gap between mobility edges at low fields is no less than 0.8 eV, such as no less than 1 eV. Small band gaps degrade the OFF currents.

When values of the band gap are too low (such as less than 0.5 eV), the CCL may have an induced leakage by multiple mechanisms, including direct and Fowler-Nordheim tunneling, trap-assisted tunneling, and band-to-band tunneling. Simulations indicate that in order to sustain low leakage levels, band gap of at least 0.5 eV is needed or, more specifically, at least 0.8 eV. However, some states near the band edges may be localized (below the mobility edge). Simulations treating such states as defect states (with a high density) indicate that if a mobility edge exceeds 0.8 eV and particularly 1 eV, the preferred band gap requirement can be reduced to 0.7 eV.

Additional density of states within the band gap, due to tail states or due to incomplete separation of valence and conduction states (i.e. a pseudogap) further increases leakage, and the preferred band gap value is 0.9 eV even if the mobility edges are at 1 eV. On the other hand, a high density of states typically implies a very low mobility above the mobility edge, which in extreme cases allows for reasonably low OFF currents.

The largest values of band gap are limited by the need to have high ON current and the specific requirements depend on the mechanism of CCL operation. Different mechanisms may be involved. Assuming the band gap remains unchanged in the ON state (and reasonable values of other parameters, as well as low OFF currents), high ON currents are hard to achieve with band gap values in excess of 2 eV, such as 1.8 eV. However, CCL operation may involve a change in the density of states (DOS) in the ON state. The maximum rate of change seen in density functional theory (DFT) simulations suggests that ~1.5 eV of additional band gap may be acceptable, setting the upper limit at 3.5 eV.

Examples of Chalcogenide-Based CCLs with Charged Layers

In some embodiments, a CCL comprises a charged layer, such as a layer comprising ionized entities (atoms, or atomic arrangements effectively equivalent to point defects in crystalline materials) that may carry an electric charge that within the extent of the charged layer is not compensated by opposite-sign charges. One having ordinary skills in the art would understand that opposite-sign charges may compensate some, but not all of the ionized entities. One having ordinary skills in the art would understand that the charged layer may remain charged in both on and off state of the CCL, or only become charged in the off state, or only become charged in the on state. In some embodiments, a CCL comprises a non-charged layer adjacent to the charged layer.

In some embodiments, the charged layer comprises entities creating a state in the electronic density of states (eDOS) not lower than 0.2 eV below conduction band minimum (CBM) (i.e. not further away in energy than 0.2 eV from CBM) that carries positive charge as long as this state is above the local quasi-Fermi level. In some embodiments, the low-field electron mobility edge is taken as the position of the CBM in the above criterion.

In some embodiments, the mode of operation of the memory element attached to CCL is such that high current level (the ON state) is only required for the current direction from the part of the CCL that does not have the charged layer towards the charged layer (i.e. when a negative voltage is applied to the electrode adjacent to the charged layer).

In some embodiments, the charged layer comprises entities creating a state in the electronic density of states (eDOS) not higher than 0.2 eV above valance band maximum (VBM) (i.e., not further away in energy than 0.2 eV from VBM) that carries a negative charge as long as this state is below the local quasi-Fermi level. In some embodiments, the low-field hole mobility edge is taken as the position of the VBM in the above criterion.

In some embodiments, the memory element attached to CCL is such that high current level (the ON state) is only required for the current direction from the charged layer towards the part of the selector that does not have the charged layer (i.e. when a positive voltage is applied to the electrode adjacent to the charged layer).

In some embodiments, the charged layer extends no more than 50% of thickness of the CCL, such as no more than 25% of the thickness of the CCL and has no less than 2e19 per cubic centimeter, such as no less than 1e20 per cubic centimeter of such charged entities. A thinner CCL is advantageous for manufacturing.

Figure 14:
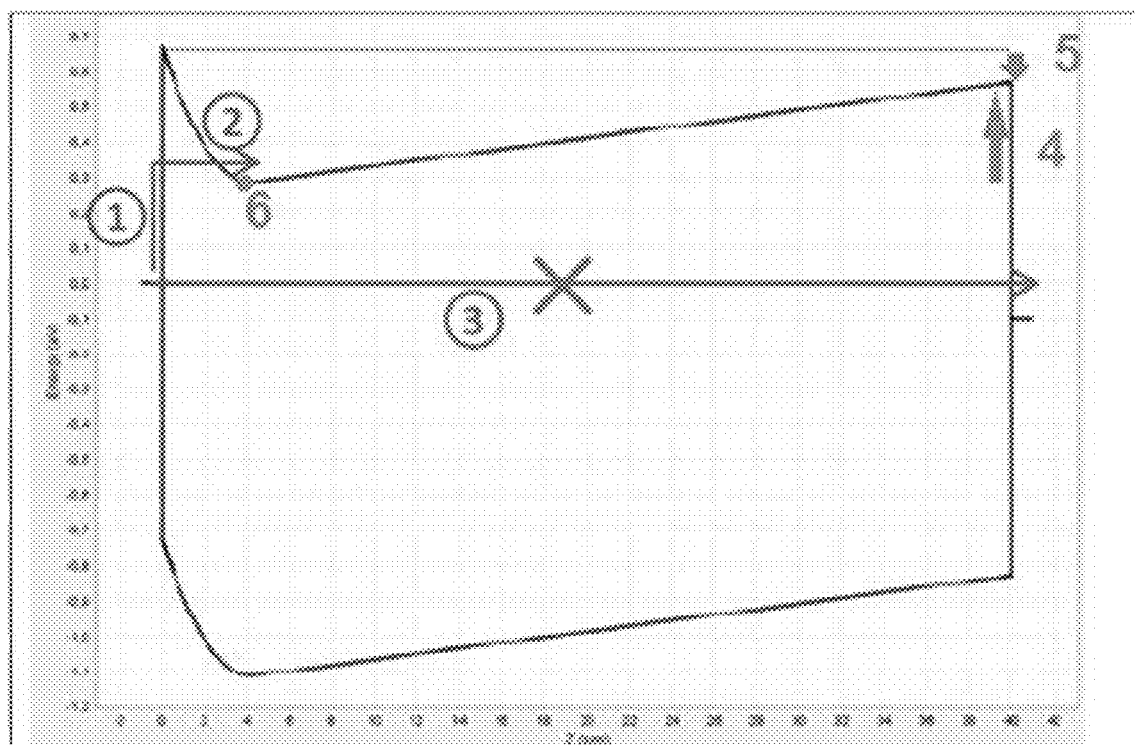
FIG. 14 is a simulation of a charge layer on one side of a semiconducting layer between two electrodes showing current-voltage non-linearity.

Without being restricted to any particular theory, it is believed that a presence of a charged layer on one side of a semiconducting material between two electrodes may lead to current-voltage non-linearity, particularly at low voltages, as can be demonstrated in device simulations. In some embodiments, this current-voltage non-linearity may be largely due to the band bending that creates a narrow barrier at the electrode adjacent to the charged layer, as illustrated in FIG. 14 for the case of a charged layer carrying a positive charge. (The case of a charged layer carrying a negative charge will be described by a figure obtained by flipping FIG. 14 vertically.)

Figure 15:
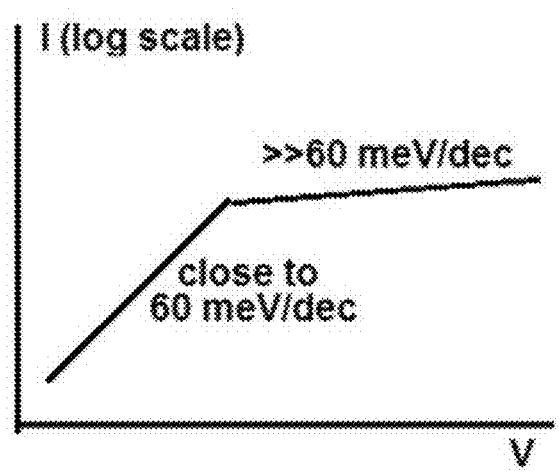
FIG. 15 is an example of an I-V plot where the resulting current is determined by thermions above a barrier layer.

With reference to FIG. 14, while direct tunneling (3) through the entire thickness of a semiconducting material is strongly suppressed, thermionic excitations (1) can tunnel through the narrow barrier (2) with a high probability. However, many such thermions (1) after tunneling (2) are contained by the second barrier (4), and eventually tunnel back to the original electrode. The diffusion current is determined by the barrier lowering (5) due to the applied voltage. The resulting current is effectively determined by the thermions above the remaining barrier (4), and as a result the current nonlinearity is approaching the thermal slope (around 60 meV/dec at room temperature and higher at elevated temperatures). Once the applied voltage reaches this critical value, the current nonlinearity changes, e.g. as illustrated in FIG. 15 for the case of room temperature (corresponding to the thermal slope of around >60 meV/dec) and a usual semiconducting material (not possessing inherent "selector-like" properties). For practical implementation, two factors would limit the operation of a CCL device based solely on the presence of such a charged layer. Both factors restrict the maximum value of the ON current and become important once the barrier lowering (5) in FIG. 14 due to the applied voltage becomes sufficiently large for the barrier (4) in FIG. 14 to disappear.

For a usual semiconducting material such as crystalline Si, Ge, III-V semiconductors, the current levels at higher V are determined by a combination of the carrier band transport (in the conduction band for the case in the figure, or in the valence band for the negative charged layer), and the limitation of the supply of the tunneling thermions (1), (2) in FIG. 14 to the point of maximum barrier lowering (6) in FIG. 14 due charged-layer-induced band bending. Due to the carrier band transport limitation, achieving high current levels may require that the material exhibits high-field mobility approaching that of high-quality single crystal silicon, which is unlikely in amorphous or even moderate-quality crystalline materials. As to the limitation of the maximum supply of thermions, it is set by the Richardson constant pre-factor, which at room temperature allows for no more than $1 \times 10^7$ A/cm$^2$ thermionic current density even in the case of zero thermionic excitation barrier (i.e. point (6) in FIG. 14 as low as at the Fermi level of the electrode adjacent to the 'charged layer"). In practice, the supply of tunneling thermions is lower due to a finite tunneling probability, and the thermionic barrier at point (6) in FIG. 14 is typically larger than zero both because the charged entities may become neutralized when the local quasi-Fermi level crosses the corresponding states, and because a strong band bending is eventually opposed by the accumulation of free carriers.

In some embodiments, in order to achieve high current levels, the CCL employs a material that exhibits "selector-like" behavior (which is due to mechanisms other than band-bending). Examples of such materials are the chalcogenide materials described in the previous sections, e.g. $Ge_{0.16}Te_{0.84}$, or $Ge_{0.12}Si_{0.08}S_{0.08}Se_{0.16}Te_{0.56}$. However, the presence of the charged layer may help to further suppress the off currents, thus improving the properties of the CCL. In some embodiments, the charged layer comprises one of the materials described above comprising metal atoms together with chalcogen and other atoms. For example, the charged layer can be a material with formula $A_g B_p M1_{m1} X_h Z_{1-g-p-m1-h}$, where A includes one or more of Ge, Si, or C, B may include zero or more of Sb, As, P, or N, M1 can be copper (Cu), silver (Ag), titanium (Ti), molybdenum (Mo), or tungsten (W), X may include one or more of I, Br, or Cl (however, no halides may be used in some examples), and Z includes one or more of Te, Se, S, and the atomic fraction g is chosen around the values $g_{coord,1} = (2+3h-5p+3m1)/12$. In some other embodiments, the charged layer comprises one of the materials described above not comprising metal atoms, with additional "dopant" atoms that may create the ionized entities.

In some embodiments, with reference to FIG. 14, in order to achieve substantial tunneling (2) of thermions (1) compared to the suppressed direct tunneling (3), the charged layer needs to extend a small fraction of thickness of the CCL, preferably no more than 25%, and generally no more than 60%. At the same time, in order to achieve a substantial bend bending, the thickness of the charged layer should be no less than 7 nm and it should have no less than 2e19 per cubic centimeter, such as no less than 1e20 per cubic centimeter of charged entities.

Typically, charged entities create states in the eDOS, such as in the band gap, such that the charge state of such an entity changes, e.g. from charged to neutral, once the local quasi-Fermi level crosses the energy of this state. This limits the maximum band bending that can be induced by the presence of such entities. If the corresponding state is within 0.2 eV from the band edge (e.g. being brought closer to the Fermi level), then the maximum supply of thermionic current density is reduced from $1e^7$ A/cm$^2$ to $4e^5$ A/cm$^2$. In order for thermionic levels to become appreciable, the state should be less than 0.2 eV (preferably less than or equal to 0.1 eV) from the band edge.

In some embodiments, the charged layer extends the entire thickness of the CCL. Without being restricted to any particular theory, a portion of the adjacent memory element may play the electrical role of the non-charged layer in such embodiments.

Examples of Capped CCLs with Enhanced Thermal Stability

As described above, a portion of CCLs may spatially or temporally melt during processing or subsequent processing and can stay substantially glassy and behave as a CCL if cooled rapidly. In some embodiments, a portion of the CCLs may be capped with another layer with a composition that is more thermally stable (e.g. higher $T_g$) and/or with a composition which crystallizes. This serves as to stabilize the CCL composite to facilitate subsequent processing at elevated temperatures. In some embodiments, multiple layers of materials with different compositions are deposited by methods that ensure conformal coverage, such as ALD or CVD.

Figure 12:
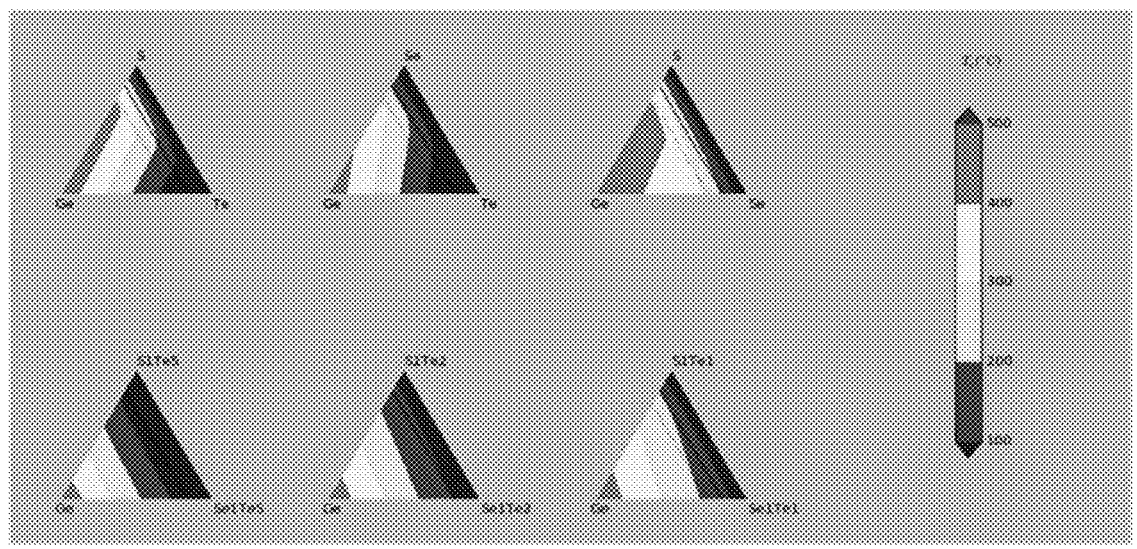

From the two different models for Tg discussed above (one model based on $T_g \sim \frac{2}{3} T_{liq}$, where $T_{liq}$ can be read off phase diagrams; the other model leading to Tg estimates shown in FIGS. 12, 13), most compositions rich in Te (such as having >80 atomic % of Te) have low glass transition temperature $T_g$<400° C. However, such Te-rich materials are known to show electrical and cycling properties desirable for CCL operation. If such materials are exposed to higher thermal budgets, such as during certain CVD TiN electrode deposition processes, performed above 400° C. (i.e. above $T_g$), the CCL material may spatially or temporally melt. If the processing temperature is also below the liquidus temperature $T_{liq}$ (including the liquid-liquid miscibility gap temperature), the CCL material may undergo phase separation forming secondary phases with different compositions. However, if the melted material is above its $T_{liq}$, it remains homogeneous. Additionally, if it is a good-glass-forming composition and is subsequently cooled rapidly, then it would remain glassy after the thermal treatment. The requirement of good glass-forming properties can be estimated according to the topological constraints as discussed in the above and below sections. The requirement of low $T_{liq}$ can be estimated from the available binary and ternary diagrams in Te-rich Ge—Te, Ge—Se—Te, Ge—S—Te and Si—Te systems. Additionally, from the similarity between Ge—Te and Si—Te we assume a similar composition range extends to Si—Se—Te and Si—S—Te systems. Together they may define the acceptable composition range for the uncapped CCL portion "bottom layer" as detailed below.

In some embodiments, the "bottom layer" is comprised of a material with compositions satisfying $X_p Si_{g1} Ge_{g2} (Te_{1-x1-x2} S_{x1} Se_{x2})_{1-g1-g2-p}$, where g1+g2<0.3, such as between 0.12 and 0.19, and x1+x2<0.4, such as between 0 and 0.25, and X represents zero, one, or more other elements with the net content p<0.15, such as 0 to 0.05.

In some embodiments, the "bottom layer" is comprised of a material with compositions satisfying $X_p Ge_{g2}(Te_{1-x2} Se_{x2})_{1-g2-p}$, where g2 is between 0.12 and 0.19, x2 is between 0 and 0.25 and such that x2(1−g2−p)/g2<45/55, and X represents zero, one, or more other elements with the net content p<0.15, such as 0 to 0.05.

Figure 4A:
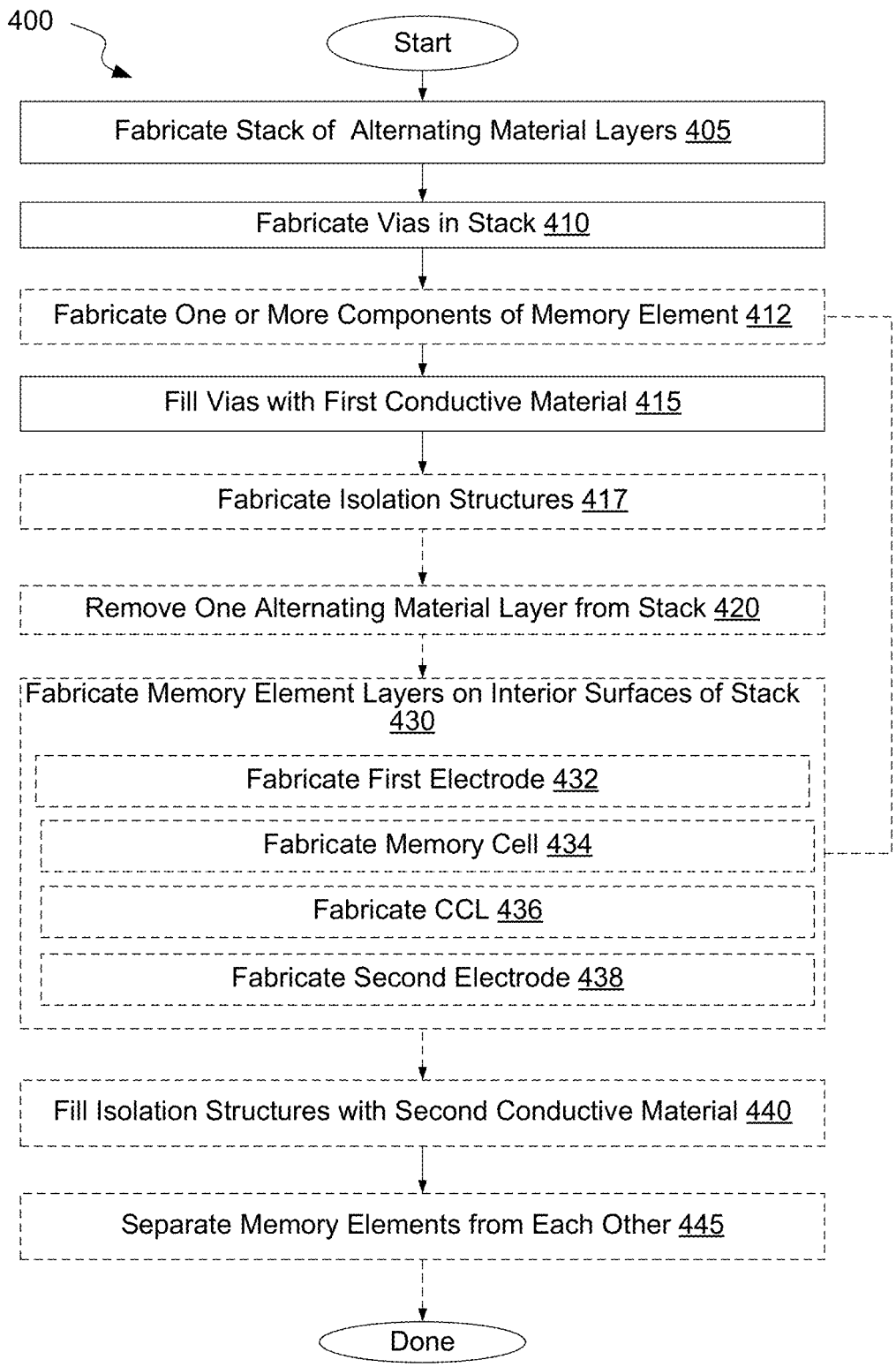
FIG. 4A is a process flowchart of fabricating a 3D array comprising multiple memory elements sharing signal lines, in accordance with some embodiments.

One having ordinary skills in the art would recognize that it may be hard to deposit new materials (such as the second electrode deposited during operation 438 in FIG. 4A) directly on top of the "bottom layer" material without deleterious affecting said layer. To avoid such problems, a layer of chemically related material deposited at low temperature (comparable to the deposition temperature of the "bottom layer" and below the $T_g$ of the "bottom layer") that is expected to have a $T_g$ above that of the subsequent thermal processing (e.g. >400 C).

In some embodiments, the "top layer" is comprised of a material with compositions satisfying $X_p Si_{g1} Ge_{g2} (Te_{1-x1-x2} S_{x1} Se_{x2})_{1-g1-g2-p}$, where g1+g2>0.20, and x1+x2>0.60, and X represents zero, one, or more other elements with the net content p<0.15, such as 0 to 0.05.

In some embodiments, the "top layer" has compositions as proposed above in the section titled "Examples of Silicon based CCLs".

In some embodiments, the "top layer" has compositions as proposed above in the section titled "Examples of CCLs Comprising Germanium and Chalcogen".

In some embodiments, the "top layer" has at least 80 atomic % of Ge and/or Si.

In some embodiments, a high thermal conductivity metallic electrode or a carbon electrode of at least 4 nm or greater thickness is deposited directly on top of the "top layer", to help removal of the joule heat generated during device operation and rapid cooling after any post-deposition thermal history arising from subsequent process steps.

In some embodiments, a relatively rapid cooling of the CCL material, such as via cooled nitrogen gas and/or electrostatic clamping to a chilled pedestal is provided after any post-deposition thermal treatment, such as after the deposition of a second electrode if the latter is performed at temperatures exceeding $T_g$ of the bottom layer.

Examples of Nitrogen (N) Containing CCLs

In some embodiments, CCL is comprised of a material with a composition satisfying $A_{xA} N_{xN} Z_{xZ}$, where A=Si+Ge and Z=S+Se+Te, and xN/(xSi+xGe) ratio is below 1. In some embodiments, the xN/(xSi+xGe) ratio is between 0.2 and 1, such as 0.5.

In some embodiments, compositions within the tetrahedron in the 3-dimensional compositional space of the 4-component Si—N—Te—S system limited by $Si_{0.17}N_{0.17}Te_{0.66}$, $Si_{0.17}N_{0.17}S_{0.66}$, $Si_{0.27}Te_{0.73}$ and $Si_{0.17}N_{0.17}S_{0.22}Te_{0.44}$ are used, allowing up to 2% deviations in content. For example, in some embodiments, the CCL composition is between $Si_{0.17}N_{0.17}S_{0.22}Te_{0.44}$ and $Si_{0.27}Te_{0.73}$. As another example, in some embodiments, the CCL composition is between $Si_{0.17}N_{0.17}S_{0.22}Te_{0.44}$ and $Si_{0.17}S_{0.28}Te_{0.55}$.

In some embodiments, compositions within the tetrahedron in the 3-dimensional compositional space of the 4-component Si—N—Te—Se system limited by $Si_{0.17}N_{0.17}Te_{0.66}$, $Si_{0.17}N_{0.17}Se_{0.66}$, $Si_{0.27}Te_{0.73}$ and $Si_{0.17}N_{0.17}Se_{0.22}Te_{0.44}$ are used, allowing up to 2% deviations in content. For example, in some embodiments, the CCL composition is between $Si_{0.17}N_{0.17}Se_{0.22}Te_{0.44}$ and $Si_{0.27}Te_{0.73}$. As another example, in some embodiments, the CCL composition is between $Si_{0.17}N_{0.17}Se_{0.22}Te_{0.44}$ and $Si_{0.17}Se_{0.28}Te_{0.55}$.

In some embodiments, compositions within the Gibbs triangle of the quasi-3-component $A_{xA} N_{xN} Z_{xZ}$ system limited by $A_{0.17}N_{0.17}Z_{0.66}$, $A_{0.27}Z_{0.73}$ and $A_{0.17}Z_{0.83}$ are used, allowing up to 2% deviations in content, where A is one or more of Si, Ge, and Z is one or more of Te, Se, and S. Without being restricted to any particular theory, it is believed that the estimate of the glass transition temperature Tg of Si- and Ge-based chalcogenides can be extended to include N-containing compositions. Although N is a group V element, one important difference needs to be introduced for N-containing systems, compared to the treatment found in the literature for As- and Sb-containing systems. This distinction is due to the different electronegativity of N. Pauling electronegativity of Sb (2.05) is much lower than those (2.1 . . . 2.58) of any of the chalcogen atoms (S, Se, Te), and the electronegativity of As is much lower than those of S and Se and comparable to that of Te. Thus, in (Ge, Si)—(As,Sb)—(S,Se,Te) one can always treat chalcogen atoms as anions, in particular assuming that they fabricate 2 bonds per atom. At the same time, because the electronegativity of Ge and Si are even lower, the IV-VI bonds are preferred to V-VI or V-IV bonds. The electronegativity of N (3.04) is much greater than that of chalcogen atoms. Thus, V-IV bonds (e.g. N—Si bonds) would be preferred to other bonds. In principle, chalcogen atoms might also potentially behave as cations in the presence of N, in particular, forming more than 2 bonds per atom. Based on simulations results, we assume here that such increased coordination is not much stronger in N-containing systems than in As- and Sb-containing systems. Then, the general topological guidelines of good glass forming compositions as discussed in the above sections still hold, and the model of $T_g$ can be extended using Pauling electronegativities but properly modifying the "matrix" and "heteropolar" expressions to account for the different role of N.

Figure 16A:
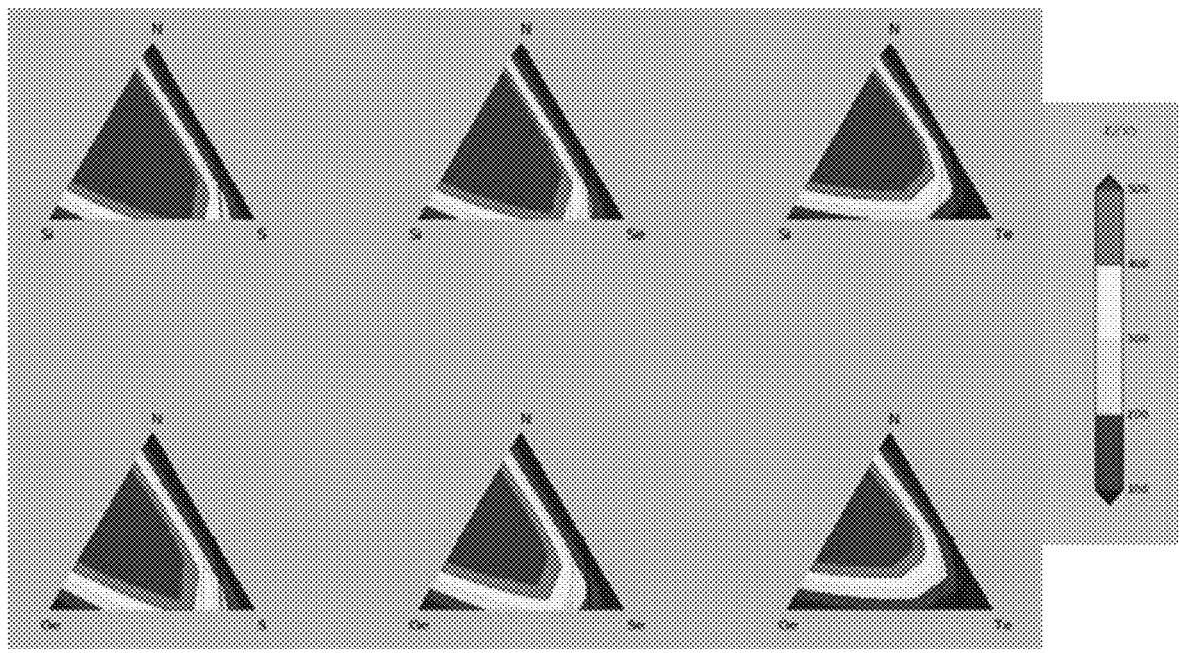
FIG. 16A-B are glass transition temperature ($T_g$) diagrams for different compositions.
Figure 16B:
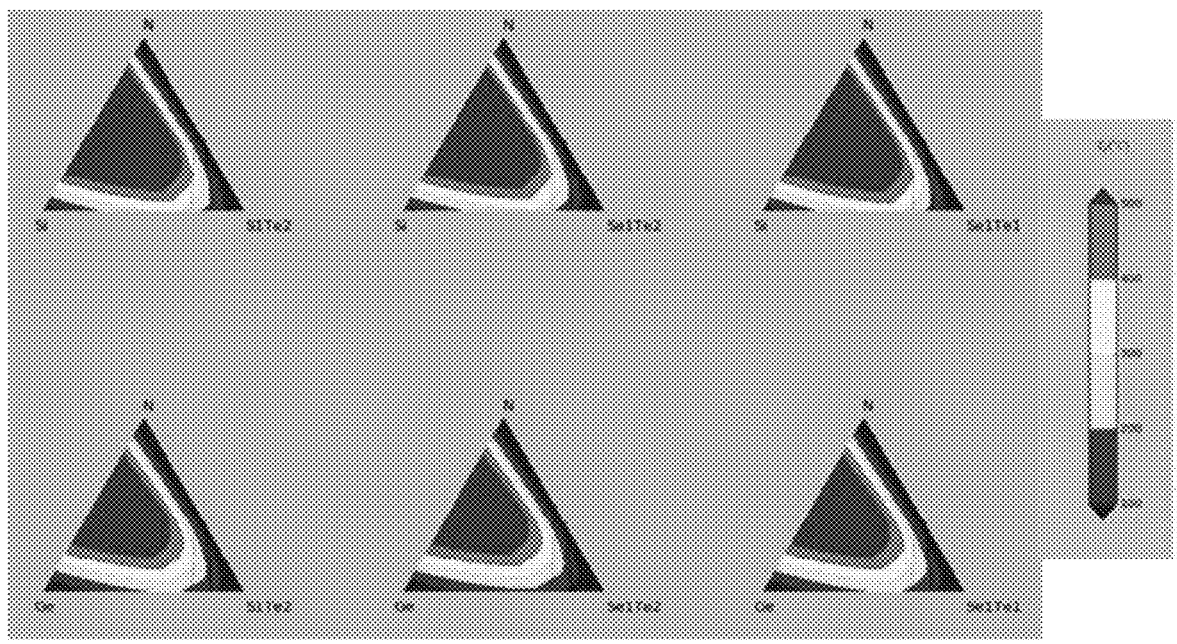

The resulting extensions of the model produces the estimates of $T_g$ in IV-N-VI systems shown in FIG. 16A for systems containing a single type of chalcogen atoms, and in FIG. 16B for systems containing Te and other types of chalcogen atoms. Similar to FIGS. 12-13, the solid lines in FIGS. 16A-B mark the topologically-favored compositions with optimal glass-forming ability according to the discussion in the above sections. These lines extend from $AZ_5$ composition to $N_2Z_3$ composition (A=Si, Ge, Z=S, Se, Te). The dashed lines in FIGS. 16A-B show the expected boundary of good-glass-forming compositions according to the topological constraints as discussed above.

One can observe in FIG. 16A-B that moderate amounts of N may raise $T_g$ of (Si, Ge)—(S, Se) and particularly of (Si, Ge)—Te and (Si, Ge)—(S, Se)—Te glasses, while a substantial N incorporation (larger N content $x_N$ than the net Si,Ge content $x_{Si}+x_{Ge}$) suppress $T_g$. Large amount of N incorporation may also prompt substantial structural changes including the change in the coordination number of chalcogens, degrading the glass-fabricating tendency. In particular, maintaining $x_N/(x_{Si}+x_{Ge})$ ratio between ⅓ and 1, such as ½, may substantially raise $T_g$.

From FIGS. 16A and 16B, the largest $T_g$ can be seen to be achieved at the portion of the good-glass-forming region, marked by the dashed line, such as around $A_{0.167}N_{0.167}Z_{0.667}$ (A=Si+Ge, Z=S+Se+Te) for CCL composition. In some embodiments, Si-based, Te-rich systems, with high $T_g$ around compositions $Si_{0.17}N_{0.17}S_{0.22}Te_{0.44}$ and $Si_{0.17}N_{0.17}Se_{0.22}Te_{0.44}$ are used for CCL. A person of ordinary skill in the art would recognize that these compositions can be referred to as $Si_{0.17}N_{0.17}S_{0.22}Te_{0.44}$ and $Si_{0.17}N_{0.17}Se_{0.22}Te_{0.44}$. Depending on the details of the processing conditions, for example if the subsequent thermal processing sequence allows use of material with somewhat smaller $T_g$, these compositions can be further adjusted towards $Si_{0.27}Te_{0.73}$ (the edge of good-glass-forming region in the binary system), or towards $Si_{0.16}S_{0.28}Te_{0.56}$ or $Si_{0.16}Se_{0.28}Te_{0.56}$ (the topologically-favored compositions at the same Se:Te, S:Te ratios), or in between those compositions. Such adjustments may be chosen in some embodiments to modify selector behavior of the CCL. In other embodiments, the CCL compositions can be adjusted towards $Si_{0.17}N_{0.17}Te_{0.66}$, $Si_{0.17}N_{0.17}S_{0.66}$ or $Si_{0.17}N_{0.17}Se_{0.66}$. In other embodiments, Ge can substitute for all or part of Si.

Examples of CCL Compositions Based on Coordination Numbers

In some embodiments, the composition of the CCL is chosen so as to satisfy topological constraints, as explained below. In some embodiments, the composition is chosen such that the root-mean-square-average coordination number is approximately 2.45, in some embodiments between 2.1 and 2.7, and in some embodiments between 2.3 and 2.55. The root-mean-square-average coordination number of the material may be calculated by taking the coordination numbers of the individual elements as typical for a given type of material as described below (e.g. as given by the chemical valence, or as reported for chalcogenide-based chemical compounds involving a given element), squaring each coordination number, taking the weighted average of the squared coordination numbers according to the atomic fractions of individual elements in the material, and taking the square root of the resulting weighted average.

The composition of the material fabricating CCL may be represented by the following formula $A_g B_p M1_{m1} M2_{m2} M3_{m3} X_h Z_{1-g-p-m1-m2-m3-h}$, where A includes one or more of Ge, Si, C with atomic fractions totaling to g, B may include one or more of Sb, As, P, N with atomic fractions totaling to p, M1, M2 and M3 may be metallic elements with atomic fractions m1, m2, and m3, respectively, X may include one or more of I, Br, Cl with atomic fractions totaling to h, and Z includes one or more of Te, Se, S with atomic fractions totaling to 1−g−p−m1−m2−m3−h, and where additional restrictions are imposed, in particular as described below.

In some embodiments, the material fabricating CCL may be substantially free from the metallic elements (M1, M2 and M3), i.e., m1=m2=m3=0. Examples of the material comprising the metallic elements are described below. In these embodiments, the representative formula is $A_g B_p X_h Z_{1-g-p-h}$. The atomic fraction g is chosen around the value $g_{coord}=(2+3h−5p)/12$, such that the usual coordination numbers $N_{coord}(A)=4$, $N_{coord}(B)=3$, $N_{coord}(X)=2$, $N_{coord}(Z)=1$, would lead to around $N_c=3$ topological constraints per atom, according to the reasoning given below). Specifically, in some embodiments, g is chosen within $g>(2+3h−5p)/12−0.125$ and $g<(2+3h−5p)/12+0.1$ or more specifically, $g>(2+3h−5p)/12−0.05$ and $g<(2+3h−5p)/12+0.03$, subject to further constraints.

In some embodiments, the material fabricating a CCL may be substantially free from Sb, As, P, N or free from I, Br, Cl, i.e., h=0 or p=0.

In some embodiments, the material fabricating a CCL may be substantially free from Sb, As, P, N and from I, Br, Cl, i.e., both h=0 and p=0. For example, the CCL materials may substantially include germanium and tellurium and represented by the formula $Ge_g Te_{1-g}$, the atomic fraction g could be chosen between 0.04 and 0.27, such as between 0.12 and 0.20. In some embodiments, $Ge_g Te_{1-g}$ with the eutectic composition g=0.15 (slightly below $g_{coord}=0.167$, equivalently written as $Ge_1 Te_{5.67}$) is used to avoid crystallization and phase separation during heat treatment at 400° C.–450° C. This heat treatment may be followed by moderate to moderately rapid cooling. In some embodiments, such material is capped at lower temperatures with a more thermally resistant material prior to any process involving higher temperatures.

In some embodiments, $Ge_g Te_{1-g}$ with $g=g_{coord}=0.167$ (i.e. $Ge_1 Te_5$) can be chosen instead of the eutectic composition to avoid crystallization and phase separation during treatment at 400° C.–450° C.

In some embodiments, compositions away from both eutectic and $g_{coord}$, such as $Ge_1 Te_4$ (g=0.2) or $Ge_1 Te_6$ (g=0.143) is used if the CCL is not exposed to temperatures of greater than approximately 100° C. after its deposition prior to any capping.

In some embodiments, compositions such as $Ge_1 Te_4$ (g=0.2) or $Ge_1 Te_8$ (g=0.111) can be chosen to facilitate compatibility with processing temperatures above 400° C., between approximately 400° C.–450° C. These compositions may contain a portion of GeTe precipitates from $Ge_1 Te_4$ or Te precipitates from $Ge_1 Te_8$.

In some embodiments, the metallic element(s) M1 can be copper (Cu), silver (Ag), titanium (Ti), molybdenum (Mo), tungsten (W) with atomic fractions totaling to m1, and the atomic fraction g is chosen around the values $g_{coord, i}=(2+3h−5p+3m1)/12$. As above, deviations of −0.125/+0.1, such as −0.05/+0.03, are acceptable.

In some embodiments, the metallic element(s) M1 can be Cu, Ag, Zn with atomic fractions totaling to m1, and the atomic fraction g is chosen around the values $g_{coord,2c}=(2+3h-5p)/12$ (note that the atomic fraction g of group-IV elements in this case does not depend on m1, but the atomic fraction of group-VI elements $1-g-p-m1-m2-m3-h$ still depends on m1). As above, deviations of $-0.125/+0.1$, such as $-0.05/+0.03$, are acceptable.

In some embodiments, the metallic element(s) M2 can be Ag (if not used as M1) and/or Al with atomic fractions totaling to m2. The atomic fraction g is chosen around the values $g_{coord,4c}=(2+3h-5p)/12$. It should be noted that the atomic fraction g of group-IV elements in this case does not depend on m2, but the atomic fraction of group-VI elements $1-g-p-m1-m2-m3-h$ still depends on m2. As above, deviations of $-0.125/+0.1$, such as $-0.05/+0.03$, are acceptable. If m1 is also nonzero, the expression for g is combined with the expressions above.

In some embodiments, the metallic element(s) M2 can be Ag (if not used as M1) and/or Al with atomic fractions totaling to m2, and the atomic fraction g is chosen around the values $g_{coord,4}c=(2+3h-5p-12m2)/12$. As above, deviations of $-0.125/+0.1$, such as $-0.05/+0.03$, are acceptable. If m1 is also nonzero, the expression for g is combined with the expressions above.

In some embodiments, the metallic element(s) M3 can be Cu (if not used as M1) and/or Ni with atomic fractions totaling to m3, and the atomic fraction g is chosen around the values $g_{coord,6i}=(2+3h-5p-2m3)/12$. As above, deviations of $-0.125/+0.1$, such as $-0.05/+0.03$, are acceptable. If m1 and/or m2 is also nonzero, the expression for g is combined with the expressions above.

In some embodiments, the metallic element(s) M3 can be Cu (if not used as M1) and/or Ni with atomic fractions totaling to m3, and the atomic fraction g is chosen around the values $g_{coord,6c}=(2+3h-5p-32m3)/12$. As above, deviations of $-0.125/+0.1$, such as $-0.05/+0.03$, are acceptable. If m1 and/or m2 is also nonzero, the expression for g is combined with the expressions above.

Figure 10:
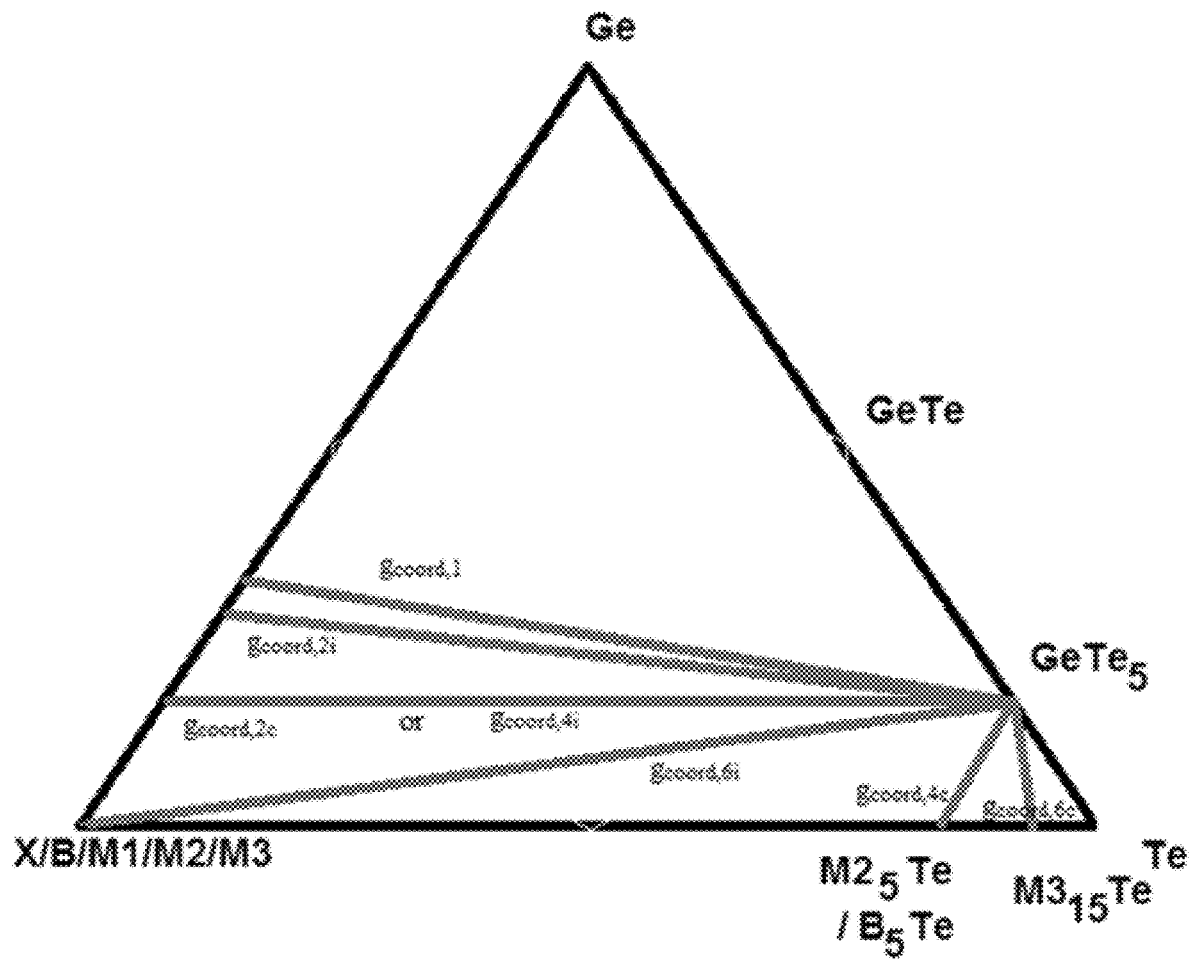
FIG. 10 is a phase diagram for Ge—Te combinations with another component.

FIG. 10 illustrates various examples of relationships between g and h, m1, m2, m3 are illustrated for a ternary system involving Ge, Te, and one of X or M1 or M2 or M3 elements.

It has been found that composition (which may be also referred to as stoichiometry) may be chosen based on coordination constraints. For example, extending this concept to include both 3-coordinated pnictogens and 1-coordinated halogens, $N_{coord}$-coordinated atom brings in $(N_{coord}/2+N_{coord}(N_{coord}-1)/2)=N_{coord}^2/2$ topological constraints. The best glass forming region is expected when the total number of constraints per atom, $N_{constr}=<N_{coord}^2>/2$ (where < > denote average over all atoms), equals the total number of degrees of freedom, i.e. 3 per atom, $N_{constr}=3$, thus implying $(<N_{coord}^2>)^{1/2}=6^{1/2}=2.45$. Specifically, for $A_gB_pX_hZ_{1-g-p-h}$, this implies optimal $g_{coord}=(2+3h-5p)/12$.

For metallic atoms, the coordination number may differ from simple valence. Furthermore, in both ionic and metallic limits the bonds are not strongly directional, thus constraints related only to the coordination number (bond lengths) but not angles may be considered. Correspondingly, for atoms that may be 1-, 2-, 4-, and 6-coordinated, the number of constraints in the "ionic" model is only ½, 2/2, 4/2, and 6/2, respectively, whereas in the usual "covalent" model they are ½, 4/2, 16/2, and 36/2, leading to the compositions presented above.

The material chosen in accordance with these coordination rules may have a very high configurational entropy as well as low chemical energy, making it less likely to phase separate during electrical cycling and retards degradation. Furthermore, such compositions may be more resilient to thermal cycling as they may remain amorphous even with slower cooling rates.

The acceptable deviations from ideal stoichiometry $g_{coord}$ may be related to the temperature-induced broadening of properties. Specifically, when $g>g_{coord}$, i.e. $g=g_{coord}+\Delta g$, additional $8\Delta g$ constraints per atom exist that cannot be fully satisfied in a glassy environment (since g is the concentration of group IV elements that each bring in $4^2/2=8$ constraints), i.e. there is one unsatisfiable constraint per cluster of $N_{cluster}=1/(8\Delta g)$ atoms. In materials considered here, a typical bond energy E is approximately 1 eV per bond, and in group IV elements, this bond energy can be considered as a combination of 1 distance and 4 angle constraints. Violating a single constraint would come with an energy penalty $\sim E/5$. However, rather than fully violating one constraint, the glassy material can partially and equally violate all $\sim 3N_{cluster}$ constraints, which due to the quadratic character of the interaction would only require an energy penalty of $\sim E/5/(3N_{cluster})^{1/2}$, i.e. $\sim E(8\Delta g/75)^{1/2} \sim 0.3$ eV$(\Delta g)^{1/2}$. Thermal fluctuations in a cluster of $N_{cluster}$ atoms are of the order of $(N_{cluster})^{1/2}$ $3k_BT/2 \sim 3k_BT/(32\Delta g)^{1/2}$, or at the typical processing temperatures of $\sim 300$ C, they are order of $\sim 0.03$ eV$/(\Delta g)^{1/2}$. Thus, if $\Delta g<\sim 0.1$, the effect of additional constraints is smeared by thermal fluctuations, and the material may still exhibit suitable glassy behavior and be acceptable for CCL use.

For example, in $Ge_gTe_{1-g}$, $g_{coord}=0.167$ corresponding to $(<N_{coord}^2>)^{1/2}=2.45$, and increasing g to $g_{coord}+\Delta g=0.267$ would increase $(<N_{coord}^2>)^{1/2}$ to 2.68. Thus, the materials with root-mean-square-average coordination number up to 2.7 may be acceptable.

On the time scales sufficient for interdiffusion and/or structural reorganization of multiple clusters of $N_{cluster}$ atoms each, the over-constrained nature of materials with $\Delta g \sim 0.1$ may crystallize and/or phase separate with prolonged annealing or slow cooling. In this respect, smaller deviations from $g_{coord}$ may be preferable.

When $g<g_{coord}$, i.e. $g=g_{coord}-\Delta g$, there are $8\Delta g$ constraints per atom too few, or one missing constraint per $N_{cluster}=1/(8\Delta g)$ atoms. Generally, missing constraints do not impede glass formation. However, when the number of missing constraints becomes comparable with the number of surface atoms in a cluster, additional correlations such as van-der-Waals interactions become important and can promote crystallization into van-der-Waals crystal. This may happen when $N_{cluster}$ becomes as small as a single atom, i.e. the glassy behavior can be expected if $\Delta g<\frac{1}{8}=0.125$. For example, in $Ge_gTe_{1-g}$, decreasing g to $g_{coord}-\Delta g=0.04$ would decrease $(<N_{coord}2>)^{1/2}$ to 2.12. Thus, the materials with root-mean-square-average coordination number above 2.1 may be acceptable. However, smaller-sized surfaces of oblong clusters may have one missing constraint per surface atom at smaller $\Delta g$ values, and thus smaller deviations from $g_{coord}$ may still be preferable.

For example, in $Ge_gTe_{1-g}$, the ideal $g=g_{coord}=0.167$ composition ($x_{Te}=0.833$ in the figure) is very close to the eutectic composition $x_{Te}=0.85$ in the phase diagram.

Elemental Chalcogens and Binary Chalcogenides

CCL may be substantially free from arsenic and have a thermally stable composition. While arsenic containing compositions can exhibit improved thermal stability of the CCL, there are safety, toxicity, and manufacturing concerns and/or complications related to the use of arsenic.

Figure 25:
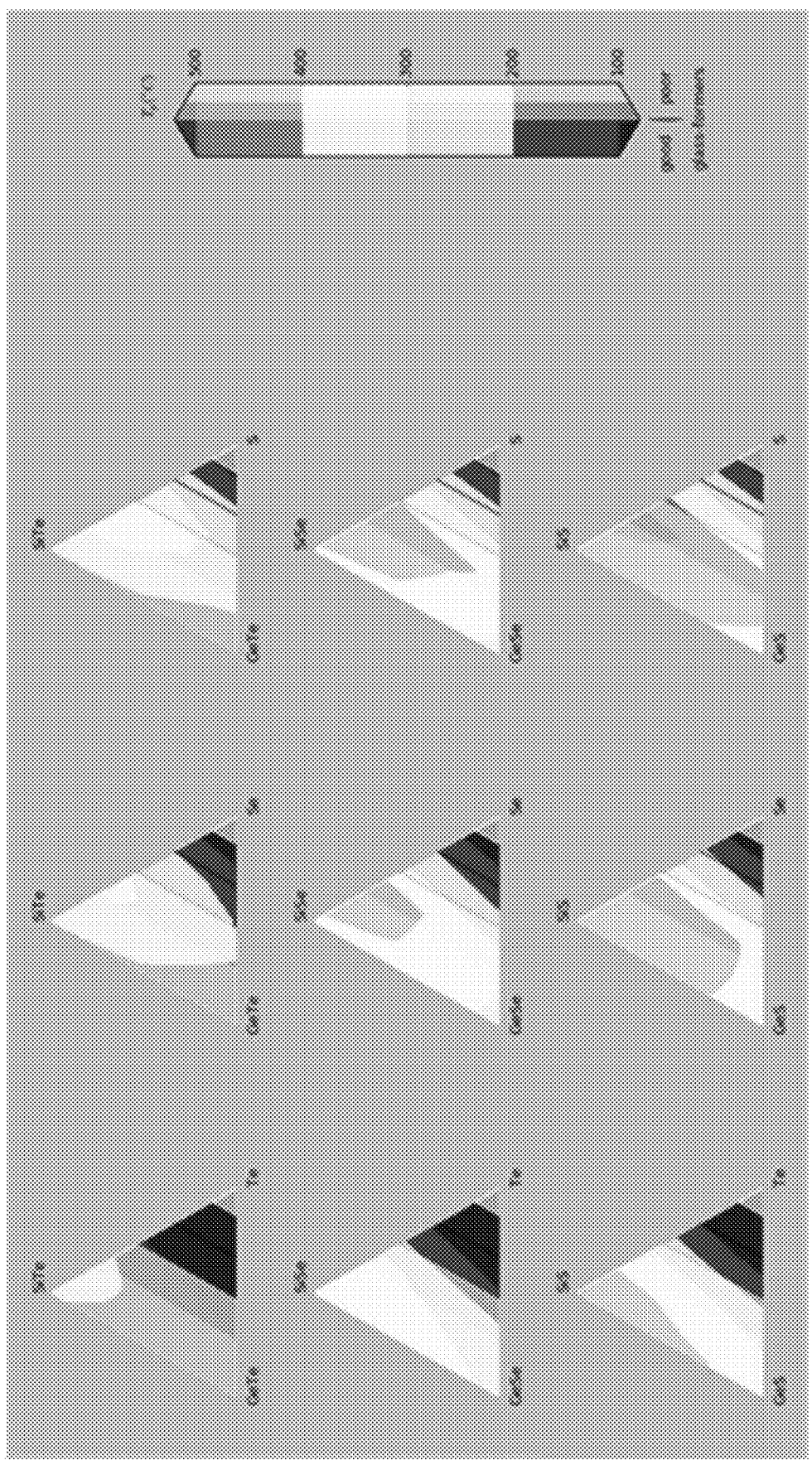

FIG. 25 illustrates representative contour plots of $T_g$ vs. CCL composition, which is modeled data. One skilled in the art would recognize that the contours can provide guidance and relative comparison of compositional choice of the CCL for improved thermal stability. In particular, representative compositions do not include elements such as arsenic, which have safety and toxicity concerns. For memory integration and reliability, CCL compositions may be thermally stabile (e.g., have a high $T_g$, $T_m$, and/or $T_c$). Additionally, CCL compositions may be amorphous and/or amorphous-like (e.g., glass formers). The black-tie line (most favored) and the regions around said line illustrates the favored glass forming compositions. Other less favored glass forming compositions are grayed out. CCL compositions can be selected in favored glass forming regions with higher relative $T_g$ (e.g. >200° C., >300° C., and/or >400° C.).

CCL compositions including those illustrated in the non-grayed out regions below combining high Tg and good glass formers can be deposited using ALD, CVD, PVD, evaporation, and derivatives thereof. ALD and/or CVD are more favorable for 3D vertical integration using a highly conformal CCL deposition process vs. PVD and or evaporation. The CCL can also be integrated in 3D layered cross-point fashion which can be formed using ALD, CVD, PVD, evaporation, and derivatives thereof. In this architecture, the CCL is deposited in planar (or substantially planar) fashion without stringent requirements of conformality. In embodiments where the CCL is formed using ALD, CVD, and/or derivatives, selected chemistries are described in the next section.

Figure 26:
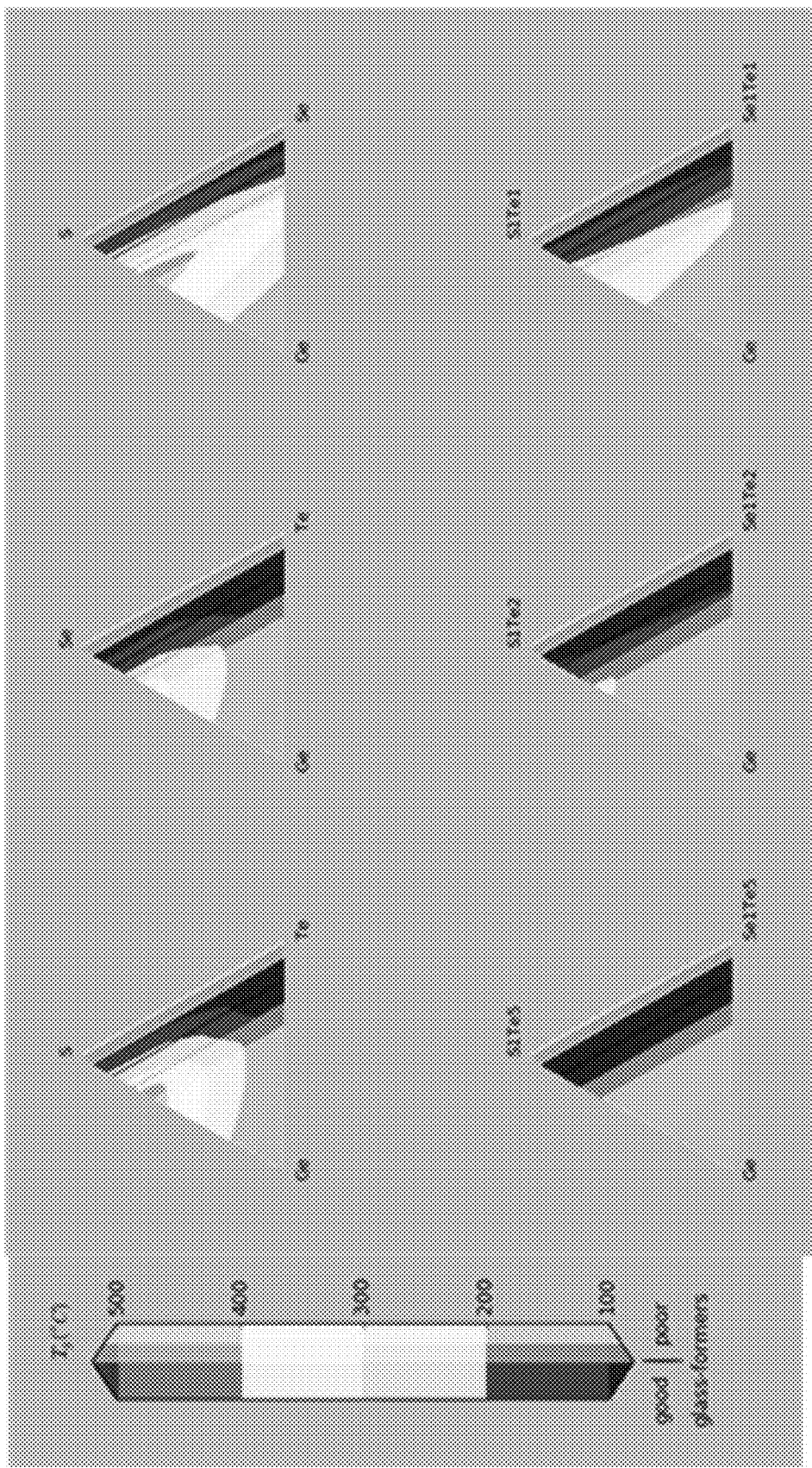

By way of example, FIG. 26 illustrates Tg plots for Ge—Se—Te (non-Arsenic) compositions. The solid black line is favored for glass formation (e.g., amorphous CCL) in that compositions of CCL along this line are most favored for said amorphous glass-like CCL formation. The dashed line illustrates the boundary by which the tendency for glass formation is reduced. Therefore, one would like to choose a CCL composition proximate to the solid black line and not outside of the dotted line. Additionally, contours of the (relative) magnitude of the glass transition temperature (in degrees C.) is shown as colored contours. It is desirable to choose a CCL composition with high $T_g$ (a proxy for thermal stability and tendency to remain amorphous during device formation and integration, as well as during operation) over compositions with low $T_g$. In the Ge—Se—Te system, "lighter" compositions (e.g. >200° C.) are favored over "darker" compositions. Also shown in FIG. 26 as "whited out regions" are compositions which are closer to crystalline compositions. These compositions are less favorable as there is tendency to become crystalline or portions of the CCL to become crystalline during CCL formation, integration, and/or operation). Combining the three points (identified regions) described above yields "non-whited out regions" as shown in FIG. 26 with varying values of (relative) $T_g$ vs. composition.

| Composition | Ge | Se | Te | NCav | NCrms | Tg (C) | Tg_eff (C) | Prox_lowT | Prox_highT |
|---|---|---|---|---|---|---|---|---|---|
| 1 | 0.38 | 0.56 | 0.06 | 2.76 | 2.93 | 294.43 | 313.98 | 18.39 | 19.89 |
| 2 | 0.34 | 0.58 | 0.08 | 2.68 | 2.84 | 296.11 | 298.68 | 18.43 | 19.93 |
| 3 | 0.36 | 0.56 | 0.08 | 2.72 | 2.88 | 291.99 | 302.72 | 17.76 | 19.26 |
| 4 | 0.38 | 0.54 | 0.08 | 2.76 | 2.93 | 287.22 | 306.77 | 17.59 | 19.09 |
| 5 | 0.34 | 0.56 | 0.10 | 2.68 | 2.84 | 288.89 | 291.467 | 17.27 | 18.77 |
| 6 | 0.36 | 0.54 | 0.1 | 2.72 | 2.88 | 284.77 | 295.51 | 16.95 | 18.45 |
| 7 | 0.38 | 0.52 | 0.1 | 2.76 | 2.926 | 280.01 | 299.55 | 16.99 | 18.49 |
| 8 | 0.32 | 0.58 | 0.1 | 2.64 | 2.8 | 282.86 | 287.17 | 17.267 | 18.767 |
| 9 | 0.34 | 0.54 | 0.12 | 2.68 | 2.84 | 281.68 | 284.25 | 16.47 | 17.97 |
| 10 | 0.36 | 0.52 | 0.12 | 2.72 | 2.88 | 277.56 | 288.29 | 16.36 | 17.86 |
| 11 | 0.3 | 0.62 | 0.08 | 2.6 | 2.76 | 277.09 | 288.73 | 18.37 | 19.87 |
| 12 | 0.38 | 0.5 | 0.12 | 2.76 | 2.93 | 272.79 | 292.34 | 16.54 | 18.04 |
| 13 | 0.32 | 0.56 | 0.12 | 2.64 | 2.8 | 275.64 | 279.96 | 16.36 | 17.86 |
| 14 | 0.3 | 0.6 | 0.1 | 2.6 | 2.76 | 272.49 | 282.76 | 17.02 | 18.52 |
| 15 | 0.34 | 0.52 | 0.14 | 2.68 | 2.84 | 274.46 | 277.03 | 15.88 | 17.38 |
| 16 | 0.36 | 0.5 | 0.14 | 2.72 | 2.88 | 270.34 | 281.08 | 15.91 | 17.41 |
| 17 | 0.38 | 0.48 | 0.14 | 2.76 | 2.93 | 265.58 | 285.12 | 15.59 | 17.05 |
| 18 | 0.32 | 0.54 | 0.14 | 2.64 | 2.80 | 268.43 | 272.74 | 15.71 | 17.21 |
| 19 | 0.3 | 0.58 | 0.12 | 2.6 | 2.76 | 265.28 | 275.54 | 16.11 | 17.61 |
| 20 | 0.28 | 0.64 | 0.08 | 2.56 | 2.71 | 259.79 | 280.58 | 18.21 | 19.71 |
| 21 | 0.34 | 0.5 | 0.16 | 2.68 | 2.84 | 267.25 | 269.82 | 15.43 | 16.93 |
| 22 | 0.36 | 0.48 | 0.16 | 2.72 | 2.88 | 263.13 | 273.86 | 15.11 | 16.57 |
| 23 | 0.38 | 0.46 | 0.16 | 2.76 | 2.93 | 258.36 | 277.90 | 14.85 | 16.28 |
| 24 | 0.28 | 0.62 | 0.1 | 2.56 | 2.71 | 255.12 | 274.61 | 16.85 | 18.35 |
| 25 | 0.32 | 0.52 | 0.16 | 2.64 | 2.80 | 261.21 | 265.53 | 15.21 | 16.71 |
| 26 | 0.3 | 0.56 | 0.14 | 2.6 | 2.76 | 258.06 | 268.33 | 15.45 | 16.95 |
| 27 | 0.28 | 0.6 | 0.12 | 2.56 | 2.71 | 250.46 | 268.64 | 15.92 | 17.42 |
| 28 | 0.3 | 0.54 | 0.16 | 2.6 | 2.76 | 250.85 | 261.11 | 14.94 | 16.44 |
| 29 | 0.28 | 0.58 | 0.14 | 2.56 | 2.71 | 245.79 | 262.67 | 15.25 | 16.75 |

By way of example, the table presented above shows specific examples of the Ge—Se—Te system which exhibit a combination of traits as illustrated above. Higher $T_g$ compositions are chosen which have tendency to be amorphous (glass forming) and are located comparatively further away from crystalline compositions. Compositions for $Ge_xSe_yTe_z$ are listed where x=relative fraction of Ge, y is the relative fraction of Se, and z is the relative fraction of Te, and x+y+z=1. NCav (and NCrms) is the average coordination numbers. Tg (and Tg_eff) is the glass transitions temperature in ° C. Prox_lowT (and prox_highT) is a figure of merit whereby a larger value is closer to crystalline compositions and is less desirable. Values for Prox-lowT >18.5 have been screened out. A smaller value is preferred due to further relative distance from crystalline phases. Compositions with Tg<250° C. have also been screened out. Please note, these are relative Tg's as the modeled "bulk" Tg can be smaller in absolute magnitude from deposited thin films. $Ge_xSe_yTe_z$ is also further constrained with the sum of Group IV semiconducting element(s)<0.4, e.g. Ge<0.4 in this example. The compositions are sorted by Tg after imposing the constraints described.

Memory Cell Examples

Various types of memory cells may be used together with CCLs described herein. For example, ReRAM, CBRAM, PCM, electrolytic, or ferroelectric cell types may be used.

During a read operation, the state of a memory cell can be sensed by applying a sensing voltage (i.e., a "read" voltage) to an appropriate set of signal lines. Depending on its history, a memory cell that is addressed in the array in this way may be in either a high resistance state or a low resistance state. The resistance of the memory cell therefore determines what digital data is being stored by the memory cell. During a write operation, the state of a memory cell can be changed by application of suitable write signals to an appropriate set of signal lines.

Figure 3A:
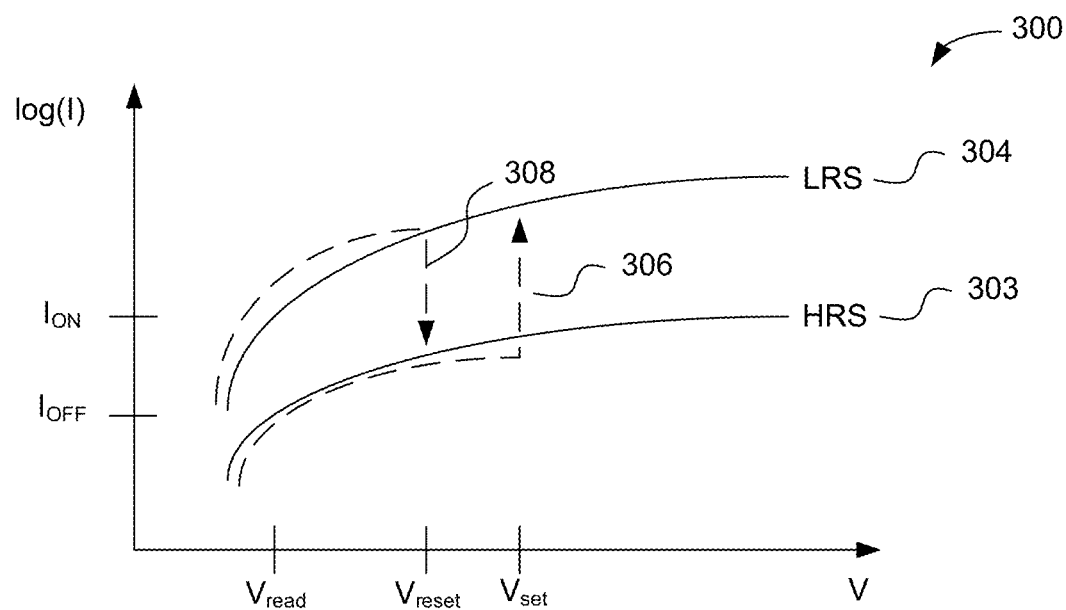
FIGS. 3A and 3B are examples of I-V performance of the memory cell.

FIG. 3A is a logarithm of current (I) versus voltage (V) plot 300 for a memory cell. FIG. 3A illustrates the set and reset operations to change the contents of the memory cell. Initially, memory cell may be in a high resistance state ("HRS", e.g., storing a logic zero). In this state, the current versus voltage characteristic of memory cell is represented by solid line HRS 303. The high resistance state of memory cell can be sensed by read circuitry using signal lines. For example, read circuitry may apply a read voltage $V_{READ}$ to the memory cell and can sense the resulting "off" current $I_{OFF}$ that flows through memory cell. When it is desired to store a logic one in memory cell, memory cell can be placed into its low-resistance state. This may be accomplished by using write circuitry to apply a set voltage $V_{SET}$ across signal lines. Applying $V_{SET}$ to memory cell causes memory cell to switch to its low resistance state, as indicated by dashed line 306. In this region, the memory cell is changed so that, following removal of the set voltage $V_{SET}$, memory cell is characterized by low resistance curve LRS 304. As is described further below, the change in the resistive state of memory cell may be because of the filling of traps (i.e., a may be "trap-mediated") in a metal oxide material.

The low resistance state of memory cell can be sensed using read circuitry. When a read voltage $V_{READ}$ is applied to resistive switching memory cell, read circuitry will sense the relatively high "on" current value $I_{ON}$, indicating that memory cell is in its low resistance state. When it is desired to store a logic zero in memory cell, the memory cell can once again be placed in its high resistance state by applying a reset voltage $V_{RESET}$ to memory cell. When write circuitry applies $V_{RESET}$ to memory cell, memory cell enters its high resistance state HRS, as indicated by dashed line 308. When the reset voltage $V_{RESET}$ is removed from memory cell, memory cell will once again be characterized by high resistance line HRS 303. Voltage pulses can be used in the programming of the memory cell.

A fabricating voltage $V_{FORM}$ is a voltage applied to the memory cell to ready the memory cell for use. Some memory cells described herein may need a fabricating event that includes the application of a voltage greater than or equal to the set voltage or reset voltage. Once the memory cell initially switches, the set and reset voltages can be used to change the resistance state of the memory cell. A lower fabricating voltage may be desirable (e.g. less than 5 volts) to reduce the likelihood of damage to the memory cell. As is described herein, certain process techniques can be used to fabricate memory cells that have lower fabricating voltages. In some embodiments $V_{FORM}$ is the same as the first programming voltage $V_{SET}$ or $V_{RESET}$.

The bistable resistance of resistive switching memory cell makes memory cell suitable for storing digital data. Because no changes take place in the stored data in the absence of application of the voltages $V_{SET}$ and $V_{RESET}$, memory fabricated from such cells are nonvolatile. As can be appreciated, it is desirable for memory cell to have a large difference between off current and on current (i.e., a high $I_{ON}/I_{OFF}$ ratio), which causes the on and off states of the memory cell to be more discrete and easily detectable.

Without being bound by theory, in some embodiments the memory cell may use a switching mechanism that is mediated in the bulk of the metal oxide. Generally, defects are fabricated in, e.g. already exist in the deposited metal oxide. Moreover, existing defects can be enhanced by additional processes. Defects may comprise of variances in charge in the structure of the metal oxide. For example, some charge carriers may be absent from the structure (i.e., vacancies) or additional charge carriers may be present (i.e., interstitials). Therefore, by applying a voltage to the memory cell, the defects, such as traps, can either be filled or emptied to alter the resistivity of a metal oxide and resistive switching memory cells can be fabricated using these principles.

The memory cell fabricated from one or more metal oxides may be of any phase, including crystalline and amorphous. The deposited metal oxides can have impurities (i.e., substitutional defects) such as an aluminum atom where a hafnium atom should be, vacancies (missing atoms), and interstitials (extra atoms). Amorphous-phase metal oxides may have increased resistivity, which in some embodiments can lower the operational currents of the device to enable low power operation and reduce potential damage to the memory cell.

Figure 3B:
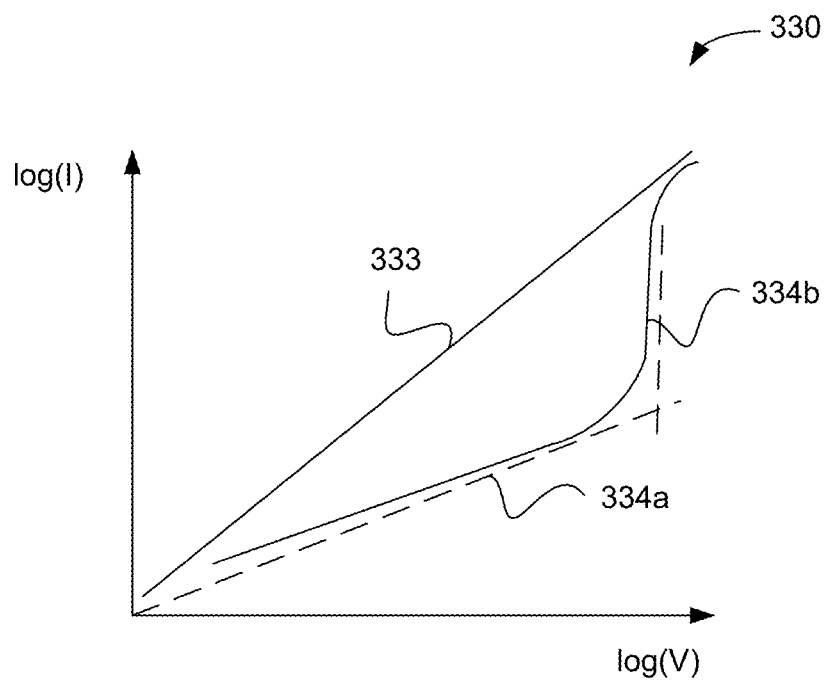

FIG. 3B is a current (I) versus voltage (V) plot 330 for a memory cell that demonstrates a resistance state change. The plot 330 shows a voltage ramp applied to the memory cell along the x-axis and the resulting current along a y-axis. The line 333 represents the response of an Ohmic material when the ramped voltage is applied. An Ohmic response is undesirable, since there is no discrete voltage at which the set or reset occurs.

Generally, a more abrupt graph like graph 334 is desired. The graph 334 begins with an Ohmic response 334a, and then curves sharply upward 334b. The graph 334 may represent a set operation, where the memory cells switches from the HRS 303 to the LRS 304.

Without being bound by theory, non-metallic percolation paths are fabricated during a set operation and broken during a reset operation. For example, during a set operation, the memory cell switches to a low resistance state. The percolation paths that are fabricated by filling traps increase the conductivity of the metal oxide, thereby reducing (i.e., changing) the resistivity. The voltage represented by 334b is the set voltage. At the set voltage, the traps are filled and there is a large jump in current as the resistivity of the metal oxide decreases.

The set voltage shown here is very discrete (i.e., vertical), which is desirable to ensure the switching of the memory cell occurs at a repeatable voltage. Additionally, a high ratio of on current to off current (i.e., a high $I_{ON}/I_{OFF}$ ratio), for example 10 or greater, is desirable because it indicates a large difference in the resistivity of the metal oxide when in the HRS and LRS, making the state of the memory cell easier to determine. Finally, it is desirable to have low set, reset, and fabricating voltages in order to avoid damage to the memory cells and to be compatible with complementary device cells such as CCLs, selectors, diodes and/or transistors in series with the memory cell.

The metal oxide includes electrically active defects (also known as traps) in the bulk. It is believed that the traps can be filled by the application of the set voltage, and emptied by applying the reset voltage. Traps can be inherent in the metal oxide (i.e., existing from fabrication of the metal oxide) or created by doping, and enhanced by doping and other processes. For example, a hafnium oxide layer may include oxygen or hafnium vacancies or oxygen or hafnium interstitials that may fabricate traps which can be used to create percolation paths and alter the conductivity of the hafnium oxide layer.

A metal oxide may include defects that are the result of the process used to fabricate the metal oxide. In other words, the defects may be inherent in the metal oxide. For example, atomic layer deposition (ALD) processes deposit layers that will always have some imperfections or flaws. These imperfections can generally be referred to as defects in the structure of the metal oxide. The defects can be used to create localized charge variances that can be filled and emptied by applying voltage pulses to the metal oxides. Defects can be created by doping, which is explained in more detail below.

Specific metal oxides that use bulk-mediated switching mechanisms according to embodiments of the invention include hafnium oxide, aluminum oxide, tantalum oxide, zirconium oxide, and yttrium oxide. These metal oxides have a bandgap that is greater than 4 eV, indicating that they are more insulating and therefore have a higher resistivity. Higher bandgap (i.e., greater than 4 eV) metal oxides also allow for scaling of set voltage as related to metal oxide thickness. However, other materials have been shown to have switching properties and may also be used with the embodiments described herein.

These oxides can be doped with each other and additionally, for example, scandium oxide, yttrium oxide, and nickel oxide. Other dopants may include rare earth metals such as lanthanum, cerium, praseodymium, neodymium, gadolinium, erbium, ytterbium, and lutetium and their oxides. Additional dopants may include hafnium, hafnium oxide, oxygen, silicon, silicon oxide, nitrogen, fluorine, chromium, and chromium oxide.

Another criterion for selecting a metal oxide can be to have a metal nitride electrode and a metal oxide adjacent to the metal nitride electrode. The metal to fabricate the metal oxide and the metal nitride are the same. For example, a memory element can be fabricated having a titanium nitride electrode and a titanium oxide layer adjacent to the titanium nitride electrode. In another embodiment, a hafnium nitride electrode and a hafnium oxide layer are adjacent to each other. This serves to stabilize the interface, for example. The memory element can also include other metal oxides (e.g., aluminum oxide or hafnium oxide) in a stacked or co-deposited manner.

In another embodiment, two metal oxides can be stacked in layers to adjust the effective on current of the memory element 200. The first metal oxide can have a smaller on current than the second metal oxide material and the second metal oxide material can have a lower off current than the first metal oxide material. In these embodiments, the memory element 200 can have the lower off current of the second metal oxide material and the lower on current of the first metal oxide material to make the memory element 200 compatible with other device elements, for example a CCL, selector, diode or transistor in series with the memory elements and also to enable lower power operation.

Processing Examples

FIG. 4A illustrates a process flow chart corresponding to method 400 of fabricating a memory array, in accordance with some embodiments.

Figure 5A:
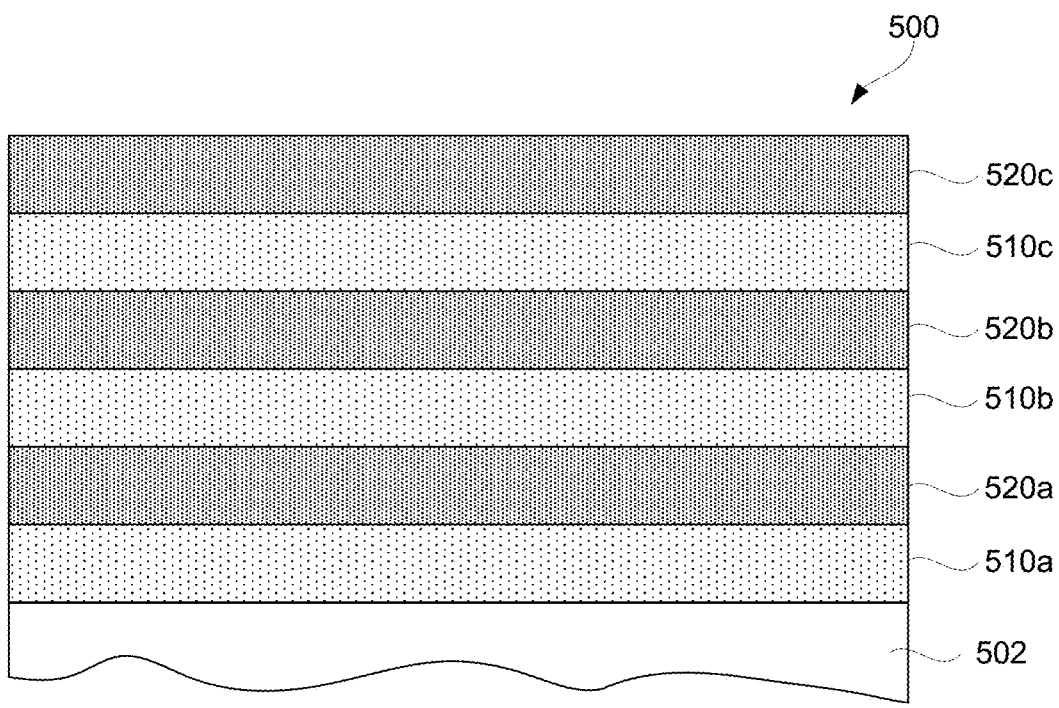
FIGS. 5A-5I-2 are schematic representations of a first example of a 3D array at different fabrication stages, in accordance with some embodiments.

Method 400 may commence with fabricating a stack of two alternating material layers on a substrate during operation 405. For example, one material layer may be fabricated from silicon nitride, while another material layer may be fabricated from silicon oxide. Another example is poly silicon and silicon oxide. Another example is silicon nitride and poly silicon. Carbon and boron containing dielectrics can also be used in other embodiments. It is desirable to choose materials which can be plasma etched as a planar stack to fabricate vias or lines and have wet etch selectivity (e.g. silicon nitride vs. silicon oxide or silicon oxide vs. poly-Si) for subsequent recessing. In some embodiments, the thickness for each layer is approximately 10 nm to 60 nm. In other embodiments, the thickness for each layer is approximately 20 nm to 50 nm, and in other embodiments, approximately 25 nm to 45 nm. FIG. 5A illustrates an example of stack 500 after completing operation 405. Stack 500 includes first dielectric layers 510a, 510b, and 510c alternating with second dialectic layers 520a, 520b, and 520c. The thickness of each of these layers may be between about 10 nm and 60 nm. One set of these dielectric layers (e.g., silicon nitride) may be sacrificial and is later recessed/(partially) removed. The other set may remain in the final device.

Figure 8A:
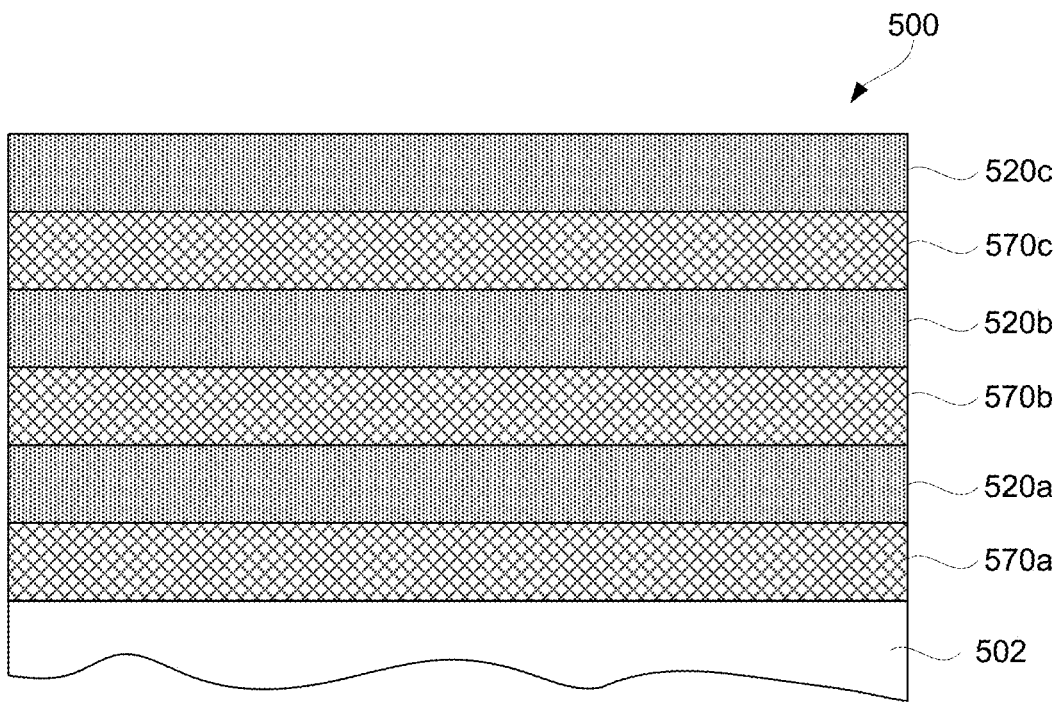
FIGS. 8A-8F illustrate examples of the stack at various stages of processing.

In some embodiments, one of the material layers is conductive (e.g. doped poly silicon, Co, Ni, W, Cu, Al, Mo, Ru, Ir, RuOx, IrOx, MoOx, TiNx, WNx, MoNx, TaNx, silicides, other conductive oxides and nitrides, alloys, combinations thereof etc.) and is later used as a signal line. FIG. 8A illustrate another example of stack 500 after completing operation 405. Stack 500 includes first conductive layers 570a, 570b, and 570c alternating with dielectric layers 520a, 520b, and 520c. The thickness of each of these layers may be between about 10 nm and 60 nm in some embodiments.

Figure 5B:
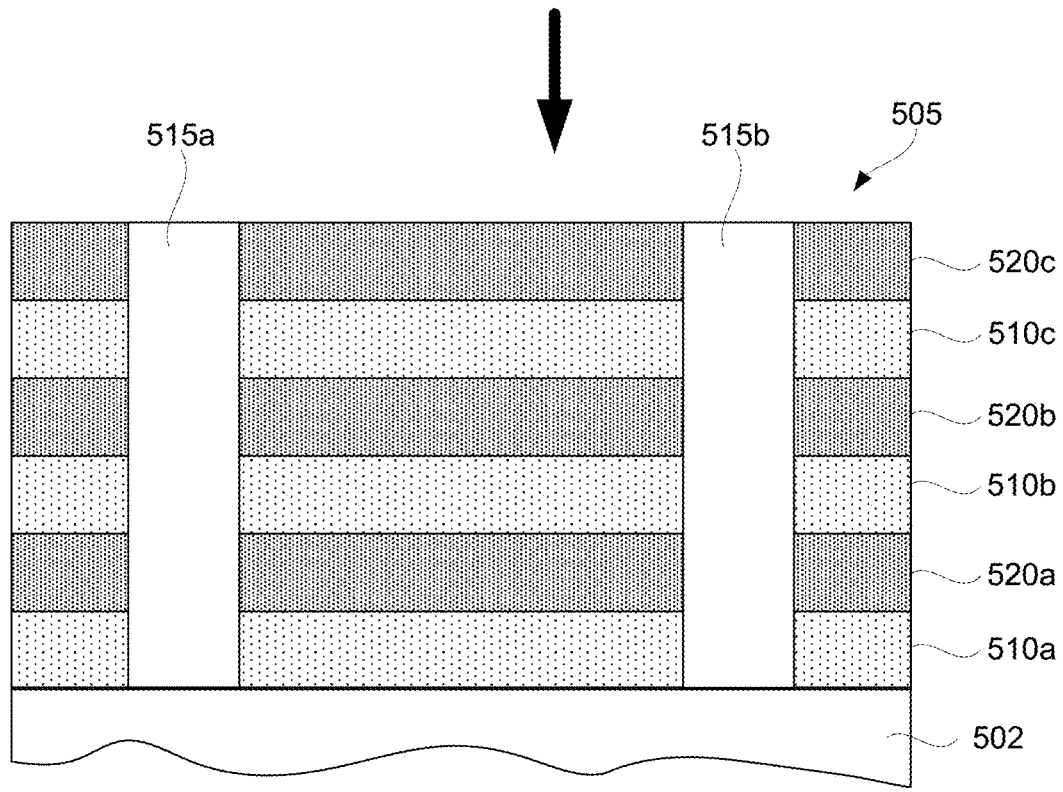

Method 400 may proceed with fabricating vias 515a-515b through stack 500 during operation 410. Vias 515a-515b may extend through all layers in stack 500 as, for example, shown in FIG. 5B or FIG. 8B. Vias 515a-515b may be fabricated by plasma etching, physical etching, wet etching, chemical etching, or combinations thereof. The size of the vias depend on the memory design generation (e.g. 40 nm, 20 nm, 10 nm, etc. nodes) and density of interest and the aspect ratio of the etch resulting from the thickness of the sum of all alternating material layer pairs divided by the size of the via diameter (critical dimension/CD). For different numbers of (e.g. 8, 16, 32, 64, 128, etc.) alternating material layer pairs, the via CD may be adjusted to manage the aspect ratio of the etch. Aspect ratios greater than approximately 60:1 to 80:1 can provide challenges to etching in some embodiments. In some embodiments, the via size is approximately 40 nm to 130 nm.

In some embodiments, method 400 may proceed with filling via (e.g., via 515a and 515b fabricated in the previous operation) with a first conductive material during operation 415. This first conductive material creates first signal lines 201a and 201b as, for example, shown in FIG. 5C (unless these signals lines have been already fabricated as one of the alternating material layers in the stack as shown in FIGS. 8A-8F). Some examples of materials suitable for first signal lines 201a and 201b include but are not limited to TiN, W, Co, Ni, Ru, Ir, Mo, Al, Cu, RuOx, IrOx, MoOx, TaN, WN, (doped) polysilicon, silicides, doped metals and alloys, and combinations thereof such as TiN/W, WN/W, TaN/W, TaN/Cu, etc. Low resistivity, fab friendly materials which can conformally line and/or gap or seam-free fill the vias are preferred. Deposition techniques such as PVD, ionized PVD, ALD, CVD, LPCVD, MOCVD, PEALD, PECVD, electroless plating, electroplating, and other suitable techniques as known in the art are used for liners, barriers, seed layers, and/or fill layers in fabricating signal lines 201a and 201b. First signal lines 201a and 201b may be fabricated in direct contact with each of the alternating material layers of stack 500.

Figures 1, 5F:
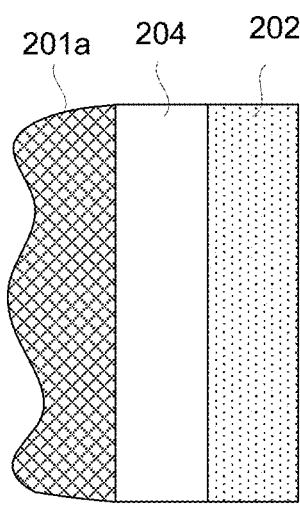
Figures 2, 5F:
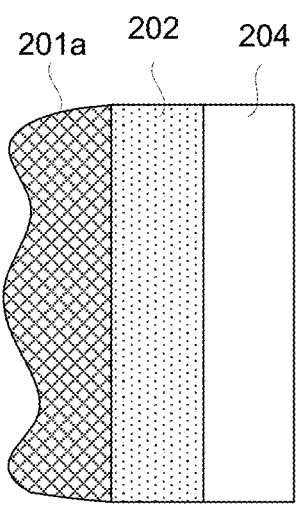
Figure 6A:
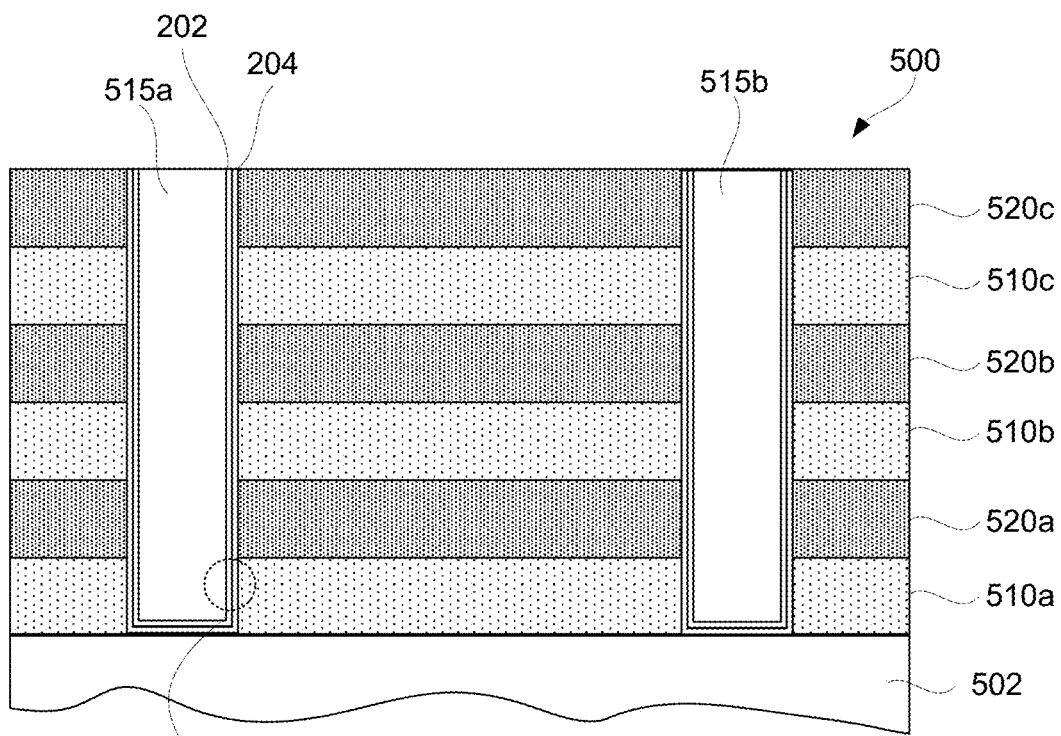

Alternatively, CCL 202 and/or memory cell layer 204 may be fabricated in vias 515a and 515b before fabricating any signal lines during optional operation 412. For example, FIG. 6A illustrates an example in which both CCL 202 and memory cell layer 204 are fabricated in via 515a and 515b. In some embodiments, CCL 202 is fabricated before memory cell layer 204 as, for example, sown in FIG. 6B-2. Alternatively, memory cell layer 204 is fabricated before CCL 202 as, for example, schematically shown in an expanded view of the stack portion presented in FIG. 6B-1. Furthermore, only one of CCL 202 and memory cell layer 204 may be fabricated in vias 515a and 515b as schematically shown in FIG. 7A and FIGS. 7B-1 and 7B-2. In these examples, method 400 may proceed the remaining portion of vias 515a and 515b with a conductive material, e.g., operation 412 is followed by operation 415.

Figure 5C:
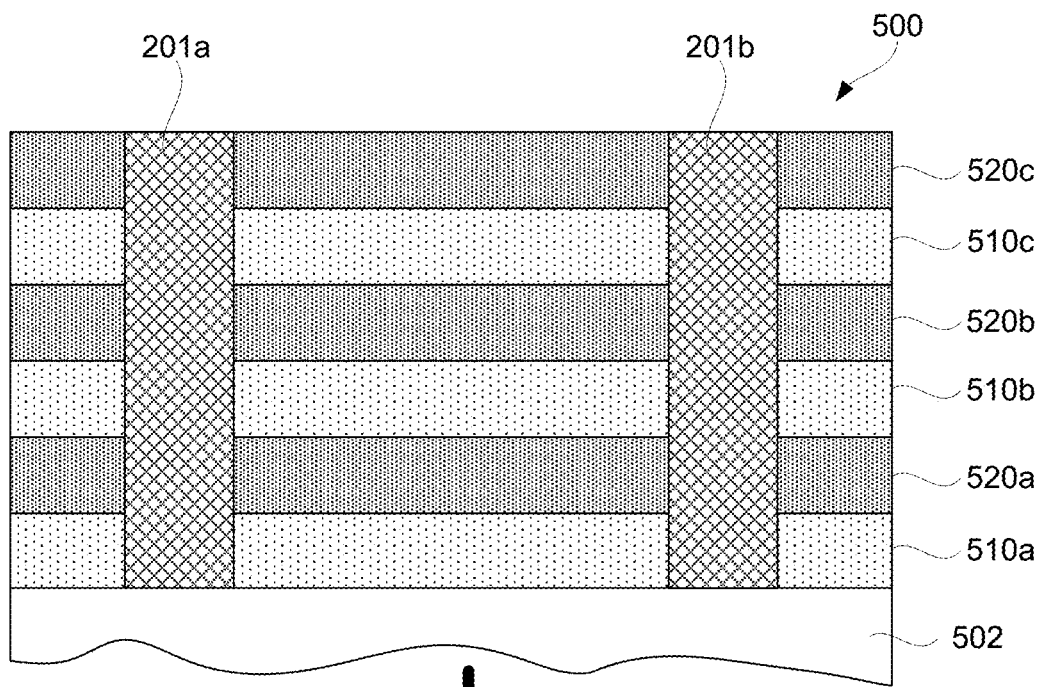
Figure 2:
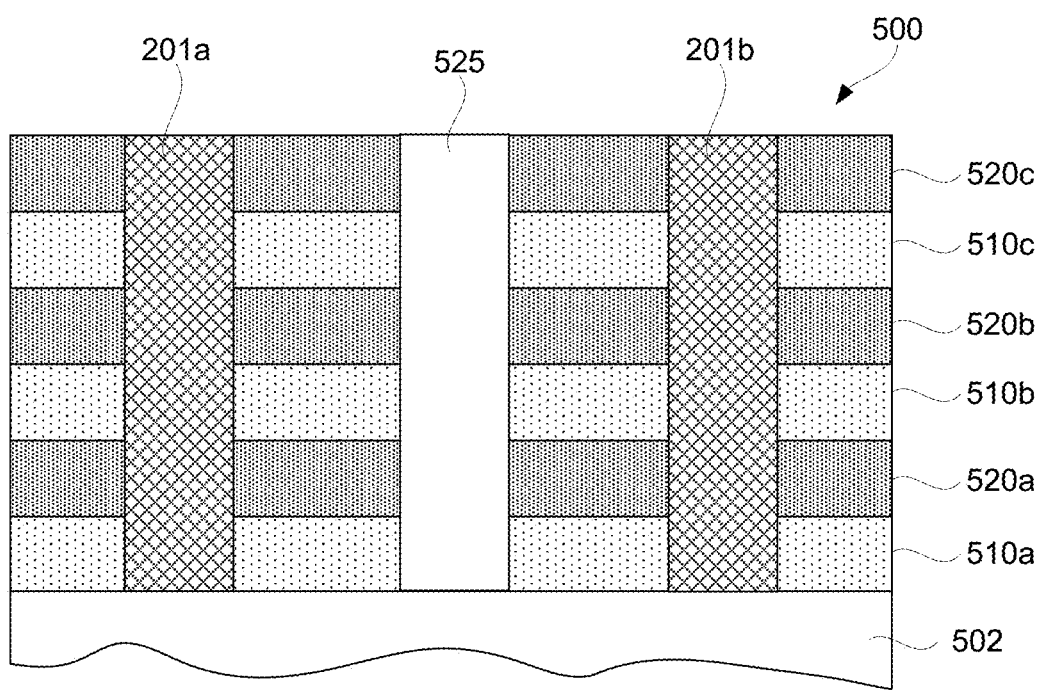
Figures 3, 5C:
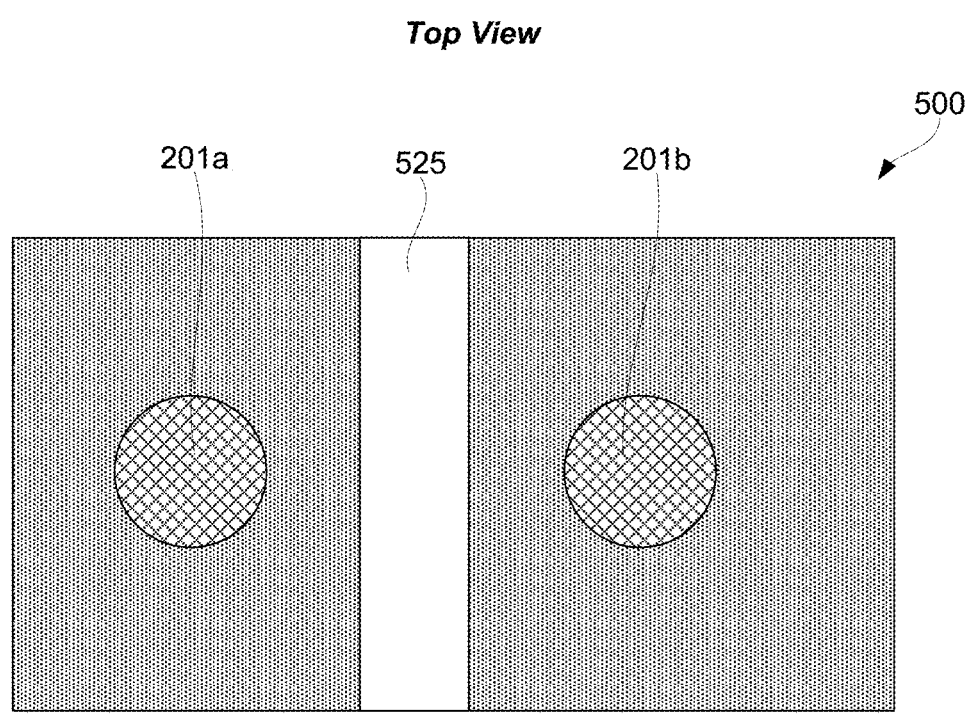

In some embodiments, method 400 may proceed with fabricating additional isolation structures 525 (e.g., in between first signal lines 201a and 201b) through stack 500 during optional operation 417 and shown in FIG. 5C-2. Isolation structure 525 may extend through all layers in stack 500 as, for example, shown in FIG. 5C-2, FIG. 5C-3 (top view), FIG. 6D, or FIG. 7D. Isolation structure 525 may be fabricated by plasma etching, physical etching, wet etching, chemical etching, or combinations thereof. Operation 417 may be similar to operation 410.

Figure 5D:
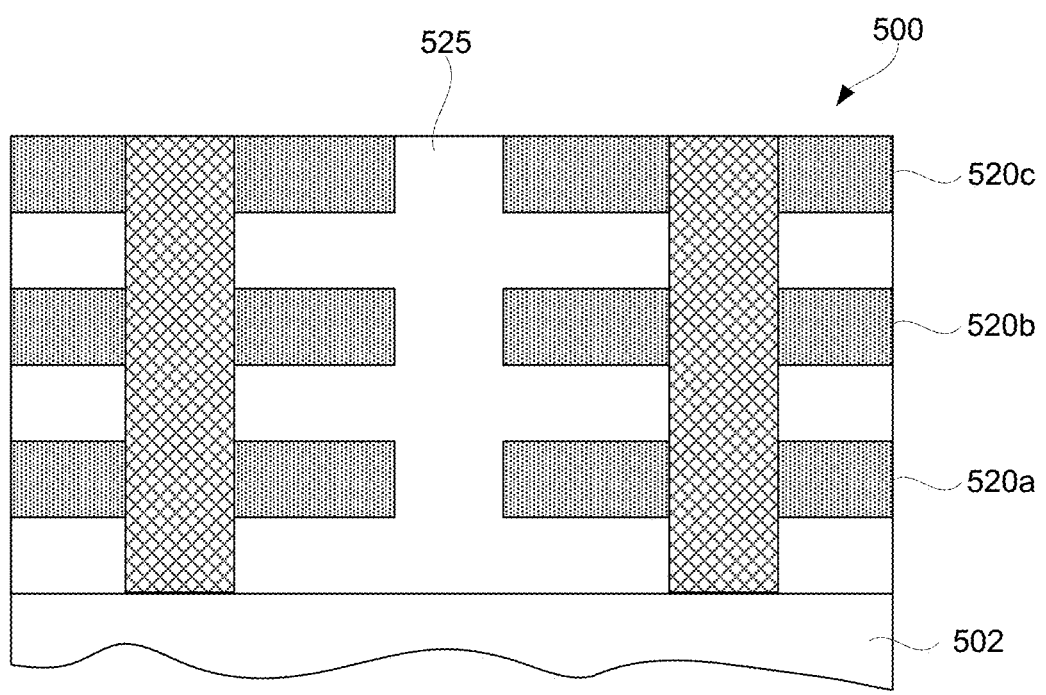

In some embodiments, method 400 may proceed with recessing/removing portions one of the two alternating materials of stack 500 during operation 420. For example, when stack is fabricated by alternating silicon nitride layers and silicon oxide layers, exposed silicon nitride layers may be removed (e.g., with wet etch using phosphoric acid), while silicon oxide layers may be retained as, for example, shown in FIG. 5D. Selective etching may be used for this operation. First conductive lines 530a and 530b may provide support to the remaining layers of stack 500.

Figure 5E:
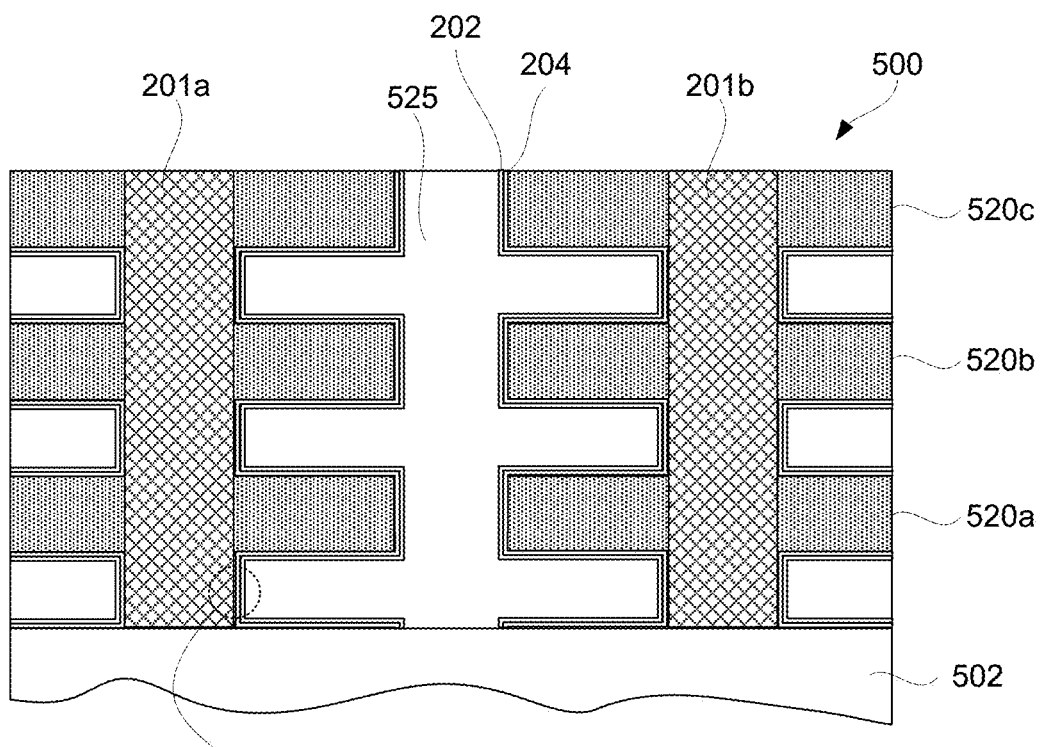

Method 400 may proceed with fabricating memory device layers on interior surfaces of stack during operation 430. This operation may involve a number of sub-operations, such as fabricating memory cell (sub-operation 434), fabricating CCL (sub-operation 436). In some embodiments, the memory device may have additional layers, such as electrodes as described above with reference to FIG. 2B. In this case, operation 430 may be also involve fabricating first electrode (sub-operation 432), and fabricating second electrode (sub-operation 438). Partially fabricated memory array 500 after completing operation 430 is shown in FIG. 5E.

Memory cell may be fabricated during sub-operation 434 using one or more oxides or other suitable materials described previously above. Memory cell may be fabricated using ALD or other suitable conformal processes.

Examples of materials for a CCL fabricated during sub-operation 436 are described above. It should be noted that certain compositions of two or more elements may not be possible to fabricate in a single ALD cycle because deposited materials often have certain stoichiometric compositions that may not closely correspond to the target composition. In these cases, the target composition may be achieved by depositing a stack of layers that include at least two layers having different compositions. In this case, the overall composition of the CCL depends on the number of layers, the composition of each layer, and the thickness of each layer. Even though, the stack has a non-uniform concentration throughout the thickness (e.g., varying from a layer having one composition to a layer having a different composition), more uniformity, if necessary, can be achieved by annealing the stack either as layers being fabricated or after fabricating of all layers. In some embodiments, a CCL may have a non-uniform composition throughout its thickness.

Each cycle for these two types of layers may represented by the following formulas (Me representing methyl group):

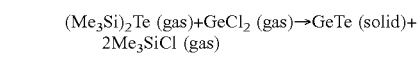
(Me$_3$Si)$_2$Te (gas)+GeCl$_2$ (gas)→GeTe (solid)+ 2Me$_3$SiCl (gas)

In some embodiments, CuS is introduced into the CCL through a reaction of a copper containing precursor, such as copper amidinate, with a sulfur containing reducing, agent such as hydrogen sulfide (H$_2$S), disilyl sulfide, or bistrialkyl-silyl sulfides.

In some embodiments, the CCL has a sulfur-rich composition. For example, the concentration of sulfur in the CCL may exceed 50 atomic % or even exceed 67 atomic %. The CCL may be formed using an ALD process. H$_2$S and a binary sulfur-halogen gas may be used as two ALD reactants. For example, H$_2$S and SF$_4$ may be used as reactants, producing S (solid) and HF (gas). Alternatively, H$_2$S and SF$_6$ may be used as reactants, producing S (solid) and HF (gas). Other materials that can be used in combinations with H$_2$S include SCl, SCl$_2$, and SBr. However, when SCl, SCl$_2$, and/or SBr, the process may involve providing a constant flow of the reactants or a sufficiently large chamber volume, to ensure very low pressure of the gaseous reactant product (HCl or HBr).

From the data based on density-functional theory (DFT) calculations, H$_2$S and SF$_6$ react at low temperatures (e.g., at T=OK) producing S (solid) and HF (gas). The reaction has a theoretical enthalpy of around −1.5e2 kJ/mol and may be presented by the following formula:

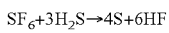
SF$_6$+3H$_2$S→4S+6HF

At a finite temperature, a finite partial pressure of one of the reactants (H$_2$S or SF$_6$) may be maintained while having one of the products (HF or HCl when other precursors are used) in very low partial pressure. The other product (sulfur) remains a solid, and the other reactant (respectively SF$_6$ or H$_2$S) stays in a solid-like partially reacted form chemisorbed on the deposition surface, which further favors the thermodynamics of this reaction. Thus, the ALD process of depositing sulfur may use H$_2$S and SF$_6$.

It should be noted that the reaction kinetics, when SF$_6$ is used, may be slow. As such, a deposition temperature may be increase which narrowing the temperature window based on reasons described above. However, SF$_4$ is a compound that may be metastable at low temperatures (e.g., at T=OK) and may decompose in accordance with the following reaction:

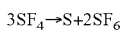
3SF$_4$→S+2SF$_6$

The theoretical enthalpy of this reaction is around −5e2 kJ/mol. SF$_4$ is commercially available and is very reactive. Thus, SF$_4$ is would have an even stronger tendency to react than SF$_6$, according to the following reaction:

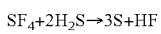
SF$_4$+2H$_2$S→3S+HF

The theoretical enthalpy of this reaction is around −3e2 kJ/mol.

The higher reactivity of SF$_4$, in comparison to SF$_6$, is expected to result in a wider temperature window and more efficient and controllable process. The favorable direction of both reactions (i.e., using SF$_4$ and SF$_6$) is illustrated in FIG.

17A by the line connecting the stable products (S+HF) in T=OK theoretical phase diagram.

Figure 17A:
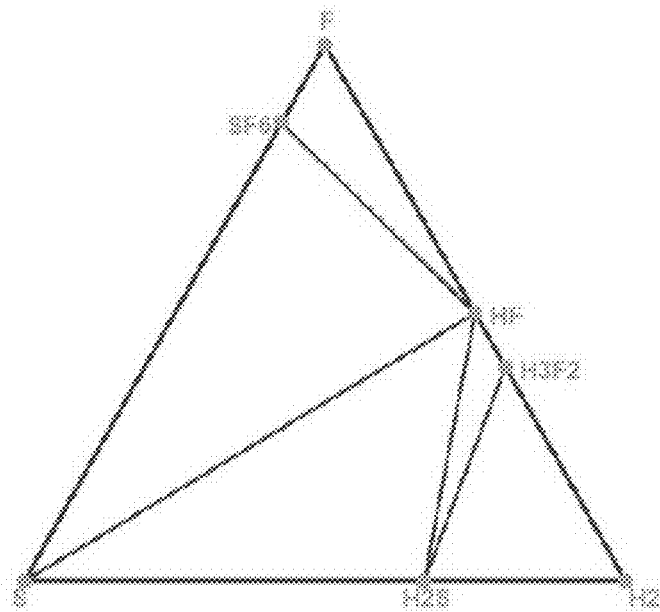
FIGS. 17A-17C illustrates phase diagrams for different types of sulfur-containing precursors.
Figure 17B:
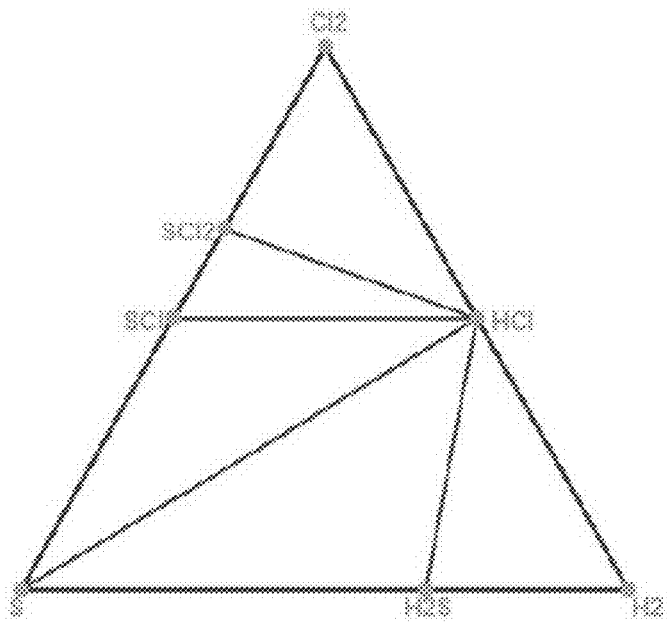
Figure 17C:
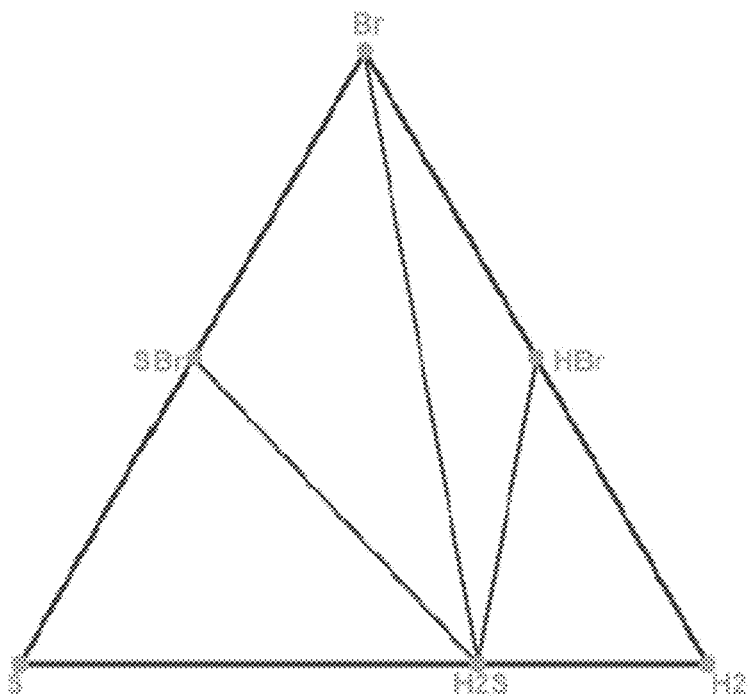

On the contrary, using other halogens (such as Cl or Br), a stable equilibrium exists between desired reactants, indicating those reactants may not be as effective for ALD deposition of S as $SF_4$ and $SF_6$. The phase diagrams for Cl or Br are shown in FIGS. 17B and 17C, respectively. However, by maintaining high partial pressures of reactants during each of the ALD cycles, while maintaining a low partial pressure of the gas product (HCl or HBr), the direction of the reaction may be shifted to deposition of S. At the same time, the use of I (iodine) as the halogen may not desirable because S and I do not form stable binaries, and use of elemental $I_2$ may result in the undesired deposition of elemental iodine.

By way of example, the specific compositions cited can be made using aforementioned techniques using below ALD unit reactions.

$$((CH_3)_3Si)_2Se + GeCl_2 \rightarrow GeSe + 2(CH_3)_3SiCl$$

$$((CH_3)_3Si)_2Te + GeCl_2 \rightarrow GeTe + 2(CH_3)_3SiCl$$

$$2((CH_3)_3Si)_2Se + Se(OEt)_4 \rightarrow 3Se + 4(CH_3)_3SiOEt$$

$$2((CH_3)_3Si)_2Te + Te(OEt)_4 \rightarrow 3Te + 4(CH_3)_3SiOEt$$

$$2((CH_3)_3Si)_2Se + Ge(OEt)_4 \rightarrow GeSe_2 + 4(CH_3)_3SiOEt$$

$$2((CH_3)_3Si)_2Te + Ge(OEt)_4 \rightarrow GeTe_2 + 4(CH_3)_3SiOEt$$

Table I shows a number of compounds useful in the deposition of chalcogenide containing films. These films are typically deposited in a vacuum apparatus using Chemical Vapor Deposition (CVD) or Atomic Layer Deposition (ALD).

TABLE I

Chalcogenide and related compounds grouped by oxidation state.

| −2 | 0 | +1 | +2 | +4 | +6 |
|---|---|---|---|---|---|
| $H_2Ch$ | $O_2$ | $S_2F_2$ | $SCl_2$ | $ChF_4$ | $ChF_6$ |
| $(R_3Si)_2Ch$ | $O_3$ | $S_2Cl_2$ | $GeCl_2$ | $GeCl_4$ | $ChClF_5$ |
| $(H_3Si)_2Ch$ | $Cl_2$ | | | $Si(OR)_4$ | |
| | $F_2$ | | | $Ch(OR)_4$ | |
| | $Br_2$ | | | $Ge(OR)_4$ | |

Ch = chalcogenide = S, Se, Te
R = H or alkyl group (e.g. ethyl, methyl, propyl, butyl, etc.)

For binary chalcogenide deposition, one selects from the table chemicals where the formal oxidation state of the chalcogenide or metal atom is opposite in sign and where the absolute value of the ratio of the oxidation states is the inverse of the desired ratio of elements in the binary film.

For example, to form binary compound $SiS_2$, tetraethylorthosilicate ($Si(OEt)_4$ or TEOS, oxidation state +4) and $H_2S$ (oxidation state −2) can be used. The successful reaction would proceed to form $SiS_2$ and ethanol as a byproduct. Additionally, the two chemicals may be chosen so that the thermodynamics of the reaction are favorable. For example, in the reaction $2H_2Te + Si(OEt)_4 \rightarrow SiTe_2 + 4EtOH$ the $\Delta G$ of the reaction is approximately +80 KJ/mol. $((CH_3)_3Si)_2Te$ may be used instead of $H_2Te$ which gives a negative $\Delta G$ and a more favored reaction.

There are other requirements for successful ALD reactions such as precursors which are stable sufficiently long enough to be synthesized, stored, and used in ALD reactions. In addition, the precursors must have sufficient vapor pressure (>0.1 Torr) so that they may be delivered to the ALD reaction chamber. If heating is required to achieve these vapor pressures (either in a bubbler or direct liquid injection system), the chemical must be stable under these conditions.

Examples of reactions for ALD of chalcogenide-containing CCLs may be as follows:

$$2((CH_3)_3Si)_2Te + Si(OEt)_4 \rightarrow SiTe_2 + 4(CH_3)_3SiOEt$$

$$2((CH_3)_3Si)_2Te + Ge(OEt)_4 \rightarrow GeTe_2 + 4(CH_3)_3SiOEt$$

$$((CH_3)_3Si)_2Te + GeCl_2 \rightarrow GeTe + 2(CH_3)_3SiCl$$

$$2H_2S + SF_4 \rightarrow 3S + 4HF$$

$$2((CH_3)_3Si)_2Te + Te(OEt)_4 \rightarrow 3Te + 4(CH_3)_3SiOEt$$

In addition, to form the elemental chalcogenides it is sometimes useful to react an oxidizer with the reduced form of the chalcogenide. An example of this is the reaction of $((CH_3)_3Si)_2Te$ with $O_2$ or $F_2$.

$$2((CH_3)_3Si)_2Te + O_2 \rightarrow 2Te + ((CH_3)_3Si)_2O$$

$$2((CH_3)_3Si)_2Te + F_2 \rightarrow 2Te + 2(CH_3)_3SiF$$

Figure 27:
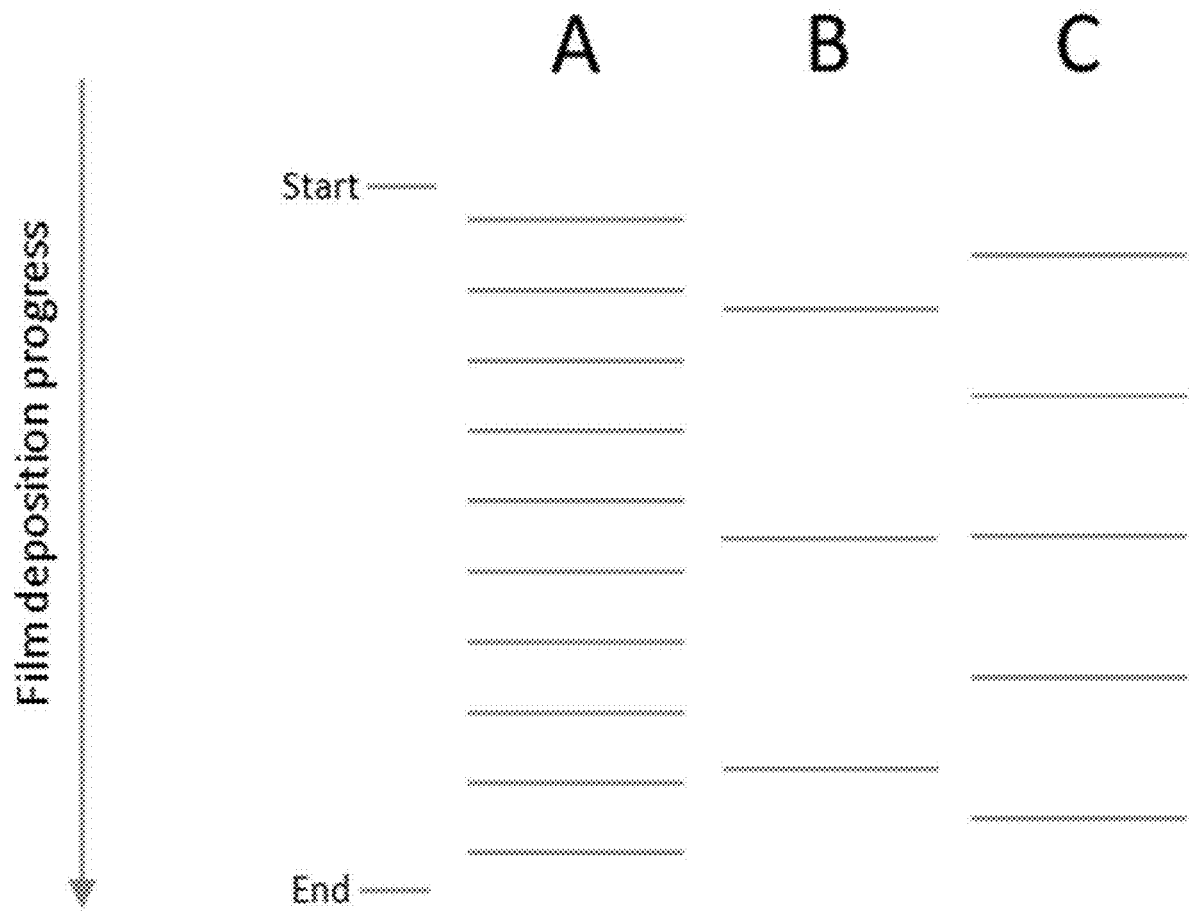
FIG. 27 illustrates an order of film deposition in an example ALD process.

To form a film of the desired composition multiple ALD cycles can be performed. The individual cycles of the component layers should be interspersed as evenly as possible to maximize compositional uniformity. As an instructive example, take the film of arbitrary composition $A_aB_bC_c$ where A, B, and C are the film components which may be elemental (e.g. Te, Se) or compound (e.g. $SiTe_2$, GeSe) and a, b, and c are the relative fractions of these components. For each of these components, an ALD process is used to form them (e.g. if A=GeTe the reaction $((CH_3)_3Si)_2Te + GeCl_2 \rightarrow GeTe + 2(CH_3)_3SiCl$ may be used). Each of the component ALD reactions will exhibit a particular growth per cycle (GPC) characteristic of the chemistry and process conditions used (e.g. pressure, reactant partial pressure, flow rates of gasses, temperature, etc.). These GPC rates for A, B, and C can be represented by $\alpha$, $\beta$, and $\gamma$. Thus the number of ALD cycles required for each component can be determined from the product of the ratio of the individual component fraction and the ratio of the component GPC to the total film thickness. For example, the number of cycles of component A will be $$\text{\# Cycles } A = \frac{a}{a+b+c}\frac{T}{\alpha}$$

where T is the total desired film thickness. Given the desired number of cycles of each component, a schedule can be constructed which determines the order of individual ALD cycles of each component. The schedule of cycles for each component should be uniformly spaced so that the cycles span the film stack. For example, if for a film of $A_aB_bC_c$ it is determined that 10 cycles of A, 3 cycles of B, and 5 cycles of C are desired, the schedule can then be represented graphically by the illustration in FIG. 27.

Thus the order of depositions in this case would be ACABACAABCAACABACA—completing the film stack.

Sometimes it is desirable to switch the order of adjacent layers if the deposition is more favored in some pairwise order. For example, if component C has a more desirable growth on component A than on component B, the order ABC may be switched to ACB. These examples of three components can be extended to two, four, or more components as required.

By way of example, consider the composition $Ge_xSe_yTe_z$ where in one example x=3, y=6 and z=1. The simplest ALD chemistries that are used to form the material are $$2((CH_3)_3Si)_2Se+Ge(OEt)_4 \rightarrow GeSe_2+4(CH_3)_3SiOEt \quad \text{(reaction \#1)}$$

$$2((CH_3)_3Si)_2Te+Te(OEt)_4 \rightarrow 3Te+4(CH_3)_3SiOEt \quad \text{(reaction \#2)}$$

While the growth per ALD cycle for these reactions depends on details of the deposition equipment, it is convenient to choose 1 Angstrom (0.1 nm) per cycle for each process. If the GPC is substantially different than this, the number of ALD cycles can be increased or decreased accordingly as is described previously.

The deposition starts with nine cycles of reaction #1 which are followed by one cycle of reaction #2. This application of nine instances of reaction #1 followed by one instance of reaction #2 can be termed a supercycle. Then this supercycle is repeated until the film reaches the desired thickness, which in some embodiments are between 1 nm and 20 nm. Thus a 5 nm film of $Ge_xSe_yTe_z$ where x=3, y=6 and z=1 would require five applications of the supercycle described.

As a second example, consider the composition $Ge_xSe_yTe_z$ where in this example x=5, y=10 and z=3. The simplest ALD chemistries that are used to form the material are $$2((CH_3)_3Si)_2Se+Ge(OEt)_4 \rightarrow GeSe_2+4(CH_3)_3SiOEt \quad \text{(reaction \#4)}$$

$$((CH_3)_3Si)_2Te+GeCl_2 \rightarrow GeTe+2(CH_3)_3SiCl \quad \text{(reaction \#5)}$$

$$2((CH_3)_3Si)_2Se+Se(OEt)_4 \rightarrow 3Se+4(CH_3)_3SiOEt \quad \text{(reaction \#6)}$$

Again, while the growth per ALD cycle for these reactions depends on details of the deposition equipment, it is convenient to choose 1 Angstrom (0.1 nm) per cycle for each process. If the GPC is substantially different than this, the number of ALD cycles can be increased or decreased accordingly as is described previously.

This supercycle would use 3 layers to achieve this composition. Using the designations of reactions #4, #5, and #6 as above, the supercycle sequence would be {4, 5, 6}, or combinations thereof, e.g. {4, 6, 5}, or {5, 4, 6}, etc. If the ALD reactions each gave 1 Angstrom of film, this supercycle would deposit 0.3 nm of material of the appropriate composition. Then this supercycle is repeated until the film reaches the desired thickness, which in some embodiments are between 1 nm and 20 nm. Thus a 4.8 nm film of $Ge_xSe_yTe_z$ where x=5, y=10 and z=3 would require 16 applications of the supercycle described.

Elemental ALD can be used in some embodiments to improve the effective thermal stability of the CCL stack. The table below illustrates some of the elemental species which can be used in such fashion and the associated melting temperatures. In some embodiments, at least one of elemental Te, Sb, Ge, or Si is used as a thermal cap for the CCL stack. In other embodiments, at least one of elemental Te, Sb, Ge, or Si is inserted in a nano-laminate fashion to improve the effective thermal stability of the CCL stack. Sn, Bi, and Se has comparatively lower melting temperatures.

It is preferable in some embodiments to be able to effect the ALD processing temperature at low temperatures, e.g. lower than the Tg, Tc, and Tm of the CCL composition of interest. Elemental Te and Sb chemistries can be processed at low temperatures (e.g. <150 C) using a dual ligand strategy as listed in Table II below and Table I in the prior section.

Ge and Si tend to need higher deposition temperatures (e.g. >300 C) which makes integration with low Tg, low Tc, and/or low Tm chalcogen containing CCL films difficult as it may deleteriously modify said underlying layers. Processes used to incorporate Ge and Si are preferably <300 C, more preferably <150 C.

TABLE II

Comparative melting points of elemental cap materials.

| Elemental ALD | Melting Temp (C.) | Comments |
|---|---|---|
| Sn | 232 | Too Low |
| Bi | 271 | Too Low |
| Se | 180-221 | Too Low |
| Te | 449 | e.g., $Te(OR)_4$ + $Te(R_3Si)_2$ |
| Sb | 630 | e.g., $SbCl_3$ + $Sb(R_3Si)_3$ or $Sb(OR)_3$ + $Sb(R_3Si)_3$ |
| Ge | 938 | DHP as reducing agent for Ge source (e.g. Ge halides) |
| Si* | 1410 | $SiH_4$ soak or higher order silanes |

In some embodiments, the CCL is free from arsenic, which is highly toxic. The CCL may include at least one or more of germanium and silicon, at least one or more of tellurium, selenium, and sulfur, at least one or more of nitrogen and carbon, and/or copper.

In some embodiments, the CCL is in direct contact with a memory cells, e.g., a metal oxide memory layer. Alternatively, an optional electrode separates the CCL from the memory cell.

Some examples of ALD reaction pathways are presented below. A binary-chalcogenide containing layer comprising germanium and tellurium may be deposited using:

$$(Me_3Si)_2Te\text{ (gas)}+GeCl_2\text{ (gas)}=>GeTe\text{ (solid)}+2Me_3SiCl\text{ (gas)}$$

A single-elemental chalcogenide layer may be fabricated using:

$$(R_3Si)_2Te\text{ (gas)}+H_2O\text{ (gas)}=>Te\text{ (solid)}+R_3SiOSiR_3\text{ (gas)}+H_2\text{ (gas)}$$

Some examples of alkyl (R) in $(R_3Si)_2Te$ are methyl, ethyl, phenyl, and mixtures of these and other organics groups. Tellurium may be substituted by selenium.

Another example of fabricating a single elemental chalcogenide layer is presented by the following formula:

$$TeF_6\text{ (gas)}+3C_{10}H_{22}N_2Si_2\text{ (gas)}=>Te\text{ (solid)}+6Me_3SiF+3C_4H_4N_2$$

$C_{10}H_{22}N_2Si_2$, which is 1,4-bis(trimethylsilyl)-1,4-dihydropyrazine (DHP), is a strong reducing agent. Other strong reducing agents may be used as well, such as atomic hydrogen (such as is generated in a remote $H_2$ plasma), $C_{13}H_{26}Si_2$ (CHP), and $C_9H_{16}Si$ (1-trimethylsilyl-2,5-cyclohexadiene). As with the previous examples, tellurium may be substituted by selenium.

In the above examples, deposition of binary chalcogenide layers and single elemental chalcogenide layers may be performed at less than 150° C. or even at less than 100° C. The lower temperatures required in these ALD reactions can be attributed in part to the large thermodynamic driving force of reactions between relatively strong reducing agents and oxidizing agents such as these and the stability of the byproducts.

Such single elemental tellurium layers may be used in various combinations with other single elemental layers and/or binary layers to achieve specific compositions of the CCL. For example, a binary GeTe layer can be alternated with 5 single elemental Te layers to form a composite with the formula of $GeTe_6$.

A brief description of ALD process may be helpful to better understand various aspects of controlling the composition of the CCL. Each ALD cycle involves the following four steps: introducing one or more precursors into the depositing chamber to fabricate an absorbed layer, followed by purging these precursors, and then introducing reactive agents that will react with the precursor in the absorbed layer to fabricate a portion of the CCL. This process is followed by purging the excess reactive agents and byproducts. For purposes of this description, reactive agents may be also referred to as precursors, and in some instances, a portion of the reactive agent also goes into fabricating of the CCL (e.g., carbon of an organic reactive agent). Selection of precursors and processing conditions depend on desired composition, morphology, thickness and structure of the resulting CCL as well as the underlying surface type that the CCL will be deposited. A layer fabricated during each atomic layer deposition cycle described above may be between about 0.05 and 2 Angstroms thick. The cycle may be repeated multiple times until the overall base layer (and subsequently the thickness of the CCL) reaches it desired thickness. In some embodiments, ALD cycles are repeated using different precursors to fabricate layers of different compositions that collectively fabricate the CCL.

A precursor containing one or more elements that are used for CCL is introduced into the ALD chamber and allowed to flow over the deposition surface (which may have previously deposited ALD layers) provided therein. The precursor is introduced in the form of a pulse. After this pulse (and other pulses when other precursors/reactive agents are introduced), the reaction chamber is purged, for example, with an inert gas to remove unreacted precursors/reactive agents, reaction products, and other undesirable components from the chamber.

The introduced precursor adsorbs (e.g., chemisorb) on the deposition surface. Subsequent pulsing with a purging gas removes excess precursor from the deposition chamber. In some embodiments, purging is performed before full saturation of the substrate surface occurs with the precursors. In other words, additional precursor molecules could have been further adsorbed on the substrate surface if the purging was not initiated so early. This aspect may be referred to as partial saturation.

After the initial precursor pulsing and purging of the precursor, a subsequent pulse introduces a reactive or reducing agent, which reacts with the adsorbed precursor to fabricate a portion of CCL. Reaction byproducts and excess reactants are purged from the deposition chamber. The saturation during the reaction and purging stages makes the growth self-limiting. This feature helps to improve deposition uniformity and conformality and allows more precise control of CCL.

The temperature of the substrate during atomic layer deposition may be between about 50° C. to 350° C. The precursor may be either in gaseous phase, liquid phase, or solid phase. If a liquid or solid precursor is used, then it may be transported into the chamber an inert carrier gas, such as argon or nitrogen.

In the above examples, deposition of binary chalcogenide layers and single elemental chalcogenide layers may be performed at less than 150° C. or even at less than 100° C. The lower temperatures required in these ALD reactions can be attributed in part to the large thermodynamic driving force of reactions between relatively strong reducing agents and oxidizing agents such as these and the stability of the byproducts.

Such single elemental tellurium layers may be used in various combinations with other single elemental layers and/or binary layers to achieve specific compositions of the CCL. For example, a binary GeTe layer can be alternated with 5 single elemental Te layers to form a composite with the formula of $GeTe_6$.

Examples of phosphorus (P) containing precursors include phosphine ($PH_3$), diethyl phosphoramidate. Examples of arsenic (As) containing precursors include $AsCl_3$, $(Me_3Si)_3As$, and arsine $AsH_3$. Examples of antimony (Sb) containing precursors include $SbCl_3$, $(Me_3Si)_3Sb$, and tris(dimethylamido)antimony. Examples of selenium containing precursors include diselenium dichloride, selenium tetrafluoride, selenium hexafluoride, hydrogen selenide, alkyl selenides (such as $Me_2Se$), and alkylsilyl selenides (such as $(Me_3Si)_2Se$ and selenium alkoxides (such as $(MeO)_4$ Se). Examples of Sulfur containing precursors include hydrogen sulfide, disilyl sulfide $((SiH_3)_2S)$, and bistrialkylsilyl sulfides (such as $(Me_3Si)_2S$).

Now referring to Group IVB elements, examples of carbon (C) containing precursors include trimethyl aluminum (TMA), acetylene, formic acid, methane, CHx containing radicals/moieties, and carbon-containing precursors that may also be used to provide other elements. Trimethyl aluminum may be used as both carbon source and as a reducing agent. Furthermore, parts of carbon containing ligands from other precursors (e.g., Se, Te, Cu containing precursors) may be used as sources of carbon. Examples of silicon (Si) containing precursors include silane ($SiH_4$) and higher order silanes ($Si_nH_{2n+2}$), as well as halogenated versions such as hexachlorodisilane. Examples of germanium (Ge) containing precursors include $GeCl_2.(C_4H_8O_2)$, $GeCl_4$, $Ge(OCH_3)_4$, Ge(II) amidinate. Specifically, $Ge(OCH_3)_4$ may be used to form $GeTe_2$ layers in combination with alkyl tellurium precursors, while Ge(II) amidinate may be used for GeS layers in combination $H_2S$ precursor.

Now referring to electronegative metal elements, examples of copper (Cu) containing precursors include Cu amidinate (which is a Ge analogue), copper(2+) bis(2,2-dimethylpropanoate) $Cu(acac)_2$.

Now referring to reducing agents, examples of such agents include 1,4-Bis(trimethylsilyl)-1,4-dihydropyrazine (DHP), $C_{13}H_{26}Si_2$ (CHP), $C_9H_{16}Si$ (1-trimethylsilyl-2,5-cyclohexadiene), hydrogen gas ($H_2$) or H containing atoms or radicals (such as is generated in a remote $H_2$ plasma).

Figure 4B:
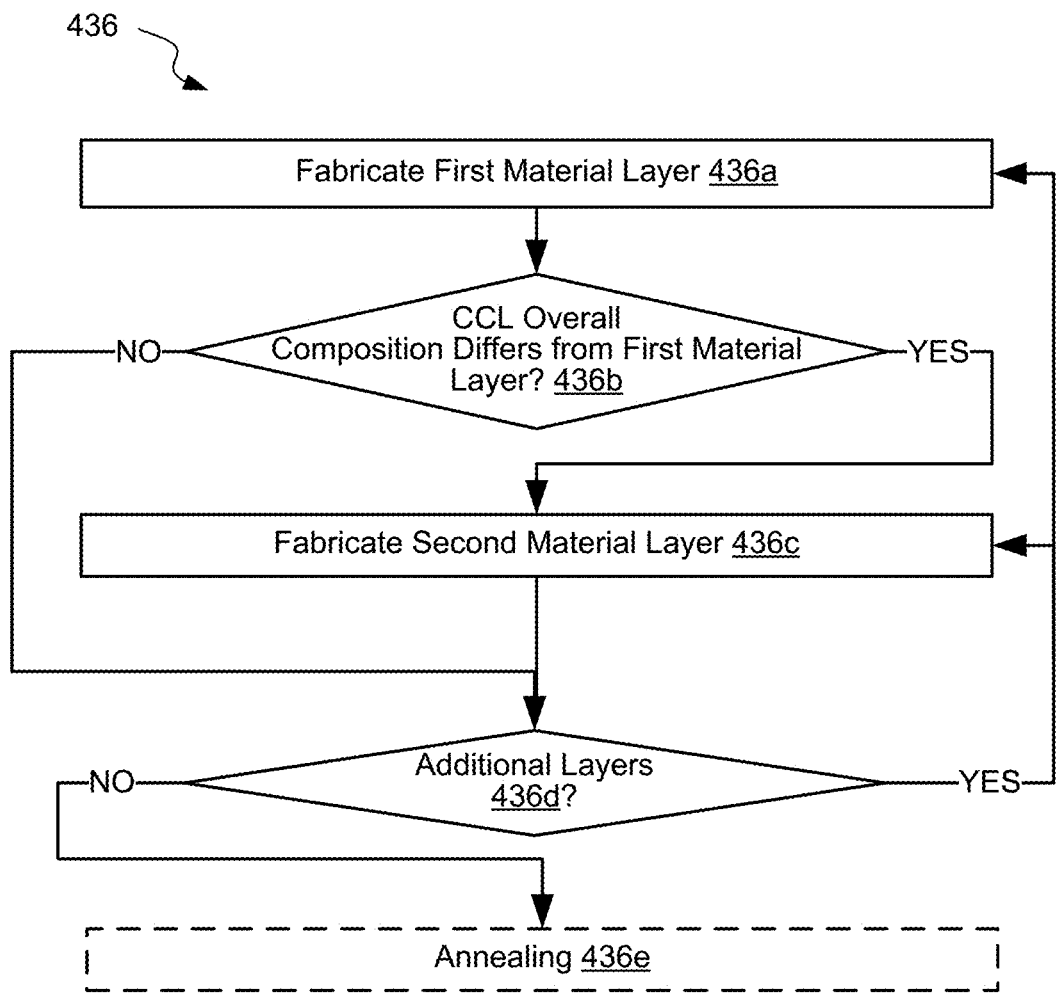
FIG. 4B is a process flowchart of fabricating a CCL in a 3D array, in accordance with some embodiments.
Figure 4C:
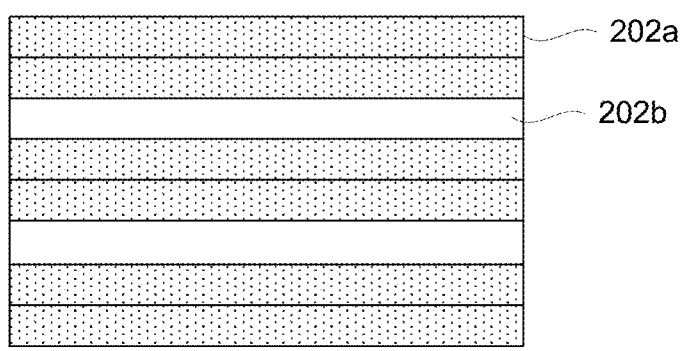
FIG. 4C is an example of a nanolaminate, in accordance with some embodiments.
Figure 4D:
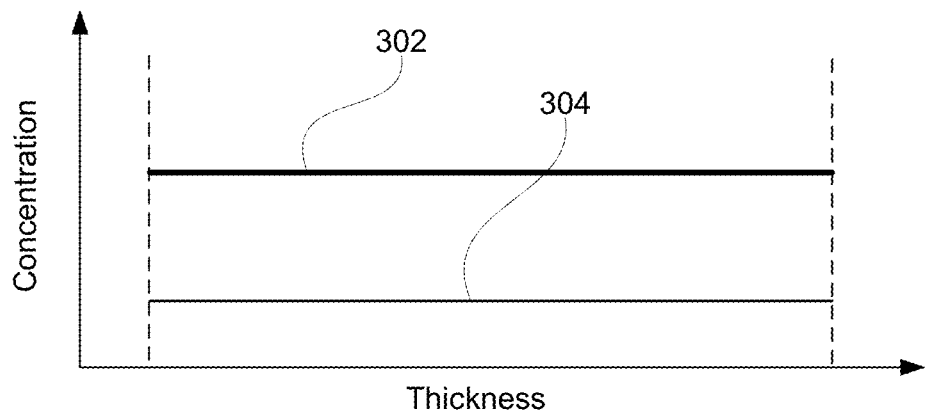
FIGS. 4D and 4E are examples of concentration profiles within a CCL, in accordance with some embodiments.
Figure 4E:
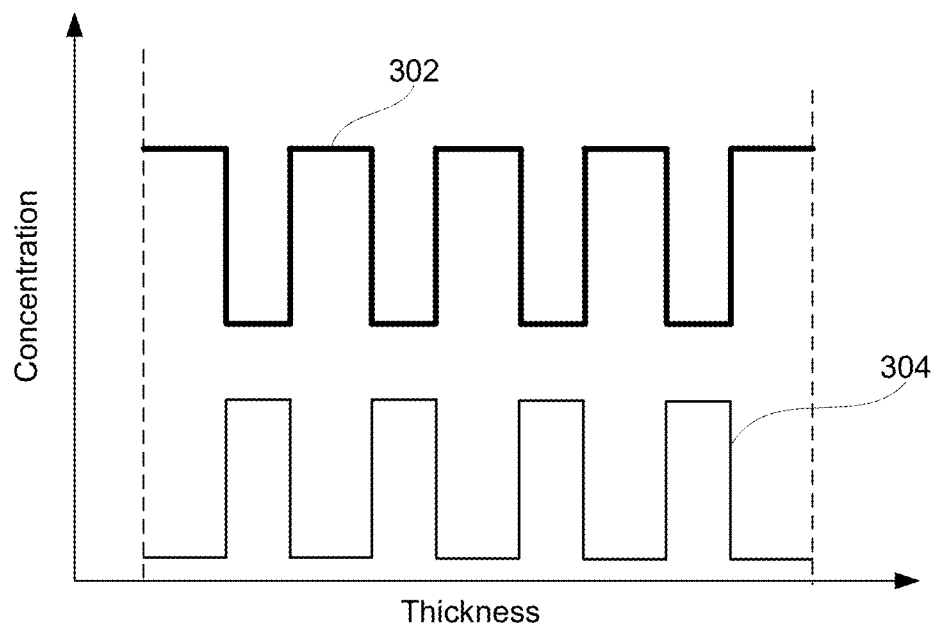

The ALD cycles are repeated until the entire nanolaminate structure of a CCL is fabricated as schematically shown in FIG. 4C. As noted above, each nanolaminate structure may include at least two layers having different compositions used to control the overall composition of a CCL. One having ordinary skill in the art would understand that arrangement of first material layers 202a and second material layers 202b shown in FIG. 4C is just one example. Various other arrangements are possible to achieve the overall desired composition, thickness, material distribution within the layers, and other like characteristics. For example, FIG. 4D and FIG. 4E illustrates two examples of concentration profiles within a CCL. In the example shown in FIG. 4D, concentration profiles 302 and 304 of first material layers 202a and second material layers 202b are uniform throughout the entire CCL thickness. This profile may be achieved when first material layers 202a and second material layers 202b are introduced in each ALD cycle or when annealing is used after forming a nanolaminate to redistribute first material layers 202a and second material layers 202b within the CCL. In the example shown in FIG. 4E, concentration profiles 302 and 304 of first material layers 202a and second material layers 202b are non-uniform. Small portions of the CCL include high concentrations of first material layers 202a and low concentrations of second material layers 202b and vice versa. This type of a CCL may be formed when one ALD cycle forms only or predominantly first material layers 202a, while another (different) ALD cycle forms only or predominantly second material layers 202b. It should be noted that the example shown in FIG. 4E may be converted to some extent into the example shown in FIG. 4D by annealing.

In some embodiments, the same element of CCL may be deposited using two different element-containing precursors in different ALD cycles. For example, one ALD cycle may use a first tellurium-containing precursor, while another ALD cycle may use a second tellurium-containing precursor that is different from the first precursor. For example, alkylsilyl tellurides (such as $(Me_3Si)_2Te$) can be reacted with tellurium alkoxides (such as $Te(OMe)_4$) to form elemental Te. As with the previous examples, tellurium may be substituted by selenium in either or both the first or second precursor. Because the precursors and their chemistry are different, different types of layers will be deposited in each of these ALD cycles, e.g., having different compositions, having different thicknesses. For example, if $Ge(II)Cl_2$ and $Te(II)(TMS)_2$ are used as precursors, GeTe is the predominant material formed by ALD. If $Ge(IV)Cl_4$ and $Te(II)(TMS)_2$ are used as the precursors, $GeTe_2$ is the predominant material formed by ALD. If $Ge(IV)(OEt)_4$ and $Te(II)(TMS)_2$ are used as the precursors, $GeTe_2$ is the predominant material formed by ALD. If $Sb(III)(OEt)_3$ and $Te(II)(TMS)_2$ are used as the precursors, $Sb_2Te_3$ is the predominant material formed by ALD. If $Sb(III)Cl_3$ and $Te(II)(TMS)_2$ are used as the precursors, $Sb_2Te_3$ is the predominant material formed by ALD.

In each ALD layer cycle, two metal precursors (of the same metal) may be used. In this case, a reactive metal precursor may be reacted directly with a co-reactive metal precursor. Each of the metal precursors includes a metal and at least one ligand coordinated to the metal, with the metal in each of the metal precursors being the same. In other words, the metal precursors used in a particular ALD layer cycle may differ in the ligands, which provide the desired degree of reactivity to the metal precursors, but have the same metal center. The number of ligands coordinated to the metal is dependent on the valence state of the metal and may be determined by a person of ordinary skill in the art. For simplicity, the term "ligand" is used herein even if multiple ligands are coordinated to the metal. Each of the ligands coordinated to the metal may be selected depending on the desired reactivity of the metal precursor. As used herein, the terms "reactive metal precursor" and "co-reactive metal precursor" are used to differentiate between the metal precursors and do not indicate relative reactivities of the metal precursors utilized in a particular ALD layer cycle.

In some specific examples, the two metal precursors used in a particular ALD layer cycle may have the following general structure $M\text{-}(L1)_n$ and $M\text{-}(L2)_n$, where M is the metal (germanium, antimony, or tellurium), L1 and L2 are ligands, and n is the number of ligands coordinated to the metal, which is dependent on the valence state of the metal and is an integer greater than or equal to 2. Each of the ligands coordinated to the metal may be the same or may be different so long as the desired reactivity of the metal precursor is achieved. As a result, the metal precursor may be symmetric or asymmetric. The metal precursors used in a particular ALD layer cycle may be able to participate in efficient ligand exchange reactions with one another or react with the surface. The metal precursors may also have sufficient reactivity, thermal stability, and volatility to be used in the ALD process. The metal precursors may be solids, liquids, or gases at room temperature (from approximately 20° C. to approximately 25° C.).

By way of example, during an ALD layer cycle to deposit a tellurium monolayer on a substrate, two tellurium precursors may be utilized, with one of the tellurium precursors being a reactive tellurium precursor and the other being a co-reactive tellurium precursor. Since the tellurium has a valence state of −2 or +4, two ligands or four ligands may be coordinated to the tellurium. Thus, the formation of the tellurium layer during the ALD layer cycle may utilize two tellurium precursors having a common metal center but different ligands. As with the previous examples, tellurium may be substituted by selenium.

Reactive ligands that may be used include, but are not limited to, a halide group or an alkoxide group. By way of example, the reactive ligand may be a fluoride group, a chloride group, a bromide group, an iodide group, or combinations thereof. Metal halides that may be used as the reactive metal precursor include, but are not limited to, $Ge(II)F_2$, $Ge(IV)F_4$, $Ge(II)Cl_2$, $Ge(IV)Cl_4$, $Ge(II)Br_2$, $Ge(IV)Br_4$, $Ge(II)I_2$, $Ge(IV)I_4$, $Sb(V)F_5$, $Sb(III)F_3$, $Sb(III)Cl_3$, $Sb(V)Cl_5$, $Sb(III)I_3$, $Sb(III)Br_3$, $TeF_4$, $TeF_6$, $TeF_4Cl_2$, $Se_2Cl_2$, $SeF_6$, or $SeF_4$. Such metal halides are commercially available from numerous sources, such as from Sigma-Aldrich Co. (St. Louis, Mo.). While most of the above examples includes a single type of halide group as the ligand, a metal halide having at least two different halide groups may be used. The alkoxide group of the reactive ligand may include an alkyl group having from one carbon atom to eight carbon atoms, including straight or branched carbon chains or rings. By way of example, the alkoxide group may be a methoxy group (OMe), an ethoxy group (OEt), an iso-propoxy group, an n-propoxy group, an iso-butoxy group, an n-butoxy group, a sec-butoxy group, a t-butoxy group, a pentoxy group, a hexoxy group, a heptoxy group, an octoxy group, or combinations thereof. The alkoxide may also include heteroatoms, such as oxygen or nitrogen. Metal alkoxides that may be used as the reactive metal precursor include, but are not limited to, germanium(IV) methoxide $(Ge(OMe)_4)$, germanium(IV) ethoxide $(Ge(OEt)_4)$, antimony(III) methoxide $(Sb(OMe)_3)$, antimony (III) ethoxide $(Sb(OEt)_3)$, selenium(IV) methoxide $(Se(OMe)_4)$, or selenium(IV) ethoxide $(Se(OEt)_4)$, tellurium tellurium(IV) methoxide $(Te(OMe)_4)$, or tellurium(IV) ethoxide $(Te(OEt)_4)$. Such metal alkoxides are commercially available from numerous sources, such as from Sigma-Aldrich Co. (St. Louis, Mo.). While each of the above examples includes a single type of alkoxide group as the ligand, a metal alkoxide having at least two different alkoxide groups may be used.

The co-reactive ligand coordinated to the metal may be a substituted silyl group. The substituents on the silicon atom of the substituted silyl group may include a hydrogen atom, an alkyl group, an alkenyl group, a halogen atom, or combinations thereof. The alkyl group and alkenyl group may have from one carbon atom to four carbon atoms and may include straight or branched carbon chains. By way of example, the silicon atom may be substituted with trimethyl groups, forming a trimethylsilyl (TMS) group. The substituted silyl group may also include heteroatoms, such as oxygen or nitrogen. Metal silyl compounds that may be used as the co-reactive metal precursor include, but are not limited to, a bis-silylgermanium compound, a silylalkylgermanium compound, a tetrasilylgermanium compound, a tris-silylalkylgermanium compound, a tris-silylgermanium hydride compound, a silyltrialkylgermane compound, a disilyldialkylgermanium compound, a silyltrialkylgermanium compound, a trisilylantimony compound, a disilylalkylantimony compound, a dialkylsilylantimony compound, a disilylaminoantimony compound, a disilylselenium compound, a silylalkylselenium compound, a silylaminoselenium compound, a disilyltellurium compound, a silylalkyltellurium compound, or a silylaminotellurium compound. By way of example, the metal silyl compound may be $Ge(II)(TMS)_2$, $Ge(IV)(TMS)_4$, $GeH(TMS)_3$, $Sb(III)(TMS)_3$, $Se(II)(TMS)_2$, or $Te(II)(TMS)_2$. Such metal silyl compounds are commercially available from numerous sources, such as Air Products and Chemicals, Inc. (Allentown, Pa.), or may be synthesized by conventional techniques.

By way of example, to form a germanium layer by ALD, the reactive germanium precursor (i.e., $GeCl_2$) and the co-reactive germanium precursor (i.e., $GeH(IV)(TMS)_3$) may be sequentially introduced into the ALD reaction chamber and exposed to the substrate. The reactive germanium precursor may be introduced into the ALD reaction chamber and reacted with the substrate to form a partial germanium monolayer, the ALD reaction chamber purged to remove excess reactive germanium precursor and byproducts, the co-reactive germanium precursor introduced into the ALD reaction chamber and reacted with the substrate, and the ALD reaction chamber purged to remove excess co-reactive germanium precursor and byproducts. The reactive germanium precursor and the co-reactive germanium precursor may each be pulsed into the ALD reaction chamber for an amount of time sufficient for the reactive germanium precursor and the co-reactive germanium precursor to be chemisorbed or adsorbed to the substrate, resulting in the formation of the germanium layer. During formation of the germanium layer, the ALD reaction chamber may be maintained at a temperature of between approximately 50° C. and approximately 250° C.

To fabricate an antimony layer by ALD, the reactive antimony precursor (i.e., $Sb(OEt)_3$) and the co-reactive antimony precursor (i.e., $Sb(III)(TMS)_3$) may be separately introduced into the ALD reaction chamber and exposed to the germanium layer on the substrate. The reactive antimony precursor may react with ligands of the reactive germanium precursor and the co-reactive germanium precursor to fabricate a partial antimony monolayer over the germanium layer. The co-reactive antimony precursor may react with ligands of the reactive germanium precursor and the co-reactive germanium precursor to fabricate the antimony layer over the germanium layer. The reactive antimony precursor and the co-reactive antimony precursor may be sequentially pulsed into the ALD reaction chamber for an amount of time sufficient for the reactive antimony precursor and the co-reactive antimony precursor to be chemisorbed or adsorbed to the germanium monolayer, resulting in the fabrication of the antimony monolayer. Between pulses of the reactive antimony precursor and the co-reactive antimony precursor, the ALD reaction chamber may be purged with the inert gas to remove excess reactive antimony precursor, co-reactive antimony precursor, and byproducts. As with the previous examples, tellurium may be substituted by selenium.

To fabricate a tellurium layer by ALD, the reactive tellurium precursor (i.e., $Te(OEt)_4$) and the co-reactive tellurium precursor (i.e., $Te(TMS)_2$) may be separately introduced into the ALD reaction chamber and exposed to the antimony layer. The reactive tellurium precursor may react with ligands of the reactive antimony precursor and the co-reactive antimony precursor to fabricate a partial tellurium monolayer over the antimony layer. The co-reactive tellurium precursor may react with ligands of the reactive antimony precursor and the co-reactive antimony precursor to fabricate the tellurium layer over the antimony layer. The reactive tellurium precursor and the co-reactive tellurium precursor may be sequentially pulsed into the ALD reaction chamber for an amount of time sufficient for the reactive tellurium precursor and the co-reactive tellurium precursor to be chemisorbed or adsorbed to the antimony layer, resulting in the fabrication of the tellurium layer. Between pulses of the reactive tellurium precursor and the co-reactive tellurium precursor, the ALD reaction chamber may be purged with the inert gas to remove excess reactive tellurium precursor, co-reactive tellurium precursor, and byproducts.

Since the ALD layer cycles for fabricating the metal layers include reactive and co-reactive metal precursors, the metal layers may be fabricated without co-reactants, such as water, oxygen, hydrogen, or ammonia. Each of the ALD layer cycles may include the metal precursors, the carrier gas, and the purge gas, with no other reactants.

In some embodiments, the reactive germanium precursor is $Ge(II)Cl_2$ and the co-reactive metal precursor is $GeH(IV)(TMS)_3$. When these germanium precursors are reacted in the ALD reaction chamber, the layer of germanium is formed on the substrate. In one embodiment, the reactive antimony precursor is $Sb(III)(OEt)_3$ and the co-reactive antimony precursor is $Sb(III)(TMS)_3$, which react to form the layer of antimony on the layer of germanium. In another embodiment, the reactive metal precursor is $Sb(III)Cl_3$ and the co-reactive metal precursor is $Sb(III)(TMS)_3$, which react to form the layer of antimony on the germanium layer. In another embodiment, the reactive germanium precursor is $GeCl_4$ and the reactive antimony precursor is $Sb(III)(TMS)_3$, which react to give a layer of $Ge_3Sb_4$. In another embodiment, the reactive metal precursor is $Te(OEt)_4$ and the co-reactive metal precursor is $Te(II)(TMS)_2$, which react to form the layer of tellurium on the antimony or germanium layer. In another embodiment, the reactive metal precursor is $Te(OMe)_4$ and the co-reactive metal precursor is $Te(II)(TMS)_2$, which react to form the layer of tellurium on the antimony or germanium layer. In another embodiment, the reactive germanium precursor is $Ge(OEt)_4$ and the reactive tellurium precursor is $Te(II)(TMS)_2$ which react to form a layer of $GeTe_2$ on the antimony layer. In another embodiment, the reactive metal precursor is $Se(OMe)_4$ and the co-reactive metal precursor is $Se(II)(TMS)_2$, which react to form the layer of selenium on the antimony or germanium layer.

FIG. 4B shows operation 436 with sub-operation steps 436a-d for forming the CCL by ALD as described above. Sub-operation 436 may also involve optional annealing sub-operation 436e as shown in FIG. 4B. Annealing 436e may be performed before or after forming the second electrode. Annealing temperatures should be higher than the ALD deposition temperatures but less than the melting or crystallization temperatures of the CCL. In some embodiments, annealing 436e is performed on a partially formed CCL, e.g., a stack including some but not all nanolaminate structures.

Method 400 may proceed with fabricating a second electrode during operation 438. The second electrode may also be deposited in a manner similar to the first electrode as described above with reference to operation 432.

Figure 5G:
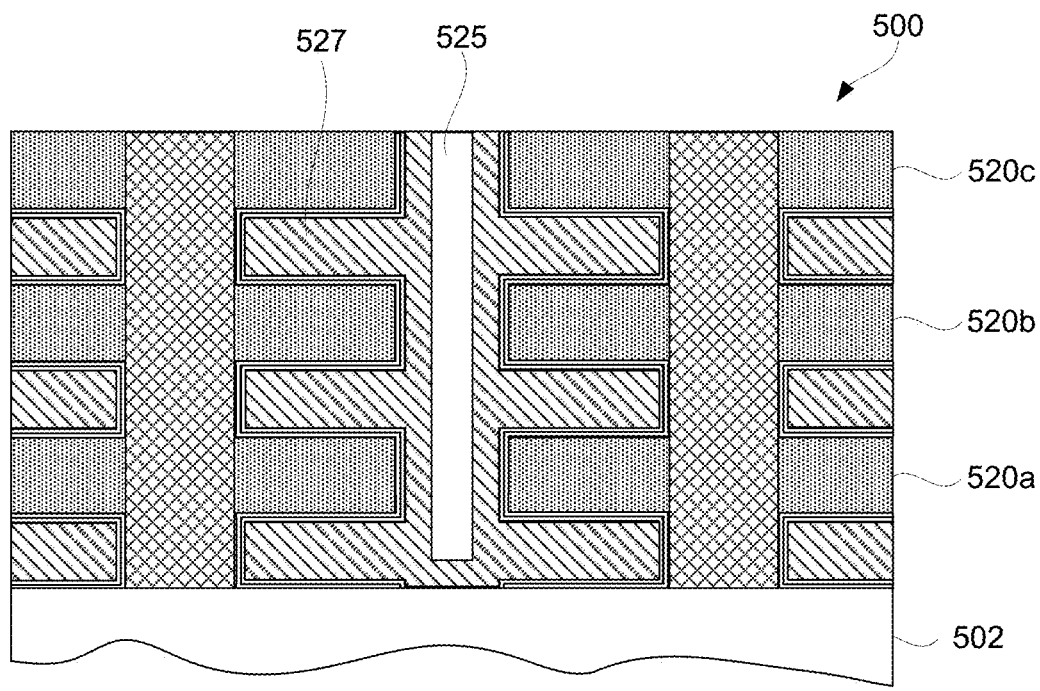

In some embodiments, method 400 comprises filling isolation structures 525 with second conductive material 527 during optional operation 440. One example of a structure after completing operation 440 is shown in FIG. 5G. Second conductive material 527 may be the same or different than the first insulating material forming first signal line 201a (described above with reference to operation 415). Second conductive material 527 is later used to fabricate second signal lines 203a and 203b. Isolation structures 525 may be filled with second conductive material 527 using ALD, CVD, or other suitable techniques. Second conductive material 527 may be deposited as a continuous layer covering all surfaces of isolation structures 525. As such, second conductive material 527 may be in direct contact with memory cell 204 or CCL 202 or a second electrode, if one is used. In some embodiments, second conductive material 527 is tungsten (W) deposited by ALD or CVD. In some embodiments, second conductive material 527 is comprised of an initial liner material such as titanium nitride, tantalum, tantalum nitride, or tungsten nitride, deposited by ALD or CVD, followed by tungsten deposited by ALD or CVD.

Figure 5H:
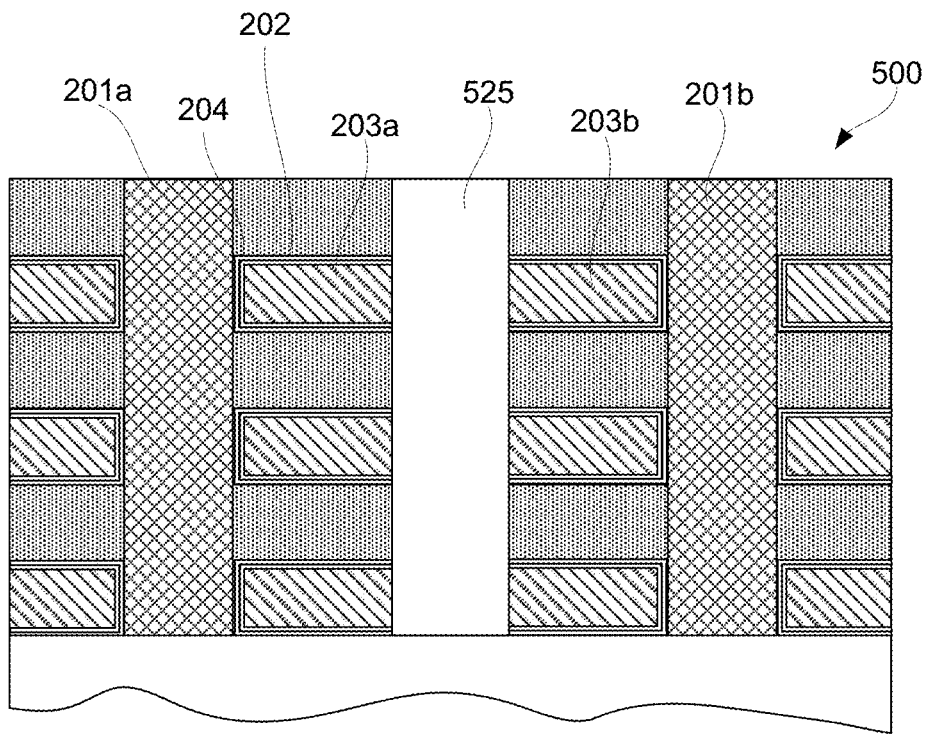

In some embodiments, method 400 comprises separating memory devices from each other during optional operation 445. One example of a structure after completing operation 445 is shown in FIG. 5H. For example, when materials forming memory cells 204, CCLs 202, and second signal lines 203 may be deposited into isolation structures as continuous layers which results in adjacent cells (in the vertical direction) being electrically connected. At least a portion of the second conductive material (and the second electrode if one is present) extending between the vertically adjacent cells need to be removed. In some embodiments, portions of memory cells 204 and/or CCLs 202 extending between the vertically adjacent cells are removed. The space formed between adjacent columns of memory devices can be later filled with dielectric.

Figures 1, 5I:
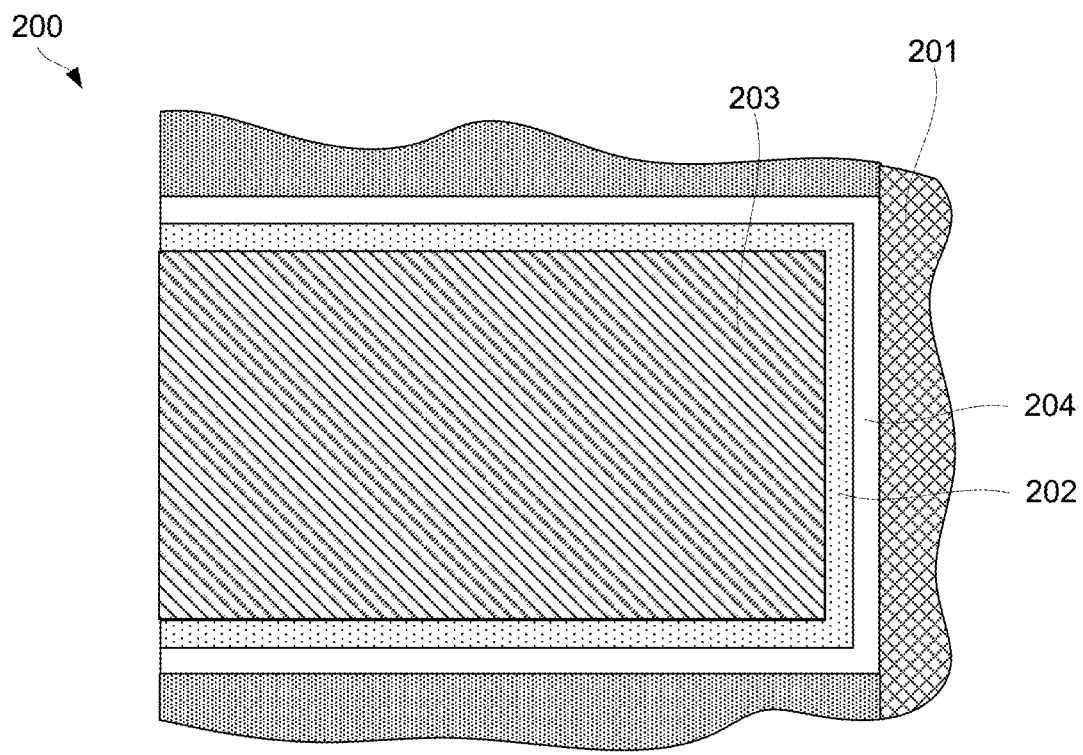
Figures 2, 5I:
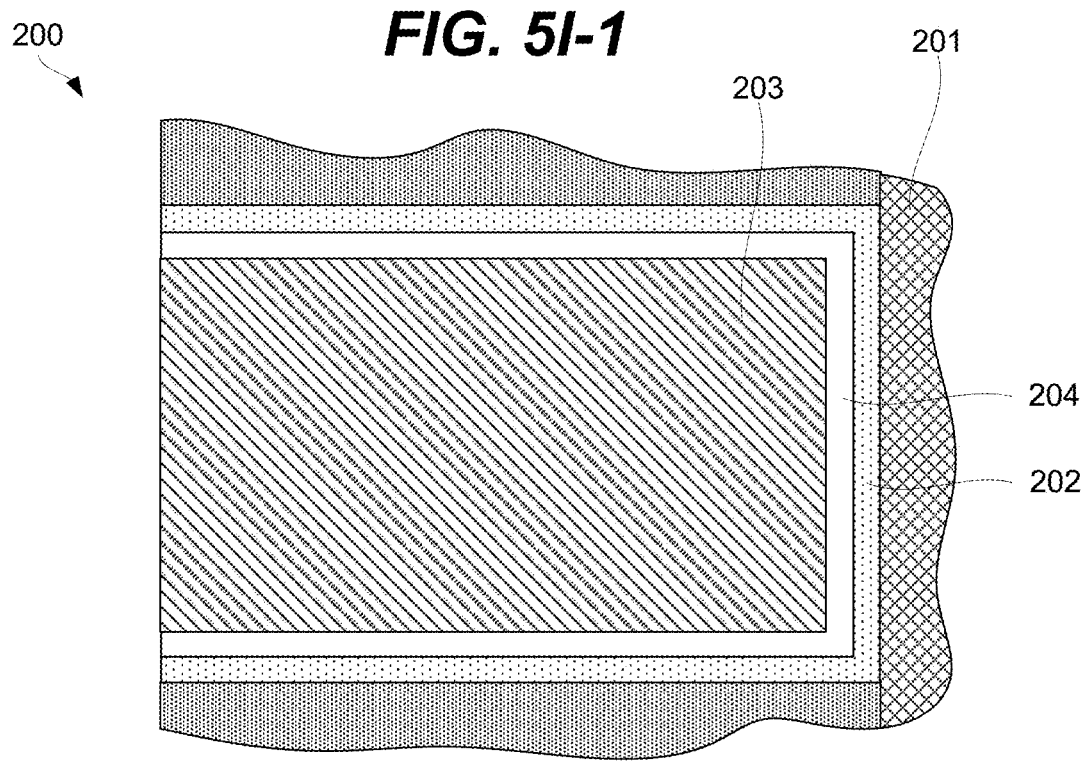

Referring to FIG. 5H, each junction between one of first signal lines 201a, 201b, etc. and between one of second signal lines 203a, 203b, etc. has at least memory cell 204 (e.g., a portion of the originally formed layer) and CCL 202 (e.g., a portion of the originally formed layer). This combination of memory cell 204 and CCL 202 is referred to as memory element 200, two examples of which are presented in FIGS. 5I-1 and 5I-2. Specifically, FIG. 5I-1 illustrates an example of memory element 200 in which memory cell 204 is formed before forming CCL 202. As such, memory cell 204 is adjacent (and in some embodiments, e.g., FIG. 5I-1) directly interfacing first signal line 201. Continuing with this example, CCL 202 is adjacent (and in some embodiments, e.g., FIG. 5I-1) directly interfacing second signal line 203. On the other hand, FIG. 5I-2 illustrates an example of memory element 200 in which memory cell 204 is formed after forming CCL 202. As such, CCL 202 is adjacent (and in some embodiments, e.g., FIG. 5I-2) directly interfacing first signal line 201. Continuing with this example, memory cell 204 is adjacent (and in some embodiments, e.g., FIG. 5I-2) directly interfacing second signal line 203.

Figures 1, 2, 6B:
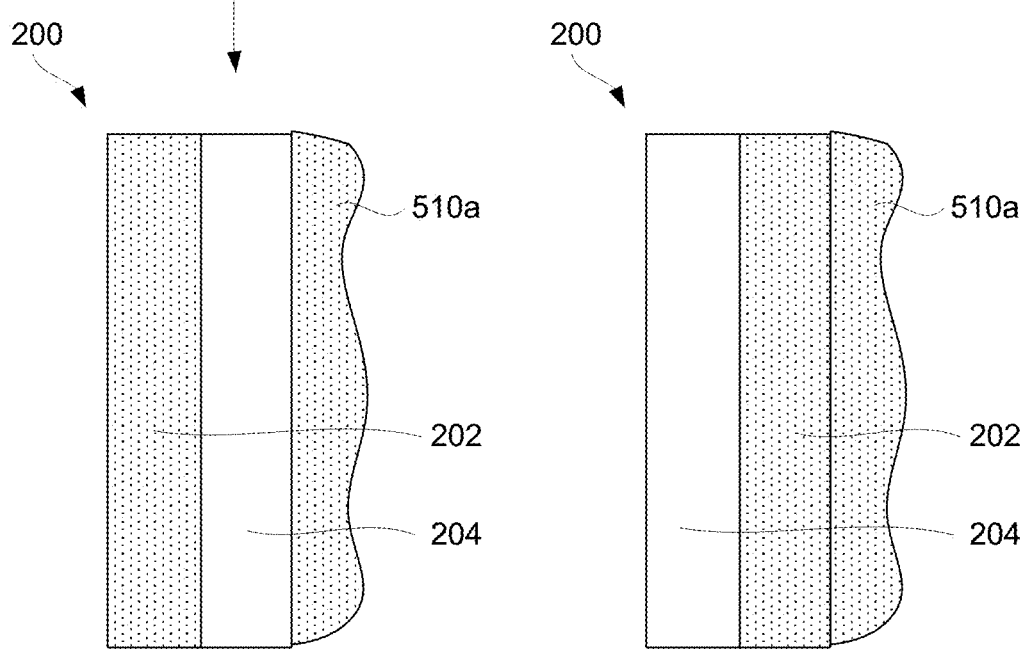
Figure 6C:
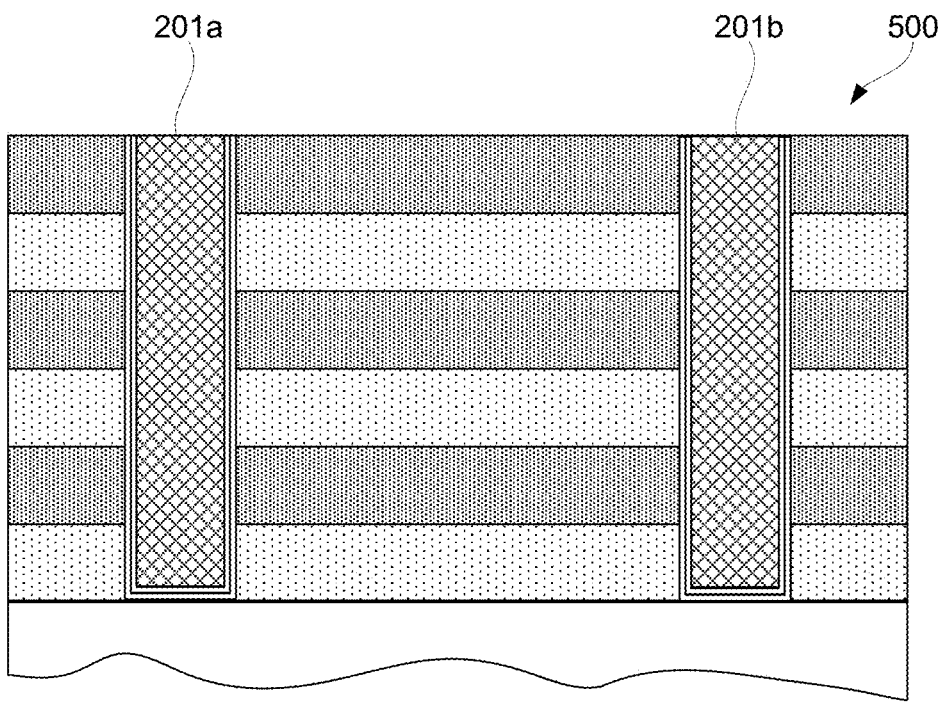
Figure 6D:
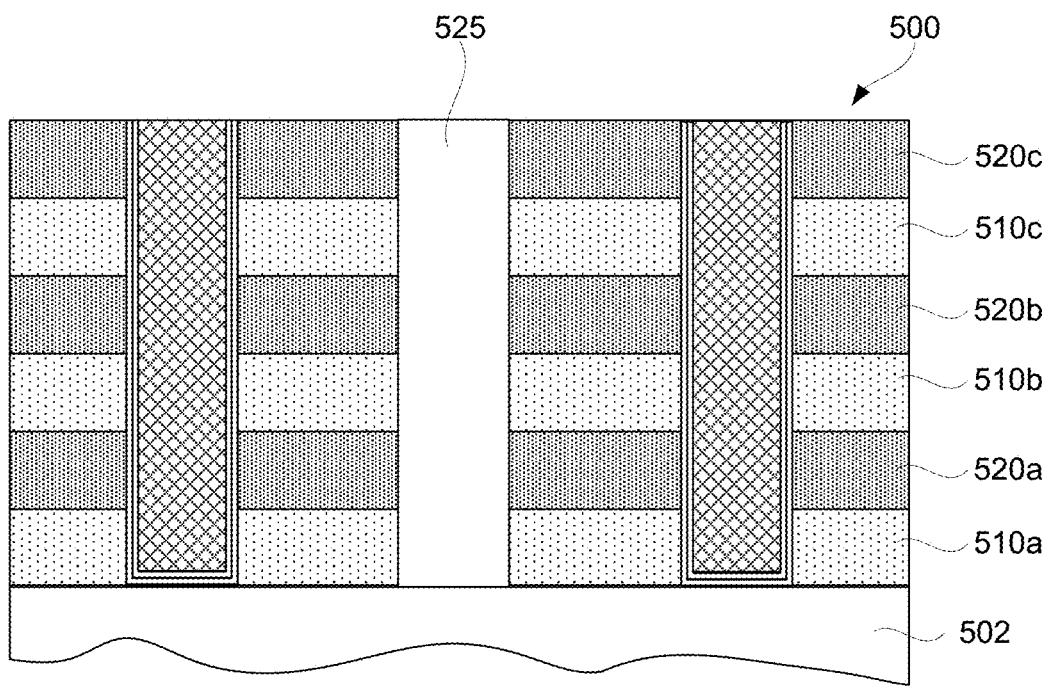
Figure 6E:
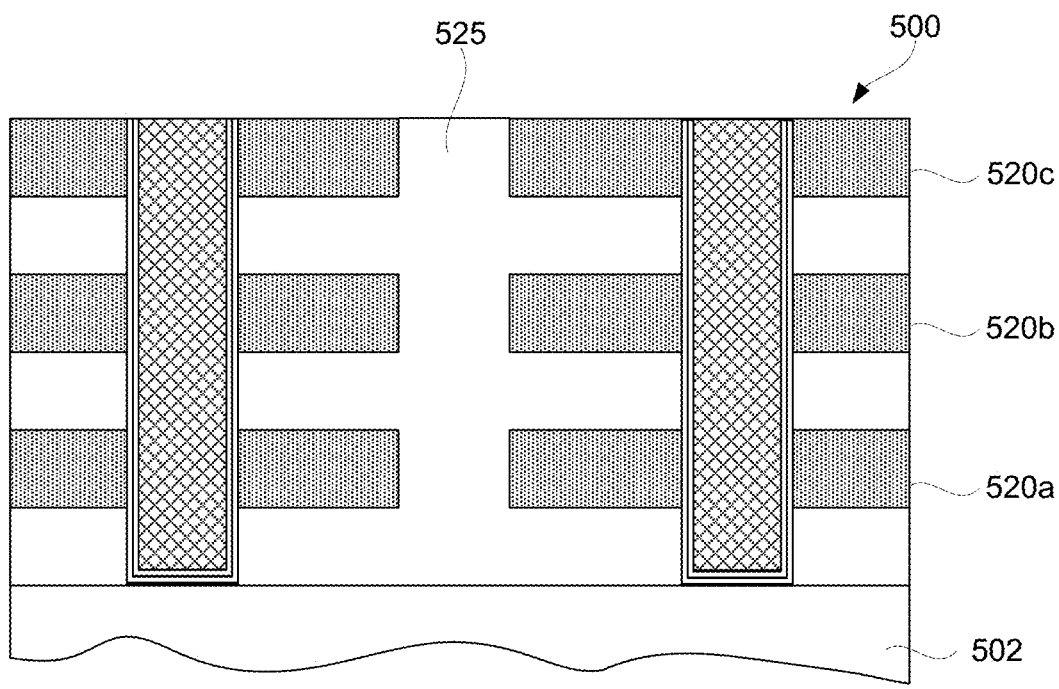
Figure 6F:
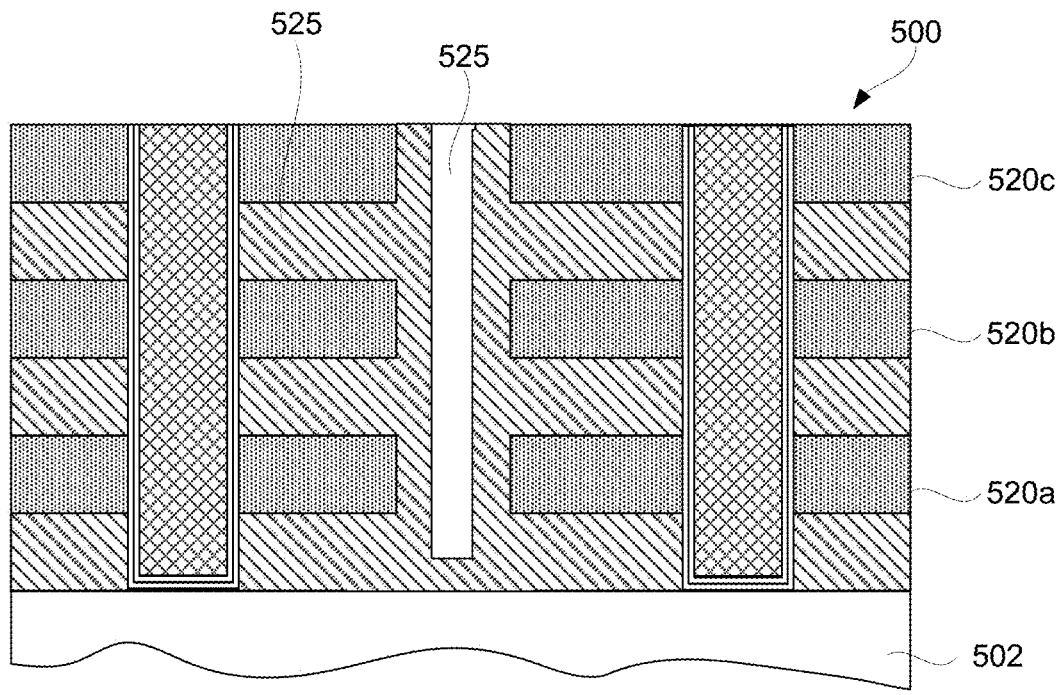
Figure 6G:
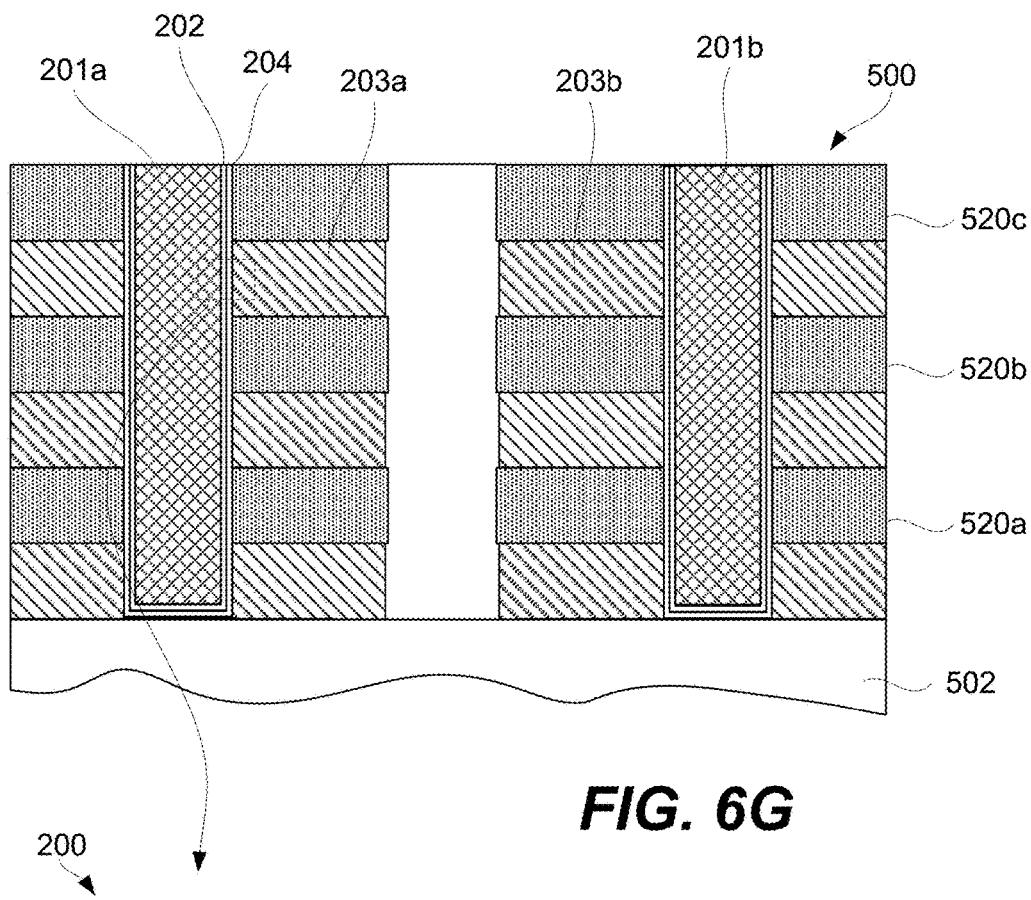
Figures 1, 6H:
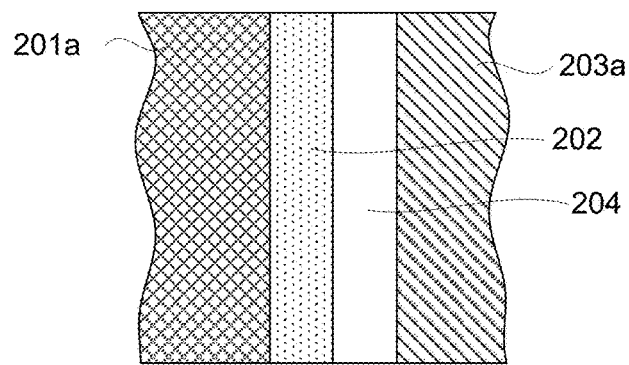
Figures 2, 6H:
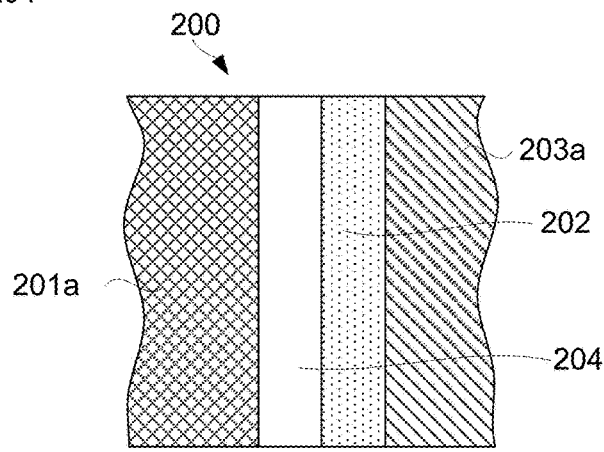

FIGS. 6A-6H2 illustrate another example of method 400. In this example, once vias 515a and 515b are formed in the stack of two alternating materials, both layers corresponding to CCL 202 and memory cell 204 are formed within these vias 515a and 515b before filling these vias with the first conductive material. In other words, operation 412 (referring to FIG. 4A) is performed after operation 410 and before operation 415. FIG. 6A illustrates an example of the partially fabricated circuit after completing operation 412, while FIGS. 6B-1 and 6B-2 illustrate an expanded view a portion comprising of CCL 202, memory cell 204, and first dielectric layer 510a. In FIG. 6B-1, memory cell 204 is formed before CCL 202. In FIG. 6B-2, memory cell 204 is formed after CCL 202. It should be noted at right after completing operation 412, either CCL 202 or memory cell 204 (or a first electrode, if one is present) directly interface a stack of first dielectric layers 510a, 510b, etc. and second dielectric layers 520a, 520b, etc.

Method 400 then proceed with filling remaining portions of vias 515a and 515b with first conductive material (thereby forming first signal lines 201a and 201b) during operation 415. One example of a partially fabricated circuit after completing operation 415 is shown in FIG. 6C. Method 400 may then proceed with fabricating isolating structures 525 during operation 417. One example of a partially fabricated circuit after completing operation 417 is shown in FIG. 6D. Method 400 may proceed with removing one alternating material layer from the stack during operation 420, as for example, shown in FIG. 6E. Operations 415, 417, and 420 may be the same as operations described above with reference to FIGS. 5C-5D. However, it should be noted that since CCL 202 and memory cell 204 are already present in the partially fabricated circuit subjected to these operation, operations 415, 417, and 420 may be designed to avoid damage to CCL 202 and memory cell 204.

Since CCL 202 and memory cell 204 are already present, operation 430 may not be performed at all and method 400 may proceed directly to operations 440 and 445 as described above. The subassembly examples are illustrated in FIG. 6F (after completing operation 440) and in FIG. 6G (after completing operation 445). FIGS. 6H-1 and 6H-2 illustrate two examples of memory elements 200. Specifically, FIG. 6H-1 illustrates an example of memory element 200 in which memory cell 204 is formed before forming CCL 202. As such, memory cell 204 is adjacent (and in some embodiments, e.g., FIG. 6H-1) directly interfacing second signal line 203. Continuing with this example, CCL 202 is adjacent (and in some embodiments, e.g., FIG. 6H-1) directly interfacing first signal line 201. On the other hand, FIG. 6H-2 illustrates an example of memory element 200 in which memory cell 204 is formed after forming CCL 202. As such, CCL 202 is adjacent (and in some embodiments, e.g., FIG. 6H-2) directly interfacing second signal line 203. Continuing with this example, memory cell 204 is adjacent (and in some embodiments, e.g., FIG. 6H-2) directly interfacing first signal line 201.

Figure 7A:
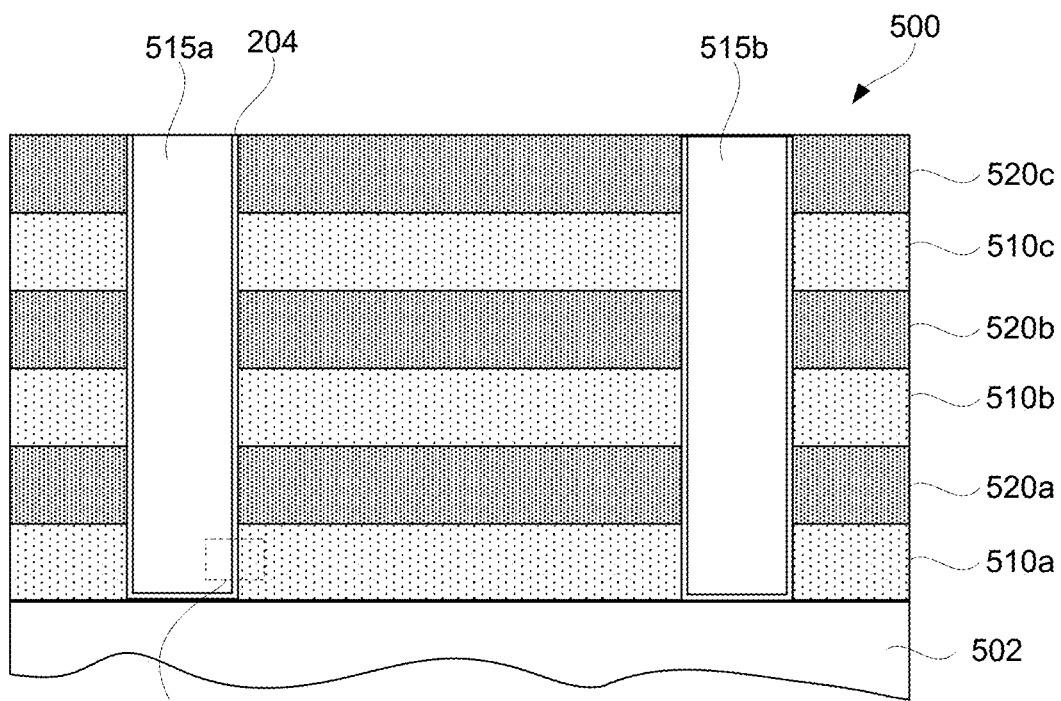
Figures 1, 7B:
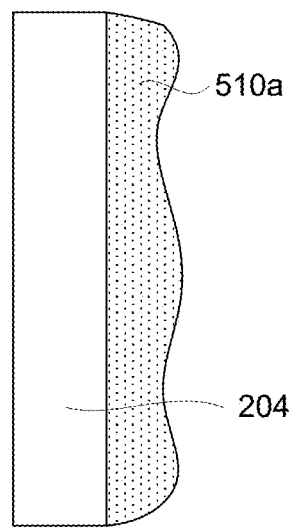
Figures 2, 7B:
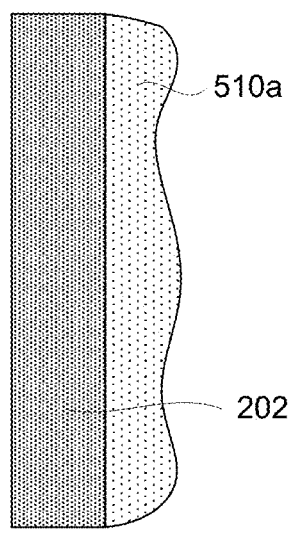

FIGS. 7A-7H illustrate another example of method 400 in which one of CCL 202 or memory cell 204 is formed in vias 515a and 515b before filling these vias with the first conductive material (similar to the example described above with reference to FIGS. 6A-6H-2). The other one of CCL 202 or memory cell 204 is deposited within isolation structure 525 (similar to the example described above with reference to FIGS. 5A-5I-2). FIGS. 7A and 7B-1 illustrate an example of the partially fabricated circuit after completing operation 412 during which memory cell 204 is formed in vias 515a and 515b. In this example, CCL 202 is later formed within isolation structure 525. FIGS. 7B-2 illustrate an example of the partially fabricated circuit after completing operation 412 during which CCL 202 is formed in vias 515a and 515b. In this example, memory cell 204 is later formed within isolation structure 525.

Figure 7C:
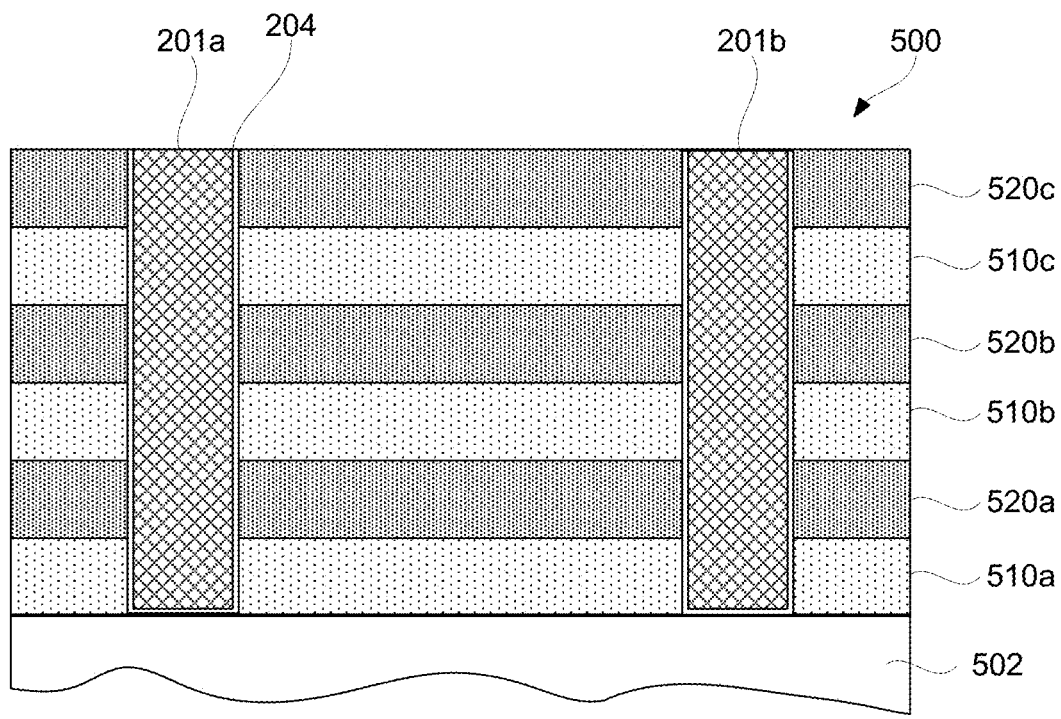
Figure 7D:
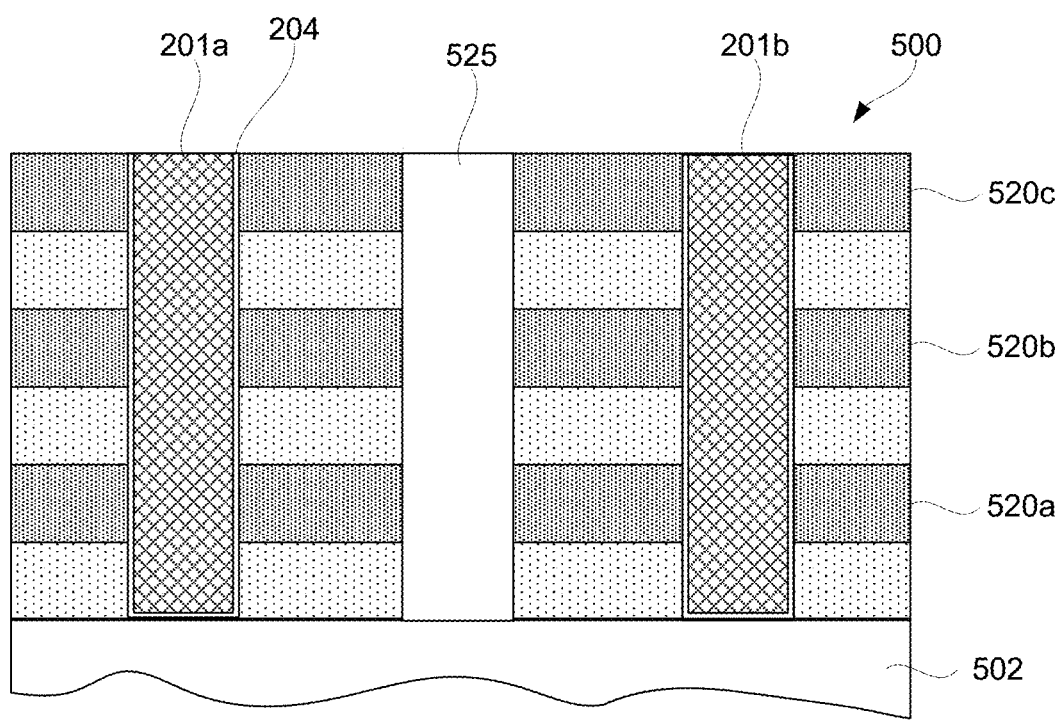
Figure 7E:
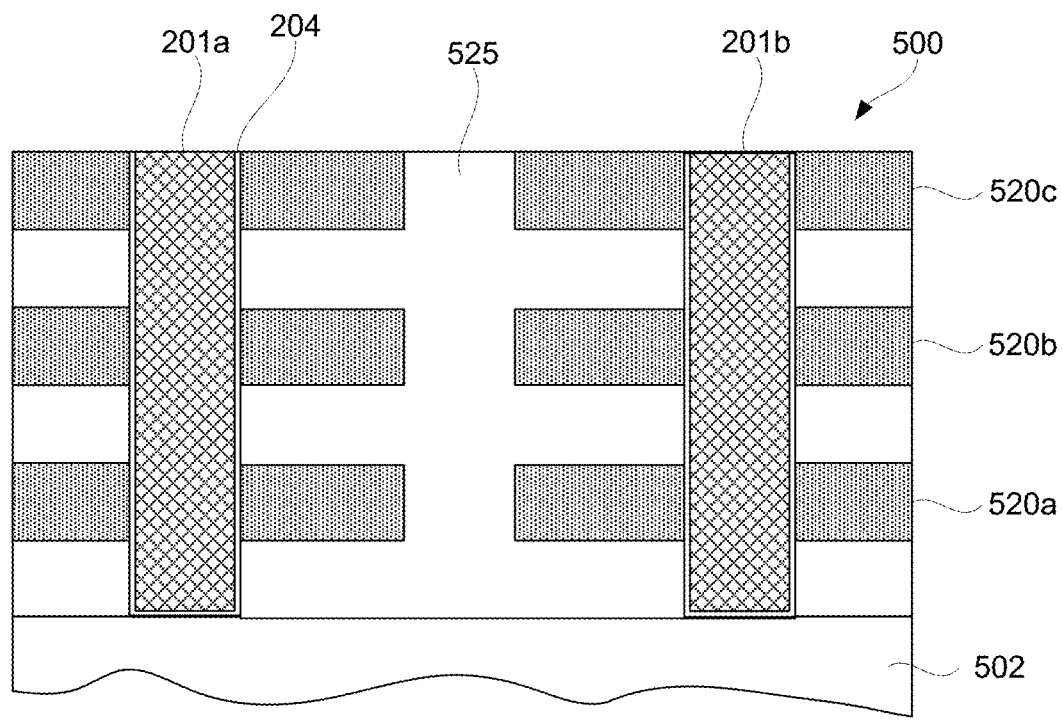
Figure 7F:
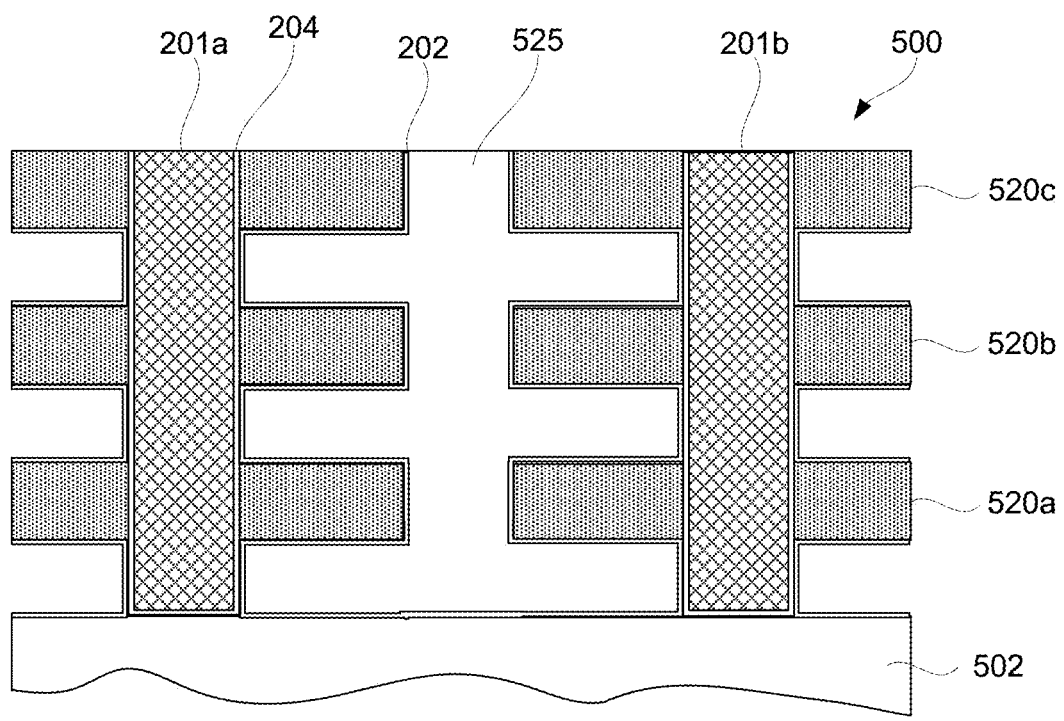
Figure 7G:
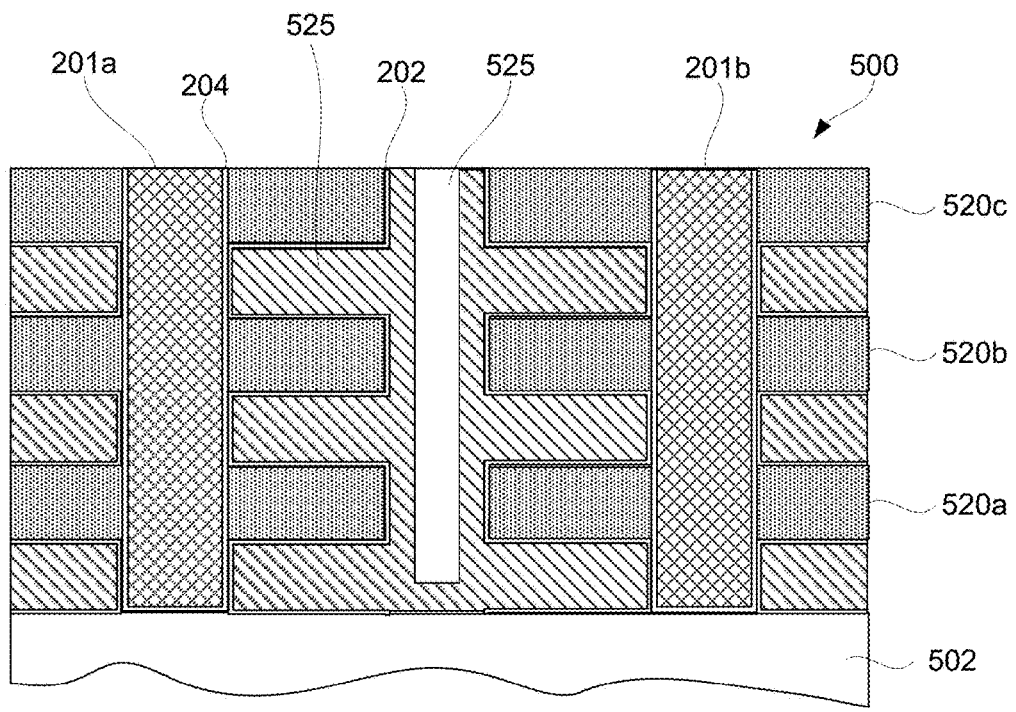
Figure 7H:
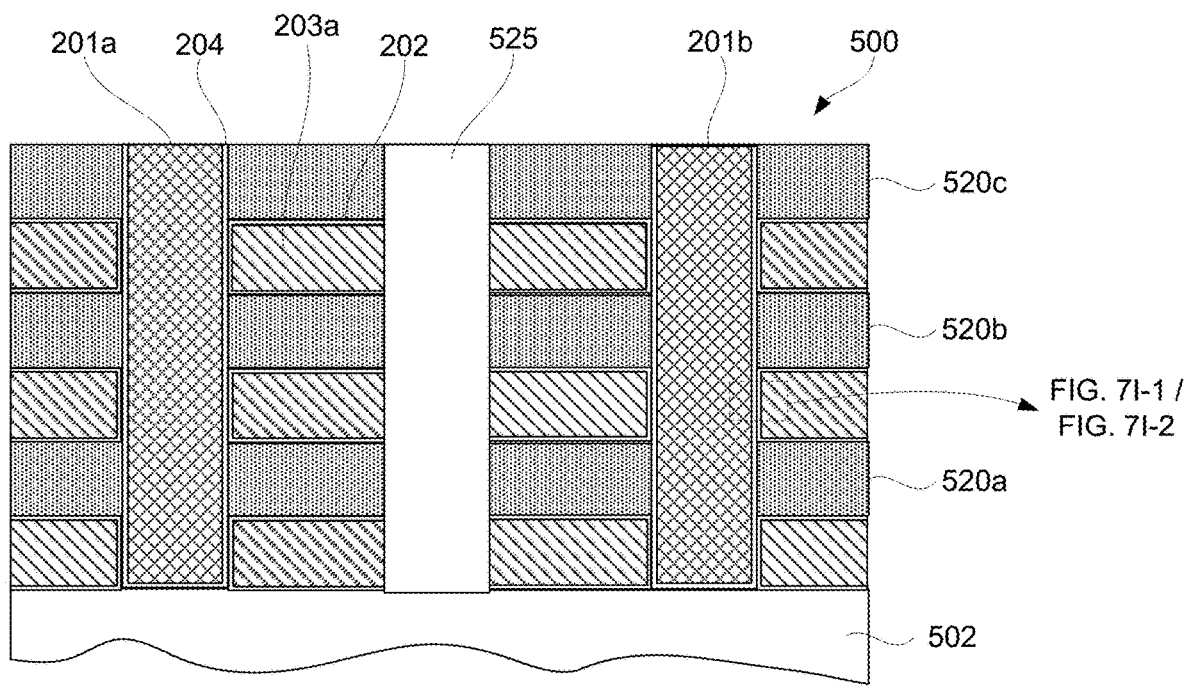
Figures 1, 7I:
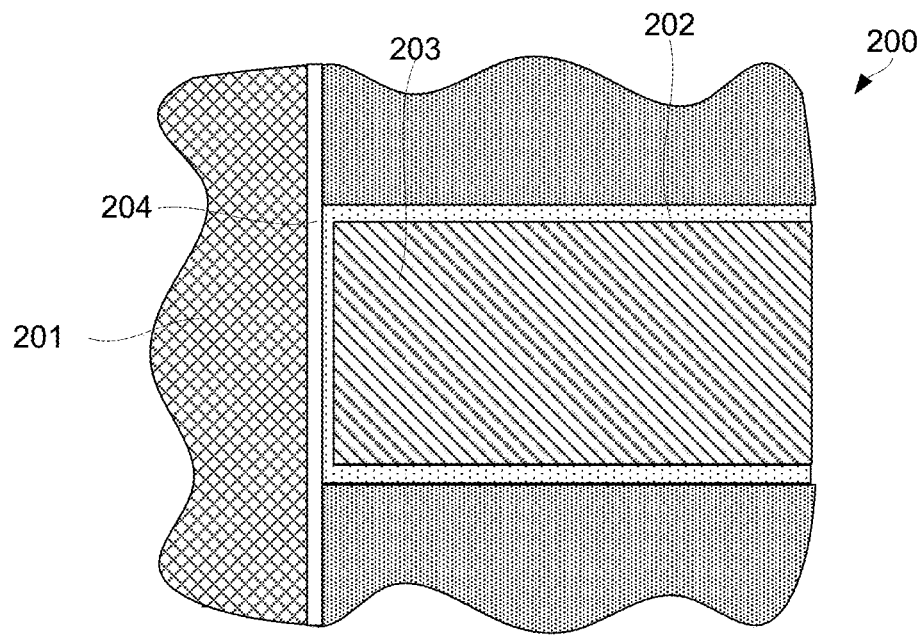
Figures 2, 7I:
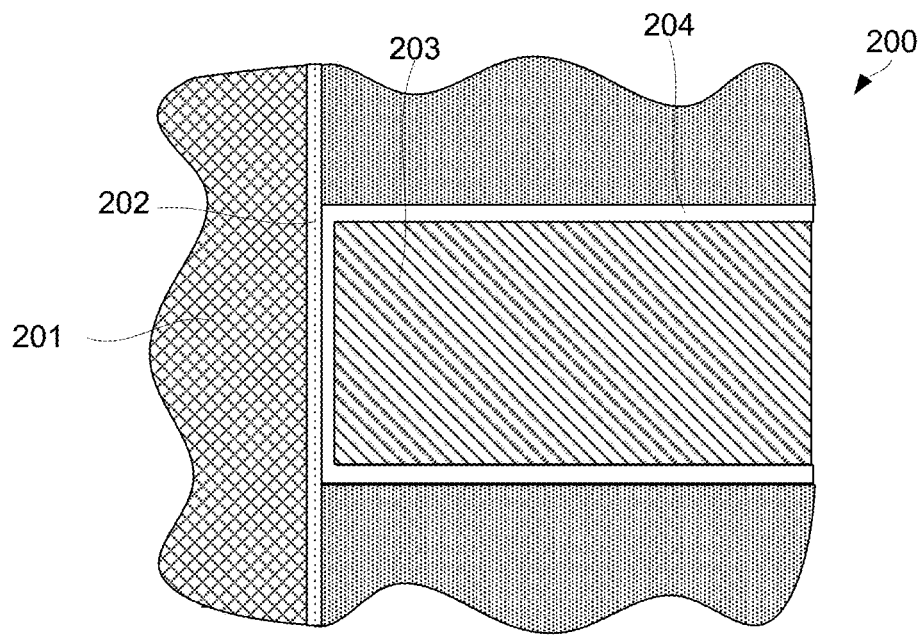

Referring to FIG. 7C, method 400 then proceeds with filling remaining portions of vias 515a and 515b with first conductive material (thereby forming first signal lines 201a and 201b) during operation 415. Method 400 continues with fabricating isolating structures 525 during operation 417 as shown in FIG. 7D. Method 400 may proceed with removing one alternating material layer from the stack during operation 420, as for example, shown in FIG. 7E. The remaining one of CCL 202 or memory cell 204 is then formed within isolation structure 525 during operation 430 (or more specifically during sub-operation 434 or sub-operation 436) as schematically shown in FIG. 7F. Method 400 may proceed directly to operations 440 and 445 as described above. The subassembly examples are illustrated in FIG. 7G (after completing operation 440) and in FIG. 7H (after completing operation 445). FIG. 7I-1 illustrates an example of a memory device where memory cell 204 was formed first (prior to first signal line 201 and prior to CCL 202), while FIG. 7I-2 illustrates an example of a memory device where CCL 202 was formed first (prior to first signal line 201 and prior to memory cell 204).

FIGS. 8A-8F illustrate a different example of method 400. One key difference, from the examples described above, appears during operation 405. Rather than forming a stack of alternating dielectric layers, a stack formed in this example includes conductive layers 570a, 570b, etc. alternating with dielectric layer 520a, 520b, etc. An example of such stack is shown in FIG. 8A. Conductive layers 570a, 570b will be converted into second signal lines 230. In some embodiments, dielectric layer 520a, 520b, etc. is SiO₂ (or SiN), while the conductive layers 570a, 570b is doped polysilicon. Doped polysilicon serves as a conductor.

Figure 8B:
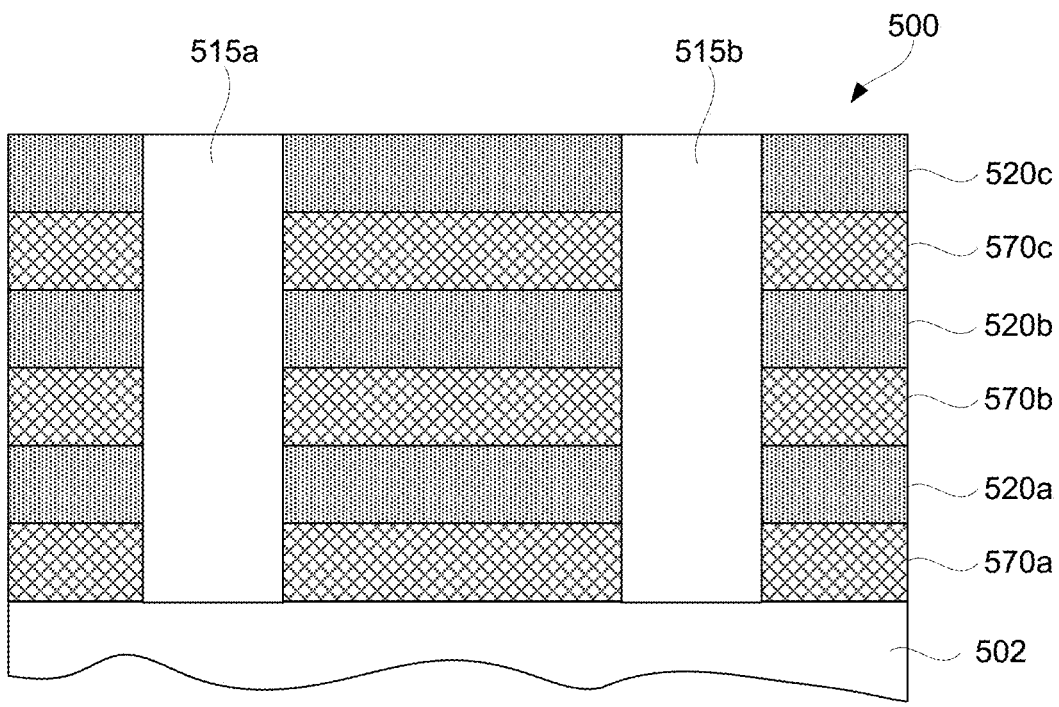
Figure 8C:
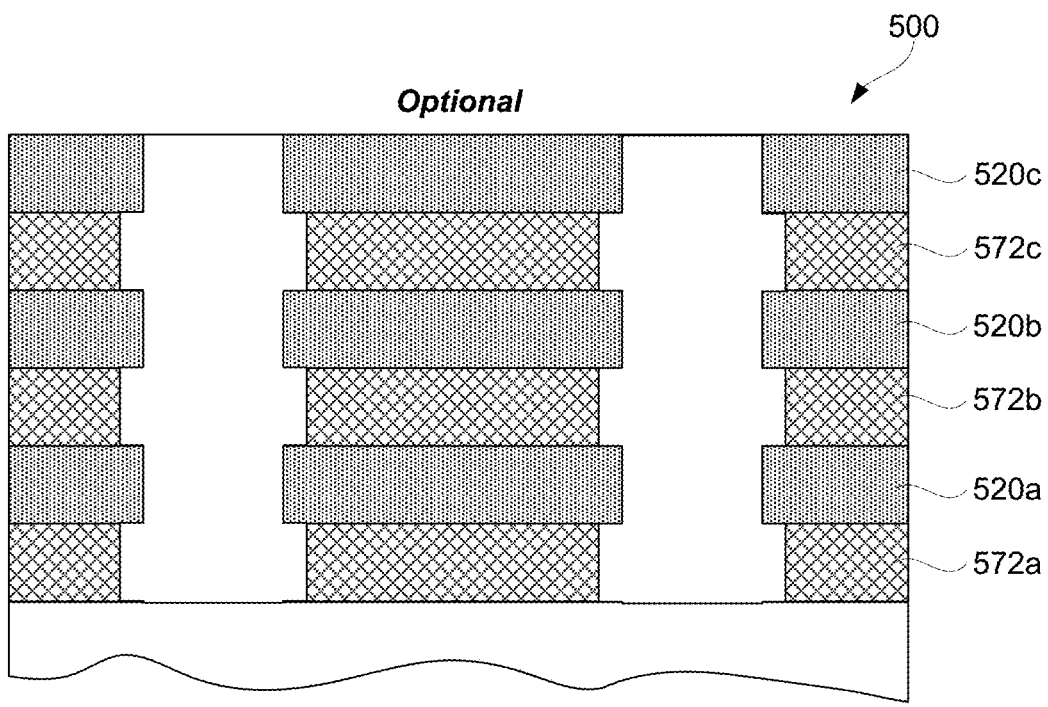

Method 400 proceeds with fabricating vias 515a and 515b in the stack during operation 410, as shown in FIG. 8B. In some embodiments, portions of conductive layers 570a, 570b, etc. may be optionally recessed in between semiconductor layer 520a, 520b, etc. as, for example, shown in FIG. 8C. For example, selective etching may be used for this optional operation.

Figure 8D:
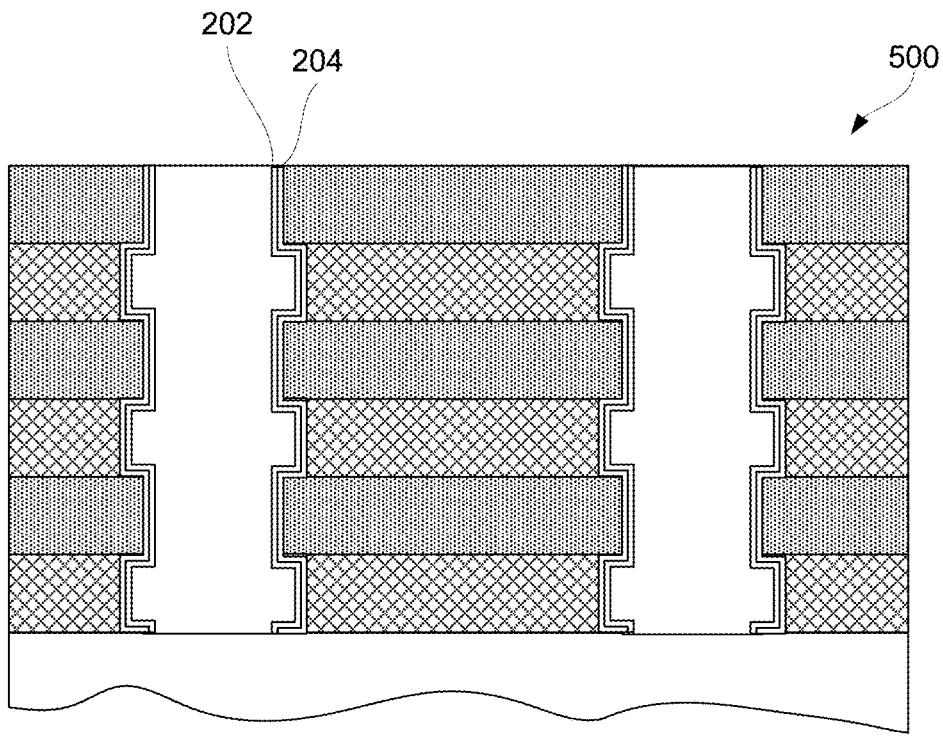

Method 400 may proceed with forming CCL 202 and memory cell 204 in vias 515a and 515b, as shown in FIG. 8D. This operation 412 is similar to the one described above with reference to FIG. 6A. In some embodiments, CCL 202 is formed before memory cell 204. However, the alternative is also within the scope.

Figure 8E:
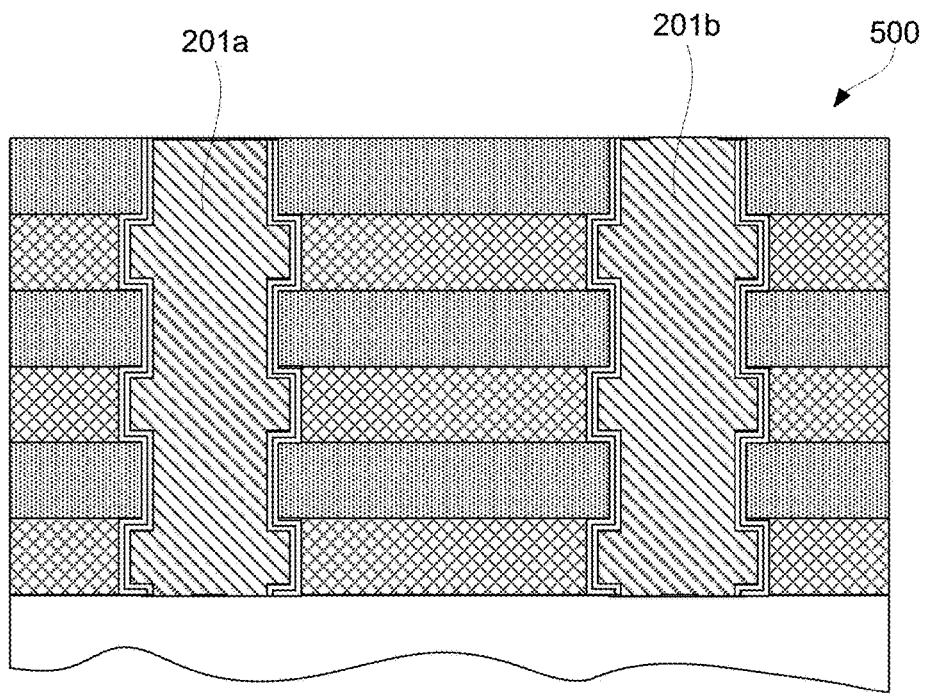
Figure 8F:
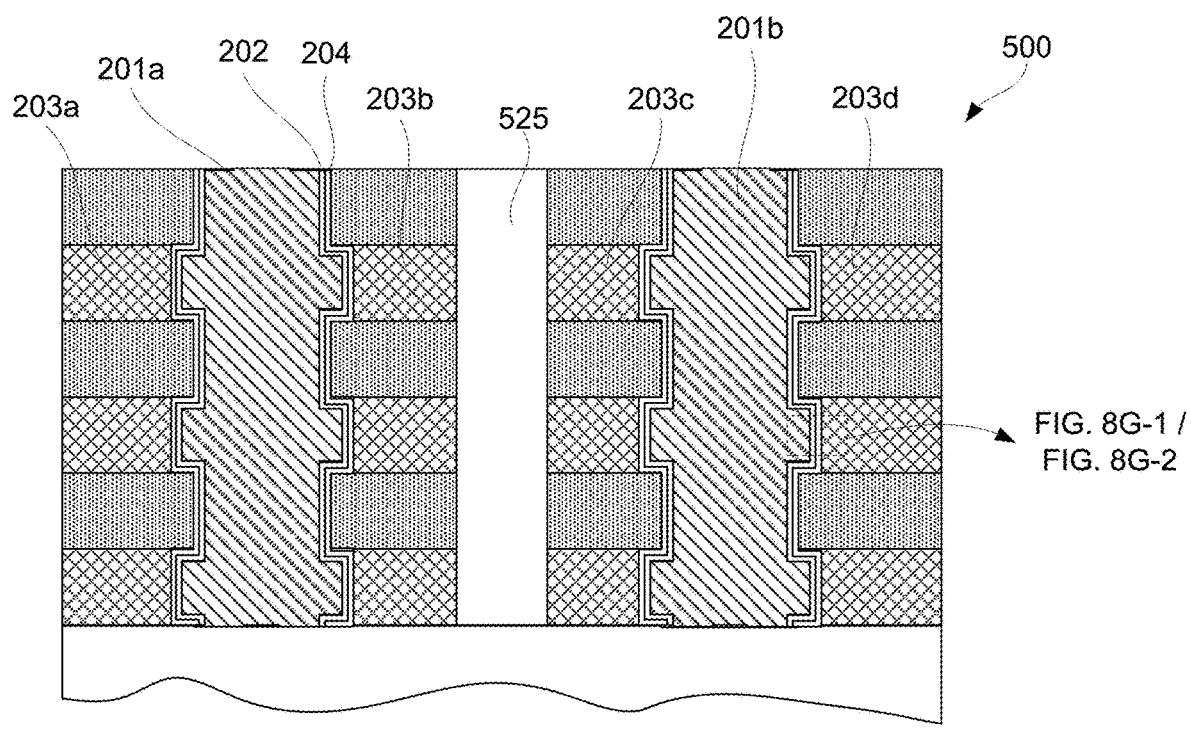
Figure 9A:
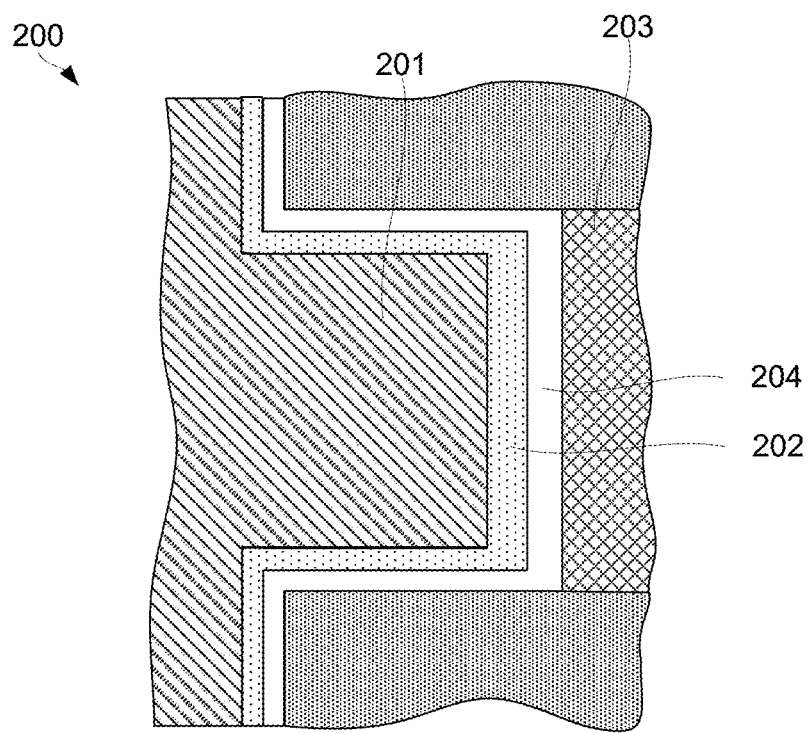
FIGS. 9A-9B are schematic representations of an example of a 3D array at different fabrication stages, in accordance with some embodiments.
Figure 9B:
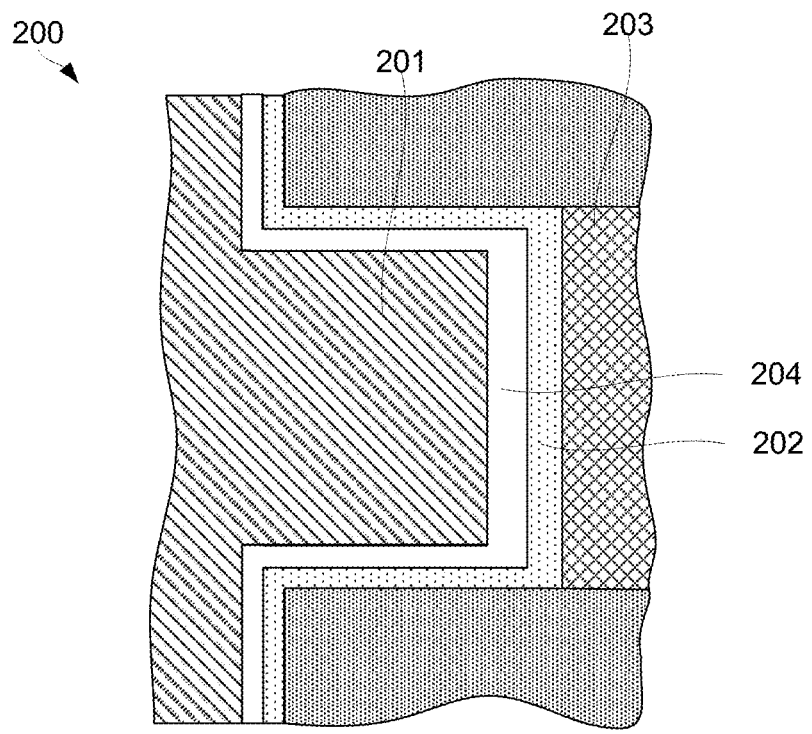

Method 400 may proceed with filling vias 515a and 515b with a conductive material to forming first signal lines 201a and 201b, as schematically shown in FIG. 8E. Isolation structure 525 is then fabricated to separate second signal lines 203a, 203b, etc., as schematically shown in FIG. 8F. FIG. 9A illustrates an example where memory cell 204 is formed before CCL 202, while FIG. 9B illustrates an example where memory cell 204 is formed after CCL 202.

CONCLUSION

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A memory device, comprising:
   a stack of two alternating material layers on a substrate;
   a via in the stack, the via including a sidewall;
   a memory cell layer disposed on the sidewall in the via; and
   a current compliance layer (CCL) disposed on the memory cell layer in the via, the CCL including an interface layer and a main layer, wherein the interface layer comprises tellurium oxide and the main layer comprises germanium and tellurium.

2. The memory of claim 1 wherein the memory cell layer and the CCL are deposited with an atomic layer deposition process.

3. The memory of claim 1 wherein the main layer of the CCL includes a Copper Sulfide (CuS).

4. The memory of claim 1 wherein the main layer of the CCL includes a sulfur concentration of at least 50% atomic.

5. The memory of claim 1, wherein a concentration of germanium in the main layer is between about 1% atomic and 10% atomic.

6. The memory of claim 1, wherein a concentration of tellurium in the main layer is between about 80% atomic and 99% atomic.

7. The memory of claim 1 further comprising a conductive material disposed in the via.

8. A memory device, comprising:
   means or depositing an interface layer of a current compliance layer (CCL) on a memory element;
   means for depositing a main layer of the CCL,
   wherein the interface layer directly interfaces the main layer,
   wherein the interface layer comprises tellurium oxide,
   wherein the main layer comprises germanium and tellurium.

* * * * *